US012479815B2

(12) United States Patent
Voges et al.

(10) Patent No.: US 12,479,815 B2
(45) Date of Patent: Nov. 25, 2025

(54) MATERIALS FOR ELECTRONIC DEVICES

(71) Applicant: Merck Patent GmbH, Darmstadt (DE)

(72) Inventors: Frank Voges, Bad Duerkheim (DE); Teresa Mujica-Fernaud, Darmstadt (DE); Elvira Montenegro, Weinheim (DE); Rémi Manouk Anémian, Seoul (KR)

(73) Assignee: Merck Patent GmbH, Darmstadt (DE)

( * ) Notice: Subject to any disclaimer, the term of this patent is extended or adjusted under 35 U.S.C. 154(b) by 264 days.

(21) Appl. No.: 16/075,363

(22) PCT Filed: Jan. 17, 2017

(86) PCT No.: PCT/EP2017/000042
§ 371 (c)(1),
(2) Date: Aug. 3, 2018

(87) PCT Pub. No.: WO2017/133829
PCT Pub. Date: Aug. 10, 2017

(65) Prior Publication Data
US 2019/0040034 A1 Feb. 7, 2019

(30) Foreign Application Priority Data
Feb. 5, 2016 (EP) .................................... 16154514

(51) Int. Cl.
| | |
|---|---|
| *C07D 333/76* | (2006.01) |
| *C07C 211/61* | (2006.01) |
| *C07D 209/82* | (2006.01) |
| *C07D 213/16* | (2006.01) |
| *C07D 251/24* | (2006.01) |
| *C07D 307/91* | (2006.01) |
| *C07D 403/04* | (2006.01) |
| *C09K 11/06* | (2006.01) |
| *H01L 51/00* | (2006.01) |
| *H01L 51/50* | (2006.01) |
| *H01L 51/52* | (2006.01) |
| *H05B 33/14* | (2006.01) |
| *H10K 50/15* | (2023.01) |
| *H10K 50/155* | (2023.01) |
| *H10K 85/60* | (2023.01) |
| *H05B 33/10* | (2006.01) |
| *H10K 50/17* | (2023.01) |
| *H10K 50/18* | (2023.01) |
| *H10K 50/814* | (2023.01) |

(52) U.S. Cl.
CPC .......... *C07D 333/76* (2013.01); *C07C 211/61* (2013.01); *C07D 209/82* (2013.01); *C07D 213/16* (2013.01); *C07D 251/24* (2013.01); *C07D 307/91* (2013.01); *C07D 403/04* (2013.01); *C09K 11/06* (2013.01); *H05B 33/14* (2013.01); *H10K 50/155* (2023.02); *H10K 50/156* (2023.02); *H10K 85/615* (2023.02); *H10K 85/624* (2023.02); *H10K 85/631* (2023.02); *H10K 85/633* (2023.02); *H10K 85/655* (2023.02); *H10K 85/6572* (2023.02); *H10K 85/6574* (2023.02); *C09K 2211/1007* (2013.01); *C09K 2211/1029* (2013.01); *C09K 2211/185* (2013.01); *H05B 33/10* (2013.01); *H10K 50/17* (2023.02); *H10K 50/181* (2023.02); *H10K 50/814* (2023.02)

(58) Field of Classification Search
None
See application file for complete search history.

(56) References Cited

U.S. PATENT DOCUMENTS

| | | | |
|---|---|---|---|
| 9,812,648 B2 | 11/2017 | Montenegro et al. | |
| 2015/0076415 A1 | 3/2015 | Heil et al. | |
| 2015/0322198 A1* | 11/2015 | Hayer | C08L 65/02 |
| | | | 252/500 |
| 2016/0028014 A1 | 1/2016 | Kim et al. | |
| 2016/0190466 A1 | 6/2016 | Pfister et al. | |
| 2016/0225993 A1* | 8/2016 | Huh | C07D 403/10 |

FOREIGN PATENT DOCUMENTS

| | | |
|---|---|---|
| CN | 104114672 A | 10/2014 |
| CN | 105304823 A | 2/2016 |
| CN | 105358554 A | 2/2016 |
| CN | 106796996 A | 5/2017 |
| CN | 108368054 A | 8/2018 |
| CN | 108603107 A | 9/2018 |
| EP | 2978040 A1 | 1/2016 |
| JP | 2015-516487 A | 6/2015 |
| JP | 2019-507138 A | 3/2019 |
| KR | 10-2015-0102735 A | 9/2015 |
| KR | 10-1555155 B1 | 9/2015 |
| TW | 201800385 A | 1/2018 |
| WO | WO-2014/000860 A1 * | 1/2014 |
| WO | WO-2014129846 A1 | 8/2014 |
| WO | WO-2014171779 A1 | 10/2014 |
| WO | WO-2015012618 A1 | 1/2015 |
| WO | 2015/022051 A1 | 2/2015 |
| WO | WO-2016/052798 A1 * | 4/2016 |
| WO | 2017/102063 A1 | 6/2017 |

OTHER PUBLICATIONS

International Search Report for PCT/EP2017/000042 mailed Mar. 29, 2017.
Written Opinion of the International Searching Authority for PCT/EP2017/000042 mailed Mar. 29, 2017.
International Preliminary Report on Patentability received for PCT Patent Application No. PCT/EP2017/000042, mailed on Aug. 16, 2018, 19 pages (11 pages of English Translation and 8 pages of Original Document).

(Continued)

*Primary Examiner* — Jay Yang
(74) *Attorney, Agent, or Firm* — Faegre Drinker Biddle & Reath LLP

(57) ABSTRACT

The present application relates to compounds of a formula (I), to the use thereof in electronic devices, and to processes for preparing the compounds.

34 Claims, No Drawings

(56) References Cited

OTHER PUBLICATIONS

International Search Report and Written Opinion received for PCT Patent Application No. PCT/EP2017/000042, mailed on Mar. 29, 2017, 23 pages (11 pages of English Translation and 12 pages of Original Document).

\* cited by examiner

MATERIALS FOR ELECTRONIC DEVICES

CROSS-REFERENCE TO RELATED APPLICATIONS

This application is a national stage application (under 35 U.S.C. § 371) of PCT/EP2017/000042, filed Jan. 17, 2017, which claims benefit of European Application No. 16154514.0, filed Feb. 5, 2016, both of which are incorporated herein by reference in their entirety.

The present application relates to a spirobifluorene derivative of a formula (I) defined hereinafter which is suitable for use in electronic devices, especially organic electroluminescent devices (OLEDs).

Electronic devices in the context of this application are understood to mean what are called organic electronic devices, which contain organic semiconductor materials as functional materials. More particularly, these are understood to mean OLEDs.

The construction of OLEDs in which organic compounds are used as functional materials is common knowledge in the prior art. In general, the term OLEDs is understood to mean electronic devices which have one or more layers comprising organic compounds and emit light on application of electrical voltage.

In electronic devices, especially OLEDs, there is great interest in improving the performance data, especially lifetime, efficiency and operating voltage. In these aspects, it has not yet been possible to find any entirely satisfactory solution.

A great influence on the performance data of electronic devices is possessed by layers having a hole-transporting function, for example hole-injecting layers, hole transport layers, electron blocker layers and also emitting layers. For use in these layers, there is a continuous search for new materials having hole-transporting properties.

The prior art discloses using spirobifluorene derivatives substituted by an amino group in a position selected from positions 3 and 4 on the spirobifluorene. This amino group may optionally be bonded to the spirobifluorene group via a spacer group.

In the context of studies of novel materials for use in OLEDs, it has now been found that, surprisingly, compounds which differ from the abovementioned compounds in that they specifically have a meta- or ortho-bonded phenylene group between the spirobifluorene and the nitrogen atom of the amino group are of excellent suitability for use in OLEDs, especially as materials with a hole-transporting function.

More particularly, they are superior to the abovementioned compounds in terms of their performance data when used in OLEDs, very particularly in terms of the lifetime, operating voltage and quantum efficiency of the OLEDs. The new compounds found also have one or more properties selected from very good hole-conducting properties, very good electron-blocking properties, high glass transition temperature, high oxidation stability, good solubility and high thermal stability.

The present application thus provides a compound of formula (I)

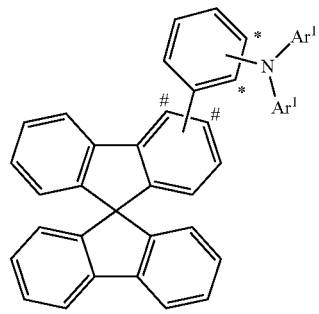

Formula (I)

where the compound may be substituted by an $R^1$ radical at each of the free positions on the spirobifluorene unit, and may be substituted by an $R^2$ radical at each of the free positions on the phenylene unit, and where the variables that occur are:

$R^1$ is the same or different at each instance and is selected from H, D, F, C(=O)$R^4$, CN, Si($R^4$)$_3$, N($R^4$)$_2$, P(=O)($R^4$)$_2$, O$R^4$, S(=O)$R^4$, S(=O)$_2R^4$, straight-chain alkyl or alkoxy groups having 1 to 20 carbon atoms, branched or cyclic alkyl or alkoxy groups having 3 to 20 carbon atoms, alkenyl or alkynyl groups having 2 to 20 carbon atoms, aromatic ring systems having 6 to 40 aromatic ring atoms, and heteroaromatic ring systems having 5 to 40 aromatic ring atoms; where two or more $R^1$ radicals may be joined to one another and may form a ring; where the alkyl, alkoxy, alkenyl and alkynyl groups mentioned and the aromatic ring systems and heteroaromatic ring systems mentioned may each be substituted by one or more $R^4$ radicals; and where one or more CH$_2$ groups in the alkyl, alkoxy, alkenyl and alkynyl groups mentioned may be replaced by —$R^4$C=C$R^4$—, —C≡C—, Si($R^4$)$_2$, C=O, C=N$R^4$, —C(=O)O—, —C(=O)N$R^4$—, N$R^4$, P(=O)($R^4$), —O—, —S—, SO or SO$_2$;

$R^2$ is the same or different at each instance and is selected from H, D, F, C(=O)$R^4$, CN, Si($R^4$)$_3$, P(=O)($R^4$)$_2$, O$R^4$, S(=O)$R^4$, S(=O)$_2R^4$, straight-chain alkyl or alkoxy groups having 1 to 20 carbon atoms, branched or cyclic alkyl or alkoxy groups having 3 to 20 carbon atoms, alkenyl or alkynyl groups having 2 to 20 carbon atoms, aromatic ring systems having 6 to 40 aromatic ring atoms, and heteroaromatic ring systems having 5 to 40 aromatic ring atoms; where two or more $R^2$ radicals may be joined to one another and may form a ring; where the alkyl, alkoxy, alkenyl and alkynyl groups mentioned and the aromatic ring systems and heteroaromatic ring systems mentioned may each be substituted by one or more $R^4$ radicals; and where one or more CH$_2$ groups in the alkyl, alkoxy, alkenyl and alkynyl groups mentioned may be replaced by —$R^4$C=C$R^4$—, —C≡C—, Si($R^4$)$_2$, C=O, C=N$R^4$, —C(=O)O—, —C(=O)N$R^4$—, N$R^4$, P(=O)($R^4$), —O—, —S—, SO or SO$_2$;

$Ar^1$ is the same or different at each instance and is selected from aromatic ring systems which have 6 to 20 aromatic ring atoms and are optionally substituted by one or more $R^3$ radicals, and from heteroaromatic ring systems which have 5 to 30 aromatic ring atoms and are optionally substituted by one or more $R^3$ radicals;

$R^3$ is the same or different at each instance and is selected from H, D, F, C(=O)$R^4$, CN, Si($R^4$)$_3$, N($R^4$)$_2$, P(=O)($R^4$)$_2$, O$R^4$, S(=O)$R^4$, S(=O)$_2R^4$, straight-chain alkyl or alkoxy groups having 1 to 20 carbon atoms, branched or cyclic alkyl or alkoxy groups having 3 to 20 carbon atoms, alkenyl or alkynyl groups having 2 to 20 carbon atoms, aromatic ring systems having 6 to 40 aromatic ring atoms, and heteroaromatic ring systems having 5 to 40 aromatic ring atoms; where the alkyl, alkoxy, alkenyl and alkynyl groups mentioned and the aromatic ring systems and heteroaromatic ring systems mentioned may each be substituted by one or more $R^4$ radicals; and where one or more $CH_2$ groups in the alkyl, alkoxy, alkenyl and alkynyl groups mentioned may be replaced by —$R^4C$=$CR^4$—, —C≡C—, Si($R^4$)$_2$, C=O, C=$NR^4$, —C(=O)O—, —C(=O)$NR^4$—, $NR^4$, P(=O)($R^4$), —O—, —S—, SO or $SO_2$;

$R^4$ is the same or different at each instance and is selected from H, D, F, C(=O)$R^5$, CN, Si($R^5$)$_3$, N($R^5$)$_2$, P(=O)($R^5$)$_2$, $OR^5$, S(=O)$R^5$, S(=O)$_2R^5$, straight-chain alkyl or alkoxy groups having 1 to 20 carbon atoms, branched or cyclic alkyl or alkoxy groups having 3 to 20 carbon atoms, alkenyl or alkynyl groups having 2 to 20 carbon atoms, aromatic ring systems having 6 to 40 aromatic ring atoms, and heteroaromatic ring systems having 5 to 40 aromatic ring atoms; where two or more $R^4$ radicals may be joined to one another and may form a ring; where the alkyl, alkoxy, alkenyl and alkynyl groups mentioned and the aromatic ring systems and heteroaromatic ring systems mentioned may each be substituted by one or more $R^5$ radicals; and where one or more $CH_2$ groups in the alkyl, alkoxy, alkenyl and alkynyl groups mentioned may be replaced by —$R^5C$=$CR^5$—, —C≡C—, Si($R^5$)$_2$, C=O, C=$NR^5$, —C(=O)O—, —C(=O)$NR^5$—, $NR^5$, P(=O)($R^5$), —O—, —S—, SO or $SO_2$;

$R^5$ is the same or different at each instance and is selected from H, D, F, CN, alkyl or alkoxy groups having 1 to 20 carbon atoms, alkenyl or alkynyl groups having 2 to 20 carbon atoms, aromatic ring systems having 6 to 40 aromatic ring atoms and heteroaromatic ring systems having 5 to 40 aromatic ring atoms; where two or more $R^4$ radicals may be joined to one another and may form a ring; and where the alkyl, alkoxy, alkenyl and alkynyl groups, aromatic ring systems and heteroaromatic ring systems mentioned may be substituted by F or CN;

where the benzene ring is bonded to the spirobifluorene group at one of the positions marked by the # symbol; and where the N(Ar$^1$)$_2$ group is bonded to the benzene ring at one of the positions marked by the * symbol.

The following definitions apply in the context of the present application:

An aryl group in the context of this invention contains 6 to 40 aromatic ring atoms of which none is a heteroatom. An aryl group in the context of this invention is understood to mean either a simple aromatic cycle, i.e. benzene, or a fused aromatic polycycle, for example naphthalene, phenanthrene or anthracene. A fused aromatic polycycle in the context of the present application consists of two or more simple aromatic cycles fused to one another. Fusion between cycles is understood here to mean that the cycles share at least one edge with one another.

A heteroaryl group in the context of this invention contains 5 to 40 aromatic ring atoms of which at least one is a heteroatom. The heteroatoms of the heteroaryl group are preferably selected from N, O and S. A heteroaryl group in the context of this invention is understood to mean either a simple heteroaromatic cycle, for example pyridine, pyrimidine or thiophene, or a fused heteroaromatic polycycle, for example quinoline or carbazole. A fused heteroaromatic polycycle in the context of the present application consists of two or more simple heteroaromatic cycles fused to one another. Fusion between cycles is understood here to mean that the cycles share at least one edge with one another.

An aryl or heteroaryl group, each of which may be substituted by the abovementioned radicals and which may be joined to the aromatic or heteroaromatic system via any desired positions, is especially understood to mean groups derived from benzene, naphthalene, anthracene, phenanthrene, pyrene, dihydropyrene, chrysene, perylene, triphenylene, fluoranthene, benzanthracene, benzophenanthrene, tetracene, pentacene, benzopyrene, furan, benzofuran, isobenzofuran, dibenzofuran, thiophene, benzothiophene, isobenzothiophene, dibenzothiophene, pyrrole, indole, isoindole, carbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, quinoxaline, pyrazine, phenazine, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine and benzothiadiazole.

An aromatic ring system in the context of this invention contains 6 to 40 carbon atoms in the ring system and does not include any heteroatoms as aromatic ring atoms. An aromatic ring system in the context of this invention therefore does not contain any heteroaryl groups. An aromatic ring system in the context of this invention shall be understood to mean a system which does not necessarily contain only aryl groups but in which it is also possible for a plurality of aryl groups to be bonded by a single bond or by a non-aromatic unit, for example one or more optionally substituted C, Si, N, O or S atoms. In this case, the nonaromatic unit comprises preferably less than 10% of the atoms other than H, based on the total number of atoms other than H in the system. For example, systems such as 9,9'-spirobifluorene, 9,9'-diarylfluorene, triarylamine, diaryl ethers and stilbene are also to be regarded as aromatic ring systems in the context of this invention, and likewise systems in which two or more aryl groups are joined, for example, by a linear or cyclic alkyl, alkenyl or alkynyl group or by a silyl group. In addition, systems in which two or more aryl groups are joined to one another via single bonds are also to be regarded as aromatic ring systems in the context of this invention, for example systems such as biphenyl and terphenyl.

A heteroaromatic ring system in the context of this invention contains 5 to 40 aromatic ring atoms, at least one of which is a heteroatom. The heteroatoms of the heteroaromatic ring system are preferably selected from N, O and/or S. A heteroaromatic ring system corresponds to the abovementioned definition of an aromatic ring system, but has at least one heteroatom as one of the aromatic ring atoms. In this way, it differs from an aromatic ring system in the sense of the definition of the present application, which, according to this definition, cannot contain any heteroatom as aromatic ring atom.

An aromatic ring system having 6 to 40 aromatic ring atoms or a heteroaromatic ring system having 5 to 40 aromatic ring atoms is especially understood to mean groups derived from the groups mentioned above under aryl groups and heteroaryl groups, and from biphenyl, terphenyl, quaterphenyl, fluorene, spirobifluorene, dihydrophenanthrene, dihydropyrene, tetrahydropyrene, indenofluorene, truxene, isotruxene, spirotruxene, spiroisotruxene, indenocarbazole, or from combinations of these groups.

In the context of the present invention, a straight-chain alkyl group having 1 to 20 carbon atoms and a branched or cyclic alkyl group having 3 to 20 carbon atoms and an alkenyl or alkynyl group having 2 to 40 carbon atoms in which individual hydrogen atoms or $CH_2$ groups may also be substituted by the groups mentioned above in the definition of the radicals are preferably understood to mean the methyl, ethyl, n-propyl, i-propyl, n-butyl, i-butyl, s-butyl, t-butyl, 2-methylbutyl, n-pentyl, s-pentyl, cyclopentyl, neopentyl, n-hexyl, cyclohexyl, neohexyl, n-heptyl, cycloheptyl, n-octyl, cyclooctyl, 2-ethylhexyl, trifluoromethyl, pentafluoroethyl, 2,2,2-trifluoroethyl, ethenyl, propenyl, butenyl, pentenyl, cyclopentenyl, hexenyl, cyclohexenyl, heptenyl, cycloheptenyl, octenyl, cyclooctenyl, ethynyl, propynyl, butynyl, pentynyl, hexynyl or octynyl radicals.

An alkoxy or thioalkyl group having 1 to 20 carbon atoms in which individual hydrogen atoms or $CH_2$ groups may also be replaced by the groups mentioned above in the definition of the radicals is preferably understood to mean methoxy, trifluoromethoxy, ethoxy, n-propoxy, i-propoxy, n-butoxy, i-butoxy, s-butoxy, t-butoxy, n-pentoxy, s-pentoxy, 2-methylbutoxy, n-hexoxy, cyclohexyloxy, n-heptoxy, cycloheptyloxy, n-octyloxy, cyclooctyloxy, 2-ethylhexyloxy, pentafluoroethoxy, 2,2,2-trifluoroethoxy, methylthio, ethylthio, n-propylthio, i-propylthio, n-butylthio, i-butylthio, s-butylthio, t-butylthio, n-pentylthio, s-pentylthio, n-hexylthio, cyclohexylthio, n-heptylthio, cycloheptylthio, n-octylthio, cyclooctylthio, 2-ethylhexylthio, trifluoromethylthio, pentafluoroethylthio, 2,2,2-trifluoroethylthio, ethenylthio, propenylthio, butenylthio, pentenylthio, cyclopentenylthio, hexenylthio, cyclohexenylthio, heptenylthio, cycloheptenylthio, octenylthio, cyclooctenylthio, ethynylthio, propynylthio, butynylthio, pentynylthio, hexynylthio, heptynylthio or octynylthio.

The wording that two or more radicals together may form a ring, in the context of the present application, shall be understood to mean, inter alia, that the two radicals are joined to one another by a chemical bond. In addition, however, the abovementioned wording shall also be understood to mean that, if one of the two radicals is hydrogen, the second radical binds to the position to which the hydrogen atom was bonded, forming a ring.

Preferred embodiments of compounds of the formula (I) are compounds of one of the formulae (I-1) to (I-4)

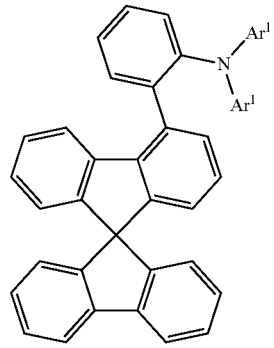

Formula (I-1)

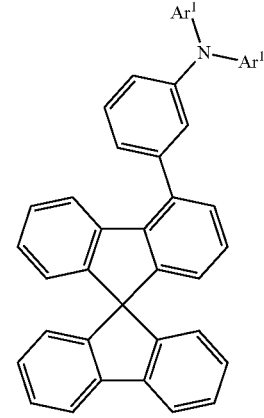

Formula (I-2)

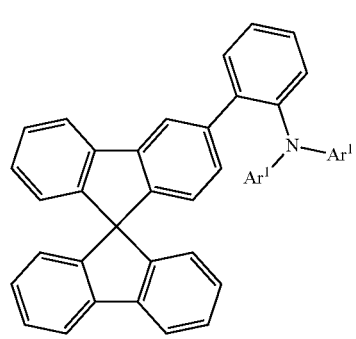

Formula (I-3)

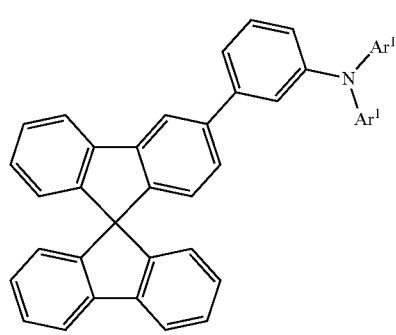

Formula (I-4)

where the formula may be substituted by an $R^1$ radical at each of the free positions on the spirobifluorene unit, and may be substituted by an $R^2$ radical at each of the free positions on the phenylene unit, and where the groups that occur are as defined above.

Among the compounds of the formula (I-1) to (I-4), particular preference is given to the compounds of the formula (I-1) and (I-2).

Preferably, $R^1$ is the same or different at each instance and is selected from H, D, F, CN, $Si(R^4)_3$, straight-chain alkyl groups having 1 to 20 carbon atoms, branched or cyclic alkyl groups having 3 to 20 carbon atoms, aromatic ring systems having 6 to 40 aromatic ring atoms and heteroaromatic ring systems having 5 to 40 aromatic ring atoms, where said alkyl groups and said aromatic ring systems and heteroaromatic ring systems may each be substituted by one or more $R^4$ radicals. More preferably, $R^1$ is the same or different at each instance and is selected from H, F, methyl, ethyl, propyl, butyl, tert-butyl, phenyl, biphenyl, terphenyl, naphthyl, carbazolyl, benzofuranyl, benzothiophenyl, dibenzofuranyl, dibenzothiophenyl, 9,9'-dimethylfluorenyl and 9,9'-diphenylfluorenyl. Most preferably, $R^1$ is H.

Preferably, no $R^1$ radical is bonded, exactly one $R^1$ radical other than H is bonded, or exactly two $R^1$ radicals other than H are bonded to the spirobifluorene base skeleton. More preferably, no $R^1$ radical is bonded to the spirobifluorenyl base skeleton.

Preferably, $R^2$ is the same or different at each instance and is selected from H, D, F, CN, $Si(R^4)_3$, straight-chain alkyl groups having 1 to 20 carbon atoms, branched or cyclic alkyl groups having 3 to 20 carbon atoms, aromatic ring systems having 6 to 40 aromatic ring atoms and heteroaromatic ring systems having 5 to 40 aromatic ring atoms, where said alkyl groups and said aromatic ring systems and heteroaromatic ring systems may each be substituted by one or more $R^4$ radicals. More preferably, $R^2$ is the same or different at each instance and is selected from H, F, methyl, ethyl, propyl, butyl, tert-butyl, phenyl, biphenyl, terphenyl, naphthyl, carbazolyl, benzofuranyl, benzothiophenyl, dibenzofuranyl, dibenzothiophenyl, 9,9'-dimethylfluorenyl and 9,9'-diphenylfluorenyl. Most preferably, $R^2$ is H.

Preferably, no $R^2$ radical or exactly one $R^2$ radical other than H is bonded to the phenylene group in formula (I).

Preferred embodiments of the formula (I-1) to (I-4) therefore correspond to the formulae (I-1) to (I-4) in each of which there are no $R^1$ and $R^2$ radicals bonded to the corresponding free positions, or they correspond to the substituted variants shown below:

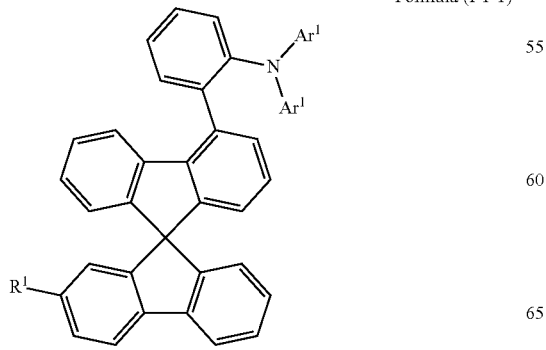

Formula (I-1-1)

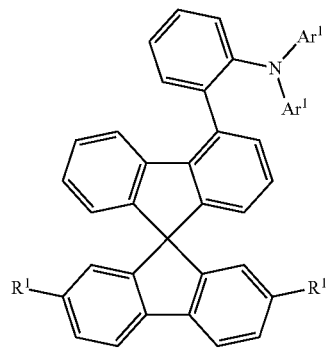

Formula (I-1-2)

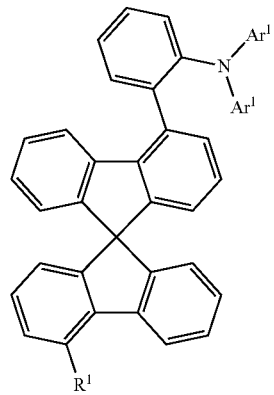

Formula (I-1-3)

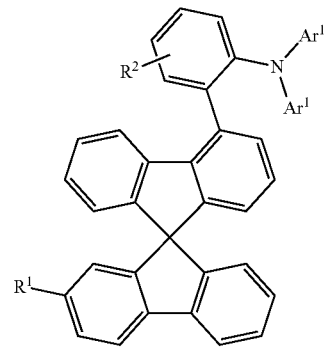

Formula (I-1-4)

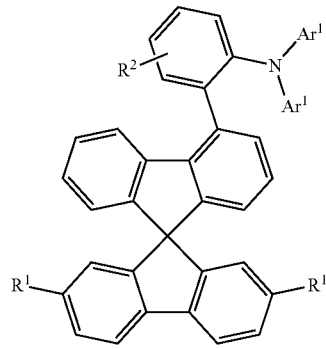

Formula (I-1-5)

Formula (I-1-6)
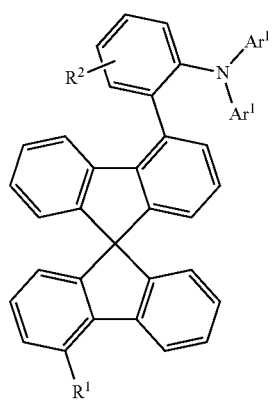
Formula (I-1-7)
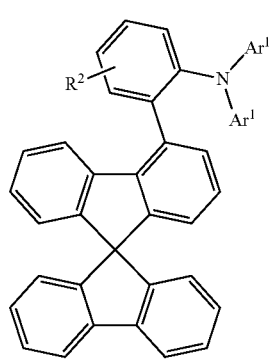
Formula (I-1-8)
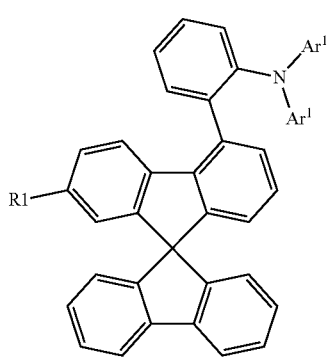
Formula (I-1-9)
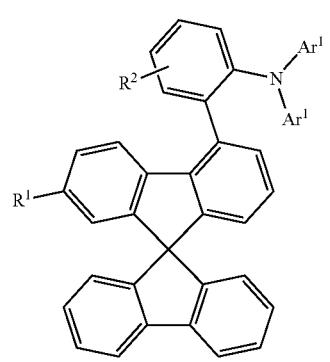
Formula (I-2-1)
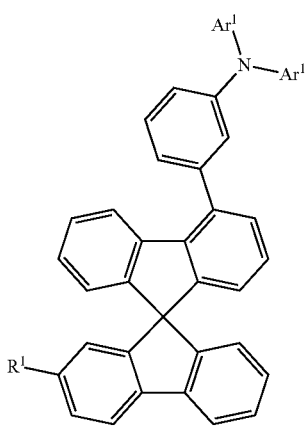
Formula (I-2-2)
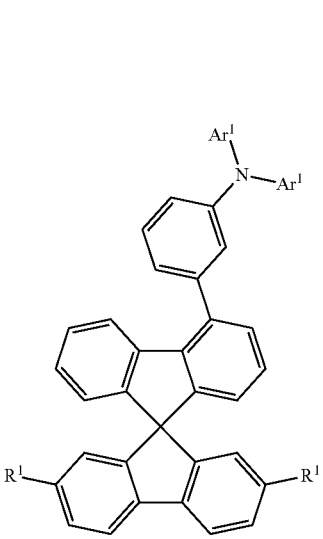
Formula (I-2-3)
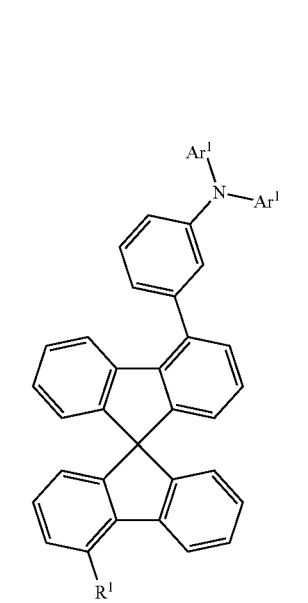

Formula (I-2-4)
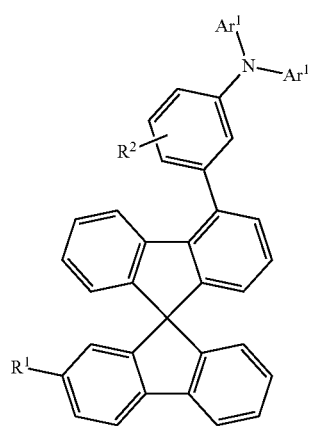
Formula (I-2-5)
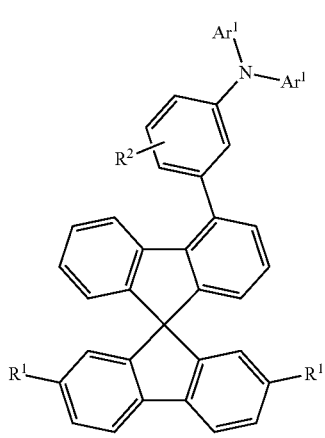
Formula (I-2-6)
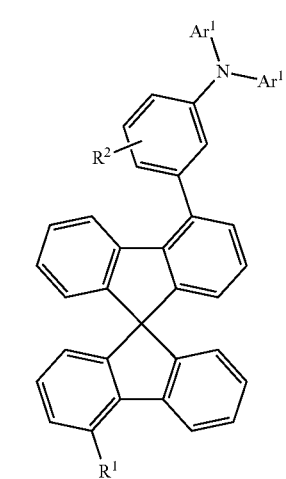
Formula (I-2-7)
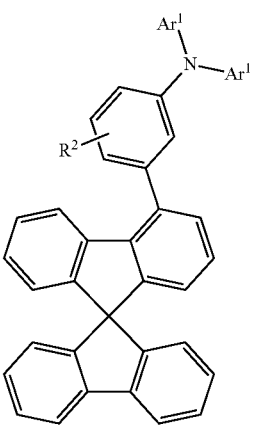
Formula (I-2-8)
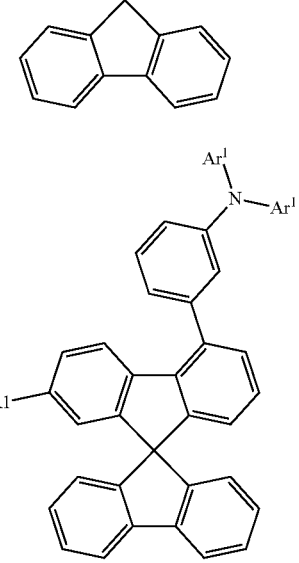
Formula (I-2-9)
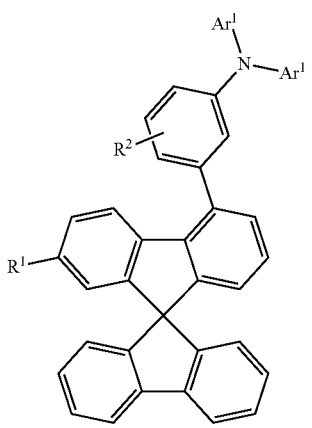
Formula (I-3-1)
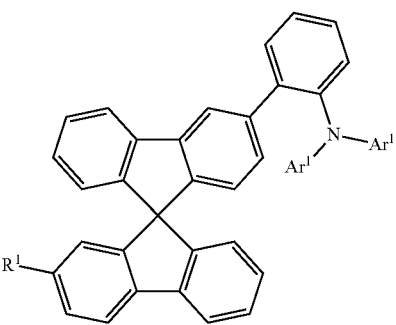

-continued
Formula (I-3-2)
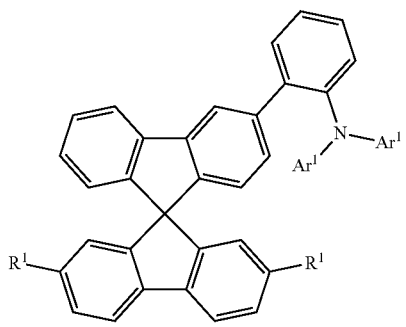
Formula (I-3-3)
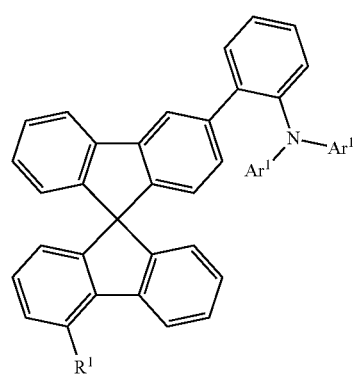
Formula (I-3-4)
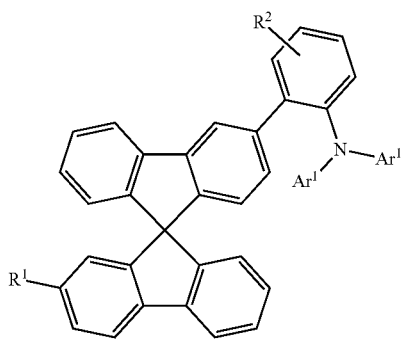
Formula (I-3-5)
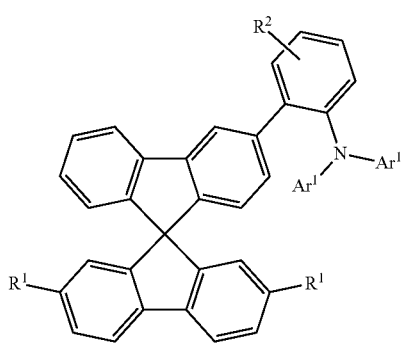
Formula (I-3-6)
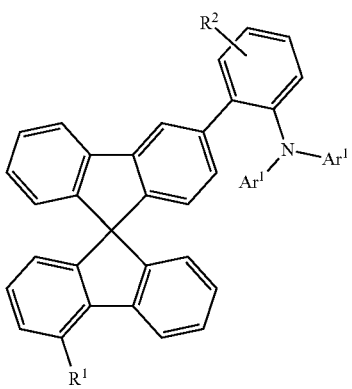
Formula (I-3-7)
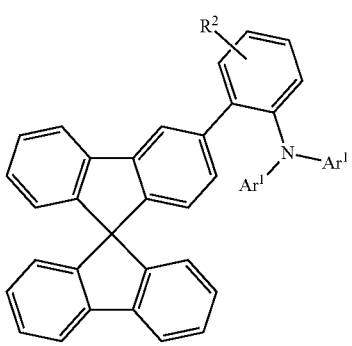
Formula (I-4-1)
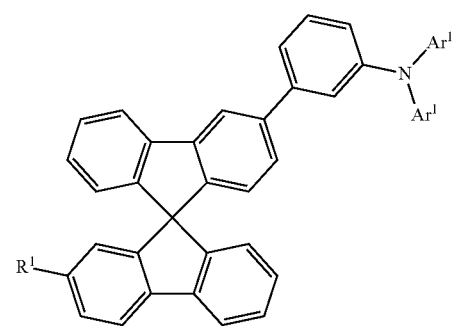
Formula (I-4-2)
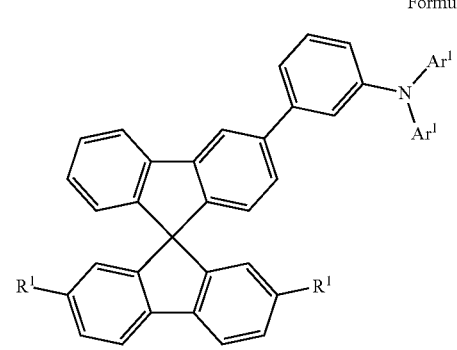

Formula (I-4-3)

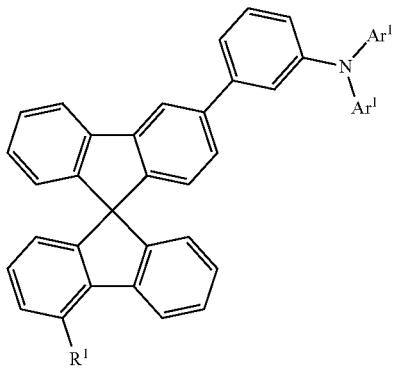

Formula (I-4-4)

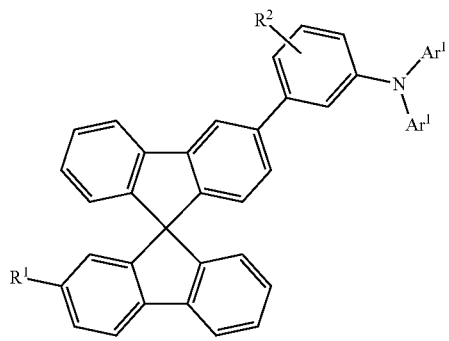

Formula (I-4-5)

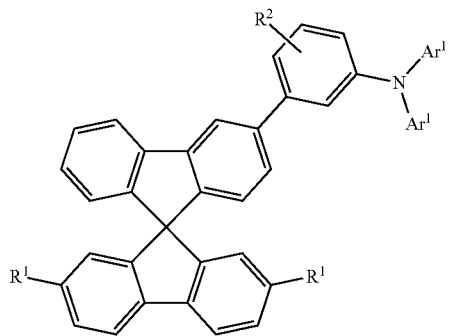

Formula (I-4-6)

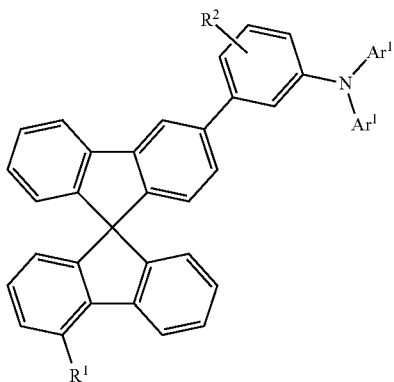

Formula (I-4-7)

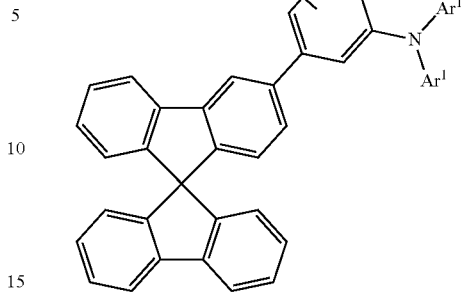

where the groups that occur are as defined above, and where no further radicals aside from the $R^1$ and $R^2$ radicals shown are present.

Preferably, $R^3$ is the same or different at each instance and is selected from H, D, F, CN, $Si(R^4)_3$, straight-chain alkyl groups having 1 to 20 carbon atoms, branched or cyclic alkyl groups having 3 to 20 carbon atoms, aromatic ring systems having 6 to 40 aromatic ring atoms and heteroaromatic ring systems having 5 to 40 aromatic ring atoms, where said alkyl groups and said aromatic ring systems and heteroaromatic ring systems may each be substituted by one or more $R^4$ radicals. More preferably, $R^3$ is H.

Preferably, $R^4$ is the same or different at each instance and is selected from H, D, F, CN, $Si(R^5)_3$, straight-chain alkyl groups having 1 to 20 carbon atoms, branched or cyclic alkyl groups having 3 to 20 carbon atoms, aromatic ring systems having 6 to 40 aromatic ring atoms and heteroaromatic ring systems having 5 to 40 aromatic ring atoms, where said alkyl groups and said aromatic ring systems and heteroaromatic ring systems may each be substituted by one or more $R^5$ radicals. More preferably, $R^4$ is H.

Preferably, $R^5$ is the same or different at each instance and is selected from H, D, F, CN, alkyl groups having 1 to 20 carbon atoms, aromatic ring systems having 6 to 40 aromatic ring atoms and heteroaromatic ring systems having 5 to 40 aromatic ring atoms; where the alkyl groups, aromatic ring systems and heteroaromatic ring systems mentioned may be substituted by F or CN.

Preferably, $Ar^1$, when it is a heteroaromatic ring system, is the same or different at each instance and is selected from the following radicals that are each optionally substituted by one or more $R^3$ radicals: dibenzofuranyl, dibenzothiophenyl, benzofuranyl, benzothiophenyl, benzofused dibenzofuranyl, benzofused dibenzothiophenyl, indolyl, quinolinyl, pyridyl, pyrimidyl, pyrazinyl, pyridazinyl, triazinyl, triazole, oxazole, oxadiazole, benzoxazole, benzothiazole, phenanthrolyl and azacarbazolyl.

Preferably, $Ar^1$, when it is an aromatic ring system, is the same or different at each instance and is selected from aromatic ring systems which have 6 to 12 aromatic ring atoms and are optionally substituted by one or more $R^3$ radicals, Particularly preferred $Ar^1$ groups are the following radicals that are each optionally substituted by one or more $R^3$ radicals: phenyl, biphenyl, terphenyl, quaterphenyl, naphthyl, fluorenyl, especially 9,9'-dimethylfluorenyl and 9,9'-diphenylfluorenyl, monobenzofluorenyl, dibenzofluorenyl, indenofluorenyl, dibenzofuranyl, dibenzothiophenyl, benzofuranyl, benzothiophenyl, benzofused dibenzofuranyl, benzofused dibenzothiophenyl, indolyl, quinolinyl, pyridyl, pyrimidyl, pyrazinyl, pyridazinyl and triazinyl. Among these, very particular preference is given to the following radicals that are substituted by one or more R³ radicals: phenyl, biphenyl, terphenyl, quaterphenyl, naphthyl and fluorenyl; especially 9,9'-dimethylfluorenyl and 9,9'-diphenylfluorenyl.

The Ar¹ groups are most preferably the same or different at each instance and are selected from groups of the following formulae:

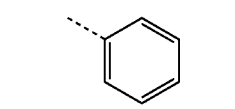
Ar¹-1

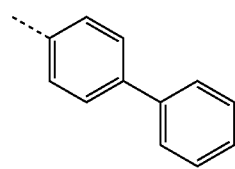
Ar¹-2

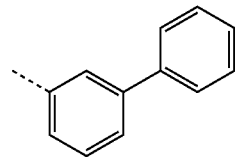
Ar¹-3

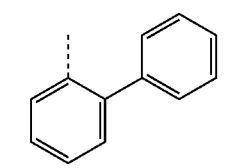
Ar¹-4

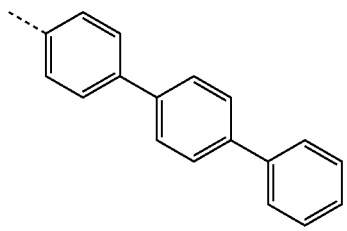
Ar¹-5

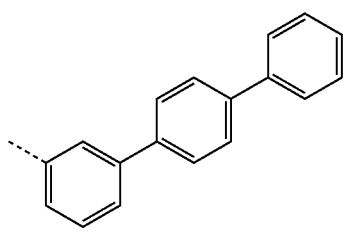
Ar¹-6

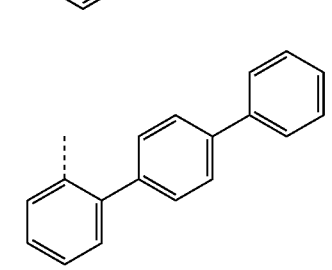
Ar¹-7

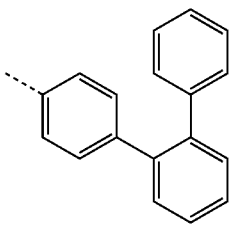
Ar¹-8

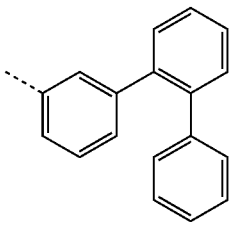
Ar¹-9

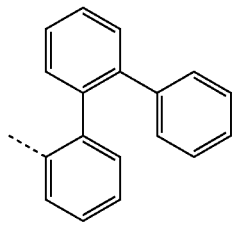
Ar¹-10

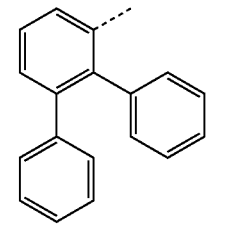
Ar¹-11

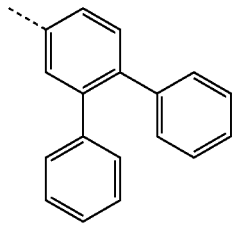
Ar¹-12

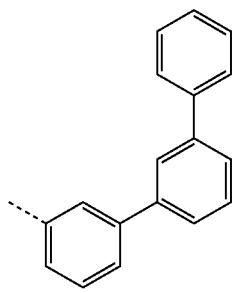
Ar¹-13

-continued
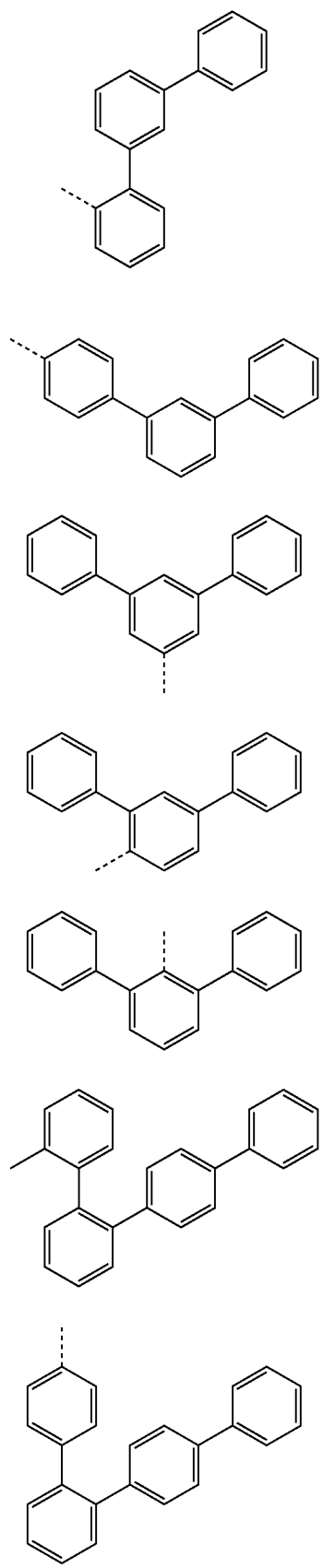
Ar¹-14
Ar¹-15
Ar¹-16
Ar¹-17
Ar¹-18
Ar¹-19
Ar¹-20
-continued
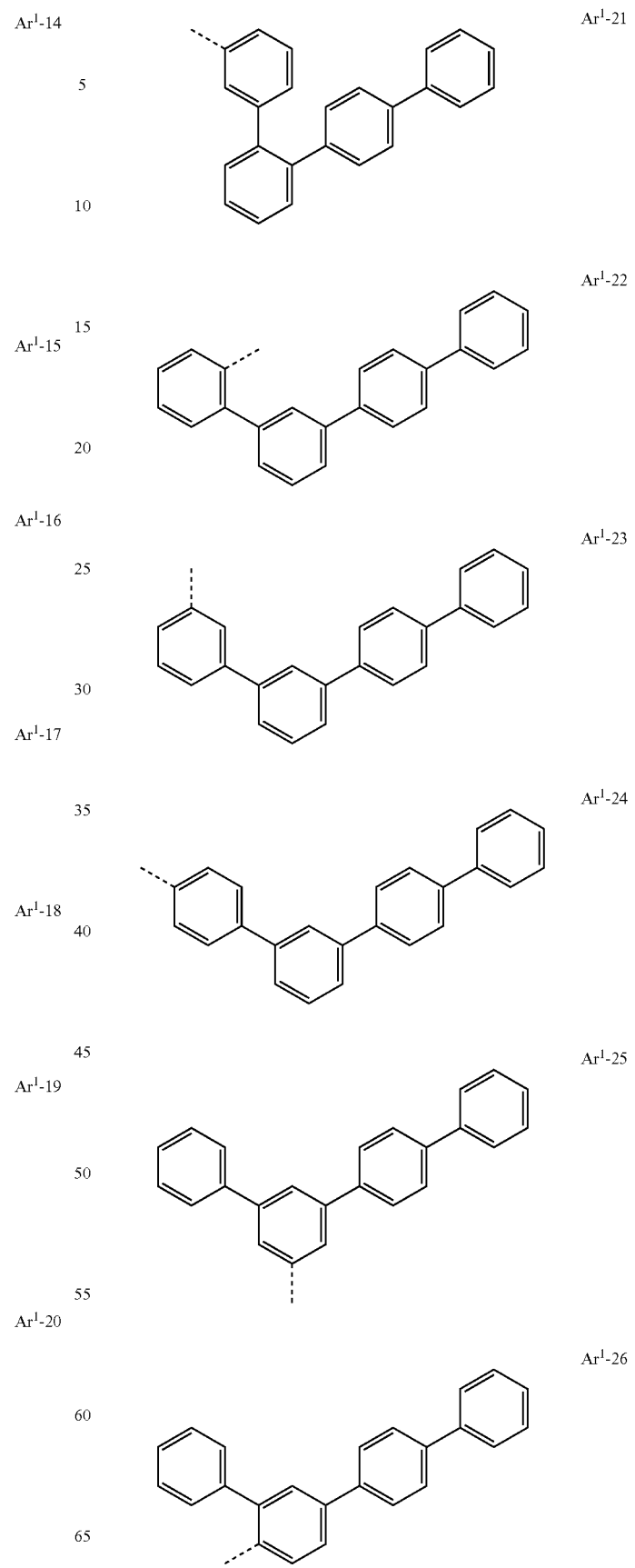
Ar¹-21
Ar¹-22
Ar¹-23
Ar¹-24
Ar¹-25
Ar¹-26

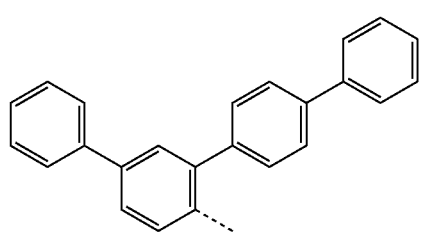 Ar¹-27
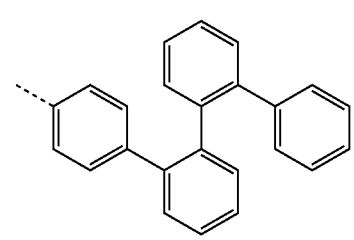 Ar¹-28
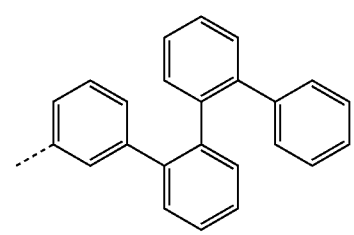 Ar¹-29
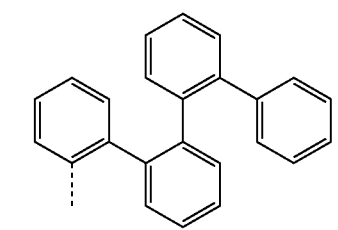 Ar¹-30
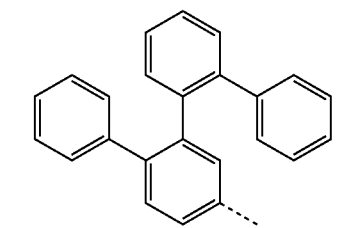 Ar¹-31
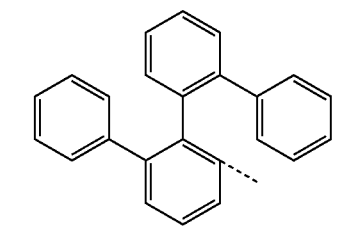 Ar¹-32
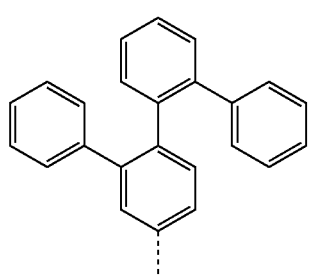 Ar¹-33
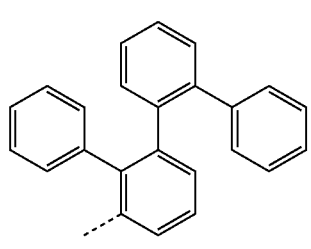 Ar¹-34
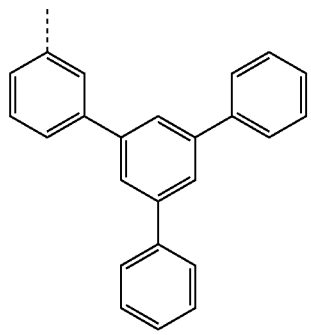 Ar¹-35
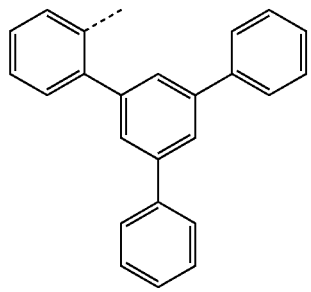 Ar¹-36
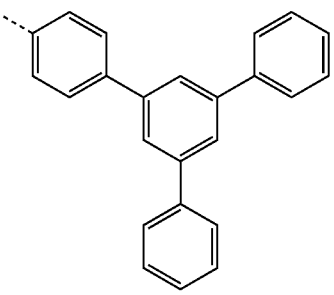 Ar¹-37

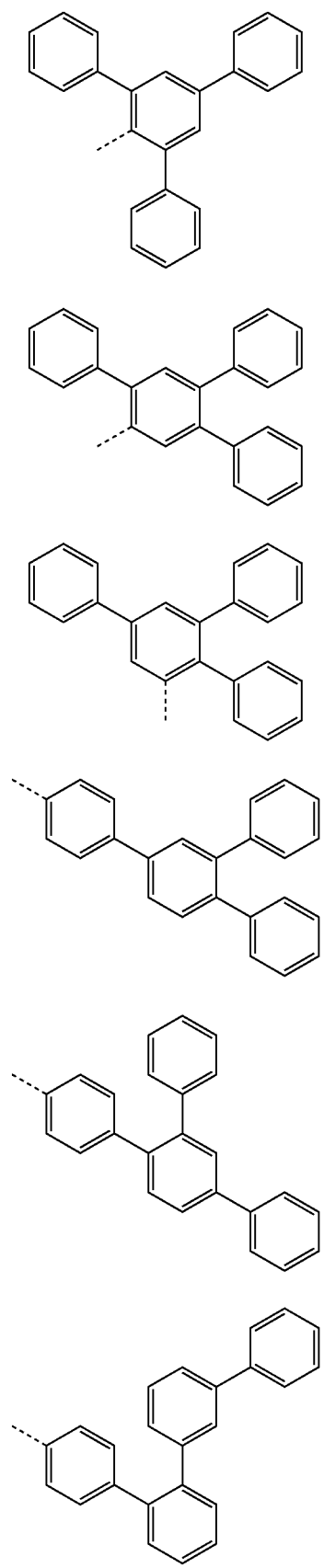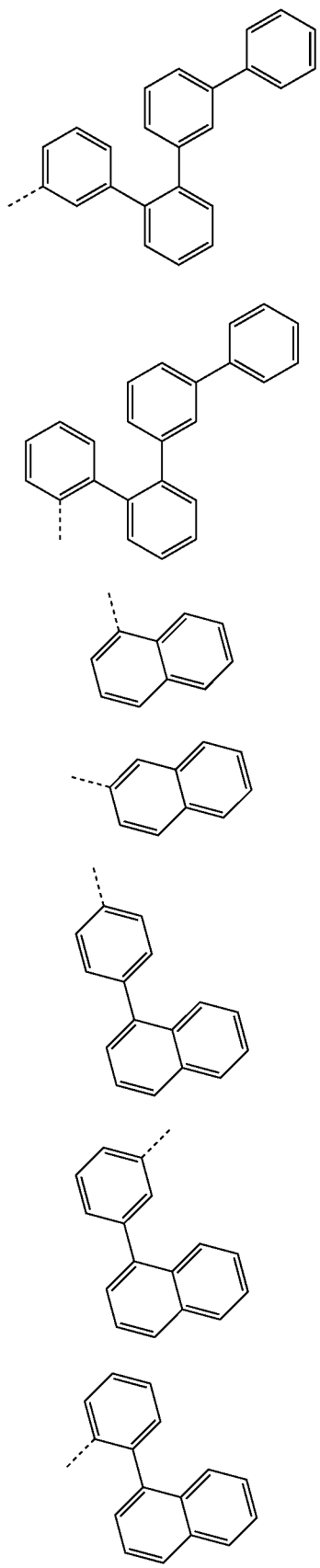

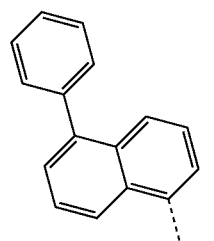
Ar¹-51
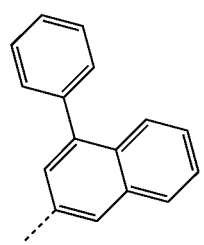
Ar¹-52
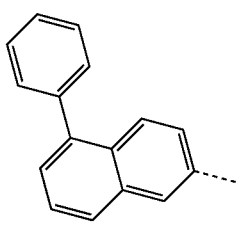
Ar¹-53
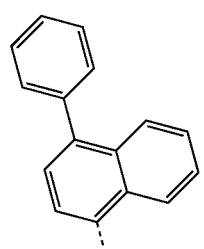
Ar¹-54
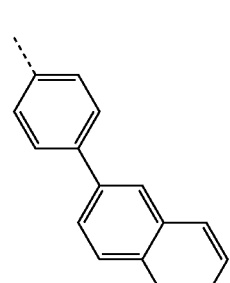
Ar¹-55
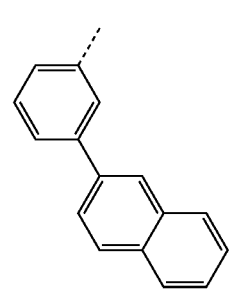
Ar¹-56
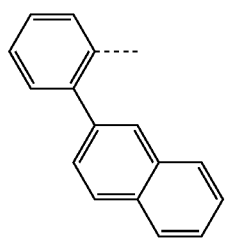
Ar¹-57
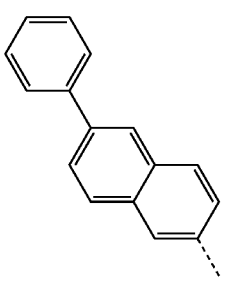
Ar¹-58
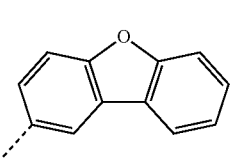
Ar¹-59
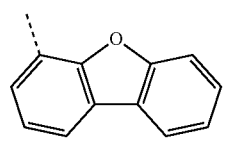
Ar¹-60
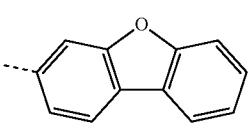
Ar¹-61
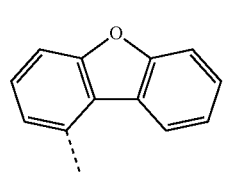
Ar¹-62
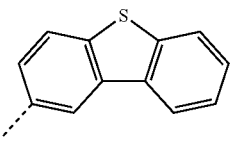
Ar¹-63
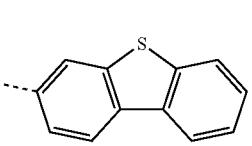
Ar¹-64
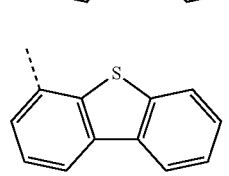
Ar¹-65

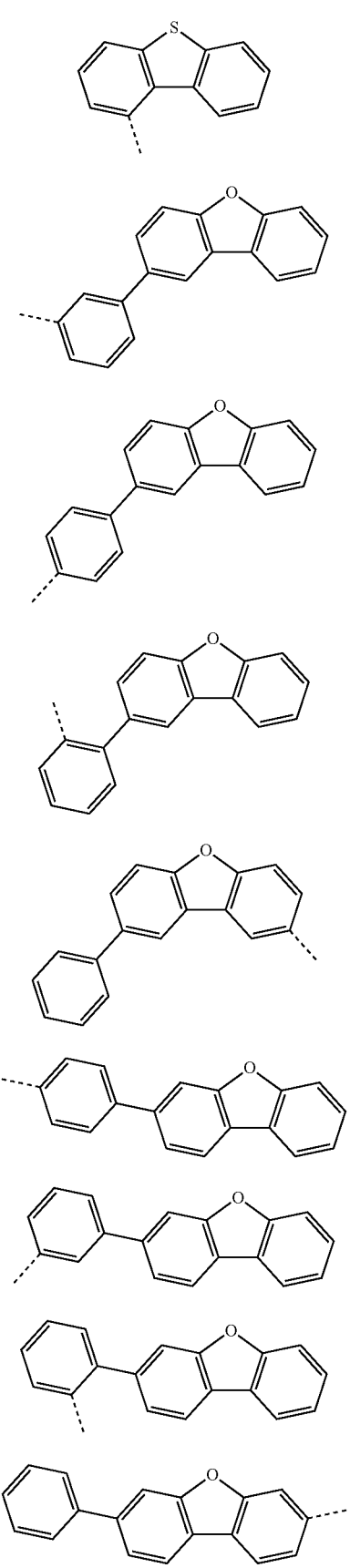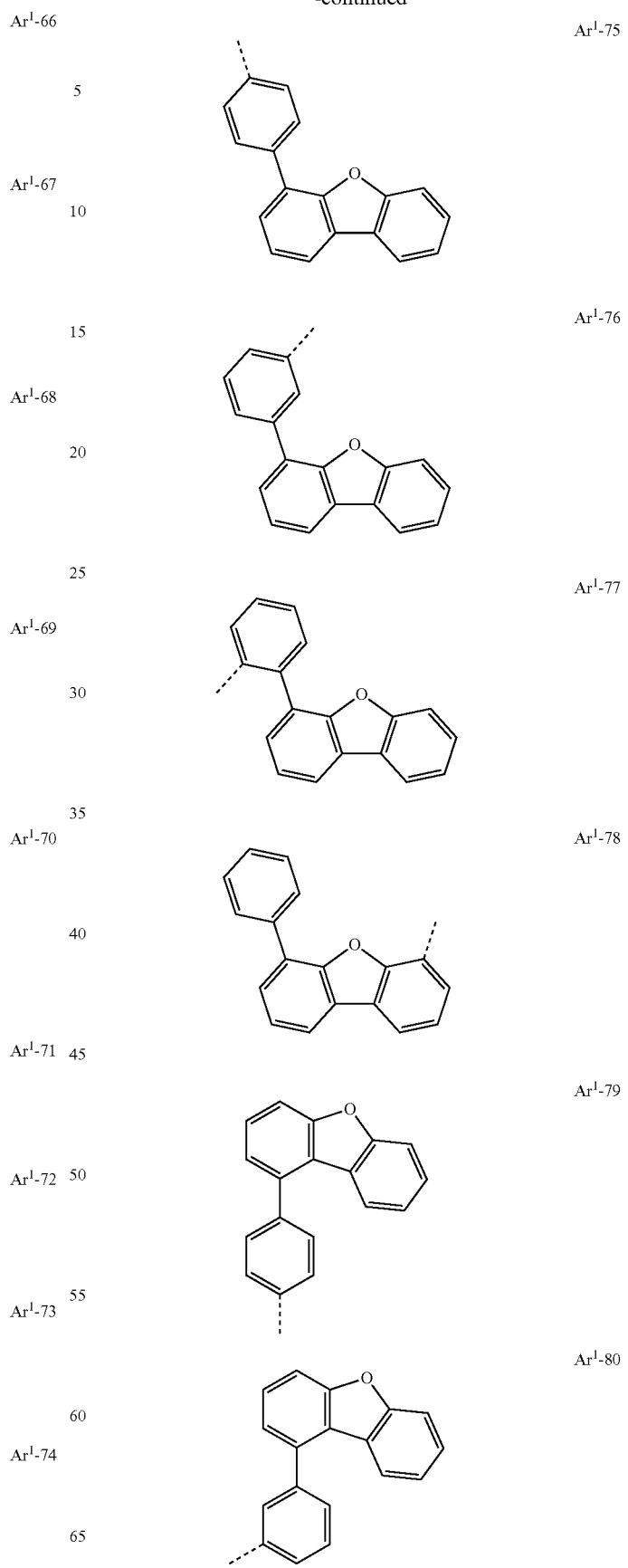

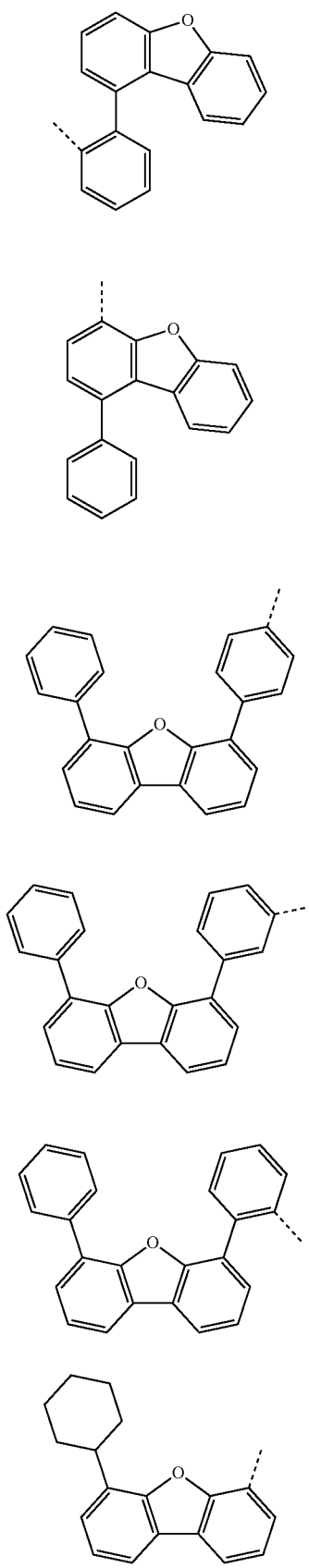

-continued
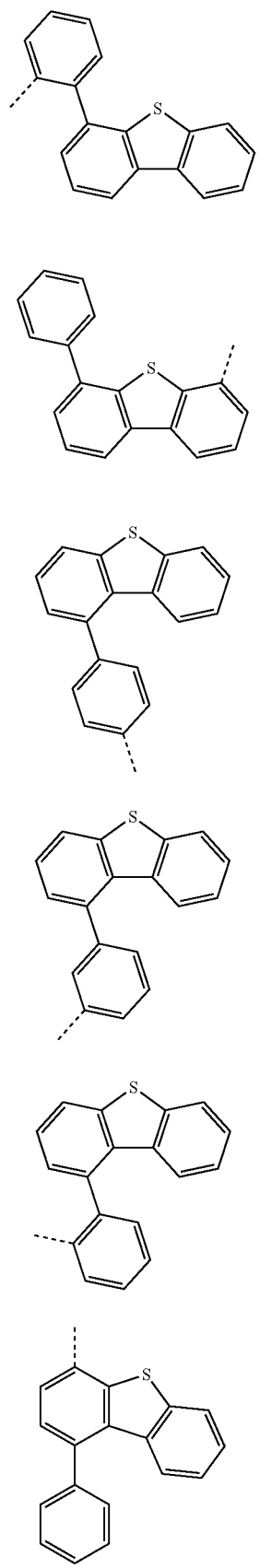
Ar¹-93
Ar¹-94
Ar¹-95
Ar¹-96
Ar¹-97
Ar¹-98
-continued
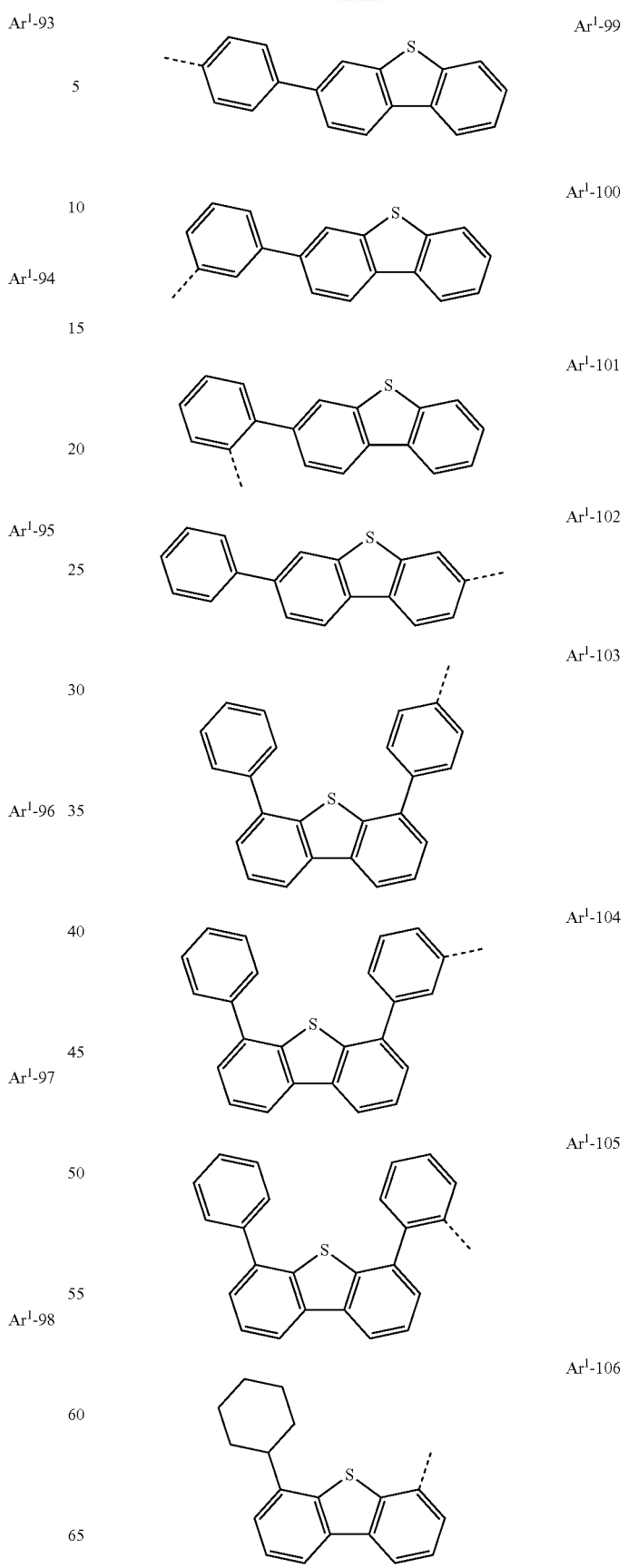
Ar¹-99
Ar¹-100
Ar¹-101
Ar¹-102
Ar¹-103
Ar¹-104
Ar¹-105
Ar¹-106

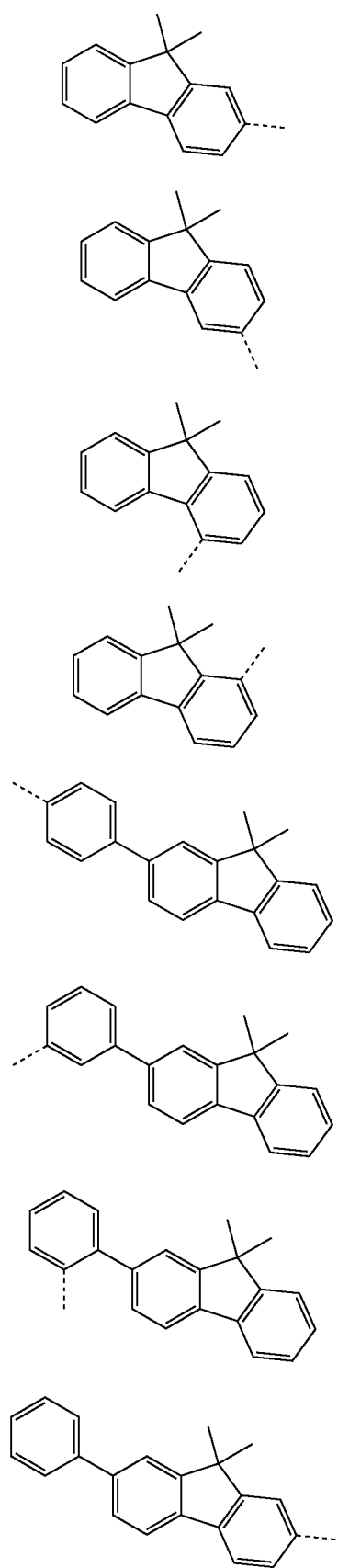
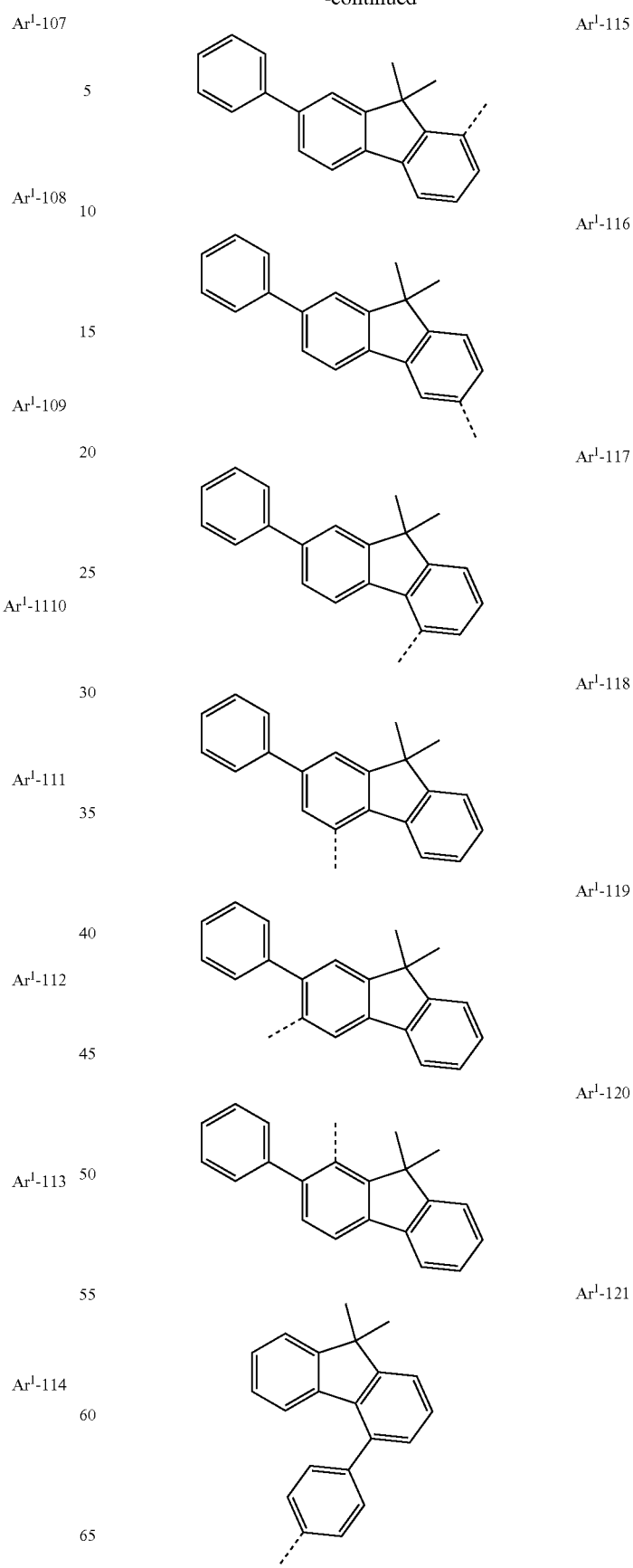

Ar¹-122
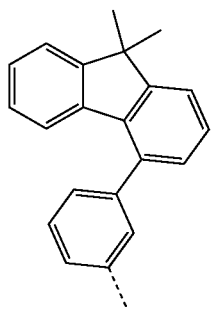
Ar¹-123
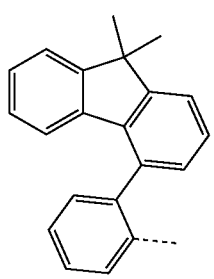
Ar¹-124
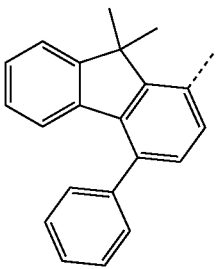
Ar¹-125
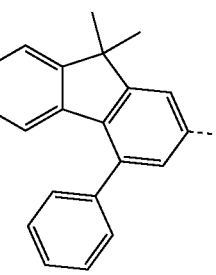
Ar¹-126
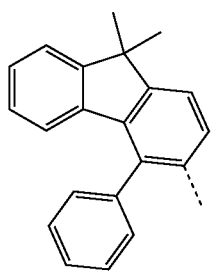
Ar¹-127
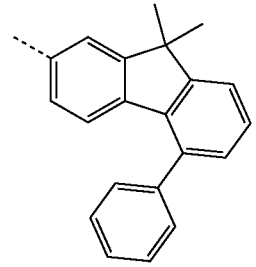
Ar¹-128
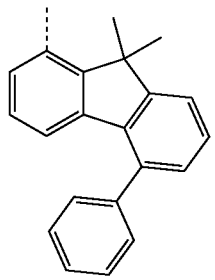
Ar¹-129
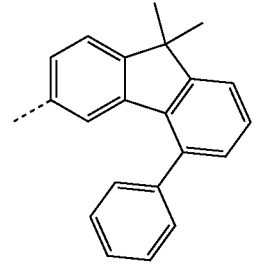
Ar¹-130
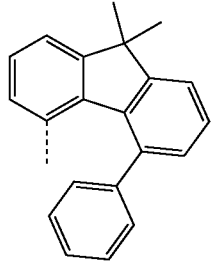
Ar¹-131
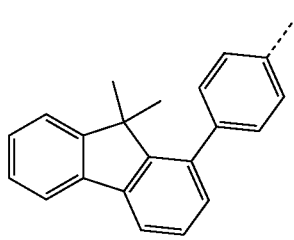
Ar¹-132
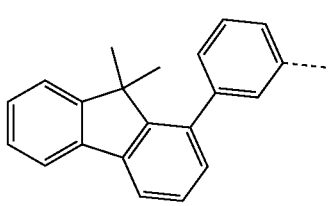

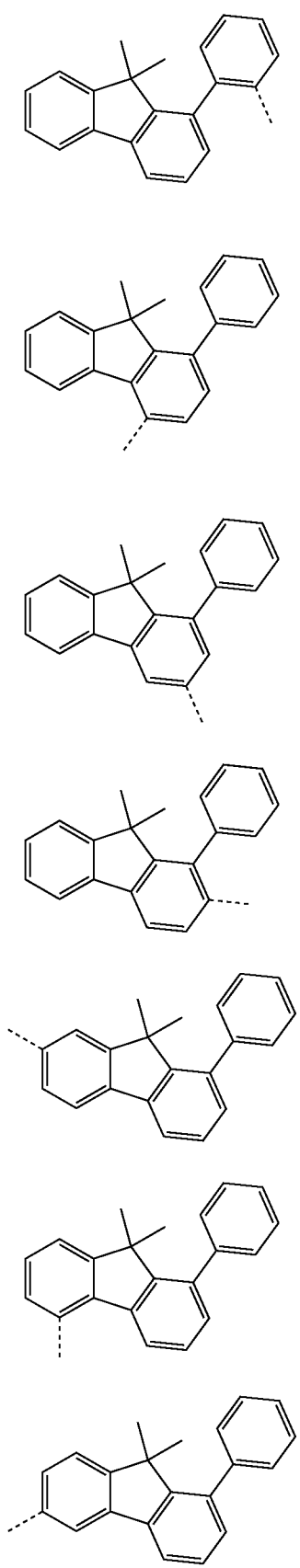
Ar¹-133
Ar¹-134
Ar¹-135
Ar¹-136
Ar¹-137
Ar¹-138
Ar¹-139
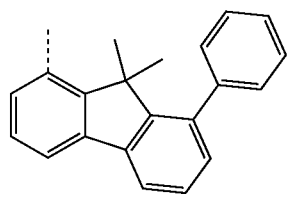
Ar¹-140
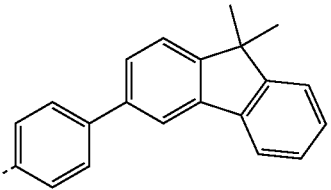
Ar¹-141
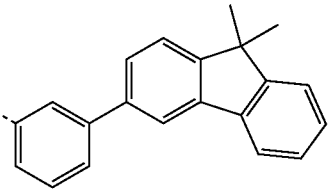
Ar¹-142
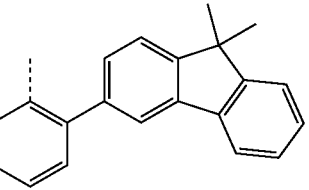
Ar¹-143
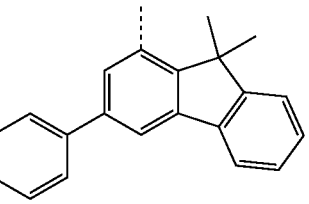
Ar¹-144
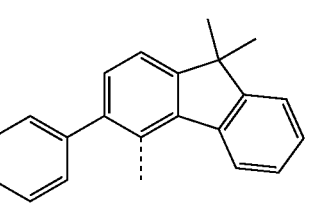
Ar¹-145
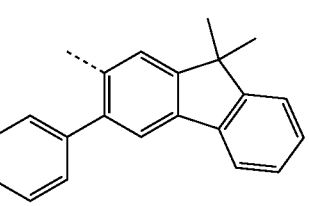
Ar¹-146

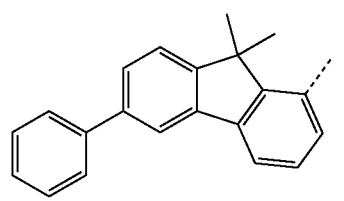 Ar¹-147
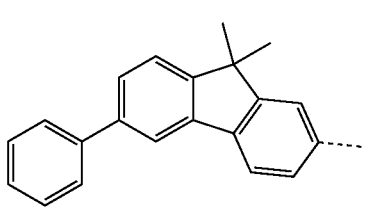 Ar¹-148
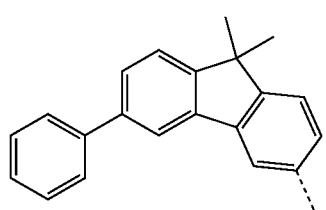 Ar¹-149
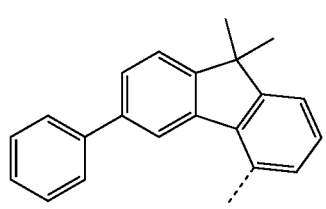 Ar¹-150
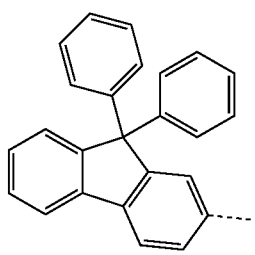 Ar¹-151
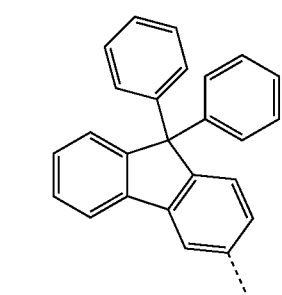 Ar¹-152
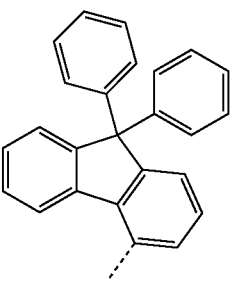 Ar¹-153
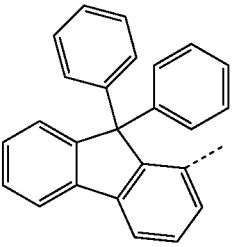 Ar¹-154
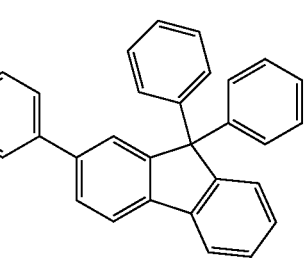 Ar¹-155
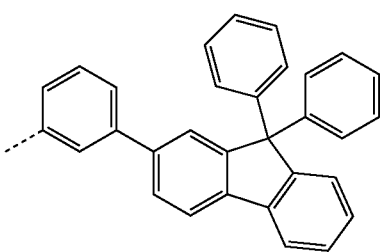 Ar¹-156
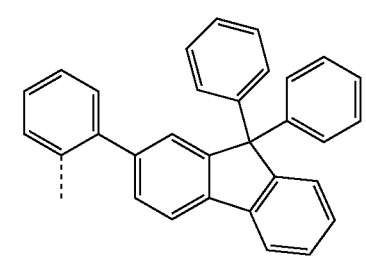 Ar¹-157
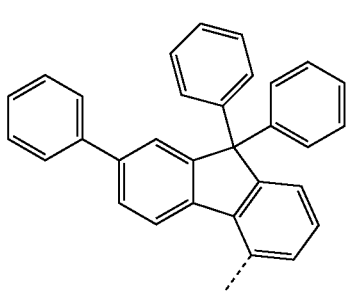 Ar¹-158

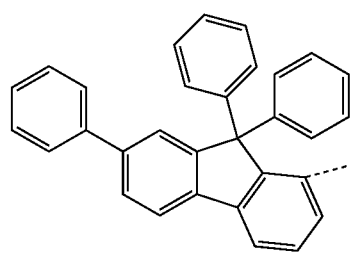
Ar¹-159
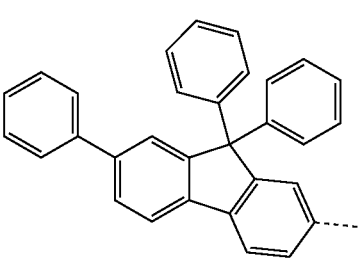
Ar¹-160
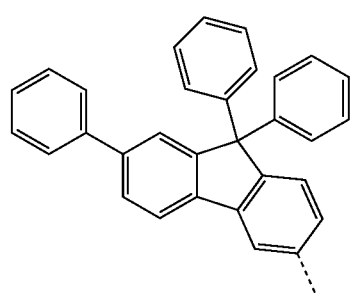
Ar¹-161
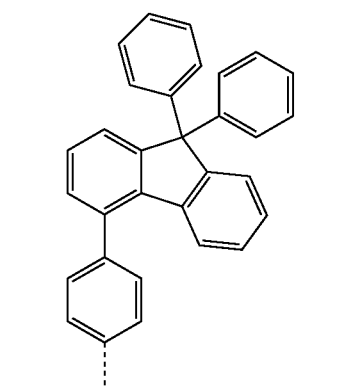
Ar¹-162
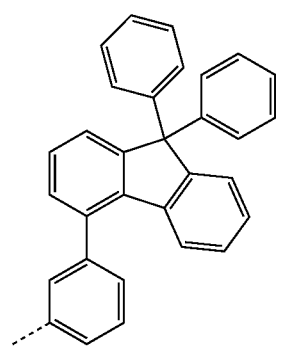
Ar¹-163
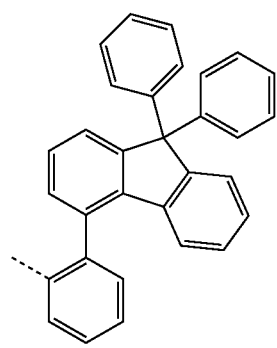
Ar¹-164
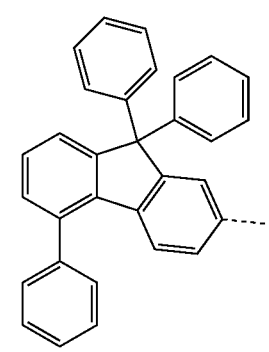
Ar¹-165
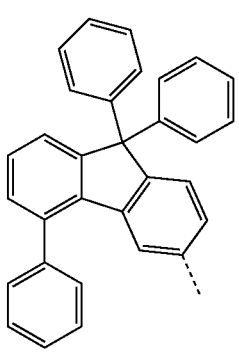
Ar¹-166
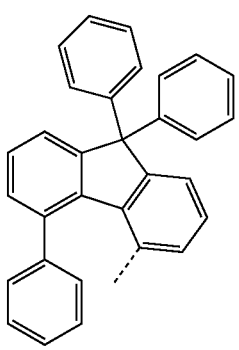
Ar¹-167

Ar¹-168
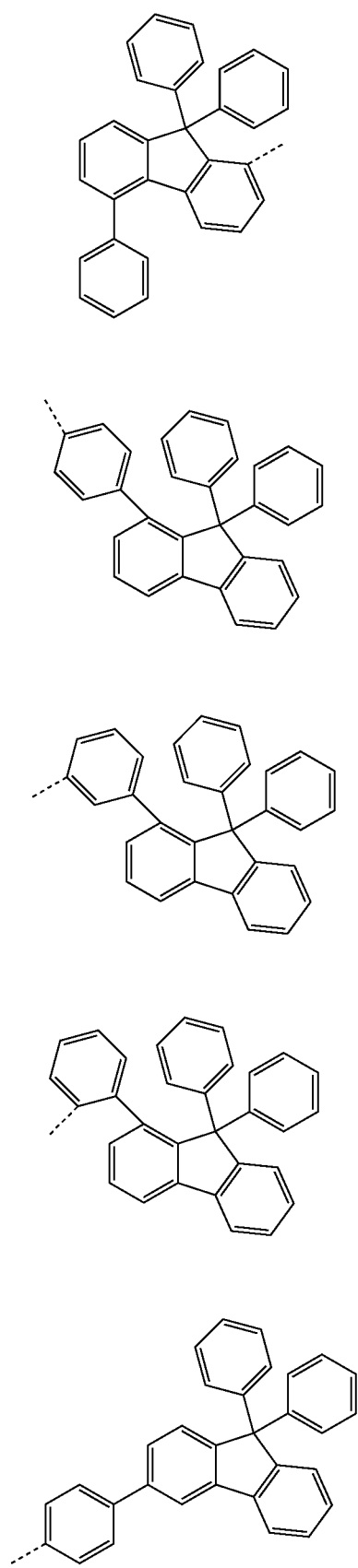
Ar¹-169
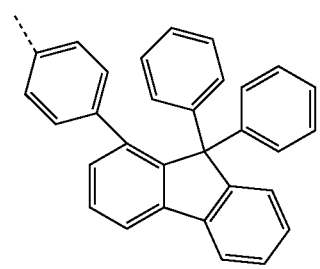
Ar¹-169
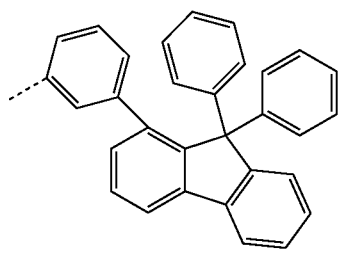
Ar¹-170
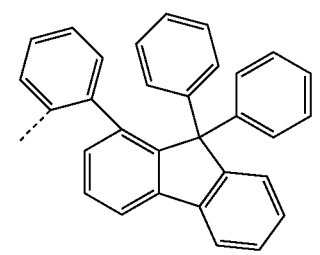
Ar¹-171
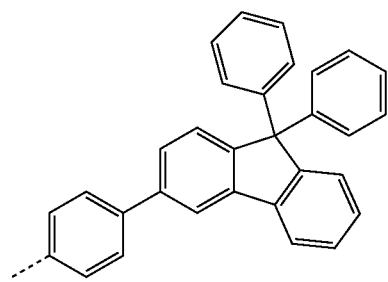
Ar¹-172
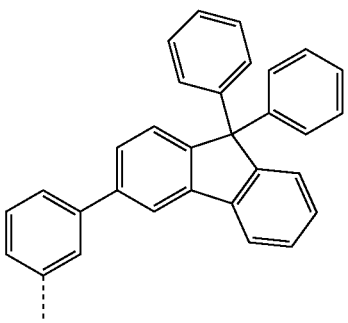
Ar¹-173
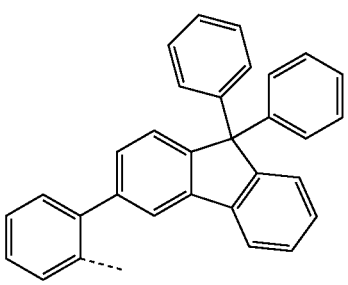
Ar1-174
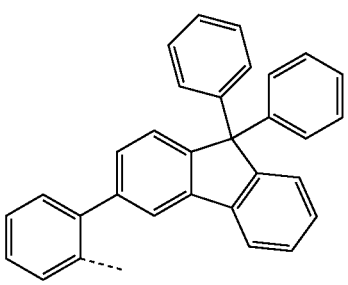
Ar¹-175
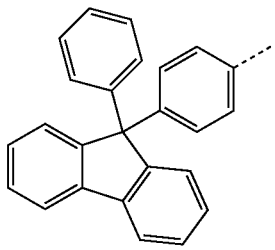
Ar¹-176
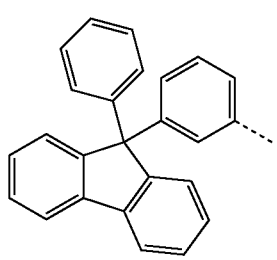
Ar¹-177
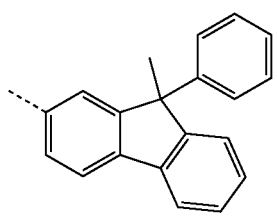

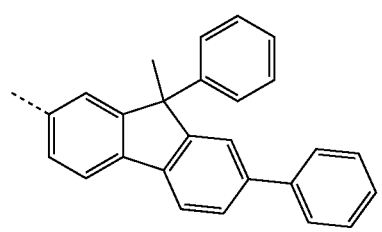
Ar¹-178
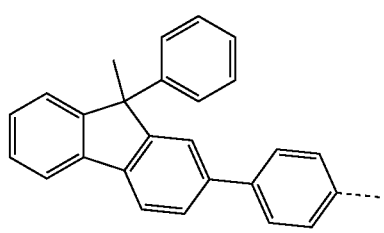
Ar¹-179
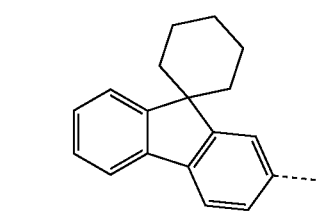
Ar¹-180
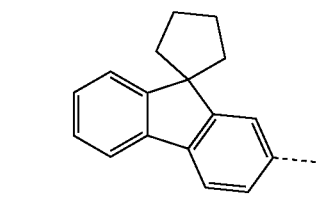
Ar¹-181
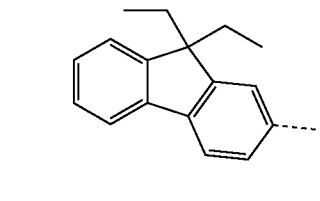
Ar¹-182
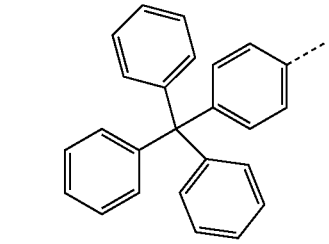
Ar¹-183
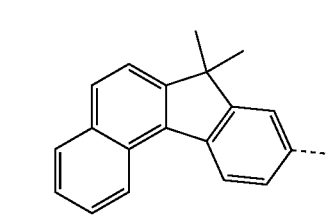
Ar¹-184
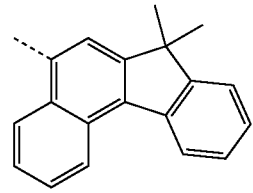
Ar¹-185
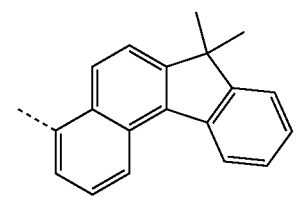
Ar¹-186
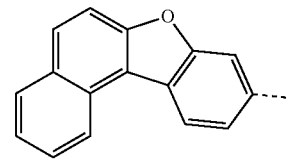
Ar¹-187
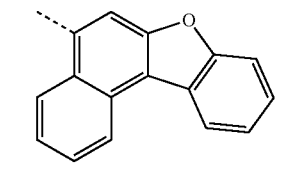
Ar¹-188
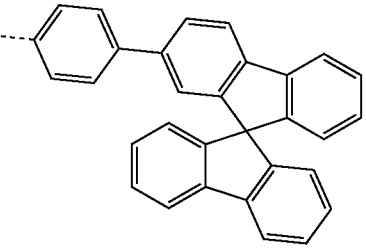
Ar¹-189
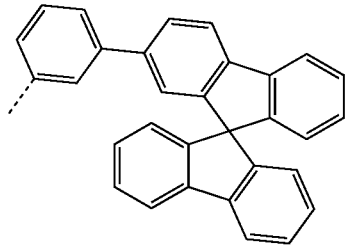
Ar¹-190
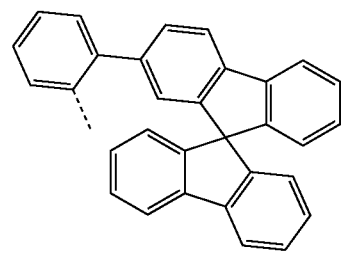
Ar¹-191

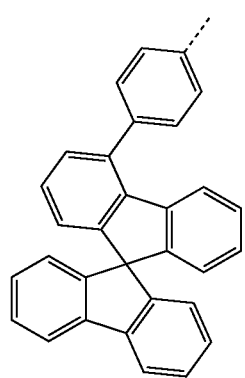 Ar¹-192
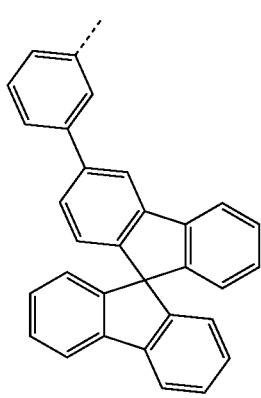 Ar¹-196
Ar¹-193
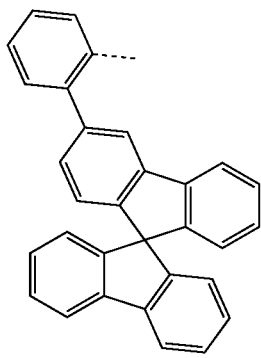 Ar¹-197
Ar¹-194
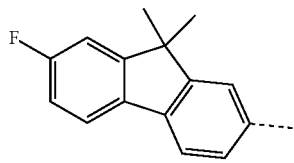 Ar¹-198
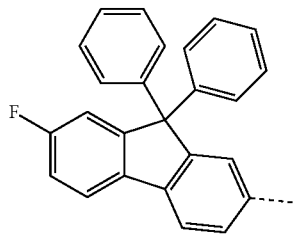 Ar¹-199
Ar¹-195
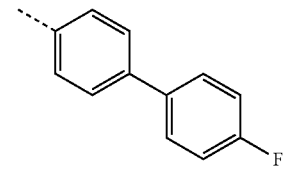 Ar¹-200
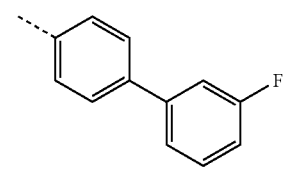 Ar¹-201

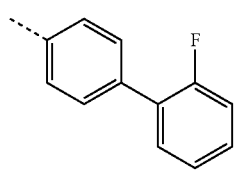
Ar¹-202
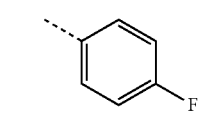
Ar¹-203
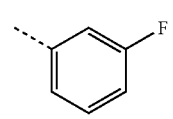
Ar¹-204
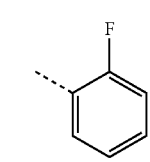
Ar¹-205
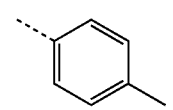
Ar¹-206
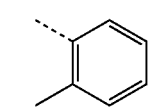
Ar¹-207
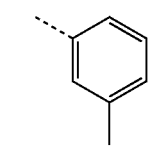
Ar¹-208
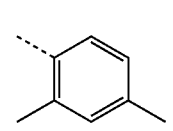
Ar¹-209
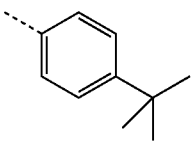
Ar¹-210
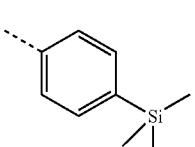
Ar¹-211
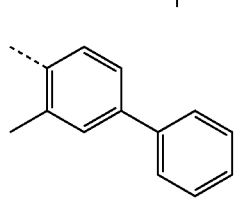
Ar¹-212
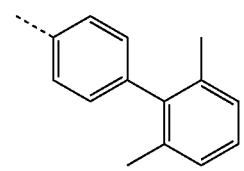
Ar¹-213
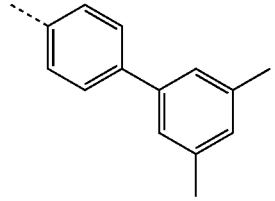
Ar¹-214
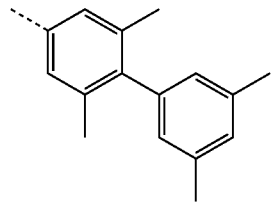
Ar¹-215
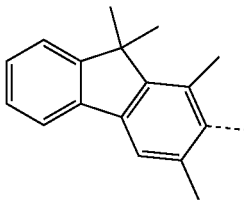
Ar¹-216
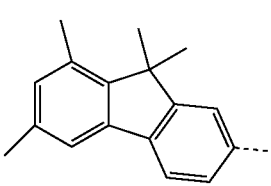
Ar¹-217
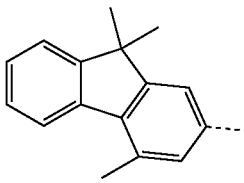
Ar¹-218
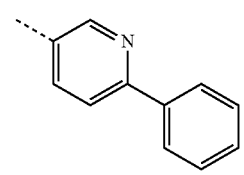
Ar¹-219
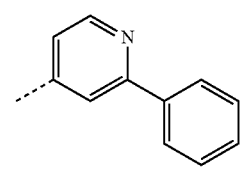
Ar¹-220

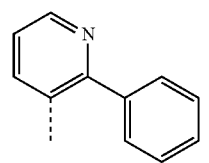 Ar¹-221
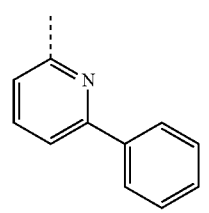 Ar¹-222
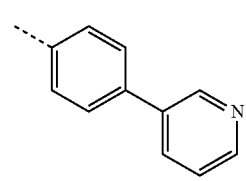 Ar¹-223
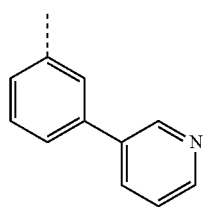 Ar¹-224
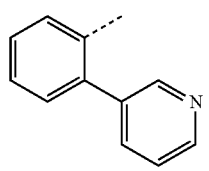 Ar¹-225
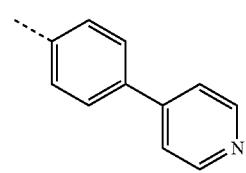 Ar¹-226
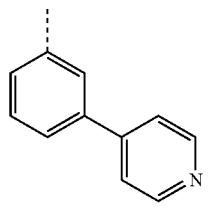 Ar¹-227
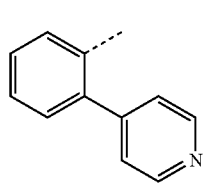 Ar¹-228
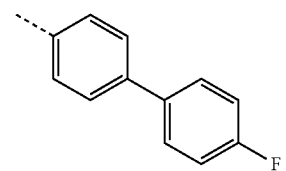 Ar¹-229
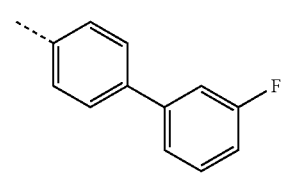 Ar¹-230
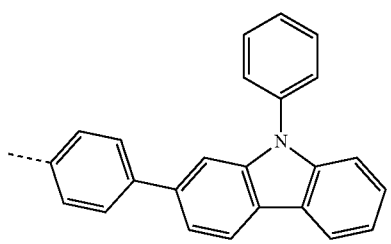 Ar¹-231
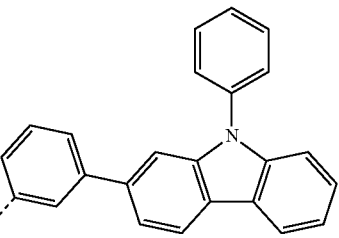 Ar¹-232
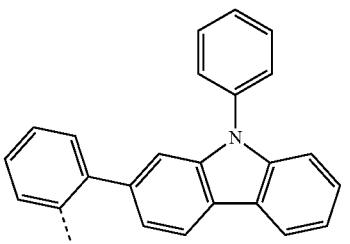 Ar¹-233
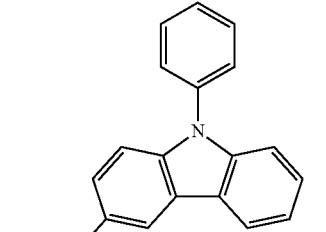 Ar1-234

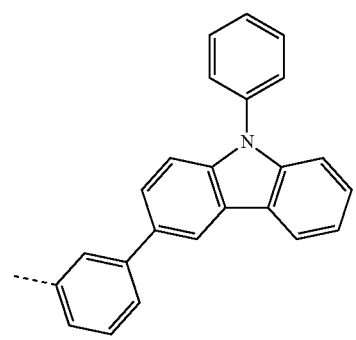 Ar¹-235
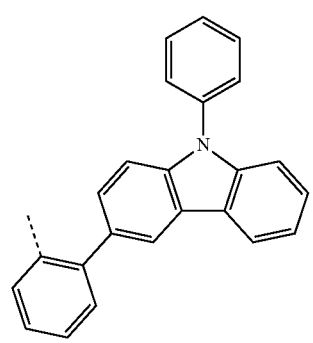 Ar¹-236
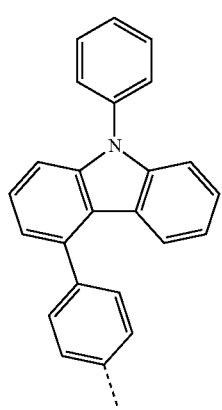 Ar¹-237
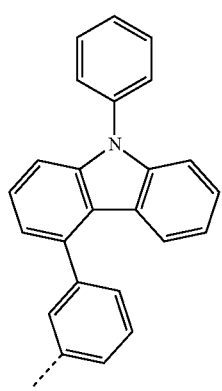 Ar¹-238
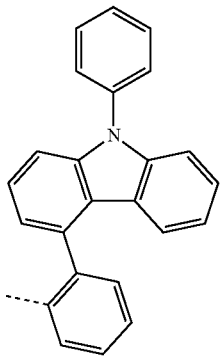 Ar¹-239
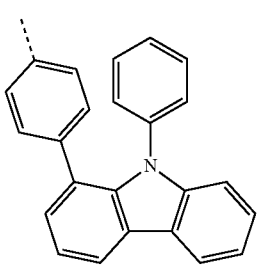 Ar¹-240
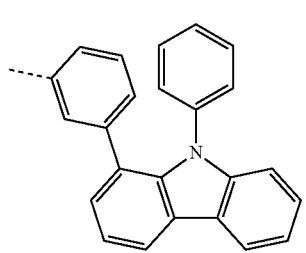 Ar¹-241
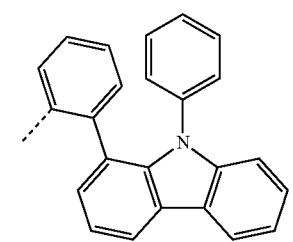 Ar¹-242
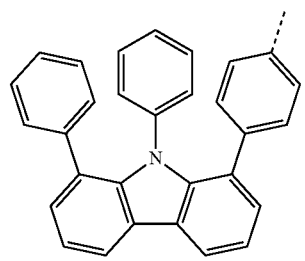 Ar¹-243
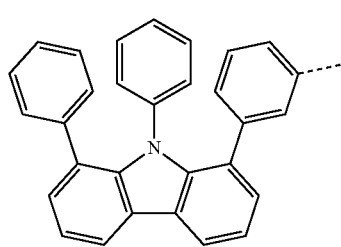 Ar¹-244

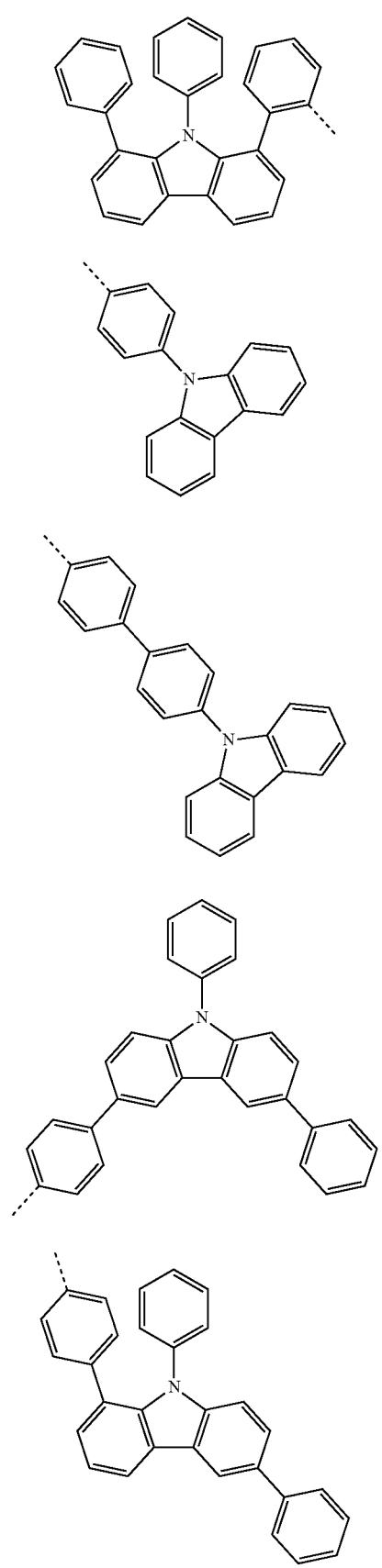

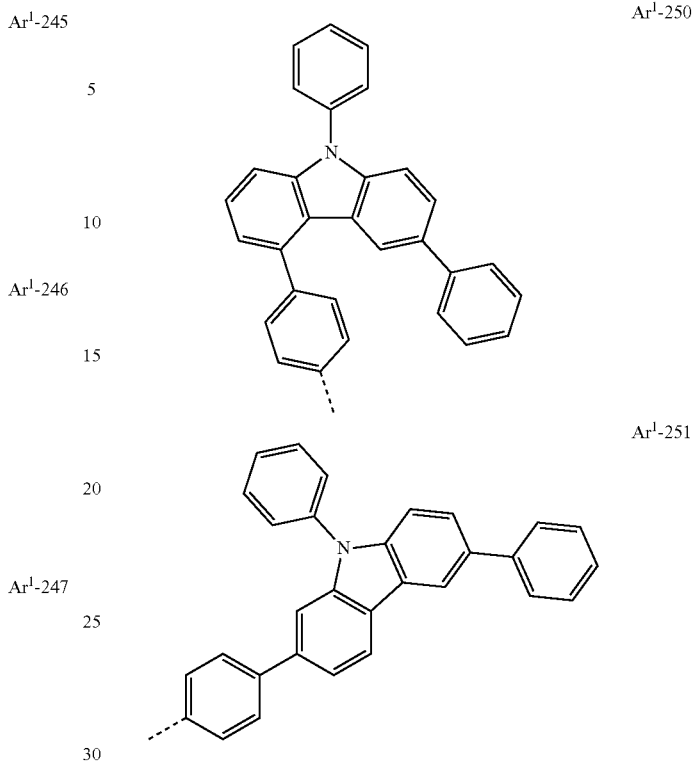

where the groups may each be substituted by $R^3$ radicals at any free position, which are as defined above. They are preferably unsubstituted at all free positions.

It is especially preferable that the preferred embodiments of the base structure of the formula (I) occur in combination with the preferred embodiments of the $Ar^1$, $R^1$, $R^2$, $R^3$, $R^4$ and $R^6$ groups.

Preferred compounds of formula (I) correspond to one of the following structures, where the base skeleton of formula (I-1) or formula (I-2) is not substituted in either case by $R^1$ and $R^2$ radicals at the free positions, and where the $Ar^1$ groups do not have any further substituents other than the substituents shown in the corresponding formulae:

| No. | Base skeleton according to | One of the $Ar^1$ groups according to | Other $Ar^1$ groups according to |
|---|---|---|---|
| 1 | Formula (I-1) | $Ar^1$-1 | $Ar^1$-1 |
| 2 | Formula (I-1) | $Ar^1$-1 | $Ar^1$-2 |
| 3 | Formula (I-1) | $Ar^1$-1 | $Ar^1$-3 |
| 4 | Formula (I-1) | $Ar^1$-1 | $Ar^1$-4 |
| 5 | Formula (I-1) | $Ar^1$-1 | $Ar^1$-59 |
| 6 | Formula (I-1) | $Ar^1$-1 | $Ar^1$-60 |
| 7 | Formula (I-1) | $Ar^1$-1 | $Ar^1$-63 |
| 8 | Formula (I-1) | $Ar^1$-1 | $Ar^1$-65 |
| 9 | Formula (I-1) | $Ar^1$-1 | $Ar^1$-68 |
| 10 | Formula (I-1) | $Ar^1$-1 | $Ar^1$-75 |
| 11 | Formula (I-1) | $Ar^1$-1 | $Ar^1$-87 |
| 12 | Formula (I-1) | $Ar^1$-1 | $Ar^1$-91 |
| 13 | Formula (I-1) | $Ar^1$-1 | $Ar^1$-107 |
| 14 | Formula (I-1) | $Ar^1$-1 | $Ar^1$-109 |
| 15 | Formula (I-1) | $Ar^1$-1 | $Ar^1$-111 |
| 16 | Formula (I-1) | $Ar^1$-1 | $Ar^1$-114 |
| 17 | Formula (I-1) | $Ar^1$-1 | $Ar^1$-121 |
| 18 | Formula (I-1) | $Ar^1$-1 | $Ar^1$-151 |
| 19 | Formula (I-1) | $Ar^1$-1 | $Ar^1$-153 |
| 20 | Formula (I-1) | $Ar^1$-1 | $Ar^1$-162 |
| 21 | Formula (I-1) | $Ar^1$-2 | $Ar^1$-1 |

| No. | Base skeleton according to | One of the Ar¹ groups according to | Other Ar¹ groups according to | No. | Base skeleton according to | One of the Ar¹ groups according to | Other Ar¹ groups according to |
|---|---|---|---|---|---|---|---|
| 22 | Formula (I-1) | Ar¹-2 | Ar¹-2 | 97 | Formula (I-1) | Ar¹-5 | Ar¹-121 |
| 23 | Formula (I-1) | Ar¹-2 | Ar¹-3 | 98 | Formula (I-1) | Ar¹-5 | Ar¹-151 |
| 24 | Formula (I-1) | Ar¹-2 | Ar¹-4 | 99 | Formula (I-1) | Ar¹-5 | Ar¹-153 |
| 25 | Formula (I-1) | Ar¹-2 | Ar¹-59 | 100 | Formula (I-1) | Ar¹-5 | Ar¹-162 |
| 26 | Formula (I-1) | Ar¹-2 | Ar¹-60 | 101 | Formula (I-1) | Ar¹-59 | Ar¹-1 |
| 27 | Formula (I-1) | Ar¹-2 | Ar¹-63 | 102 | Formula (I-1) | Ar¹-59 | Ar¹-2 |
| 28 | Formula (I-1) | Ar¹-2 | Ar¹-65 | 103 | Formula (I-1) | Ar¹-59 | Ar¹-3 |
| 29 | Formula (I-1) | Ar¹-2 | Ar¹-68 | 104 | Formula (I-1) | Ar¹-59 | Ar¹-4 |
| 30 | Formula (I-1) | Ar¹-2 | Ar¹-75 | 105 | Formula (I-1) | Ar¹-59 | Ar¹-59 |
| 31 | Formula (I-1) | Ar¹-2 | Ar¹-87 | 106 | Formula (I-1) | Ar¹-59 | Ar¹-60 |
| 32 | Formula (I-1) | Ar¹-2 | Ar¹-91 | 107 | Formula (I-1) | Ar¹-59 | Ar¹-63 |
| 33 | Formula (I-1) | Ar¹-2 | Ar¹-107 | 108 | Formula (I-1) | Ar¹-59 | Ar¹-65 |
| 34 | Formula (I-1) | Ar¹-2 | Ar¹-109 | 109 | Formula (I-1) | Ar¹-59 | Ar¹-68 |
| 35 | Formula (I-1) | Ar¹-2 | Ar¹-111 | 110 | Formula (I-1) | Ar¹-59 | Ar¹-75 |
| 36 | Formula (I-1) | Ar¹-2 | Ar¹-114 | 111 | Formula (I-1) | Ar¹-59 | Ar¹-87 |
| 37 | Formula (I-1) | Ar¹-2 | Ar¹-121 | 112 | Formula (I-1) | Ar¹-59 | Ar¹-91 |
| 38 | Formula (I-1) | Ar¹-2 | Ar¹-151 | 113 | Formula (I-1) | Ar¹-59 | Ar¹-107 |
| 39 | Formula (I-1) | Ar¹-2 | Ar¹-153 | 114 | Formula (I-1) | Ar¹-59 | Ar¹-109 |
| 40 | Formula (I-1) | Ar¹-2 | Ar¹-162 | 115 | Formula (I-1) | Ar¹-59 | Ar¹-111 |
| 41 | Formula (I-1) | Ar¹-3 | Ar¹-1 | 116 | Formula (I-1) | Ar¹-59 | Ar¹-114 |
| 42 | Formula (I-1) | Ar¹-3 | Ar¹-2 | 117 | Formula (I-1) | Ar¹-59 | Ar¹-121 |
| 43 | Formula (I-1) | Ar¹-3 | Ar¹-3 | 118 | Formula (I-1) | Ar¹-59 | Ar¹-151 |
| 44 | Formula (I-1) | Ar¹-3 | Ar¹-4 | 119 | Formula (I-1) | Ar¹-59 | Ar¹-153 |
| 45 | Formula (I-1) | Ar¹-3 | Ar¹-59 | 120 | Formula (I-1) | Ar¹-59 | Ar¹-162 |
| 46 | Formula (I-1) | Ar¹-3 | Ar¹-60 | 121 | Formula (I-1) | Ar¹-60 | Ar¹-1 |
| 47 | Formula (I-1) | Ar¹-3 | Ar¹-63 | 122 | Formula (I-1) | Ar¹-60 | Ar¹-2 |
| 48 | Formula (I-1) | Ar¹-3 | Ar¹-65 | 123 | Formula (I-1) | Ar¹-60 | Ar¹-3 |
| 49 | Formula (I-1) | Ar¹-3 | Ar¹-68 | 124 | Formula (I-1) | Ar¹-60 | Ar¹-4 |
| 50 | Formula (I-1) | Ar¹-3 | Ar¹-75 | 125 | Formula (I-1) | Ar¹-60 | Ar¹-59 |
| 51 | Formula (I-1) | Ar¹-3 | Ar¹-87 | 126 | Formula (I-1) | Ar¹-60 | Ar¹-60 |
| 52 | Formula (I-1) | Ar¹-3 | Ar¹-91 | 127 | Formula (I-1) | Ar¹-60 | Ar¹-63 |
| 53 | Formula (I-1) | Ar¹-3 | Ar¹-107 | 128 | Formula (I-1) | Ar¹-60 | Ar¹-65 |
| 54 | Formula (I-1) | Ar¹-3 | Ar¹-109 | 129 | Formula (I-1) | Ar¹-60 | Ar¹-68 |
| 55 | Formula (I-1) | Ar¹-3 | Ar¹-111 | 130 | Formula (I-1) | Ar¹-60 | Ar¹-75 |
| 56 | Formula (I-1) | Ar¹-3 | Ar¹-114 | 131 | Formula (I-1) | Ar¹-60 | Ar¹-87 |
| 57 | Formula (I-1) | Ar¹-3 | Ar¹-121 | 132 | Formula (I-1) | Ar¹-60 | Ar¹-91 |
| 58 | Formula (I-1) | Ar¹-3 | Ar¹-151 | 133 | Formula (I-1) | Ar¹-60 | Ar¹-107 |
| 59 | Formula (I-1) | Ar¹-3 | Ar¹-153 | 134 | Formula (I-1) | Ar¹-60 | Ar¹-109 |
| 60 | Formula (I-1) | Ar¹-3 | Ar¹-162 | 135 | Formula (I-1) | Ar¹-60 | Ar¹-111 |
| 61 | Formula (I-1) | Ar¹-4 | Ar¹-1 | 136 | Formula (I-1) | Ar¹-60 | Ar¹-114 |
| 62 | Formula (I-1) | Ar¹-4 | Ar¹-2 | 137 | Formula (I-1) | Ar¹-60 | Ar¹-121 |
| 63 | Formula (I-1) | Ar¹-4 | Ar¹-3 | 138 | Formula (I-1) | Ar¹-60 | Ar¹-151 |
| 64 | Formula (I-1) | Ar¹-4 | Ar¹-4 | 139 | Formula (I-1) | Ar¹-60 | Ar¹-153 |
| 65 | Formula (I-1) | Ar¹-4 | Ar¹-59 | 140 | Formula (I-1) | Ar¹-60 | Ar¹-162 |
| 66 | Formula (I-1) | Ar¹-4 | Ar¹-60 | 141 | Formula (I-1) | Ar¹-61 | Ar¹-1 |
| 67 | Formula (I-1) | Ar¹-4 | Ar¹-63 | 142 | Formula (I-1) | Ar¹-61 | Ar¹-2 |
| 68 | Formula (I-1) | Ar¹-4 | Ar¹-65 | 143 | Formula (I-1) | Ar¹-61 | Ar¹-3 |
| 69 | Formula (I-1) | Ar¹-4 | Ar¹-68 | 144 | Formula (I-1) | Ar¹-61 | Ar¹-4 |
| 70 | Formula (I-1) | Ar¹-4 | Ar¹-75 | 145 | Formula (I-1) | Ar¹-61 | Ar¹-59 |
| 71 | Formula (I-1) | Ar¹-4 | Ar¹-87 | 146 | Formula (I-1) | Ar¹-61 | Ar¹-60 |
| 72 | Formula (I-1) | Ar¹-4 | Ar¹-91 | 147 | Formula (I-1) | Ar¹-61 | Ar¹-63 |
| 73 | Formula (I-1) | Ar¹-4 | Ar¹-107 | 148 | Formula (I-1) | Ar¹-61 | Ar¹-65 |
| 74 | Formula (I-1) | Ar¹-4 | Ar¹-109 | 149 | Formula (I-1) | Ar¹-61 | Ar¹-68 |
| 75 | Formula (I-1) | Ar¹-4 | Ar¹-111 | 150 | Formula (I-1) | Ar¹-61 | Ar¹-75 |
| 76 | Formula (I-1) | Ar¹-4 | Ar¹-114 | 151 | Formula (I-1) | Ar¹-61 | Ar¹-87 |
| 77 | Formula (I-1) | Ar¹-4 | Ar¹-121 | 152 | Formula (I-1) | Ar¹-61 | Ar¹-91 |
| 78 | Formula (I-1) | Ar¹-4 | Ar¹-151 | 153 | Formula (I-1) | Ar¹-61 | Ar¹-107 |
| 79 | Formula (I-1) | Ar¹-4 | Ar¹-153 | 154 | Formula (I-1) | Ar¹-61 | Ar¹-109 |
| 80 | Formula (I-1) | Ar¹-4 | Ar¹-162 | 155 | Formula (I-1) | Ar¹-61 | Ar¹-111 |
| 81 | Formula (I-1) | Ar¹-5 | Ar¹-1 | 156 | Formula (I-1) | Ar¹-61 | Ar¹-114 |
| 82 | Formula (I-1) | Ar¹-5 | Ar¹-2 | 157 | Formula (I-1) | Ar¹-61 | Ar¹-121 |
| 83 | Formula (I-1) | Ar¹-5 | Ar¹-3 | 158 | Formula (I-1) | Ar¹-61 | Ar¹-151 |
| 84 | Formula (I-1) | Ar¹-5 | Ar¹-4 | 159 | Formula (I-1) | Ar¹-61 | Ar¹-153 |
| 85 | Formula (I-1) | Ar¹-5 | Ar¹-59 | 160 | Formula (I-1) | Ar¹-61 | Ar¹-162 |
| 86 | Formula (I-1) | Ar¹-5 | Ar¹-60 | 161 | Formula (I-1) | Ar¹-62 | Ar¹-1 |
| 87 | Formula (I-1) | Ar¹-5 | Ar¹-63 | 162 | Formula (I-1) | Ar¹-62 | Ar¹-2 |
| 88 | Formula (I-1) | Ar¹-5 | Ar¹-65 | 163 | Formula (I-1) | Ar¹-62 | Ar¹-3 |
| 89 | Formula (I-1) | Ar¹-5 | Ar¹-68 | 164 | Formula (I-1) | Ar¹-62 | Ar¹-4 |
| 90 | Formula (I-1) | Ar¹-5 | Ar¹-75 | 165 | Formula (I-1) | Ar¹-62 | Ar¹-59 |
| 91 | Formula (I-1) | Ar¹-5 | Ar¹-87 | 166 | Formula (I-1) | Ar¹-62 | Ar¹-60 |
| 92 | Formula (I-1) | Ar¹-5 | Ar¹-91 | 167 | Formula (I-1) | Ar¹-62 | Ar¹-63 |
| 93 | Formula (I-1) | Ar¹-5 | Ar¹-107 | 168 | Formula (I-1) | Ar¹-62 | Ar¹-65 |
| 94 | Formula (I-1) | Ar¹-5 | Ar¹-109 | 169 | Formula (I-1) | Ar¹-62 | Ar¹-68 |
| 95 | Formula (I-1) | Ar¹-5 | Ar¹-111 | 170 | Formula (I-1) | Ar¹-62 | Ar¹-75 |
| 96 | Formula (I-1) | Ar¹-5 | Ar¹-114 | 171 | Formula (I-1) | Ar¹-62 | Ar¹-87 |

-continued

| No. | Base skeleton according to | One of the Ar¹ groups according to | Other Ar¹ groups according to |
|---|---|---|---|
| 172 | Formula (I-1) | Ar¹-62 | Ar¹-91 |
| 173 | Formula (I-1) | Ar¹-62 | Ar¹-107 |
| 174 | Formula (I-1) | Ar¹-62 | Ar¹-109 |
| 175 | Formula (I-1) | Ar¹-62 | Ar¹-111 |
| 176 | Formula (I-1) | Ar¹-62 | Ar¹-114 |
| 177 | Formula (I-1) | Ar¹-62 | Ar¹-121 |
| 178 | Formula (I-1) | Ar¹-62 | Ar¹-151 |
| 179 | Formula (I-1) | Ar¹-62 | Ar¹-153 |
| 180 | Formula (I-1) | Ar¹-62 | Ar¹-162 |
| 181 | Formula (I-1) | Ar¹-63 | Ar¹-1 |
| 182 | Formula (I-1) | Ar¹-63 | Ar¹-2 |
| 183 | Formula (I-1) | Ar¹-63 | Ar¹-3 |
| 184 | Formula (I-1) | Ar¹-63 | Ar¹-4 |
| 185 | Formula (I-1) | Ar¹-63 | Ar¹-59 |
| 186 | Formula (I-1) | Ar¹-63 | Ar¹-60 |
| 187 | Formula (I-1) | Ar¹-63 | Ar¹-63 |
| 188 | Formula (I-1) | Ar¹-63 | Ar¹-65 |
| 189 | Formula (I-1) | Ar¹-63 | Ar¹-68 |
| 190 | Formula (I-1) | Ar¹-63 | Ar¹-75 |
| 191 | Formula (I-1) | Ar¹-63 | Ar¹-87 |
| 192 | Formula (I-1) | Ar¹-63 | Ar¹-91 |
| 193 | Formula (I-1) | Ar¹-63 | Ar¹-107 |
| 194 | Formula (I-1) | Ar¹-63 | Ar¹-109 |
| 195 | Formula (I-1) | Ar¹-63 | Ar¹-111 |
| 196 | Formula (I-1) | Ar¹-63 | Ar¹-114 |
| 197 | Formula (I-1) | Ar¹-63 | Ar¹-121 |
| 198 | Formula (I-1) | Ar¹-63 | Ar¹-151 |
| 199 | Formula (I-1) | Ar¹-63 | Ar¹-153 |
| 200 | Formula (I-1) | Ar¹-63 | Ar¹-162 |
| 201 | Formula (I-1) | Ar¹-64 | Ar¹-1 |
| 202 | Formula (I-1) | Ar¹-64 | Ar¹-2 |
| 203 | Formula (I-1) | Ar¹-64 | Ar¹-3 |
| 204 | Formula (I-1) | Ar¹-64 | Ar¹-4 |
| 205 | Formula (I-1) | Ar¹-64 | Ar¹-59 |
| 206 | Formula (I-1) | Ar¹-64 | Ar¹-60 |
| 207 | Formula (I-1) | Ar¹-64 | Ar¹-63 |
| 208 | Formula (I-1) | Ar¹-64 | Ar¹-65 |
| 209 | Formula (I-1) | Ar¹-64 | Ar¹-68 |
| 210 | Formula (I-1) | Ar¹-64 | Ar¹-75 |
| 211 | Formula (I-1) | Ar¹-64 | Ar¹-87 |
| 212 | Formula (I-1) | Ar¹-64 | Ar¹-91 |
| 213 | Formula (I-1) | Ar¹-64 | Ar¹-107 |
| 214 | Formula (I-1) | Ar¹-64 | Ar¹-109 |
| 215 | Formula (I-1) | Ar¹-64 | Ar¹-111 |
| 216 | Formula (I-1) | Ar¹-64 | Ar¹-114 |
| 217 | Formula (I-1) | Ar¹-64 | Ar¹-121 |
| 218 | Formula (I-1) | Ar¹-64 | Ar¹-151 |
| 219 | Formula (I-1) | Ar¹-64 | Ar¹-153 |
| 220 | Formula (I-1) | Ar¹-64 | Ar¹-162 |
| 221 | Formula (I-1) | Ar¹-65 | Ar¹-1 |
| 222 | Formula (I-1) | Ar¹-65 | Ar¹-2 |
| 223 | Formula (I-1) | Ar¹-65 | Ar¹-3 |
| 224 | Formula (I-1) | Ar¹-65 | Ar¹-4 |
| 225 | Formula (I-1) | Ar¹-65 | Ar¹-59 |
| 226 | Formula (I-1) | Ar¹-65 | Ar¹-60 |
| 227 | Formula (I-1) | Ar¹-65 | Ar¹-63 |
| 228 | Formula (I-1) | Ar¹-65 | Ar¹-65 |
| 229 | Formula (I-1) | Ar¹-65 | Ar¹-68 |
| 230 | Formula (I-1) | Ar¹-65 | Ar¹-75 |
| 231 | Formula (I-1) | Ar¹-65 | Ar¹-87 |
| 232 | Formula (I-1) | Ar¹-65 | Ar¹-91 |
| 233 | Formula (I-1) | Ar¹-65 | Ar¹-107 |
| 234 | Formula (I-1) | Ar¹-65 | Ar¹-109 |
| 235 | Formula (I-1) | Ar¹-65 | Ar¹-111 |
| 236 | Formula (I-1) | Ar¹-65 | Ar¹-114 |
| 237 | Formula (I-1) | Ar¹-65 | Ar¹-121 |
| 238 | Formula (I-1) | Ar¹-65 | Ar¹-151 |
| 239 | Formula (I-1) | Ar¹-65 | Ar¹-153 |
| 240 | Formula (I-1) | Ar¹-65 | Ar¹-162 |
| 241 | Formula (I-1) | Ar¹-66 | Ar¹-1 |
| 242 | Formula (I-1) | Ar¹-66 | Ar¹-2 |
| 243 | Formula (I-1) | Ar¹-66 | Ar¹-3 |
| 244 | Formula (I-1) | Ar¹-66 | Ar¹-4 |
| 245 | Formula (I-1) | Ar¹-66 | Ar¹-59 |
| 246 | Formula (I-1) | Ar¹-66 | Ar¹-60 |
| 247 | Formula (I-1) | Ar¹-66 | Ar¹-63 |
| 248 | Formula (I-1) | Ar¹-66 | Ar¹-65 |
| 249 | Formula (I-1) | Ar¹-66 | Ar¹-68 |
| 250 | Formula (I-1) | Ar¹-66 | Ar¹-75 |
| 251 | Formula (I-1) | Ar¹-66 | Ar¹-87 |
| 252 | Formula (I-1) | Ar¹-66 | Ar¹-91 |
| 253 | Formula (I-1) | Ar¹-66 | Ar¹-107 |
| 254 | Formula (I-1) | Ar¹-66 | Ar¹-109 |
| 255 | Formula (I-1) | Ar¹-66 | Ar¹-111 |
| 256 | Formula (I-1) | Ar¹-66 | Ar¹-114 |
| 257 | Formula (I-1) | Ar¹-66 | Ar¹-121 |
| 258 | Formula (I-1) | Ar¹-66 | Ar¹-151 |
| 259 | Formula (I-1) | Ar¹-66 | Ar¹-153 |
| 260 | Formula (I-1) | Ar¹-66 | Ar¹-162 |
| 261 | Formula (I-1) | Ar¹-68 | Ar¹-1 |
| 262 | Formula (I-1) | Ar¹-68 | Ar¹-2 |
| 263 | Formula (I-1) | Ar¹-68 | Ar¹-3 |
| 264 | Formula (I-1) | Ar¹-68 | Ar¹-4 |
| 265 | Formula (I-1) | Ar¹-68 | Ar¹-59 |
| 266 | Formula (I-1) | Ar¹-68 | Ar¹-60 |
| 267 | Formula (I-1) | Ar¹-68 | Ar¹-63 |
| 268 | Formula (I-1) | Ar¹-68 | Ar¹-65 |
| 269 | Formula (I-1) | Ar¹-68 | Ar¹-68 |
| 270 | Formula (I-1) | Ar¹-68 | Ar¹-75 |
| 271 | Formula (I-1) | Ar¹-68 | Ar¹-87 |
| 272 | Formula (I-1) | Ar¹-68 | Ar¹-91 |
| 273 | Formula (I-1) | Ar¹-68 | Ar¹-107 |
| 274 | Formula (I-1) | Ar¹-68 | Ar¹-109 |
| 275 | Formula (I-1) | Ar¹-68 | Ar¹-111 |
| 276 | Formula (I-1) | Ar¹-68 | Ar¹-114 |
| 277 | Formula (I-1) | Ar¹-68 | Ar¹-121 |
| 278 | Formula (I-1) | Ar¹-68 | Ar¹-151 |
| 279 | Formula (I-1) | Ar¹-68 | Ar¹-153 |
| 280 | Formula (I-1) | Ar¹-68 | Ar¹-162 |
| 281 | Formula (I-1) | Ar¹-71 | Ar¹-1 |
| 282 | Formula (I-1) | Ar¹-71 | Ar¹-2 |
| 283 | Formula (I-1) | Ar¹-71 | Ar¹-3 |
| 284 | Formula (I-1) | Ar¹-71 | Ar¹-4 |
| 285 | Formula (I-1) | Ar¹-71 | Ar¹-59 |
| 286 | Formula (I-1) | Ar¹-71 | Ar¹-60 |
| 287 | Formula (I-1) | Ar¹-71 | Ar¹-63 |
| 288 | Formula (I-1) | Ar¹-71 | Ar¹-65 |
| 289 | Formula (I-1) | Ar¹-71 | Ar¹-68 |
| 290 | Formula (I-1) | Ar¹-71 | Ar¹-75 |
| 291 | Formula (I-1) | Ar¹-71 | Ar¹-87 |
| 292 | Formula (I-1) | Ar¹-71 | Ar¹-91 |
| 293 | Formula (I-1) | Ar¹-71 | Ar¹-107 |
| 294 | Formula (I-1) | Ar¹-71 | Ar¹-109 |
| 295 | Formula (I-1) | Ar¹-71 | Ar¹-111 |
| 296 | Formula (I-1) | Ar¹-71 | Ar¹-114 |
| 297 | Formula (I-1) | Ar¹-71 | Ar¹-121 |
| 298 | Formula (I-1) | Ar¹-71 | Ar¹-151 |
| 299 | Formula (I-1) | Ar¹-71 | Ar¹-153 |
| 300 | Formula (I-1) | Ar¹-71 | Ar¹-162 |
| 301 | Formula (I-1) | Ar¹-75 | Ar¹-1 |
| 302 | Formula (I-1) | Ar¹-75 | Ar¹-2 |
| 303 | Formula (I-1) | Ar¹-75 | Ar¹-3 |
| 304 | Formula (I-1) | Ar¹-75 | Ar¹-4 |
| 305 | Formula (I-1) | Ar¹-75 | Ar¹-59 |
| 306 | Formula (I-1) | Ar¹-75 | Ar¹-60 |
| 307 | Formula (I-1) | Ar¹-75 | Ar¹-63 |
| 308 | Formula (I-1) | Ar¹-75 | Ar¹-65 |
| 309 | Formula (I-1) | Ar¹-75 | Ar¹-68 |
| 310 | Formula (I-1) | Ar¹-75 | Ar¹-75 |
| 311 | Formula (I-1) | Ar¹-75 | Ar¹-87 |
| 312 | Formula (I-1) | Ar¹-75 | Ar¹-91 |
| 313 | Formula (I-1) | Ar¹-75 | Ar¹-107 |
| 314 | Formula (I-1) | Ar¹-75 | Ar¹-109 |
| 315 | Formula (I-1) | Ar¹-75 | Ar¹-111 |
| 316 | Formula (I-1) | Ar¹-75 | Ar¹-114 |
| 317 | Formula (I-1) | Ar¹-75 | Ar¹-121 |
| 318 | Formula (I-1) | Ar¹-75 | Ar¹-151 |
| 319 | Formula (I-1) | Ar¹-75 | Ar¹-153 |
| 320 | Formula (I-1) | Ar¹-75 | Ar¹-162 |
| 321 | Formula (I-1) | Ar¹-76 | Ar¹-1 |

-continued

| No. | Base skeleton according to | One of the Ar¹ groups according to | Other Ar¹ groups according to |
|---|---|---|---|
| 322 | Formula (I-1) | Ar¹-76 | Ar¹-2 |
| 323 | Formula (I-1) | Ar¹-76 | Ar¹-3 |
| 324 | Formula (I-1) | Ar¹-76 | Ar¹-4 |
| 325 | Formula (I-1) | Ar¹-76 | Ar¹-59 |
| 326 | Formula (I-1) | Ar¹-76 | Ar¹-60 |
| 327 | Formula (I-1) | Ar¹-76 | Ar¹-63 |
| 328 | Formula (I-1) | Ar¹-76 | Ar¹-65 |
| 329 | Formula (I-1) | Ar¹-76 | Ar¹-68 |
| 330 | Formula (I-1) | Ar¹-76 | Ar¹-75 |
| 331 | Formula (I-1) | Ar¹-76 | Ar¹-87 |
| 332 | Formula (I-1) | Ar¹-76 | Ar¹-91 |
| 333 | Formula (I-1) | Ar¹-76 | Ar¹-107 |
| 334 | Formula (I-1) | Ar¹-76 | Ar¹-109 |
| 335 | Formula (I-1) | Ar¹-76 | Ar¹-111 |
| 336 | Formula (I-1) | Ar¹-76 | Ar¹-114 |
| 337 | Formula (I-1) | Ar¹-76 | Ar¹-121 |
| 338 | Formula (I-1) | Ar¹-76 | Ar¹-151 |
| 339 | Formula (I-1) | Ar¹-76 | Ar¹-153 |
| 340 | Formula (I-1) | Ar¹-76 | Ar¹-162 |
| 341 | Formula (I-1) | Ar¹-79 | Ar¹-1 |
| 342 | Formula (I-1) | Ar¹-79 | Ar¹-2 |
| 343 | Formula (I-1) | Ar¹-79 | Ar¹-3 |
| 344 | Formula (I-1) | Ar¹-79 | Ar¹-4 |
| 345 | Formula (I-1) | Ar¹-79 | Ar¹-59 |
| 346 | Formula (I-1) | Ar¹-79 | Ar¹-60 |
| 347 | Formula (I-1) | Ar¹-79 | Ar¹-63 |
| 348 | Formula (I-1) | Ar¹-79 | Ar¹-65 |
| 349 | Formula (I-1) | Ar¹-79 | Ar¹-68 |
| 350 | Formula (I-1) | Ar¹-79 | Ar¹-75 |
| 351 | Formula (I-1) | Ar¹-79 | Ar¹-87 |
| 352 | Formula (I-1) | Ar¹-79 | Ar¹-91 |
| 353 | Formula (I-1) | Ar¹-79 | Ar¹-107 |
| 354 | Formula (I-1) | Ar¹-79 | Ar¹-109 |
| 355 | Formula (I-1) | Ar¹-79 | Ar¹-111 |
| 356 | Formula (I-1) | Ar¹-79 | Ar¹-114 |
| 357 | Formula (I-1) | Ar¹-79 | Ar¹-121 |
| 358 | Formula (I-1) | Ar¹-79 | Ar¹-151 |
| 359 | Formula (I-1) | Ar¹-79 | Ar¹-153 |
| 360 | Formula (I-1) | Ar¹-79 | Ar¹-162 |
| 361 | Formula (I-1) | Ar¹-87 | Ar¹-1 |
| 362 | Formula (I-1) | Ar¹-87 | Ar¹-2 |
| 363 | Formula (I-1) | Ar¹-87 | Ar¹-3 |
| 364 | Formula (I-1) | Ar¹-87 | Ar¹-4 |
| 365 | Formula (I-1) | Ar¹-87 | Ar¹-59 |
| 366 | Formula (I-1) | Ar¹-87 | Ar¹-60 |
| 367 | Formula (I-1) | Ar¹-87 | Ar¹-63 |
| 368 | Formula (I-1) | Ar¹-87 | Ar¹-65 |
| 369 | Formula (I-1) | Ar¹-87 | Ar¹-68 |
| 370 | Formula (I-1) | Ar¹-87 | Ar¹-75 |
| 371 | Formula (I-1) | Ar¹-87 | Ar¹-87 |
| 372 | Formula (I-1) | Ar¹-87 | Ar¹-91 |
| 373 | Formula (I-1) | Ar¹-87 | Ar¹-107 |
| 374 | Formula (I-1) | Ar¹-87 | Ar¹-109 |
| 375 | Formula (I-1) | Ar¹-87 | Ar¹-111 |
| 376 | Formula (I-1) | Ar¹-87 | Ar¹-114 |
| 377 | Formula (I-1) | Ar¹-87 | Ar¹-121 |
| 378 | Formula (I-1) | Ar¹-87 | Ar¹-151 |
| 379 | Formula (I-1) | Ar¹-87 | Ar¹-153 |
| 380 | Formula (I-1) | Ar¹-87 | Ar¹-162 |
| 381 | Formula (I-1) | Ar¹-91 | Ar¹-1 |
| 382 | Formula (I-1) | Ar¹-91 | Ar¹-2 |
| 383 | Formula (I-1) | Ar¹-91 | Ar¹-3 |
| 384 | Formula (I-1) | Ar¹-91 | Ar¹-4 |
| 385 | Formula (I-1) | Ar¹-91 | Ar¹-59 |
| 386 | Formula (I-1) | Ar¹-91 | Ar¹-60 |
| 387 | Formula (I-1) | Ar¹-91 | Ar¹-63 |
| 388 | Formula (I-1) | Ar¹-91 | Ar¹-65 |
| 389 | Formula (I-1) | Ar¹-91 | Ar¹-68 |
| 390 | Formula (I-1) | Ar¹-91 | Ar¹-75 |
| 391 | Formula (I-1) | Ar¹-91 | Ar¹-87 |
| 392 | Formula (I-1) | Ar¹-91 | Ar¹-91 |
| 393 | Formula (I-1) | Ar¹-91 | Ar¹-107 |
| 394 | Formula (I-1) | Ar¹-91 | Ar¹-109 |
| 395 | Formula (I-1) | Ar¹-91 | Ar¹-111 |
| 396 | Formula (I-1) | Ar¹-91 | Ar¹-114 |
| 397 | Formula (I-1) | Ar¹-91 | Ar¹-121 |
| 398 | Formula (I-1) | Ar¹-91 | Ar¹-151 |
| 399 | Formula (I-1) | Ar¹-91 | Ar¹-153 |
| 400 | Formula (I-1) | Ar¹-91 | Ar¹-162 |
| 401 | Formula (I-1) | Ar¹-92 | Ar¹-1 |
| 402 | Formula (I-1) | Ar¹-92 | Ar¹-2 |
| 403 | Formula (I-1) | Ar¹-92 | Ar¹-3 |
| 404 | Formula (I-1) | Ar¹-92 | Ar¹-4 |
| 405 | Formula (I-1) | Ar¹-92 | Ar¹-59 |
| 406 | Formula (I-1) | Ar¹-92 | Ar¹-60 |
| 407 | Formula (I-1) | Ar¹-92 | Ar¹-63 |
| 408 | Formula (I-1) | Ar¹-92 | Ar¹-65 |
| 409 | Formula (I-1) | Ar¹-92 | Ar¹-68 |
| 410 | Formula (I-1) | Ar¹-92 | Ar¹-75 |
| 411 | Formula (I-1) | Ar¹-92 | Ar¹-87 |
| 412 | Formula (I-1) | Ar¹-92 | Ar¹-91 |
| 413 | Formula (I-1) | Ar¹-92 | Ar¹-107 |
| 414 | Formula (I-1) | Ar¹-92 | Ar¹-109 |
| 415 | Formula (I-1) | Ar¹-92 | Ar¹-111 |
| 416 | Formula (I-1) | Ar¹-92 | Ar¹-114 |
| 417 | Formula (I-1) | Ar¹-92 | Ar¹-121 |
| 418 | Formula (I-1) | Ar¹-92 | Ar¹-151 |
| 419 | Formula (I-1) | Ar¹-92 | Ar¹-153 |
| 420 | Formula (I-1) | Ar¹-92 | Ar¹-162 |
| 421 | Formula (I-1) | Ar¹-95 | Ar¹-1 |
| 422 | Formula (I-1) | Ar¹-95 | Ar¹-2 |
| 423 | Formula (I-1) | Ar¹-95 | Ar¹-3 |
| 424 | Formula (I-1) | Ar¹-95 | Ar¹-4 |
| 425 | Formula (I-1) | Ar¹-95 | Ar¹-59 |
| 426 | Formula (I-1) | Ar¹-95 | Ar¹-60 |
| 427 | Formula (I-1) | Ar¹-95 | Ar¹-63 |
| 428 | Formula (I-1) | Ar¹-95 | Ar¹-65 |
| 429 | Formula (I-1) | Ar¹-95 | Ar¹-68 |
| 430 | Formula (I-1) | Ar¹-95 | Ar¹-75 |
| 431 | Formula (I-1) | Ar¹-95 | Ar¹-87 |
| 432 | Formula (I-1) | Ar¹-95 | Ar¹-91 |
| 433 | Formula (I-1) | Ar¹-95 | Ar¹-107 |
| 434 | Formula (I-1) | Ar¹-95 | Ar¹-109 |
| 435 | Formula (I-1) | Ar¹-95 | Ar¹-111 |
| 436 | Formula (I-1) | Ar¹-95 | Ar¹-114 |
| 437 | Formula (I-1) | Ar¹-95 | Ar¹-121 |
| 438 | Formula (I-1) | Ar¹-95 | Ar¹-151 |
| 439 | Formula (I-1) | Ar¹-95 | Ar¹-153 |
| 440 | Formula (I-1) | Ar¹-95 | Ar¹-162 |
| 441 | Formula (I-1) | Ar¹-99 | Ar¹-1 |
| 442 | Formula (I-1) | Ar¹-99 | Ar¹-2 |
| 443 | Formula (I-1) | Ar¹-99 | Ar¹-3 |
| 444 | Formula (I-1) | Ar¹-99 | Ar¹-4 |
| 445 | Formula (I-1) | Ar¹-99 | Ar¹-59 |
| 446 | Formula (I-1) | Ar¹-99 | Ar¹-60 |
| 447 | Formula (I-1) | Ar¹-99 | Ar¹-63 |
| 448 | Formula (I-1) | Ar¹-99 | Ar¹-65 |
| 449 | Formula (I-1) | Ar¹-99 | Ar¹-68 |
| 450 | Formula (I-1) | Ar¹-99 | Ar¹-75 |
| 451 | Formula (I-1) | Ar¹-99 | Ar¹-87 |
| 452 | Formula (I-1) | Ar¹-99 | Ar¹-91 |
| 453 | Formula (I-1) | Ar¹-99 | Ar¹-107 |
| 454 | Formula (I-1) | Ar¹-99 | Ar¹-109 |
| 455 | Formula (I-1) | Ar¹-99 | Ar¹-111 |
| 456 | Formula (I-1) | Ar¹-99 | Ar¹-114 |
| 457 | Formula (I-1) | Ar¹-99 | Ar¹-121 |
| 458 | Formula (I-1) | Ar¹-99 | Ar¹-151 |
| 459 | Formula (I-1) | Ar¹-99 | Ar¹-153 |
| 460 | Formula (I-1) | Ar¹-99 | Ar¹-162 |
| 461 | Formula (I-1) | Ar¹-107 | Ar¹-1 |
| 462 | Formula (I-1) | Ar¹-107 | Ar¹-2 |
| 463 | Formula (I-1) | Ar¹-107 | Ar¹-3 |
| 464 | Formula (I-1) | Ar¹-107 | Ar¹-4 |
| 465 | Formula (I-1) | Ar¹-107 | Ar¹-59 |
| 466 | Formula (I-1) | Ar¹-107 | Ar¹-60 |
| 467 | Formula (I-1) | Ar¹-107 | Ar¹-63 |
| 468 | Formula (I-1) | Ar¹-107 | Ar¹-65 |
| 469 | Formula (I-1) | Ar¹-107 | Ar¹-68 |
| 470 | Formula (I-1) | Ar¹-107 | Ar¹-75 |
| 471 | Formula (I-1) | Ar¹-107 | Ar¹-87 |

-continued

| No. | Base skeleton according to | One of the Ar¹ groups according to | Other Ar¹ groups according to |
|---|---|---|---|
| 472 | Formula (I-1) | Ar¹-107 | Ar¹-91 |
| 473 | Formula (I-1) | Ar¹-107 | Ar¹-107 |
| 474 | Formula (I-1) | Ar¹-107 | Ar¹-109 |
| 475 | Formula (I-1) | Ar¹-107 | Ar¹-111 |
| 476 | Formula (I-1) | Ar¹-107 | Ar¹-114 |
| 477 | Formula (I-1) | Ar¹-107 | Ar¹-121 |
| 478 | Formula (I-1) | Ar¹-107 | Ar¹-151 |
| 479 | Formula (I-1) | Ar¹-107 | Ar¹-153 |
| 480 | Formula (I-1) | Ar¹-107 | Ar¹-162 |
| 481 | Formula (I-1) | Ar¹-108 | Ar¹-1 |
| 482 | Formula (I-1) | Ar¹-108 | Ar¹-2 |
| 483 | Formula (I-1) | Ar¹-108 | Ar¹-3 |
| 484 | Formula (I-1) | Ar¹-108 | Ar¹-4 |
| 485 | Formula (I-1) | Ar¹-108 | Ar¹-59 |
| 486 | Formula (I-1) | Ar¹-108 | Ar¹-60 |
| 487 | Formula (I-1) | Ar¹-108 | Ar¹-63 |
| 488 | Formula (I-1) | Ar¹-108 | Ar¹-65 |
| 489 | Formula (I-1) | Ar¹-108 | Ar¹-68 |
| 490 | Formula (I-1) | Ar¹-108 | Ar¹-75 |
| 491 | Formula (I-1) | Ar¹-108 | Ar¹-87 |
| 492 | Formula (I-1) | Ar¹-108 | Ar¹-91 |
| 493 | Formula (I-1) | Ar¹-108 | Ar¹-107 |
| 494 | Formula (I-1) | Ar¹-108 | Ar¹-109 |
| 495 | Formula (I-1) | Ar¹-108 | Ar¹-111 |
| 496 | Formula (I-1) | Ar¹-108 | Ar¹-114 |
| 497 | Formula (I-1) | Ar¹-108 | Ar¹-121 |
| 498 | Formula (I-1) | Ar¹-108 | Ar¹-151 |
| 499 | Formula (I-1) | Ar¹-108 | Ar¹-153 |
| 500 | Formula (I-1) | Ar¹-108 | Ar¹-162 |
| 501 | Formula (I-1) | Ar¹-109 | Ar¹-1 |
| 502 | Formula (I-1) | Ar¹-109 | Ar¹-2 |
| 503 | Formula (I-1) | Ar¹-109 | Ar¹-3 |
| 504 | Formula (I-1) | Ar¹-109 | Ar¹-4 |
| 505 | Formula (I-1) | Ar¹-109 | Ar¹-59 |
| 506 | Formula (I-1) | Ar¹-109 | Ar¹-60 |
| 507 | Formula (I-1) | Ar¹-109 | Ar¹-63 |
| 508 | Formula (I-1) | Ar¹-109 | Ar¹-65 |
| 509 | Formula (I-1) | Ar¹-109 | Ar¹-68 |
| 510 | Formula (I-1) | Ar¹-109 | Ar¹-75 |
| 511 | Formula (I-1) | Ar¹-109 | Ar¹-87 |
| 512 | Formula (I-1) | Ar¹-109 | Ar¹-91 |
| 513 | Formula (I-1) | Ar¹-109 | Ar¹-107 |
| 514 | Formula (I-1) | Ar¹-109 | Ar¹-109 |
| 515 | Formula (I-1) | Ar¹-109 | Ar¹-111 |
| 516 | Formula (I-1) | Ar¹-109 | Ar¹-114 |
| 517 | Formula (I-1) | Ar¹-109 | Ar¹-121 |
| 518 | Formula (I-1) | Ar¹-109 | Ar¹-151 |
| 519 | Formula (I-1) | Ar¹-109 | Ar¹-153 |
| 520 | Formula (I-1) | Ar¹-109 | Ar¹-162 |
| 521 | Formula (I-1) | Ar¹-110 | Ar¹-1 |
| 522 | Formula (I-1) | Ar¹-110 | Ar¹-2 |
| 523 | Formula (I-1) | Ar¹-110 | Ar¹-3 |
| 524 | Formula (I-1) | Ar¹-110 | Ar¹-4 |
| 525 | Formula (I-1) | Ar¹-110 | Ar¹-59 |
| 526 | Formula (I-1) | Ar¹-110 | Ar¹-60 |
| 527 | Formula (I-1) | Ar¹-110 | Ar¹-63 |
| 528 | Formula (I-1) | Ar¹-110 | Ar¹-65 |
| 529 | Formula (I-1) | Ar¹-110 | Ar¹-68 |
| 530 | Formula (I-1) | Ar¹-110 | Ar¹-75 |
| 531 | Formula (I-1) | Ar¹-110 | Ar¹-87 |
| 532 | Formula (I-1) | Ar¹-110 | Ar¹-91 |
| 533 | Formula (I-1) | Ar¹-110 | Ar¹-107 |
| 534 | Formula (I-1) | Ar¹-110 | Ar¹-109 |
| 535 | Formula (I-1) | Ar¹-110 | Ar¹-111 |
| 536 | Formula (I-1) | Ar¹-110 | Ar¹-114 |
| 537 | Formula (I-1) | Ar¹-110 | Ar¹-121 |
| 538 | Formula (I-1) | Ar¹-110 | Ar¹-151 |
| 539 | Formula (I-1) | Ar¹-110 | Ar¹-153 |
| 540 | Formula (I-1) | Ar¹-110 | Ar¹-162 |
| 541 | Formula (I-1) | Ar¹-111 | Ar¹-1 |
| 542 | Formula (I-1) | Ar¹-111 | Ar¹-2 |
| 543 | Formula (I-1) | Ar¹-111 | Ar¹-3 |
| 544 | Formula (I-1) | Ar¹-111 | Ar¹-4 |
| 545 | Formula (I-1) | Ar¹-111 | Ar¹-59 |
| 546 | Formula (I-1) | Ar¹-111 | Ar¹-60 |
| 547 | Formula (I-1) | Ar¹-111 | Ar¹-63 |
| 548 | Formula (I-1) | Ar¹-111 | Ar¹-65 |
| 549 | Formula (I-1) | Ar¹-111 | Ar¹-68 |
| 550 | Formula (I-1) | Ar¹-111 | Ar¹-75 |
| 551 | Formula (I-1) | Ar¹-111 | Ar¹-87 |
| 552 | Formula (I-1) | Ar¹-111 | Ar¹-91 |
| 553 | Formula (I-1) | Ar¹-111 | Ar¹-107 |
| 554 | Formula (I-1) | Ar¹-111 | Ar¹-109 |
| 555 | Formula (I-1) | Ar¹-111 | Ar¹-111 |
| 556 | Formula (I-1) | Ar¹-111 | Ar¹-114 |
| 557 | Formula (I-1) | Ar¹-111 | Ar¹-121 |
| 558 | Formula (I-1) | Ar¹-111 | Ar¹-151 |
| 559 | Formula (I-1) | Ar¹-111 | Ar¹-153 |
| 560 | Formula (I-1) | Ar¹-111 | Ar¹-162 |
| 561 | Formula (I-1) | Ar¹-112 | Ar¹-1 |
| 562 | Formula (I-1) | Ar¹-112 | Ar¹-2 |
| 563 | Formula (I-1) | Ar¹-112 | Ar¹-3 |
| 564 | Formula (I-1) | Ar¹-112 | Ar¹-4 |
| 565 | Formula (I-1) | Ar¹-112 | Ar¹-59 |
| 566 | Formula (I-1) | Ar¹-112 | Ar¹-60 |
| 567 | Formula (I-1) | Ar¹-112 | Ar¹-63 |
| 568 | Formula (I-1) | Ar¹-112 | Ar¹-65 |
| 569 | Formula (I-1) | Ar¹-112 | Ar¹-68 |
| 570 | Formula (I-1) | Ar¹-112 | Ar¹-75 |
| 571 | Formula (I-1) | Ar¹-112 | Ar¹-87 |
| 572 | Formula (I-1) | Ar¹-112 | Ar¹-91 |
| 573 | Formula (I-1) | Ar¹-112 | Ar¹-107 |
| 574 | Formula (I-1) | Ar¹-112 | Ar¹-109 |
| 575 | Formula (I-1) | Ar¹-112 | Ar¹-111 |
| 576 | Formula (I-1) | Ar¹-112 | Ar¹-114 |
| 577 | Formula (I-1) | Ar¹-112 | Ar¹-121 |
| 578 | Formula (I-1) | Ar¹-112 | Ar¹-151 |
| 579 | Formula (I-1) | Ar¹-112 | Ar¹-153 |
| 580 | Formula (I-1) | Ar¹-112 | Ar¹-162 |
| 581 | Formula (I-1) | Ar¹-113 | Ar¹-1 |
| 582 | Formula (I-1) | Ar¹-113 | Ar¹-2 |
| 583 | Formula (I-1) | Ar¹-113 | Ar¹-3 |
| 584 | Formula (I-1) | Ar¹-113 | Ar¹-4 |
| 585 | Formula (I-1) | Ar¹-113 | Ar¹-59 |
| 586 | Formula (I-1) | Ar¹-113 | Ar¹-60 |
| 587 | Formula (I-1) | Ar¹-113 | Ar¹-63 |
| 588 | Formula (I-1) | Ar¹-113 | Ar¹-65 |
| 589 | Formula (I-1) | Ar¹-113 | Ar¹-68 |
| 590 | Formula (I-1) | Ar¹-113 | Ar¹-75 |
| 591 | Formula (I-1) | Ar¹-113 | Ar¹-87 |
| 592 | Formula (I-1) | Ar¹-113 | Ar¹-91 |
| 593 | Formula (I-1) | Ar¹-113 | Ar¹-107 |
| 594 | Formula (I-1) | Ar¹-113 | Ar¹-109 |
| 595 | Formula (I-1) | Ar¹-113 | Ar¹-111 |
| 596 | Formula (I-1) | Ar¹-113 | Ar¹-114 |
| 597 | Formula (I-1) | Ar¹-113 | Ar¹-121 |
| 598 | Formula (I-1) | Ar¹-113 | Ar¹-151 |
| 599 | Formula (I-1) | Ar¹-113 | Ar¹-153 |
| 600 | Formula (I-1) | Ar¹-113 | Ar¹-162 |
| 601 | Formula (I-1) | Ar¹-114 | Ar¹-1 |
| 602 | Formula (I-1) | Ar¹-114 | Ar¹-2 |
| 603 | Formula (I-1) | Ar¹-114 | Ar¹-3 |
| 604 | Formula (I-1) | Ar¹-114 | Ar¹-4 |
| 605 | Formula (I-1) | Ar¹-114 | Ar¹-59 |
| 606 | Formula (I-1) | Ar¹-114 | Ar¹-60 |
| 607 | Formula (I-1) | Ar¹-114 | Ar¹-63 |
| 608 | Formula (I-1) | Ar¹-114 | Ar¹-65 |
| 609 | Formula (I-1) | Ar¹-114 | Ar¹-68 |
| 610 | Formula (I-1) | Ar¹-114 | Ar¹-75 |
| 611 | Formula (I-1) | Ar¹-114 | Ar¹-87 |
| 612 | Formula (I-1) | Ar¹-114 | Ar¹-91 |
| 613 | Formula (I-1) | Ar¹-114 | Ar¹-107 |
| 614 | Formula (I-1) | Ar¹-114 | Ar¹-109 |
| 615 | Formula (I-1) | Ar¹-114 | Ar¹-111 |
| 616 | Formula (I-1) | Ar¹-114 | Ar¹-114 |
| 617 | Formula (I-1) | Ar¹-114 | Ar¹-121 |
| 618 | Formula (I-1) | Ar¹-114 | Ar¹-151 |
| 619 | Formula (I-1) | Ar¹-114 | Ar¹-153 |
| 620 | Formula (I-1) | Ar¹-114 | Ar¹-162 |
| 621 | Formula (I-1) | Ar¹-117 | Ar¹-1 |

| No. | Base skeleton according to | One of the Ar¹ groups according to | Other Ar¹ groups according to |
|---|---|---|---|
| 622 | Formula (I-1) | Ar¹-117 | Ar¹-2 |
| 623 | Formula (I-1) | Ar¹-117 | Ar¹-3 |
| 624 | Formula (I-1) | Ar¹-117 | Ar¹-4 |
| 625 | Formula (I-1) | Ar¹-117 | Ar¹-59 |
| 626 | Formula (I-1) | Ar¹-117 | Ar¹-60 |
| 627 | Formula (I-1) | Ar¹-117 | Ar¹-63 |
| 628 | Formula (I-1) | Ar¹-117 | Ar¹-65 |
| 629 | Formula (I-1) | Ar¹-117 | Ar¹-68 |
| 630 | Formula (I-1) | Ar¹-117 | Ar¹-75 |
| 631 | Formula (I-1) | Ar¹-117 | Ar¹-87 |
| 632 | Formula (I-1) | Ar¹-117 | Ar¹-91 |
| 633 | Formula (I-1) | Ar¹-117 | Ar¹-107 |
| 634 | Formula (I-1) | Ar¹-117 | Ar¹-109 |
| 635 | Formula (I-1) | Ar¹-117 | Ar¹-111 |
| 636 | Formula (I-1) | Ar¹-117 | Ar¹-114 |
| 637 | Formula (I-1) | Ar¹-117 | Ar¹-121 |
| 638 | Formula (I-1) | Ar¹-117 | Ar¹-151 |
| 639 | Formula (I-1) | Ar¹-117 | Ar¹-153 |
| 640 | Formula (I-1) | Ar¹-117 | Ar¹-162 |
| 641 | Formula (I-1) | Ar¹-121 | Ar¹-1 |
| 642 | Formula (I-1) | Ar¹-121 | Ar¹-2 |
| 643 | Formula (I-1) | Ar¹-121 | Ar¹-3 |
| 644 | Formula (I-1) | Ar¹-121 | Ar¹-4 |
| 645 | Formula (I-1) | Ar¹-121 | Ar¹-59 |
| 646 | Formula (I-1) | Ar¹-121 | Ar¹-60 |
| 647 | Formula (I-1) | Ar¹-121 | Ar¹-63 |
| 648 | Formula (I-1) | Ar¹-121 | Ar¹-65 |
| 649 | Formula (I-1) | Ar¹-121 | Ar¹-68 |
| 650 | Formula (I-1) | Ar¹-121 | Ar¹-75 |
| 651 | Formula (I-1) | Ar¹-121 | Ar¹-87 |
| 652 | Formula (I-1) | Ar¹-121 | Ar¹-91 |
| 653 | Formula (I-1) | Ar¹-121 | Ar¹-107 |
| 654 | Formula (I-1) | Ar¹-121 | Ar¹-109 |
| 655 | Formula (I-1) | Ar¹-121 | Ar¹-111 |
| 656 | Formula (I-1) | Ar¹-121 | Ar¹-114 |
| 657 | Formula (I-1) | Ar¹-121 | Ar¹-121 |
| 658 | Formula (I-1) | Ar¹-121 | Ar¹-151 |
| 659 | Formula (I-1) | Ar¹-121 | Ar¹-153 |
| 660 | Formula (I-1) | Ar¹-121 | Ar¹-162 |
| 661 | Formula (I-1) | Ar¹-127 | Ar¹-1 |
| 662 | Formula (I-1) | Ar¹-127 | Ar¹-2 |
| 663 | Formula (I-1) | Ar¹-127 | Ar¹-3 |
| 664 | Formula (I-1) | Ar¹-127 | Ar¹-4 |
| 665 | Formula (I-1) | Ar¹-127 | Ar¹-59 |
| 666 | Formula (I-1) | Ar¹-127 | Ar¹-60 |
| 667 | Formula (I-1) | Ar¹-127 | Ar¹-63 |
| 668 | Formula (I-1) | Ar¹-127 | Ar¹-65 |
| 669 | Formula (I-1) | Ar¹-127 | Ar¹-68 |
| 670 | Formula (I-1) | Ar¹-127 | Ar¹-75 |
| 671 | Formula (I-1) | Ar¹-127 | Ar¹-87 |
| 672 | Formula (I-1) | Ar¹-127 | Ar¹-91 |
| 673 | Formula (I-1) | Ar¹-127 | Ar¹-107 |
| 674 | Formula (I-1) | Ar¹-127 | Ar¹-109 |
| 675 | Formula (I-1) | Ar¹-127 | Ar¹-111 |
| 676 | Formula (I-1) | Ar¹-127 | Ar¹-114 |
| 677 | Formula (I-1) | Ar¹-127 | Ar¹-121 |
| 678 | Formula (I-1) | Ar¹-127 | Ar¹-151 |
| 679 | Formula (I-1) | Ar¹-127 | Ar¹-153 |
| 680 | Formula (I-1) | Ar¹-127 | Ar¹-162 |
| 681 | Formula (I-1) | Ar¹-151 | Ar¹-1 |
| 682 | Formula (I-1) | Ar¹-151 | Ar¹-2 |
| 683 | Formula (I-1) | Ar¹-151 | Ar¹-3 |
| 684 | Formula (I-1) | Ar¹-151 | Ar¹-4 |
| 685 | Formula (I-1) | Ar¹-151 | Ar¹-59 |
| 686 | Formula (I-1) | Ar¹-151 | Ar¹-60 |
| 687 | Formula (I-1) | Ar¹-151 | Ar¹-63 |
| 688 | Formula (I-1) | Ar¹-151 | Ar¹-65 |
| 689 | Formula (I-1) | Ar¹-151 | Ar¹-68 |
| 690 | Formula (I-1) | Ar¹-151 | Ar¹-75 |
| 691 | Formula (I-1) | Ar¹-151 | Ar¹-87 |
| 692 | Formula (I-1) | Ar¹-151 | Ar¹-91 |
| 693 | Formula (I-1) | Ar¹-151 | Ar¹-107 |
| 694 | Formula (I-1) | Ar¹-151 | Ar¹-109 |
| 695 | Formula (I-1) | Ar¹-151 | Ar¹-111 |
| 696 | Formula (I-1) | Ar¹-151 | Ar¹-114 |
| 697 | Formula (I-1) | Ar¹-151 | Ar¹-121 |
| 698 | Formula (I-1) | Ar¹-151 | Ar¹-151 |
| 699 | Formula (I-1) | Ar¹-151 | Ar¹-153 |
| 700 | Formula (I-1) | Ar¹-151 | Ar¹-162 |
| 701 | Formula (I-1) | Ar¹-153 | Ar¹-1 |
| 702 | Formula (I-1) | Ar¹-153 | Ar¹-2 |
| 703 | Formula (I-1) | Ar¹-153 | Ar¹-3 |
| 704 | Formula (I-1) | Ar¹-153 | Ar¹-4 |
| 705 | Formula (I-1) | Ar¹-153 | Ar¹-59 |
| 706 | Formula (I-1) | Ar¹-153 | Ar¹-60 |
| 707 | Formula (I-1) | Ar¹-153 | Ar¹-63 |
| 708 | Formula (I-1) | Ar¹-153 | Ar¹-65 |
| 709 | Formula (I-1) | Ar¹-153 | Ar¹-68 |
| 710 | Formula (I-1) | Ar¹-153 | Ar¹-75 |
| 711 | Formula (I-1) | Ar¹-153 | Ar¹-87 |
| 712 | Formula (I-1) | Ar¹-153 | Ar¹-91 |
| 713 | Formula (I-1) | Ar¹-153 | Ar¹-107 |
| 714 | Formula (I-1) | Ar¹-153 | Ar¹-109 |
| 715 | Formula (I-1) | Ar¹-153 | Ar¹-111 |
| 716 | Formula (I-1) | Ar¹-153 | Ar¹-114 |
| 717 | Formula (I-1) | Ar¹-153 | Ar¹-121 |
| 718 | Formula (I-1) | Ar¹-153 | Ar¹-151 |
| 719 | Formula (I-1) | Ar¹-153 | Ar¹-153 |
| 720 | Formula (I-1) | Ar¹-153 | Ar¹-162 |
| 721 | Formula (I-1) | Ar¹-155 | Ar¹-1 |
| 722 | Formula (I-1) | Ar¹-155 | Ar¹-2 |
| 723 | Formula (I-1) | Ar¹-155 | Ar¹-3 |
| 724 | Formula (I-1) | Ar¹-155 | Ar¹-4 |
| 725 | Formula (I-1) | Ar¹-155 | Ar¹-59 |
| 726 | Formula (I-1) | Ar¹-155 | Ar¹-60 |
| 727 | Formula (I-1) | Ar¹-155 | Ar¹-63 |
| 728 | Formula (I-1) | Ar¹-155 | Ar¹-65 |
| 729 | Formula (I-1) | Ar¹-155 | Ar¹-68 |
| 730 | Formula (I-1) | Ar¹-155 | Ar¹-75 |
| 731 | Formula (I-1) | Ar¹-155 | Ar¹-87 |
| 732 | Formula (I-1) | Ar¹-155 | Ar¹-91 |
| 733 | Formula (I-1) | Ar¹-155 | Ar¹-107 |
| 734 | Formula (I-1) | Ar¹-155 | Ar¹-109 |
| 735 | Formula (I-1) | Ar¹-155 | Ar¹-111 |
| 736 | Formula (I-1) | Ar¹-155 | Ar¹-114 |
| 737 | Formula (I-1) | Ar¹-155 | Ar¹-121 |
| 738 | Formula (I-1) | Ar¹-155 | Ar¹-151 |
| 739 | Formula (I-1) | Ar¹-155 | Ar¹-153 |
| 740 | Formula (I-1) | Ar¹-155 | Ar¹-162 |
| 741 | Formula (I-1) | Ar¹-156 | Ar¹-1 |
| 742 | Formula (I-1) | Ar¹-156 | Ar¹-2 |
| 743 | Formula (I-1) | Ar¹-156 | Ar¹-3 |
| 744 | Formula (I-1) | Ar¹-156 | Ar¹-4 |
| 745 | Formula (I-1) | Ar¹-156 | Ar¹-59 |
| 746 | Formula (I-1) | Ar¹-156 | Ar¹-60 |
| 747 | Formula (I-1) | Ar¹-156 | Ar¹-63 |
| 748 | Formula (I-1) | Ar¹-156 | Ar¹-65 |
| 749 | Formula (I-1) | Ar¹-156 | Ar¹-68 |
| 750 | Formula (I-1) | Ar¹-156 | Ar¹-75 |
| 751 | Formula (I-1) | Ar¹-156 | Ar¹-87 |
| 752 | Formula (I-1) | Ar¹-156 | Ar¹-91 |
| 753 | Formula (I-1) | Ar¹-156 | Ar¹-107 |
| 754 | Formula (I-1) | Ar¹-156 | Ar¹-109 |
| 755 | Formula (I-1) | Ar¹-156 | Ar¹-111 |
| 756 | Formula (I-1) | Ar¹-156 | Ar¹-114 |
| 757 | Formula (I-1) | Ar¹-156 | Ar¹-121 |
| 758 | Formula (I-1) | Ar¹-156 | Ar¹-151 |
| 759 | Formula (I-1) | Ar¹-156 | Ar¹-153 |
| 760 | Formula (I-1) | Ar¹-156 | Ar¹-162 |
| 761 | Formula (I-1) | Ar¹-157 | Ar¹-1 |
| 762 | Formula (I-1) | Ar¹-157 | Ar¹-2 |
| 763 | Formula (I-1) | Ar¹-157 | Ar¹-3 |
| 764 | Formula (I-1) | Ar¹-157 | Ar¹-4 |
| 765 | Formula (I-1) | Ar¹-157 | Ar¹-59 |
| 766 | Formula (I-1) | Ar¹-157 | Ar¹-60 |
| 767 | Formula (I-1) | Ar¹-157 | Ar¹-63 |
| 768 | Formula (I-1) | Ar¹-157 | Ar¹-65 |
| 769 | Formula (I-1) | Ar¹-157 | Ar¹-68 |
| 770 | Formula (I-1) | Ar¹-157 | Ar¹-75 |
| 771 | Formula (I-1) | Ar¹-157 | Ar¹-87 |

| No. | Base skeleton according to | One of the Ar¹ groups according to | Other Ar¹ groups according to |
|---|---|---|---|
| 772 | Formula (I-1) | Ar¹-157 | Ar¹-91 |
| 773 | Formula (I-1) | Ar¹-157 | Ar¹-107 |
| 774 | Formula (I-1) | Ar¹-157 | Ar¹-109 |
| 775 | Formula (I-1) | Ar¹-157 | Ar¹-111 |
| 776 | Formula (I-1) | Ar¹-157 | Ar¹-114 |
| 777 | Formula (I-1) | Ar¹-157 | Ar¹-121 |
| 778 | Formula (I-1) | Ar¹-157 | Ar¹-151 |
| 779 | Formula (I-1) | Ar¹-157 | Ar¹-153 |
| 780 | Formula (I-1) | Ar¹-157 | Ar¹-162 |
| 781 | Formula (I-1) | Ar¹-158 | Ar¹-1 |
| 782 | Formula (I-1) | Ar¹-158 | Ar¹-2 |
| 783 | Formula (I-1) | Ar¹-158 | Ar¹-3 |
| 784 | Formula (I-1) | Ar¹-158 | Ar¹-4 |
| 785 | Formula (I-1) | Ar¹-158 | Ar¹-59 |
| 786 | Formula (I-1) | Ar¹-158 | Ar¹-60 |
| 787 | Formula (I-1) | Ar¹-158 | Ar¹-63 |
| 788 | Formula (I-1) | Ar¹-158 | Ar¹-65 |
| 789 | Formula (I-1) | Ar¹-158 | Ar¹-68 |
| 790 | Formula (I-1) | Ar¹-158 | Ar¹-75 |
| 791 | Formula (I-1) | Ar¹-158 | Ar¹-87 |
| 792 | Formula (I-1) | Ar¹-158 | Ar¹-91 |
| 793 | Formula (I-1) | Ar¹-158 | Ar¹-107 |
| 794 | Formula (I-1) | Ar¹-158 | Ar¹-109 |
| 795 | Formula (I-1) | Ar¹-158 | Ar¹-111 |
| 796 | Formula (I-1) | Ar¹-158 | Ar¹-114 |
| 797 | Formula (I-1) | Ar¹-158 | Ar¹-121 |
| 798 | Formula (I-1) | Ar¹-158 | Ar¹-151 |
| 799 | Formula (I-1) | Ar¹-158 | Ar¹-153 |
| 800 | Formula (I-1) | Ar¹-158 | Ar¹-162 |
| 801 | Formula (I-1) | Ar¹-160 | Ar¹-1 |
| 802 | Formula (I-1) | Ar¹-160 | Ar¹-2 |
| 803 | Formula (I-1) | Ar¹-160 | Ar¹-3 |
| 804 | Formula (I-1) | Ar¹-160 | Ar¹-4 |
| 805 | Formula (I-1) | Ar¹-160 | Ar¹-59 |
| 806 | Formula (I-1) | Ar¹-160 | Ar¹-60 |
| 807 | Formula (I-1) | Ar¹-160 | Ar¹-63 |
| 808 | Formula (I-1) | Ar¹-160 | Ar¹-65 |
| 809 | Formula (I-1) | Ar¹-160 | Ar¹-68 |
| 810 | Formula (I-1) | Ar¹-160 | Ar¹-75 |
| 811 | Formula (I-1) | Ar¹-160 | Ar¹-87 |
| 812 | Formula (I-1) | Ar¹-160 | Ar¹-91 |
| 813 | Formula (I-1) | Ar¹-160 | Ar¹-107 |
| 814 | Formula (I-1) | Ar¹-160 | Ar¹-109 |
| 815 | Formula (I-1) | Ar¹-160 | Ar¹-111 |
| 816 | Formula (I-1) | Ar¹-160 | Ar¹-114 |
| 817 | Formula (I-1) | Ar¹-160 | Ar¹-121 |
| 818 | Formula (I-1) | Ar¹-160 | Ar¹-151 |
| 819 | Formula (I-1) | Ar¹-160 | Ar¹-153 |
| 820 | Formula (I-1) | Ar¹-160 | Ar¹-162 |
| 821 | Formula (I-1) | Ar¹-162 | Ar¹-1 |
| 822 | Formula (I-1) | Ar¹-162 | Ar¹-2 |
| 823 | Formula (I-1) | Ar¹-162 | Ar¹-3 |
| 824 | Formula (I-1) | Ar¹-162 | Ar¹-4 |
| 825 | Formula (I-1) | Ar¹-162 | Ar¹-59 |
| 826 | Formula (I-1) | Ar¹-162 | Ar¹-60 |
| 827 | Formula (I-1) | Ar¹-162 | Ar¹-63 |
| 828 | Formula (I-1) | Ar¹-162 | Ar¹-65 |
| 829 | Formula (I-1) | Ar¹-162 | Ar¹-68 |
| 830 | Formula (I-1) | Ar¹-162 | Ar¹-75 |
| 831 | Formula (I-1) | Ar¹-162 | Ar¹-87 |
| 832 | Formula (I-1) | Ar¹-162 | Ar¹-91 |
| 833 | Formula (I-1) | Ar¹-162 | Ar¹-107 |
| 834 | Formula (I-1) | Ar¹-162 | Ar¹-109 |
| 835 | Formula (I-1) | Ar¹-162 | Ar¹-111 |
| 836 | Formula (I-1) | Ar¹-162 | Ar¹-114 |
| 837 | Formula (I-1) | Ar¹-162 | Ar¹-121 |
| 838 | Formula (I-1) | Ar¹-162 | Ar¹-151 |
| 839 | Formula (I-1) | Ar¹-162 | Ar¹-153 |
| 840 | Formula (I-1) | Ar¹-162 | Ar¹-162 |
| 841 | Formula (I-1) | Ar¹-163 | Ar¹-1 |
| 842 | Formula (I-1) | Ar¹-163 | Ar¹-2 |
| 843 | Formula (I-1) | Ar¹-163 | Ar¹-3 |
| 844 | Formula (I-1) | Ar¹-163 | Ar¹-4 |
| 845 | Formula (I-1) | Ar¹-163 | Ar¹-59 |
| 846 | Formula (I-1) | Ar¹-163 | Ar¹-60 |
| 847 | Formula (I-1) | Ar¹-163 | Ar¹-63 |
| 848 | Formula (I-1) | Ar¹-163 | Ar¹-65 |
| 849 | Formula (I-1) | Ar¹-163 | Ar¹-68 |
| 850 | Formula (I-1) | Ar¹-163 | Ar¹-75 |
| 851 | Formula (I-1) | Ar¹-163 | Ar¹-87 |
| 852 | Formula (I-1) | Ar¹-163 | Ar¹-91 |
| 853 | Formula (I-1) | Ar¹-163 | Ar¹-107 |
| 854 | Formula (I-1) | Ar¹-163 | Ar¹-109 |
| 855 | Formula (I-1) | Ar¹-163 | Ar¹-111 |
| 856 | Formula (I-1) | Ar¹-163 | Ar¹-114 |
| 857 | Formula (I-1) | Ar¹-163 | Ar¹-121 |
| 858 | Formula (I-1) | Ar¹-163 | Ar¹-151 |
| 859 | Formula (I-1) | Ar¹-163 | Ar¹-153 |
| 860 | Formula (I-1) | Ar¹-163 | Ar¹-162 |
| 861 | Formula (I-1) | Ar¹-164 | Ar¹-1 |
| 862 | Formula (I-1) | Ar¹-164 | Ar¹-2 |
| 863 | Formula (I-1) | Ar¹-164 | Ar¹-3 |
| 864 | Formula (I-1) | Ar¹-164 | Ar¹-4 |
| 865 | Formula (I-1) | Ar¹-164 | Ar¹-59 |
| 866 | Formula (I-1) | Ar¹-164 | Ar¹-60 |
| 867 | Formula (I-1) | Ar¹-164 | Ar¹-63 |
| 868 | Formula (I-1) | Ar¹-164 | Ar¹-65 |
| 869 | Formula (I-1) | Ar¹-164 | Ar¹-68 |
| 870 | Formula (I-1) | Ar¹-164 | Ar¹-75 |
| 871 | Formula (I-1) | Ar¹-164 | Ar¹-87 |
| 872 | Formula (I-1) | Ar¹-164 | Ar¹-91 |
| 873 | Formula (I-1) | Ar¹-164 | Ar¹-107 |
| 874 | Formula (I-1) | Ar¹-164 | Ar¹-109 |
| 875 | Formula (I-1) | Ar¹-164 | Ar¹-111 |
| 876 | Formula (I-1) | Ar¹-164 | Ar¹-114 |
| 877 | Formula (I-1) | Ar¹-164 | Ar¹-121 |
| 878 | Formula (I-1) | Ar¹-164 | Ar¹-151 |
| 879 | Formula (I-1) | Ar¹-164 | Ar¹-153 |
| 880 | Formula (I-1) | Ar¹-164 | Ar¹-162 |
| 881 | Formula (I-1) | Ar¹-165 | Ar¹-1 |
| 882 | Formula (I-1) | Ar¹-165 | Ar¹-2 |
| 883 | Formula (I-1) | Ar¹-165 | Ar¹-3 |
| 884 | Formula (I-1) | Ar¹-165 | Ar¹-4 |
| 885 | Formula (I-1) | Ar¹-165 | Ar¹-59 |
| 886 | Formula (I-1) | Ar¹-165 | Ar¹-60 |
| 887 | Formula (I-1) | Ar¹-165 | Ar¹-63 |
| 888 | Formula (I-1) | Ar¹-165 | Ar¹-65 |
| 889 | Formula (I-1) | Ar¹-165 | Ar¹-68 |
| 890 | Formula (I-1) | Ar¹-165 | Ar¹-75 |
| 891 | Formula (I-1) | Ar¹-165 | Ar¹-87 |
| 892 | Formula (I-1) | Ar¹-165 | Ar¹-91 |
| 893 | Formula (I-1) | Ar¹-165 | Ar¹-107 |
| 894 | Formula (I-1) | Ar¹-165 | Ar¹-109 |
| 895 | Formula (I-1) | Ar¹-165 | Ar¹-111 |
| 896 | Formula (I-1) | Ar¹-165 | Ar¹-114 |
| 897 | Formula (I-1) | Ar¹-165 | Ar¹-121 |
| 898 | Formula (I-1) | Ar¹-165 | Ar¹-151 |
| 899 | Formula (I-1) | Ar¹-165 | Ar¹-153 |
| 900 | Formula (I-1) | Ar¹-165 | Ar¹-162 |
| 901 | Formula (I-1) | Ar¹-189 | Ar¹-1 |
| 902 | Formula (I-1) | Ar¹-189 | Ar¹-2 |
| 903 | Formula (I-1) | Ar¹-189 | Ar¹-3 |
| 904 | Formula (I-1) | Ar¹-189 | Ar¹-4 |
| 905 | Formula (I-1) | Ar¹-189 | Ar¹-59 |
| 906 | Formula (I-1) | Ar¹-189 | Ar¹-60 |
| 907 | Formula (I-1) | Ar¹-189 | Ar¹-63 |
| 908 | Formula (I-1) | Ar¹-189 | Ar¹-65 |
| 909 | Formula (I-1) | Ar¹-189 | Ar¹-68 |
| 910 | Formula (I-1) | Ar¹-189 | Ar¹-75 |
| 911 | Formula (I-1) | Ar¹-189 | Ar¹-87 |
| 912 | Formula (I-1) | Ar¹-189 | Ar¹-91 |
| 913 | Formula (I-1) | Ar¹-189 | Ar¹-107 |
| 914 | Formula (I-1) | Ar¹-189 | Ar¹-109 |
| 915 | Formula (I-1) | Ar¹-189 | Ar¹-111 |
| 916 | Formula (I-1) | Ar¹-189 | Ar¹-114 |
| 917 | Formula (I-1) | Ar¹-189 | Ar¹-121 |
| 918 | Formula (I-1) | Ar¹-189 | Ar¹-151 |
| 919 | Formula (I-1) | Ar¹-189 | Ar¹-153 |
| 920 | Formula (I-1) | Ar¹-189 | Ar¹-162 |
| 921 | Formula (I-1) | Ar¹-192 | Ar¹-1 |

-continued

| No. | Base skeleton according to | One of the Ar¹ groups according to | Other Ar¹ groups according to |
|---|---|---|---|
| 922 | Formula (I-1) | Ar¹-192 | Ar¹-2 |
| 923 | Formula (I-1) | Ar¹-192 | Ar¹-3 |
| 924 | Formula (I-1) | Ar¹-192 | Ar¹-4 |
| 925 | Formula (I-1) | Ar¹-192 | Ar¹-59 |
| 926 | Formula (I-1) | Ar¹-192 | Ar¹-60 |
| 927 | Formula (I-1) | Ar¹-192 | Ar¹-63 |
| 928 | Formula (I-1) | Ar¹-192 | Ar¹-65 |
| 929 | Formula (I-1) | Ar¹-192 | Ar¹-68 |
| 930 | Formula (I-1) | Ar¹-192 | Ar¹-75 |
| 931 | Formula (I-1) | Ar¹-192 | Ar¹-87 |
| 932 | Formula (I-1) | Ar¹-192 | Ar¹-91 |
| 933 | Formula (I-1) | Ar¹-192 | Ar¹-107 |
| 934 | Formula (I-1) | Ar¹-192 | Ar¹-109 |
| 935 | Formula (I-1) | Ar¹-192 | Ar¹-111 |
| 936 | Formula (I-1) | Ar¹-192 | Ar¹-114 |
| 937 | Formula (I-1) | Ar¹-192 | Ar¹-121 |
| 938 | Formula (I-1) | Ar¹-192 | Ar¹-151 |
| 939 | Formula (I-1) | Ar¹-192 | Ar¹-153 |
| 940 | Formula (I-1) | Ar¹-192 | Ar¹-162 |
| 941 | Formula (I-1) | Ar¹-234 | Ar¹-1 |
| 942 | Formula (I-1) | Ar¹-234 | Ar¹-2 |
| 943 | Formula (I-1) | Ar¹-234 | Ar¹-3 |
| 944 | Formula (I-1) | Ar¹-234 | Ar¹-4 |
| 945 | Formula (I-1) | Ar¹-234 | Ar¹-59 |
| 946 | Formula (I-1) | Ar¹-234 | Ar¹-60 |
| 947 | Formula (I-1) | Ar¹-234 | Ar¹-63 |
| 948 | Formula (I-1) | Ar¹-234 | Ar¹-65 |
| 949 | Formula (I-1) | Ar¹-234 | Ar¹-68 |
| 950 | Formula (I-1) | Ar¹-234 | Ar¹-75 |
| 951 | Formula (I-1) | Ar¹-234 | Ar¹-87 |
| 952 | Formula (I-1) | Ar¹-234 | Ar¹-91 |
| 953 | Formula (I-1) | Ar¹-234 | Ar¹-107 |
| 954 | Formula (I-1) | Ar¹-234 | Ar¹-109 |
| 955 | Formula (I-1) | Ar¹-234 | Ar¹-111 |
| 956 | Formula (I-1) | Ar¹-234 | Ar¹-114 |
| 957 | Formula (I-1) | Ar¹-234 | Ar¹-121 |
| 958 | Formula (I-1) | Ar¹-234 | Ar¹-151 |
| 959 | Formula (I-1) | Ar¹-234 | Ar¹-153 |
| 960 | Formula (I-1) | Ar¹-234 | Ar¹-162 |
| 961 | Formula (I-1) | Ar¹-237 | Ar¹-1 |
| 962 | Formula (I-1) | Ar¹-237 | Ar¹-2 |
| 963 | Formula (I-1) | Ar¹-237 | Ar¹-3 |
| 964 | Formula (I-1) | Ar¹-237 | Ar¹-4 |
| 965 | Formula (I-1) | Ar¹-237 | Ar¹-59 |
| 966 | Formula (I-1) | Ar¹-237 | Ar¹-60 |
| 967 | Formula (I-1) | Ar¹-237 | Ar¹-63 |
| 968 | Formula (I-1) | Ar¹-237 | Ar¹-65 |
| 969 | Formula (I-1) | Ar¹-237 | Ar¹-68 |
| 970 | Formula (I-1) | Ar¹-237 | Ar¹-75 |
| 971 | Formula (I-1) | Ar¹-237 | Ar¹-87 |
| 972 | Formula (I-1) | Ar¹-237 | Ar¹-91 |
| 973 | Formula (I-1) | Ar¹-237 | Ar¹-107 |
| 974 | Formula (I-1) | Ar¹-237 | Ar¹-109 |
| 975 | Formula (I-1) | Ar¹-237 | Ar¹-111 |
| 976 | Formula (I-1) | Ar¹-237 | Ar¹-114 |
| 977 | Formula (I-1) | Ar¹-237 | Ar¹-121 |
| 978 | Formula (I-1) | Ar¹-237 | Ar¹-151 |
| 979 | Formula (I-1) | Ar¹-237 | Ar¹-153 |
| 980 | Formula (I-1) | Ar¹-237 | Ar¹-162 |
| 981 | Formula (I-2) | Ar¹-1 | Ar¹-1 |
| 982 | Formula (I-2) | Ar¹-1 | Ar¹-2 |
| 983 | Formula (I-2) | Ar¹-1 | Ar¹-3 |
| 984 | Formula (I-2) | Ar¹-1 | Ar¹-4 |
| 985 | Formula (I-2) | Ar¹-1 | Ar¹-59 |
| 986 | Formula (I-2) | Ar¹-1 | Ar¹-60 |
| 987 | Formula (I-2) | Ar¹-1 | Ar¹-63 |
| 988 | Formula (I-2) | Ar¹-1 | Ar¹-65 |
| 989 | Formula (I-2) | Ar¹-1 | Ar¹-68 |
| 990 | Formula (I-2) | Ar¹-1 | Ar¹-75 |
| 991 | Formula (I-2) | Ar¹-1 | Ar¹-87 |
| 992 | Formula (I-2) | Ar¹-1 | Ar¹-91 |
| 993 | Formula (I-2) | Ar¹-1 | Ar¹-107 |
| 994 | Formula (I-2) | Ar¹-1 | Ar¹-109 |
| 995 | Formula (I-2) | Ar¹-1 | Ar¹-111 |
| 996 | Formula (I-2) | Ar¹-1 | Ar¹-114 |
| 997 | Formula (I-2) | Ar¹-1 | Ar¹-121 |
| 998 | Formula (I-2) | Ar¹-1 | Ar¹-151 |
| 999 | Formula (I-2) | Ar¹-1 | Ar¹-153 |
| 1000 | Formula (I-2) | Ar¹-1 | Ar¹-162 |
| 1001 | Formula (I-2) | Ar¹-2 | Ar¹-1 |
| 1002 | Formula (I-2) | Ar¹-2 | Ar¹-2 |
| 1003 | Formula (I-2) | Ar¹-2 | Ar¹-3 |
| 1004 | Formula (I-2) | Ar¹-2 | Ar¹-4 |
| 1005 | Formula (I-2) | Ar¹-2 | Ar¹-59 |
| 1006 | Formula (I-2) | Ar¹-2 | Ar¹-60 |
| 1007 | Formula (I-2) | Ar¹-2 | Ar¹-63 |
| 1008 | Formula (I-2) | Ar¹-2 | Ar¹-65 |
| 1009 | Formula (I-2) | Ar¹-2 | Ar¹-68 |
| 1010 | Formula (I-2) | Ar¹-2 | Ar¹-75 |
| 1011 | Formula (I-2) | Ar¹-2 | Ar¹-87 |
| 1012 | Formula (I-2) | Ar¹-2 | Ar¹-91 |
| 1013 | Formula (I-2) | Ar¹-2 | Ar¹-107 |
| 1014 | Formula (I-2) | Ar¹-2 | Ar¹-109 |
| 1015 | Formula (I-2) | Ar¹-2 | Ar¹-111 |
| 1016 | Formula (I-2) | Ar¹-2 | Ar¹-114 |
| 1017 | Formula (I-2) | Ar¹-2 | Ar¹-121 |
| 1018 | Formula (I-2) | Ar¹-2 | Ar¹-151 |
| 1019 | Formula (I-2) | Ar¹-2 | Ar¹-153 |
| 1020 | Formula (I-2) | Ar¹-2 | Ar¹-162 |
| 1021 | Formula (I-2) | Ar¹-3 | Ar¹-1 |
| 1022 | Formula (I-2) | Ar¹-3 | Ar¹-2 |
| 1023 | Formula (I-2) | Ar¹-3 | Ar¹-3 |
| 1024 | Formula (I-2) | Ar¹-3 | Ar¹-4 |
| 1025 | Formula (I-2) | Ar¹-3 | Ar¹-59 |
| 1026 | Formula (I-2) | Ar¹-3 | Ar¹-60 |
| 1027 | Formula (I-2) | Ar¹-3 | Ar¹-63 |
| 1028 | Formula (I-2) | Ar¹-3 | Ar¹-65 |
| 1029 | Formula (I-2) | Ar¹-3 | Ar¹-68 |
| 1030 | Formula (I-2) | Ar¹-3 | Ar¹-75 |
| 1031 | Formula (I-2) | Ar¹-3 | Ar¹-87 |
| 1032 | Formula (I-2) | Ar¹-3 | Ar¹-91 |
| 1033 | Formula (I-2) | Ar¹-3 | Ar¹-107 |
| 1034 | Formula (I-2) | Ar¹-3 | Ar¹-109 |
| 1035 | Formula (I-2) | Ar¹-3 | Ar¹-111 |
| 1036 | Formula (I-2) | Ar¹-3 | Ar¹-114 |
| 1037 | Formula (I-2) | Ar¹-3 | Ar¹-121 |
| 1038 | Formula (I-2) | Ar¹-3 | Ar¹-151 |
| 1039 | Formula (I-2) | Ar¹-3 | Ar¹-153 |
| 1040 | Formula (I-2) | Ar¹-3 | Ar¹-162 |
| 1041 | Formula (I-2) | Ar¹-4 | Ar¹-1 |
| 1042 | Formula (I-2) | Ar¹-4 | Ar¹-2 |
| 1043 | Formula (I-2) | Ar¹-4 | Ar¹-3 |
| 1044 | Formula (I-2) | Ar¹-4 | Ar¹-4 |
| 1045 | Formula (I-2) | Ar¹-4 | Ar¹-59 |
| 1046 | Formula (I-2) | Ar¹-4 | Ar¹-60 |
| 1047 | Formula (I-2) | Ar¹-4 | Ar¹-63 |
| 1048 | Formula (I-2) | Ar¹-4 | Ar¹-65 |
| 1049 | Formula (I-2) | Ar¹-4 | Ar¹-68 |
| 1050 | Formula (I-2) | Ar¹-4 | Ar¹-75 |
| 1051 | Formula (I-2) | Ar¹-4 | Ar¹-87 |
| 1052 | Formula (I-2) | Ar¹-4 | Ar¹-91 |
| 1053 | Formula (I-2) | Ar¹-4 | Ar¹-107 |
| 1054 | Formula (I-2) | Ar¹-4 | Ar¹-109 |
| 1055 | Formula (I-2) | Ar¹-4 | Ar¹-111 |
| 1056 | Formula (I-2) | Ar¹-4 | Ar¹-114 |
| 1057 | Formula (I-2) | Ar¹-4 | Ar¹-121 |
| 1058 | Formula (I-2) | Ar¹-4 | Ar¹-151 |
| 1059 | Formula (I-2) | Ar¹-4 | Ar¹-153 |
| 1060 | Formula (I-2) | Ar¹-4 | Ar¹-162 |
| 1061 | Formula (I-2) | Ar¹-5 | Ar¹-1 |
| 1062 | Formula (I-2) | Ar¹-5 | Ar¹-2 |
| 1063 | Formula (I-2) | Ar¹-5 | Ar¹-3 |
| 1064 | Formula (I-2) | Ar¹-5 | Ar¹-4 |
| 1065 | Formula (I-2) | Ar¹-5 | Ar¹-59 |
| 1066 | Formula (I-2) | Ar¹-5 | Ar¹-60 |
| 1067 | Formula (I-2) | Ar¹-5 | Ar¹-63 |
| 1068 | Formula (I-2) | Ar¹-5 | Ar¹-65 |
| 1069 | Formula (I-2) | Ar¹-5 | Ar¹-68 |
| 1070 | Formula (I-2) | Ar¹-5 | Ar¹-75 |
| 1071 | Formula (I-2) | Ar¹-5 | Ar¹-87 |

| No. | Base skeleton according to | One of the Ar¹ groups according to | Other Ar¹ groups according to |
|---|---|---|---|
| 1072 | Formula (I-2) | Ar¹-5 | Ar¹-91 |
| 1073 | Formula (I-2) | Ar¹-5 | Ar¹-107 |
| 1074 | Formula (I-2) | Ar¹-5 | Ar¹-109 |
| 1075 | Formula (I-2) | Ar¹-5 | Ar¹-111 |
| 1076 | Formula (I-2) | Ar¹-5 | Ar¹-114 |
| 1077 | Formula (I-2) | Ar¹-5 | Ar¹-121 |
| 1078 | Formula (I-2) | Ar¹-5 | Ar¹-151 |
| 1079 | Formula (I-2) | Ar¹-5 | Ar¹-153 |
| 1080 | Formula (I-2) | Ar¹-5 | Ar¹-162 |
| 1081 | Formula (I-2) | Ar¹-59 | Ar¹-1 |
| 1082 | Formula (I-2) | Ar¹-59 | Ar¹-2 |
| 1083 | Formula (I-2) | Ar¹-59 | Ar¹-3 |
| 1084 | Formula (I-2) | Ar¹-59 | Ar¹-4 |
| 1085 | Formula (I-2) | Ar¹-59 | Ar¹-59 |
| 1086 | Formula (I-2) | Ar¹-59 | Ar¹-60 |
| 1087 | Formula (I-2) | Ar¹-59 | Ar¹-63 |
| 1088 | Formula (I-2) | Ar¹-59 | Ar¹-65 |
| 1089 | Formula (I-2) | Ar¹-59 | Ar¹-68 |
| 1090 | Formula (I-2) | Ar¹-59 | Ar¹-75 |
| 1091 | Formula (I-2) | Ar¹-59 | Ar¹-87 |
| 1092 | Formula (I-2) | Ar¹-59 | Ar¹-91 |
| 1093 | Formula (I-2) | Ar¹-59 | Ar¹-107 |
| 1094 | Formula (I-2) | Ar¹-59 | Ar¹-109 |
| 1095 | Formula (I-2) | Ar¹-59 | Ar¹-111 |
| 1096 | Formula (I-2) | Ar¹-59 | Ar¹-114 |
| 1097 | Formula (I-2) | Ar¹-59 | Ar¹-121 |
| 1098 | Formula (I-2) | Ar¹-59 | Ar¹-151 |
| 1099 | Formula (I-2) | Ar¹-59 | Ar¹-153 |
| 1100 | Formula (I-2) | Ar¹-59 | Ar¹-162 |
| 1101 | Formula (I-2) | Ar¹-60 | Ar¹-1 |
| 1102 | Formula (I-2) | Ar¹-60 | Ar¹-2 |
| 1103 | Formula (I-2) | Ar¹-60 | Ar¹-3 |
| 1104 | Formula (I-2) | Ar¹-60 | Ar¹-4 |
| 1105 | Formula (I-2) | Ar¹-60 | Ar¹-59 |
| 1106 | Formula (I-2) | Ar¹-60 | Ar¹-60 |
| 1107 | Formula (I-2) | Ar¹-60 | Ar¹-63 |
| 1108 | Formula (I-2) | Ar¹-60 | Ar¹-65 |
| 1109 | Formula (I-2) | Ar¹-60 | Ar¹-68 |
| 1110 | Formula (I-2) | Ar¹-60 | Ar¹-75 |
| 1111 | Formula (I-2) | Ar¹-60 | Ar¹-87 |
| 1112 | Formula (I-2) | Ar¹-60 | Ar¹-91 |
| 1113 | Formula (I-2) | Ar¹-60 | Ar¹-107 |
| 1114 | Formula (I-2) | Ar¹-60 | Ar¹-109 |
| 1115 | Formula (I-2) | Ar¹-60 | Ar¹-111 |
| 1116 | Formula (I-2) | Ar¹-60 | Ar¹-114 |
| 1117 | Formula (I-2) | Ar¹-60 | Ar¹-121 |
| 1118 | Formula (I-2) | Ar¹-60 | Ar¹-151 |
| 1119 | Formula (I-2) | Ar¹-60 | Ar¹-153 |
| 1120 | Formula (I-2) | Ar¹-60 | Ar¹-162 |
| 1121 | Formula (I-2) | Ar¹-61 | Ar¹-1 |
| 1122 | Formula (I-2) | Ar¹-61 | Ar¹-2 |
| 1123 | Formula (I-2) | Ar¹-61 | Ar¹-3 |
| 1124 | Formula (I-2) | Ar¹-61 | Ar¹-4 |
| 1125 | Formula (I-2) | Ar¹-61 | Ar¹-59 |
| 1126 | Formula (I-2) | Ar¹-61 | Ar¹-60 |
| 1127 | Formula (I-2) | Ar¹-61 | Ar¹-63 |
| 1128 | Formula (I-2) | Ar¹-61 | Ar¹-65 |
| 1129 | Formula (I-2) | Ar¹-61 | Ar¹-68 |
| 1130 | Formula (I-2) | Ar¹-61 | Ar¹-75 |
| 1131 | Formula (I-2) | Ar¹-61 | Ar¹-87 |
| 1132 | Formula (I-2) | Ar¹-61 | Ar¹-91 |
| 1133 | Formula (I-2) | Ar¹-61 | Ar¹-107 |
| 1134 | Formula (I-2) | Ar¹-61 | Ar¹-109 |
| 1135 | Formula (I-2) | Ar¹-61 | Ar¹-111 |
| 1136 | Formula (I-2) | Ar¹-61 | Ar¹-114 |
| 1137 | Formula (I-2) | Ar¹-61 | Ar¹-121 |
| 1138 | Formula (I-2) | Ar¹-61 | Ar¹-151 |
| 1139 | Formula (I-2) | Ar¹-61 | Ar¹-153 |
| 1140 | Formula (I-2) | Ar¹-61 | Ar¹-162 |
| 1141 | Formula (I-2) | Ar¹-62 | Ar¹-1 |
| 1142 | Formula (I-2) | Ar¹-62 | Ar¹-2 |
| 1143 | Formula (I-2) | Ar¹-62 | Ar¹-3 |
| 1144 | Formula (I-2) | Ar¹-62 | Ar¹-4 |
| 1145 | Formula (I-2) | Ar¹-62 | Ar¹-59 |
| 1146 | Formula (I-2) | Ar¹-62 | Ar¹-60 |
| 1147 | Formula (I-2) | Ar¹-62 | Ar¹-63 |
| 1148 | Formula (I-2) | Ar¹-62 | Ar¹-65 |
| 1149 | Formula (I-2) | Ar¹-62 | Ar¹-68 |
| 1150 | Formula (I-2) | Ar¹-62 | Ar¹-75 |
| 1151 | Formula (I-2) | Ar¹-62 | Ar¹-87 |
| 1152 | Formula (I-2) | Ar¹-62 | Ar¹-91 |
| 1153 | Formula (I-2) | Ar¹-62 | Ar¹-107 |
| 1154 | Formula (I-2) | Ar¹-62 | Ar¹-109 |
| 1155 | Formula (I-2) | Ar¹-62 | Ar¹-111 |
| 1156 | Formula (I-2) | Ar¹-62 | Ar¹-114 |
| 1157 | Formula (I-2) | Ar¹-62 | Ar¹-121 |
| 1158 | Formula (I-2) | Ar¹-62 | Ar¹-151 |
| 1159 | Formula (I-2) | Ar¹-62 | Ar¹-153 |
| 1160 | Formula (I-2) | Ar¹-62 | Ar¹-162 |
| 1161 | Formula (I-2) | Ar¹-63 | Ar¹-1 |
| 1162 | Formula (I-2) | Ar¹-63 | Ar¹-2 |
| 1163 | Formula (I-2) | Ar¹-63 | Ar¹-3 |
| 1164 | Formula (I-2) | Ar¹-63 | Ar¹-4 |
| 1165 | Formula (I-2) | Ar¹-63 | Ar¹-59 |
| 1166 | Formula (I-2) | Ar¹-63 | Ar¹-60 |
| 1167 | Formula (I-2) | Ar¹-63 | Ar¹-63 |
| 1168 | Formula (I-2) | Ar¹-63 | Ar¹-65 |
| 1169 | Formula (I-2) | Ar¹-63 | Ar¹-68 |
| 1170 | Formula (I-2) | Ar¹-63 | Ar¹-75 |
| 1171 | Formula (I-2) | Ar¹-63 | Ar¹-87 |
| 1172 | Formula (I-2) | Ar¹-63 | Ar¹-91 |
| 1173 | Formula (I-2) | Ar¹-63 | Ar¹-107 |
| 1174 | Formula (I-2) | Ar¹-63 | Ar¹-109 |
| 1175 | Formula (I-2) | Ar¹-63 | Ar¹-111 |
| 1176 | Formula (I-2) | Ar¹-63 | Ar¹-114 |
| 1177 | Formula (I-2) | Ar¹-63 | Ar¹-121 |
| 1178 | Formula (I-2) | Ar¹-63 | Ar¹-151 |
| 1179 | Formula (I-2) | Ar¹-63 | Ar¹-153 |
| 1180 | Formula (I-2) | Ar¹-63 | Ar¹-162 |
| 1181 | Formula (I-2) | Ar¹-64 | Ar¹-1 |
| 1182 | Formula (I-2) | Ar¹-64 | Ar¹-2 |
| 1183 | Formula (I-2) | Ar¹-64 | Ar¹-3 |
| 1184 | Formula (I-2) | Ar¹-64 | Ar¹-4 |
| 1185 | Formula (I-2) | Ar¹-64 | Ar¹-59 |
| 1186 | Formula (I-2) | Ar¹-64 | Ar¹-60 |
| 1187 | Formula (I-2) | Ar¹-64 | Ar¹-63 |
| 1188 | Formula (I-2) | Ar¹-64 | Ar¹-65 |
| 1189 | Formula (I-2) | Ar¹-64 | Ar¹-68 |
| 1190 | Formula (I-2) | Ar¹-64 | Ar¹-75 |
| 1191 | Formula (I-2) | Ar¹-64 | Ar¹-87 |
| 1192 | Formula (I-2) | Ar¹-64 | Ar¹-91 |
| 1193 | Formula (I-2) | Ar¹-64 | Ar¹-107 |
| 1194 | Formula (I-2) | Ar¹-64 | Ar¹-109 |
| 1195 | Formula (I-2) | Ar¹-64 | Ar¹-111 |
| 1196 | Formula (I-2) | Ar¹-64 | Ar¹-114 |
| 1197 | Formula (I-2) | Ar¹-64 | Ar¹-121 |
| 1198 | Formula (I-2) | Ar¹-64 | Ar¹-151 |
| 1199 | Formula (I-2) | Ar¹-64 | Ar¹-153 |
| 1200 | Formula (I-2) | Ar¹-64 | Ar¹-162 |
| 1201 | Formula (I-2) | Ar¹-65 | Ar¹-1 |
| 1202 | Formula (I-2) | Ar¹-65 | Ar¹-2 |
| 1203 | Formula (I-2) | Ar¹-65 | Ar¹-3 |
| 1204 | Formula (I-2) | Ar¹-65 | Ar¹-4 |
| 1205 | Formula (I-2) | Ar¹-65 | Ar¹-59 |
| 1206 | Formula (I-2) | Ar¹-65 | Ar¹-60 |
| 1207 | Formula (I-2) | Ar¹-65 | Ar¹-63 |
| 1208 | Formula (I-2) | Ar¹-65 | Ar¹-65 |
| 1209 | Formula (I-2) | Ar¹-65 | Ar¹-68 |
| 1210 | Formula (I-2) | Ar¹-65 | Ar¹-75 |
| 1211 | Formula (I-2) | Ar¹-65 | Ar¹-87 |
| 1212 | Formula (I-2) | Ar¹-65 | Ar¹-91 |
| 1213 | Formula (I-2) | Ar¹-65 | Ar¹-107 |
| 1214 | Formula (I-2) | Ar¹-65 | Ar¹-109 |
| 1215 | Formula (I-2) | Ar¹-65 | Ar¹-111 |
| 1216 | Formula (I-2) | Ar¹-65 | Ar¹-114 |
| 1217 | Formula (I-2) | Ar¹-65 | Ar¹-121 |
| 1218 | Formula (I-2) | Ar¹-65 | Ar¹-151 |
| 1219 | Formula (I-2) | Ar¹-65 | Ar¹-153 |
| 1220 | Formula (I-2) | Ar¹-65 | Ar¹-162 |
| 1221 | Formula (I-2) | Ar¹-66 | Ar¹-1 |

| No. | Base skeleton according to | One of the Ar¹ groups according to | Other Ar¹ groups according to |
|---|---|---|---|
| 1222 | Formula (I-2) | Ar¹-66 | Ar¹-2 |
| 1223 | Formula (I-2) | Ar¹-66 | Ar¹-3 |
| 1224 | Formula (I-2) | Ar¹-66 | Ar¹-4 |
| 1225 | Formula (I-2) | Ar¹-66 | Ar¹-59 |
| 1226 | Formula (I-2) | Ar¹-66 | Ar¹-60 |
| 1227 | Formula (I-2) | Ar¹-66 | Ar¹-63 |
| 1228 | Formula (I-2) | Ar¹-66 | Ar¹-65 |
| 1229 | Formula (I-2) | Ar¹-66 | Ar¹-68 |
| 1230 | Formula (I-2) | Ar¹-66 | Ar¹-75 |
| 1231 | Formula (I-2) | Ar¹-66 | Ar¹-87 |
| 1232 | Formula (I-2) | Ar¹-66 | Ar¹-91 |
| 1233 | Formula (I-2) | Ar¹-66 | Ar¹-107 |
| 1234 | Formula (I-2) | Ar¹-66 | Ar¹-109 |
| 1235 | Formula (I-2) | Ar¹-66 | Ar¹-111 |
| 1236 | Formula (I-2) | Ar¹-66 | Ar¹-114 |
| 1237 | Formula (I-2) | Ar¹-66 | Ar¹-121 |
| 1238 | Formula (I-2) | Ar¹-66 | Ar¹-151 |
| 1239 | Formula (I-2) | Ar¹-66 | Ar¹-153 |
| 1240 | Formula (I-2) | Ar¹-66 | Ar¹-162 |
| 1241 | Formula (I-2) | Ar¹-68 | Ar¹-1 |
| 1242 | Formula (I-2) | Ar¹-68 | Ar¹-2 |
| 1243 | Formula (I-2) | Ar¹-68 | Ar¹-3 |
| 1244 | Formula (I-2) | Ar¹-68 | Ar¹-4 |
| 1245 | Formula (I-2) | Ar¹-68 | Ar¹-59 |
| 1246 | Formula (I-2) | Ar¹-68 | Ar¹-60 |
| 1247 | Formula (I-2) | Ar¹-68 | Ar¹-63 |
| 1248 | Formula (I-2) | Ar¹-68 | Ar¹-65 |
| 1249 | Formula (I-2) | Ar¹-68 | Ar¹-68 |
| 1250 | Formula (I-2) | Ar¹-68 | Ar¹-75 |
| 1251 | Formula (I-2) | Ar¹-68 | Ar¹-87 |
| 1252 | Formula (I-2) | Ar¹-68 | Ar¹-91 |
| 1253 | Formula (I-2) | Ar¹-68 | Ar¹-107 |
| 1254 | Formula (I-2) | Ar¹-68 | Ar¹-109 |
| 1255 | Formula (I-2) | Ar¹-68 | Ar¹-111 |
| 1256 | Formula (I-2) | Ar¹-68 | Ar¹-114 |
| 1257 | Formula (I-2) | Ar¹-68 | Ar¹-121 |
| 1258 | Formula (I-2) | Ar¹-68 | Ar¹-151 |
| 1259 | Formula (I-2) | Ar¹-68 | Ar¹-153 |
| 1260 | Formula (I-2) | Ar¹-68 | Ar¹-162 |
| 1261 | Formula (I-2) | Ar¹-71 | Ar¹-1 |
| 1262 | Formula (I-2) | Ar¹-71 | Ar¹-2 |
| 1263 | Formula (I-2) | Ar¹-71 | Ar¹-3 |
| 1264 | Formula (I-2) | Ar¹-71 | Ar¹-4 |
| 1265 | Formula (I-2) | Ar¹-71 | Ar¹-59 |
| 1266 | Formula (I-2) | Ar¹-71 | Ar¹-60 |
| 1267 | Formula (I-2) | Ar¹-71 | Ar¹-63 |
| 1268 | Formula (I-2) | Ar¹-71 | Ar¹-65 |
| 1269 | Formula (I-2) | Ar¹-71 | Ar¹-68 |
| 1270 | Formula (I-2) | Ar¹-71 | Ar¹-75 |
| 1271 | Formula (I-2) | Ar¹-71 | Ar¹-87 |
| 1272 | Formula (I-2) | Ar¹-71 | Ar¹-91 |
| 1273 | Formula (I-2) | Ar¹-71 | Ar¹-107 |
| 1274 | Formula (I-2) | Ar¹-71 | Ar¹-109 |
| 1275 | Formula (I-2) | Ar¹-71 | Ar¹-111 |
| 1276 | Formula (I-2) | Ar¹-71 | Ar¹-114 |
| 1277 | Formula (I-2) | Ar¹-71 | Ar¹-121 |
| 1278 | Formula (I-2) | Ar¹-71 | Ar¹-151 |
| 1279 | Formula (I-2) | Ar¹-71 | Ar¹-153 |
| 1280 | Formula (I-2) | Ar¹-71 | Ar¹-162 |
| 1281 | Formula (I-2) | Ar¹-75 | Ar¹-1 |
| 1282 | Formula (I-2) | Ar¹-75 | Ar¹-2 |
| 1283 | Formula (I-2) | Ar¹-75 | Ar¹-3 |
| 1284 | Formula (I-2) | Ar¹-75 | Ar¹-4 |
| 1285 | Formula (I-2) | Ar¹-75 | Ar¹-59 |
| 1286 | Formula (I-2) | Ar¹-75 | Ar¹-60 |
| 1287 | Formula (I-2) | Ar¹-75 | Ar¹-63 |
| 1288 | Formula (I-2) | Ar¹-75 | Ar¹-65 |
| 1289 | Formula (I-2) | Ar¹-75 | Ar¹-68 |
| 1290 | Formula (I-2) | Ar¹-75 | Ar¹-75 |
| 1291 | Formula (I-2) | Ar¹-75 | Ar¹-87 |
| 1292 | Formula (I-2) | Ar¹-75 | Ar¹-91 |
| 1293 | Formula (I-2) | Ar¹-75 | Ar¹-107 |
| 1294 | Formula (I-2) | Ar¹-75 | Ar¹-109 |
| 1295 | Formula (I-2) | Ar¹-75 | Ar¹-111 |
| 1296 | Formula (I-2) | Ar¹-75 | Ar¹-114 |
| 1297 | Formula (I-2) | Ar¹-75 | Ar¹-121 |
| 1298 | Formula (I-2) | Ar¹-75 | Ar¹-151 |
| 1299 | Formula (I-2) | Ar¹-75 | Ar¹-153 |
| 1300 | Formula (I-2) | Ar¹-75 | Ar¹-162 |
| 1301 | Formula (I-2) | Ar¹-76 | Ar¹-1 |
| 1302 | Formula (I-2) | Ar¹-76 | Ar¹-2 |
| 1303 | Formula (I-2) | Ar¹-76 | Ar¹-3 |
| 1304 | Formula (I-2) | Ar¹-76 | Ar¹-4 |
| 1305 | Formula (I-2) | Ar¹-76 | Ar¹-59 |
| 1306 | Formula (I-2) | Ar¹-76 | Ar¹-60 |
| 1307 | Formula (I-2) | Ar¹-76 | Ar¹-63 |
| 1308 | Formula (I-2) | Ar¹-76 | Ar¹-65 |
| 1309 | Formula (I-2) | Ar¹-76 | Ar¹-68 |
| 1310 | Formula (I-2) | Ar¹-76 | Ar¹-75 |
| 1311 | Formula (I-2) | Ar¹-76 | Ar¹-87 |
| 1312 | Formula (I-2) | Ar¹-76 | Ar¹-91 |
| 1313 | Formula (I-2) | Ar¹-76 | Ar¹-107 |
| 1314 | Formula (I-2) | Ar¹-76 | Ar¹-109 |
| 1315 | Formula (I-2) | Ar¹-76 | Ar¹-111 |
| 1316 | Formula (I-2) | Ar¹-76 | Ar¹-114 |
| 1317 | Formula (I-2) | Ar¹-76 | Ar¹-121 |
| 1318 | Formula (I-2) | Ar¹-76 | Ar¹-151 |
| 1319 | Formula (I-2) | Ar¹-76 | Ar¹-153 |
| 1320 | Formula (I-2) | Ar¹-76 | Ar¹-162 |
| 1321 | Formula (I-2) | Ar¹-79 | Ar¹-1 |
| 1322 | Formula (I-2) | Ar¹-79 | Ar¹-2 |
| 1323 | Formula (I-2) | Ar¹-79 | Ar¹-3 |
| 1324 | Formula (I-2) | Ar¹-79 | Ar¹-4 |
| 1325 | Formula (I-2) | Ar¹-79 | Ar¹-59 |
| 1326 | Formula (I-2) | Ar¹-79 | Ar¹-60 |
| 1327 | Formula (I-2) | Ar¹-79 | Ar¹-63 |
| 1328 | Formula (I-2) | Ar¹-79 | Ar¹-65 |
| 1329 | Formula (I-2) | Ar¹-79 | Ar¹-68 |
| 1330 | Formula (I-2) | Ar¹-79 | Ar¹-75 |
| 1331 | Formula (I-2) | Ar¹-79 | Ar¹-87 |
| 1332 | Formula (I-2) | Ar¹-79 | Ar¹-91 |
| 1333 | Formula (I-2) | Ar¹-79 | Ar¹-107 |
| 1334 | Formula (I-2) | Ar¹-79 | Ar¹-109 |
| 1335 | Formula (I-2) | Ar¹-79 | Ar¹-111 |
| 1336 | Formula (I-2) | Ar¹-79 | Ar¹-114 |
| 1337 | Formula (I-2) | Ar¹-79 | Ar¹-121 |
| 1338 | Formula (I-2) | Ar¹-79 | Ar¹-151 |
| 1339 | Formula (I-2) | Ar¹-79 | Ar¹-153 |
| 1340 | Formula (I-2) | Ar¹-79 | Ar¹-162 |
| 1341 | Formula (I-2) | Ar¹-87 | Ar¹-1 |
| 1342 | Formula (I-2) | Ar¹-87 | Ar¹-2 |
| 1343 | Formula (I-2) | Ar¹-87 | Ar¹-3 |
| 1344 | Formula (I-2) | Ar¹-87 | Ar¹-4 |
| 1345 | Formula (I-2) | Ar¹-87 | Ar¹-59 |
| 1346 | Formula (I-2) | Ar¹-87 | Ar¹-60 |
| 1347 | Formula (I-2) | Ar¹-87 | Ar¹-63 |
| 1348 | Formula (I-2) | Ar¹-87 | Ar¹-65 |
| 1349 | Formula (I-2) | Ar¹-87 | Ar¹-68 |
| 1350 | Formula (I-2) | Ar¹-87 | Ar¹-75 |
| 1351 | Formula (I-2) | Ar¹-87 | Ar¹-87 |
| 1352 | Formula (I-2) | Ar¹-87 | Ar¹-91 |
| 1353 | Formula (I-2) | Ar¹-87 | Ar¹-107 |
| 1354 | Formula (I-2) | Ar¹-87 | Ar¹-109 |
| 1355 | Formula (I-2) | Ar¹-87 | Ar¹-111 |
| 1356 | Formula (I-2) | Ar¹-87 | Ar¹-114 |
| 1357 | Formula (I-2) | Ar¹-87 | Ar¹-121 |
| 1358 | Formula (I-2) | Ar¹-87 | Ar¹-151 |
| 1359 | Formula (I-2) | Ar¹-87 | Ar¹-153 |
| 1360 | Formula (I-2) | Ar¹-87 | Ar¹-162 |
| 1361 | Formula (I-2) | Ar¹-91 | Ar¹-1 |
| 1362 | Formula (I-2) | Ar¹-91 | Ar¹-2 |
| 1363 | Formula (I-2) | Ar¹-91 | Ar¹-3 |
| 1364 | Formula (I-2) | Ar¹-91 | Ar¹-4 |
| 1365 | Formula (I-2) | Ar¹-91 | Ar¹-59 |
| 1366 | Formula (I-2) | Ar¹-91 | Ar¹-60 |
| 1367 | Formula (I-2) | Ar¹-91 | Ar¹-63 |
| 1368 | Formula (I-2) | Ar¹-91 | Ar¹-65 |
| 1369 | Formula (I-2) | Ar¹-91 | Ar¹-68 |
| 1370 | Formula (I-2) | Ar¹-91 | Ar¹-75 |
| 1371 | Formula (I-2) | Ar¹-91 | Ar¹-87 |

| No. | Base skeleton according to | One of the Ar¹ groups according to | Other Ar¹ groups according to |
|---|---|---|---|
| 1372 | Formula (I-2) | Ar¹-91 | Ar¹-91 |
| 1373 | Formula (I-2) | Ar¹-91 | Ar¹-107 |
| 1374 | Formula (I-2) | Ar¹-91 | Ar¹-109 |
| 1375 | Formula (I-2) | Ar¹-91 | Ar¹-111 |
| 1376 | Formula (I-2) | Ar¹-91 | Ar¹-114 |
| 1377 | Formula (I-2) | Ar¹-91 | Ar¹-121 |
| 1378 | Formula (I-2) | Ar¹-91 | Ar¹-151 |
| 1379 | Formula (I-2) | Ar¹-91 | Ar¹-153 |
| 1380 | Formula (I-2) | Ar¹-91 | Ar¹-162 |
| 1381 | Formula (I-2) | Ar¹-92 | Ar¹-1 |
| 1382 | Formula (I-2) | Ar¹-92 | Ar¹-2 |
| 1383 | Formula (I-2) | Ar¹-92 | Ar¹-3 |
| 1384 | Formula (I-2) | Ar¹-92 | Ar¹-4 |
| 1385 | Formula (I-2) | Ar¹-92 | Ar¹-59 |
| 1386 | Formula (I-2) | Ar¹-92 | Ar¹-60 |
| 1387 | Formula (I-2) | Ar¹-92 | Ar¹-63 |
| 1388 | Formula (I-2) | Ar¹-92 | Ar¹-65 |
| 1389 | Formula (I-2) | Ar¹-92 | Ar¹-68 |
| 1390 | Formula (I-2) | Ar¹-92 | Ar¹-75 |
| 1391 | Formula (I-2) | Ar¹-92 | Ar¹-87 |
| 1392 | Formula (I-2) | Ar¹-92 | Ar¹-91 |
| 1393 | Formula (I-2) | Ar¹-92 | Ar¹-107 |
| 1394 | Formula (I-2) | Ar¹-92 | Ar¹-109 |
| 1395 | Formula (I-2) | Ar¹-92 | Ar¹-111 |
| 1396 | Formula (I-2) | Ar¹-92 | Ar¹-114 |
| 1397 | Formula (I-2) | Ar¹-92 | Ar¹-121 |
| 1398 | Formula (I-2) | Ar¹-92 | Ar¹-151 |
| 1399 | Formula (I-2) | Ar¹-92 | Ar¹-153 |
| 1400 | Formula (I-2) | Ar¹-92 | Ar¹-162 |
| 1401 | Formula (I-2) | Ar¹-95 | Ar¹-1 |
| 1402 | Formula (I-2) | Ar¹-95 | Ar¹-2 |
| 1403 | Formula (I-2) | Ar¹-95 | Ar¹-3 |
| 1404 | Formula (I-2) | Ar¹-95 | Ar¹-4 |
| 1405 | Formula (I-2) | Ar¹-95 | Ar¹-59 |
| 1406 | Formula (I-2) | Ar¹-95 | Ar¹-60 |
| 1407 | Formula (I-2) | Ar¹-95 | Ar¹-63 |
| 1408 | Formula (I-2) | Ar¹-95 | Ar¹-65 |
| 1409 | Formula (I-2) | Ar¹-95 | Ar¹-68 |
| 1410 | Formula (I-2) | Ar¹-95 | Ar¹-75 |
| 1411 | Formula (I-2) | Ar¹-95 | Ar¹-87 |
| 1412 | Formula (I-2) | Ar¹-95 | Ar¹-91 |
| 1413 | Formula (I-2) | Ar¹-95 | Ar¹-107 |
| 1414 | Formula (I-2) | Ar¹-95 | Ar¹-109 |
| 1415 | Formula (I-2) | Ar¹-95 | Ar¹-111 |
| 1416 | Formula (I-2) | Ar¹-95 | Ar¹-114 |
| 1417 | Formula (I-2) | Ar¹-95 | Ar¹-121 |
| 1418 | Formula (I-2) | Ar¹-95 | Ar¹-151 |
| 1419 | Formula (I-2) | Ar¹-95 | Ar¹-153 |
| 1420 | Formula (I-2) | Ar¹-95 | Ar¹-162 |
| 1421 | Formula (I-2) | Ar¹-99 | Ar¹-1 |
| 1422 | Formula (I-2) | Ar¹-99 | Ar¹-2 |
| 1423 | Formula (I-2) | Ar¹-99 | Ar¹-3 |
| 1424 | Formula (I-2) | Ar¹-99 | Ar¹-4 |
| 1425 | Formula (I-2) | Ar¹-99 | Ar¹-59 |
| 1426 | Formula (I-2) | Ar¹-99 | Ar¹-60 |
| 1427 | Formula (I-2) | Ar¹-99 | Ar¹-63 |
| 1428 | Formula (I-2) | Ar¹-99 | Ar¹-65 |
| 1429 | Formula (I-2) | Ar¹-99 | Ar¹-68 |
| 1430 | Formula (I-2) | Ar¹-99 | Ar¹-75 |
| 1431 | Formula (I-2) | Ar¹-99 | Ar¹-87 |
| 1432 | Formula (I-2) | Ar¹-99 | Ar¹-91 |
| 1433 | Formula (I-2) | Ar¹-99 | Ar¹-107 |
| 1434 | Formula (I-2) | Ar¹-99 | Ar¹-109 |
| 1435 | Formula (I-2) | Ar¹-99 | Ar¹-111 |
| 1436 | Formula (I-2) | Ar¹-99 | Ar¹-114 |
| 1437 | Formula (I-2) | Ar¹-99 | Ar¹-121 |
| 1438 | Formula (I-2) | Ar¹-99 | Ar¹-151 |
| 1439 | Formula (I-2) | Ar¹-99 | Ar¹-153 |
| 1440 | Formula (I-2) | Ar¹-99 | Ar¹-162 |
| 1441 | Formula (I-2) | Ar¹-107 | Ar¹-1 |
| 1442 | Formula (I-2) | Ar¹-107 | Ar¹-2 |
| 1443 | Formula (I-2) | Ar¹-107 | Ar¹-3 |
| 1444 | Formula (I-2) | Ar¹-107 | Ar¹-4 |
| 1445 | Formula (I-2) | Ar¹-107 | Ar¹-59 |
| 1446 | Formula (I-2) | Ar¹-107 | Ar¹-60 |
| 1447 | Formula (I-2) | Ar¹-107 | Ar¹-63 |
| 1448 | Formula (I-2) | Ar¹-107 | Ar¹-65 |
| 1449 | Formula (I-2) | Ar¹-107 | Ar¹-68 |
| 1450 | Formula (I-2) | Ar¹-107 | Ar¹-75 |
| 1451 | Formula (I-2) | Ar¹-107 | Ar¹-87 |
| 1452 | Formula (I-2) | Ar¹-107 | Ar¹-91 |
| 1453 | Formula (I-2) | Ar¹-107 | Ar¹-107 |
| 1454 | Formula (I-2) | Ar¹-107 | Ar¹-109 |
| 1455 | Formula (I-2) | Ar¹-107 | Ar¹-111 |
| 1456 | Formula (I-2) | Ar¹-107 | Ar¹-114 |
| 1457 | Formula (I-2) | Ar¹-107 | Ar¹-121 |
| 1458 | Formula (I-2) | Ar¹-107 | Ar¹-151 |
| 1459 | Formula (I-2) | Ar¹-107 | Ar¹-153 |
| 1460 | Formula (I-2) | Ar¹-107 | Ar¹-162 |
| 1461 | Formula (I-2) | Ar¹-108 | Ar¹-1 |
| 1462 | Formula (I-2) | Ar¹-108 | Ar¹-2 |
| 1463 | Formula (I-2) | Ar¹-108 | Ar¹-3 |
| 1464 | Formula (I-2) | Ar¹-108 | Ar¹-4 |
| 1465 | Formula (I-2) | Ar¹-108 | Ar¹-59 |
| 1466 | Formula (I-2) | Ar¹-108 | Ar¹-60 |
| 1467 | Formula (I-2) | Ar¹-108 | Ar¹-63 |
| 1468 | Formula (I-2) | Ar¹-108 | Ar¹-65 |
| 1469 | Formula (I-2) | Ar¹-108 | Ar¹-68 |
| 1470 | Formula (I-2) | Ar¹-108 | Ar¹-75 |
| 1471 | Formula (I-2) | Ar¹-108 | Ar¹-87 |
| 1472 | Formula (I-2) | Ar¹-108 | Ar¹-91 |
| 1473 | Formula (I-2) | Ar¹-108 | Ar¹-107 |
| 1474 | Formula (I-2) | Ar¹-108 | Ar¹-109 |
| 1475 | Formula (I-2) | Ar¹-108 | Ar¹-111 |
| 1476 | Formula (I-2) | Ar¹-108 | Ar¹-114 |
| 1477 | Formula (I-2) | Ar¹-108 | Ar¹-121 |
| 1478 | Formula (I-2) | Ar¹-108 | Ar¹-151 |
| 1479 | Formula (I-2) | Ar¹-108 | Ar¹-153 |
| 1480 | Formula (I-2) | Ar¹-108 | Ar¹-162 |
| 1481 | Formula (I-2) | Ar¹-109 | Ar¹-1 |
| 1482 | Formula (I-2) | Ar¹-109 | Ar¹-2 |
| 1483 | Formula (I-2) | Ar¹-109 | Ar¹-3 |
| 1484 | Formula (I-2) | Ar¹-109 | Ar¹-4 |
| 1485 | Formula (I-2) | Ar¹-109 | Ar¹-59 |
| 1486 | Formula (I-2) | Ar¹-109 | Ar¹-60 |
| 1487 | Formula (I-2) | Ar¹-109 | Ar¹-63 |
| 1488 | Formula (I-2) | Ar¹-109 | Ar¹-65 |
| 1489 | Formula (I-2) | Ar¹-109 | Ar¹-68 |
| 1490 | Formula (I-2) | Ar¹-109 | Ar¹-75 |
| 1491 | Formula (I-2) | Ar¹-109 | Ar¹-87 |
| 1492 | Formula (I-2) | Ar¹-109 | Ar¹-91 |
| 1493 | Formula (I-2) | Ar¹-109 | Ar¹-107 |
| 1494 | Formula (I-2) | Ar¹-109 | Ar¹-109 |
| 1495 | Formula (I-2) | Ar¹-109 | Ar¹-111 |
| 1496 | Formula (I-2) | Ar¹-109 | Ar¹-114 |
| 1497 | Formula (I-2) | Ar¹-109 | Ar¹-121 |
| 1498 | Formula (I-2) | Ar¹-109 | Ar¹-151 |
| 1499 | Formula (I-2) | Ar¹-109 | Ar¹-153 |
| 1500 | Formula (I-2) | Ar¹-109 | Ar¹-162 |
| 1501 | Formula (I-2) | Ar¹-110 | Ar¹-1 |
| 1502 | Formula (I-2) | Ar¹-110 | Ar¹-2 |
| 1503 | Formula (I-2) | Ar¹-110 | Ar¹-3 |
| 1504 | Formula (I-2) | Ar¹-110 | Ar¹-4 |
| 1505 | Formula (I-2) | Ar¹-110 | Ar¹-59 |
| 1506 | Formula (I-2) | Ar¹-110 | Ar¹-60 |
| 1507 | Formula (I-2) | Ar¹-110 | Ar¹-63 |
| 1508 | Formula (I-2) | Ar¹-110 | Ar¹-65 |
| 1509 | Formula (I-2) | Ar¹-110 | Ar¹-68 |
| 1510 | Formula (I-2) | Ar¹-110 | Ar¹-75 |
| 1511 | Formula (I-2) | Ar¹-110 | Ar¹-87 |
| 1512 | Formula (I-2) | Ar¹-110 | Ar¹-91 |
| 1513 | Formula (I-2) | Ar¹-110 | Ar¹-107 |
| 1514 | Formula (I-2) | Ar¹-110 | Ar¹-109 |
| 1515 | Formula (I-2) | Ar¹-110 | Ar¹-111 |
| 1516 | Formula (I-2) | Ar¹-110 | Ar¹-114 |
| 1517 | Formula (I-2) | Ar¹-110 | Ar¹-121 |
| 1518 | Formula (I-2) | Ar¹-110 | Ar¹-151 |
| 1519 | Formula (I-2) | Ar¹-110 | Ar¹-153 |
| 1520 | Formula (I-2) | Ar¹-110 | Ar¹-162 |
| 1521 | Formula (I-2) | Ar¹-111 | Ar¹-1 |

| No. | Base skeleton according to | One of the Ar¹ groups according to | Other Ar¹ groups according to |
|---|---|---|---|
| 1522 | Formula (I-2) | Ar¹-111 | Ar¹-2 |
| 1523 | Formula (I-2) | Ar¹-111 | Ar¹-3 |
| 1524 | Formula (I-2) | Ar¹-111 | Ar¹-4 |
| 1525 | Formula (I-2) | Ar¹-111 | Ar¹-59 |
| 1526 | Formula (I-2) | Ar¹-111 | Ar¹-60 |
| 1527 | Formula (I-2) | Ar¹-111 | Ar¹-63 |
| 1528 | Formula (I-2) | Ar¹-111 | Ar¹-65 |
| 1529 | Formula (I-2) | Ar¹-111 | Ar¹-68 |
| 1530 | Formula (I-2) | Ar¹-111 | Ar¹-75 |
| 1531 | Formula (I-2) | Ar¹-111 | Ar¹-87 |
| 1532 | Formula (I-2) | Ar¹-111 | Ar¹-91 |
| 1533 | Formula (I-2) | Ar¹-111 | Ar¹-107 |
| 1534 | Formula (I-2) | Ar¹-111 | Ar¹-109 |
| 1535 | Formula (I-2) | Ar¹-111 | Ar¹-111 |
| 1536 | Formula (I-2) | Ar¹-111 | Ar¹-114 |
| 1537 | Formula (I-2) | Ar¹-111 | Ar¹-121 |
| 1538 | Formula (I-2) | Ar¹-111 | Ar¹-151 |
| 1539 | Formula (I-2) | Ar¹-111 | Ar¹-153 |
| 1540 | Formula (I-2) | Ar¹-111 | Ar¹-162 |
| 1541 | Formula (I-2) | Ar¹-112 | Ar¹-1 |
| 1542 | Formula (I-2) | Ar¹-112 | Ar¹-2 |
| 1543 | Formula (I-2) | Ar¹-112 | Ar¹-3 |
| 1544 | Formula (I-2) | Ar¹-112 | Ar¹-4 |
| 1545 | Formula (I-2) | Ar¹-112 | Ar¹-59 |
| 1546 | Formula (I-2) | Ar¹-112 | Ar¹-60 |
| 1547 | Formula (I-2) | Ar¹-112 | Ar¹-63 |
| 1548 | Formula (I-2) | Ar¹-112 | Ar¹-65 |
| 1549 | Formula (I-2) | Ar¹-112 | Ar¹-68 |
| 1550 | Formula (I-2) | Ar¹-112 | Ar¹-75 |
| 1551 | Formula (I-2) | Ar¹-112 | Ar¹-87 |
| 1552 | Formula (I-2) | Ar¹-112 | Ar¹-91 |
| 1553 | Formula (I-2) | Ar¹-112 | Ar¹-107 |
| 1554 | Formula (I-2) | Ar¹-112 | Ar¹-109 |
| 1555 | Formula (I-2) | Ar¹-112 | Ar¹-111 |
| 1556 | Formula (I-2) | Ar¹-112 | Ar¹-114 |
| 1557 | Formula (I-2) | Ar¹-112 | Ar¹-121 |
| 1558 | Formula (I-2) | Ar¹-112 | Ar¹-151 |
| 1559 | Formula (I-2) | Ar¹-112 | Ar¹-153 |
| 1560 | Formula (I-2) | Ar¹-112 | Ar¹-162 |
| 1561 | Formula (I-2) | Ar¹-113 | Ar¹-1 |
| 1562 | Formula (I-2) | Ar¹-113 | Ar¹-2 |
| 1563 | Formula (I-2) | Ar¹-113 | Ar¹-3 |
| 1564 | Formula (I-2) | Ar¹-113 | Ar¹-4 |
| 1565 | Formula (I-2) | Ar¹-113 | Ar¹-59 |
| 1566 | Formula (I-2) | Ar¹-113 | Ar¹-60 |
| 1567 | Formula (I-2) | Ar¹-113 | Ar¹-63 |
| 1568 | Formula (I-2) | Ar¹-113 | Ar¹-65 |
| 1569 | Formula (I-2) | Ar¹-113 | Ar¹-68 |
| 1570 | Formula (I-2) | Ar¹-113 | Ar¹-75 |
| 1571 | Formula (I-2) | Ar¹-113 | Ar¹-87 |
| 1572 | Formula (I-2) | Ar¹-113 | Ar¹-91 |
| 1573 | Formula (I-2) | Ar¹-113 | Ar¹-107 |
| 1574 | Formula (I-2) | Ar¹-113 | Ar¹-109 |
| 1575 | Formula (I-2) | Ar¹-113 | Ar¹-111 |
| 1576 | Formula (I-2) | Ar¹-113 | Ar¹-114 |
| 1577 | Formula (I-2) | Ar¹-113 | Ar¹-121 |
| 1578 | Formula (I-2) | Ar¹-113 | Ar¹-151 |
| 1579 | Formula (I-2) | Ar¹-113 | Ar¹-153 |
| 1580 | Formula (I-2) | Ar¹-113 | Ar¹-162 |
| 1581 | Formula (I-2) | Ar¹-114 | Ar¹-1 |
| 1582 | Formula (I-2) | Ar¹-114 | Ar¹-2 |
| 1583 | Formula (I-2) | Ar¹-114 | Ar¹-3 |
| 1584 | Formula (I-2) | Ar¹-114 | Ar¹-4 |
| 1585 | Formula (I-2) | Ar¹-114 | Ar¹-59 |
| 1586 | Formula (I-2) | Ar¹-114 | Ar¹-60 |
| 1587 | Formula (I-2) | Ar¹-114 | Ar¹-63 |
| 1588 | Formula (I-2) | Ar¹-114 | Ar¹-65 |
| 1589 | Formula (I-2) | Ar¹-114 | Ar¹-68 |
| 1590 | Formula (I-2) | Ar¹-114 | Ar¹-75 |
| 1591 | Formula (I-2) | Ar¹-114 | Ar¹-87 |
| 1592 | Formula (I-2) | Ar¹-114 | Ar¹-91 |
| 1593 | Formula (I-2) | Ar¹-114 | Ar¹-107 |
| 1594 | Formula (I-2) | Ar¹-114 | Ar¹-109 |
| 1595 | Formula (I-2) | Ar¹-114 | Ar¹-111 |
| 1596 | Formula (I-2) | Ar¹-114 | Ar¹-114 |
| 1597 | Formula (I-2) | Ar¹-114 | Ar¹-121 |
| 1598 | Formula (I-2) | Ar¹-114 | Ar¹-151 |
| 1599 | Formula (I-2) | Ar¹-114 | Ar¹-153 |
| 1600 | Formula (I-2) | Ar¹-114 | Ar¹-162 |
| 1601 | Formula (I-2) | Ar¹-117 | Ar¹-1 |
| 1602 | Formula (I-2) | Ar¹-117 | Ar¹-2 |
| 1603 | Formula (I-2) | Ar¹-117 | Ar¹-3 |
| 1604 | Formula (I-2) | Ar¹-117 | Ar¹-4 |
| 1605 | Formula (I-2) | Ar¹-117 | Ar¹-59 |
| 1606 | Formula (I-2) | Ar¹-117 | Ar¹-60 |
| 1607 | Formula (I-2) | Ar¹-117 | Ar¹-63 |
| 1608 | Formula (I-2) | Ar¹-117 | Ar¹-65 |
| 1609 | Formula (I-2) | Ar¹-117 | Ar¹-68 |
| 1610 | Formula (I-2) | Ar¹-117 | Ar¹-75 |
| 1611 | Formula (I-2) | Ar¹-117 | Ar¹-87 |
| 1612 | Formula (I-2) | Ar¹-117 | Ar¹-91 |
| 1613 | Formula (I-2) | Ar¹-117 | Ar¹-107 |
| 1614 | Formula (I-2) | Ar¹-117 | Ar¹-109 |
| 1615 | Formula (I-2) | Ar¹-117 | Ar¹-111 |
| 1616 | Formula (I-2) | Ar¹-117 | Ar¹-114 |
| 1617 | Formula (I-2) | Ar¹-117 | Ar¹-121 |
| 1618 | Formula (I-2) | Ar¹-117 | Ar¹-151 |
| 1619 | Formula (I-2) | Ar¹-117 | Ar¹-153 |
| 1620 | Formula (I-2) | Ar¹-117 | Ar¹-162 |
| 1621 | Formula (I-2) | Ar¹-121 | Ar¹-1 |
| 1622 | Formula (I-2) | Ar¹-121 | Ar¹-2 |
| 1623 | Formula (I-2) | Ar¹-121 | Ar¹-3 |
| 1624 | Formula (I-2) | Ar¹-121 | Ar¹-4 |
| 1625 | Formula (I-2) | Ar¹-121 | Ar¹-59 |
| 1626 | Formula (I-2) | Ar¹-121 | Ar¹-60 |
| 1627 | Formula (I-2) | Ar¹-121 | Ar¹-63 |
| 1628 | Formula (I-2) | Ar¹-121 | Ar¹-65 |
| 1629 | Formula (I-2) | Ar¹-121 | Ar¹-68 |
| 1630 | Formula (I-2) | Ar¹-121 | Ar¹-75 |
| 1631 | Formula (I-2) | Ar¹-121 | Ar¹-87 |
| 1632 | Formula (I-2) | Ar¹-121 | Ar¹-91 |
| 1633 | Formula (I-2) | Ar¹-121 | Ar¹-107 |
| 1634 | Formula (I-2) | Ar¹-121 | Ar¹-109 |
| 1635 | Formula (I-2) | Ar¹-121 | Ar¹-111 |
| 1636 | Formula (I-2) | Ar¹-121 | Ar¹-114 |
| 1637 | Formula (I-2) | Ar¹-121 | Ar¹-121 |
| 1638 | Formula (I-2) | Ar¹-121 | Ar¹-151 |
| 1639 | Formula (I-2) | Ar¹-121 | Ar¹-153 |
| 1640 | Formula (I-2) | Ar¹-121 | Ar¹-162 |
| 1641 | Formula (I-2) | Ar¹-127 | Ar¹-1 |
| 1642 | Formula (I-2) | Ar¹-127 | Ar¹-2 |
| 1643 | Formula (I-2) | Ar¹-127 | Ar¹-3 |
| 1644 | Formula (I-2) | Ar¹-127 | Ar¹-4 |
| 1645 | Formula (I-2) | Ar¹-127 | Ar¹-59 |
| 1646 | Formula (I-2) | Ar¹-127 | Ar¹-60 |
| 1647 | Formula (I-2) | Ar¹-127 | Ar¹-63 |
| 1648 | Formula (I-2) | Ar¹-127 | Ar¹-65 |
| 1649 | Formula (I-2) | Ar¹-127 | Ar¹-68 |
| 1650 | Formula (I-2) | Ar¹-127 | Ar¹-75 |
| 1651 | Formula (I-2) | Ar¹-127 | Ar¹-87 |
| 1652 | Formula (I-2) | Ar¹-127 | Ar¹-91 |
| 1653 | Formula (I-2) | Ar¹-127 | Ar¹-107 |
| 1654 | Formula (I-2) | Ar¹-127 | Ar¹-109 |
| 1655 | Formula (I-2) | Ar¹-127 | Ar¹-111 |
| 1656 | Formula (I-2) | Ar¹-127 | Ar¹-114 |
| 1657 | Formula (I-2) | Ar¹-127 | Ar¹-121 |
| 1658 | Formula (I-2) | Ar¹-127 | Ar¹-151 |
| 1659 | Formula (I-2) | Ar¹-127 | Ar¹-153 |
| 1660 | Formula (I-2) | Ar¹-127 | Ar¹-162 |
| 1661 | Formula (I-2) | Ar¹-151 | Ar¹-1 |
| 1662 | Formula (I-2) | Ar¹-151 | Ar¹-2 |
| 1663 | Formula (I-2) | Ar¹-151 | Ar¹-3 |
| 1664 | Formula (I-2) | Ar¹-151 | Ar¹-4 |
| 1665 | Formula (I-2) | Ar¹-151 | Ar¹-59 |
| 1666 | Formula (I-2) | Ar¹-151 | Ar¹-60 |
| 1667 | Formula (I-2) | Ar¹-151 | Ar¹-63 |
| 1668 | Formula (I-2) | Ar¹-151 | Ar¹-65 |
| 1669 | Formula (I-2) | Ar¹-151 | Ar¹-68 |
| 1670 | Formula (I-2) | Ar¹-151 | Ar¹-75 |
| 1671 | Formula (I-2) | Ar¹-151 | Ar¹-87 |

| No. | Base skeleton according to | One of the Ar¹ groups according to | Other Ar¹ groups according to |
|---|---|---|---|
| 1672 | Formula (I-2) | Ar¹-151 | Ar¹-91 |
| 1673 | Formula (I-2) | Ar¹-151 | Ar¹-107 |
| 1674 | Formula (I-2) | Ar¹-151 | Ar¹-109 |
| 1675 | Formula (I-2) | Ar¹-151 | Ar¹-111 |
| 1676 | Formula (I-2) | Ar¹-151 | Ar¹-114 |
| 1677 | Formula (I-2) | Ar¹-151 | Ar¹-121 |
| 1678 | Formula (I-2) | Ar¹-151 | Ar¹-151 |
| 1679 | Formula (I-2) | Ar¹-151 | Ar¹-153 |
| 1680 | Formula (I-2) | Ar¹-151 | Ar¹-162 |
| 1681 | Formula (I-2) | Ar¹-153 | Ar¹-1 |
| 1682 | Formula (I-2) | Ar¹-153 | Ar¹-2 |
| 1683 | Formula (I-2) | Ar¹-153 | Ar¹-3 |
| 1684 | Formula (I-2) | Ar¹-153 | Ar¹-4 |
| 1685 | Formula (I-2) | Ar¹-153 | Ar¹-59 |
| 1686 | Formula (I-2) | Ar¹-153 | Ar¹-60 |
| 1687 | Formula (I-2) | Ar¹-153 | Ar¹-63 |
| 1688 | Formula (I-2) | Ar¹-153 | Ar¹-65 |
| 1689 | Formula (I-2) | Ar¹-153 | Ar¹-68 |
| 1690 | Formula (I-2) | Ar¹-153 | Ar¹-75 |
| 1691 | Formula (I-2) | Ar¹-153 | Ar¹-87 |
| 1692 | Formula (I-2) | Ar¹-153 | Ar¹-91 |
| 1693 | Formula (I-2) | Ar¹-153 | Ar¹-107 |
| 1694 | Formula (I-2) | Ar¹-153 | Ar¹-109 |
| 1695 | Formula (I-2) | Ar¹-153 | Ar¹-111 |
| 1696 | Formula (I-2) | Ar¹-153 | Ar¹-114 |
| 1697 | Formula (I-2) | Ar¹-153 | Ar¹-121 |
| 1698 | Formula (I-2) | Ar¹-153 | Ar¹-151 |
| 1699 | Formula (I-2) | Ar¹-153 | Ar¹-153 |
| 1700 | Formula (I-2) | Ar¹-153 | Ar¹-162 |
| 1701 | Formula (I-2) | Ar¹-155 | Ar¹-1 |
| 1702 | Formula (I-2) | Ar¹-155 | Ar¹-2 |
| 1703 | Formula (I-2) | Ar¹-155 | Ar¹-3 |
| 1704 | Formula (I-2) | Ar¹-155 | Ar¹-4 |
| 1705 | Formula (I-2) | Ar¹-155 | Ar¹-59 |
| 1706 | Formula (I-2) | Ar¹-155 | Ar¹-60 |
| 1707 | Formula (I-2) | Ar¹-155 | Ar¹-63 |
| 1708 | Formula (I-2) | Ar¹-155 | Ar¹-65 |
| 1709 | Formula (I-2) | Ar¹-155 | Ar¹-68 |
| 1710 | Formula (I-2) | Ar¹-155 | Ar¹-75 |
| 1711 | Formula (I-2) | Ar¹-155 | Ar¹-87 |
| 1712 | Formula (I-2) | Ar¹-155 | Ar¹-91 |
| 1713 | Formula (I-2) | Ar¹-155 | Ar¹-107 |
| 1714 | Formula (I-2) | Ar¹-155 | Ar¹-109 |
| 1715 | Formula (I-2) | Ar¹-155 | Ar¹-111 |
| 1716 | Formula (I-2) | Ar¹-155 | Ar¹-114 |
| 1717 | Formula (I-2) | Ar¹-155 | Ar¹-121 |
| 1718 | Formula (I-2) | Ar¹-155 | Ar¹-151 |
| 1719 | Formula (I-2) | Ar¹-155 | Ar¹-153 |
| 1720 | Formula (I-2) | Ar¹-155 | Ar¹-162 |
| 1721 | Formula (I-2) | Ar¹-156 | Ar¹-1 |
| 1722 | Formula (I-2) | Ar¹-156 | Ar¹-2 |
| 1723 | Formula (I-2) | Ar¹-156 | Ar¹-3 |
| 1724 | Formula (I-2) | Ar¹-156 | Ar¹-4 |
| 1725 | Formula (I-2) | Ar¹-156 | Ar¹-59 |
| 1726 | Formula (I-2) | Ar¹-156 | Ar¹-60 |
| 1727 | Formula (I-2) | Ar¹-156 | Ar¹-63 |
| 1728 | Formula (I-2) | Ar¹-156 | Ar¹-65 |
| 1729 | Formula (I-2) | Ar¹-156 | Ar¹-68 |
| 1730 | Formula (I-2) | Ar¹-156 | Ar¹-75 |
| 1731 | Formula (I-2) | Ar¹-156 | Ar¹-87 |
| 1732 | Formula (I-2) | Ar¹-156 | Ar¹-91 |
| 1733 | Formula (I-2) | Ar¹-156 | Ar¹-107 |
| 1734 | Formula (I-2) | Ar¹-156 | Ar¹-109 |
| 1735 | Formula (I-2) | Ar¹-156 | Ar¹-111 |
| 1736 | Formula (I-2) | Ar¹-156 | Ar¹-114 |
| 1737 | Formula (I-2) | Ar¹-156 | Ar¹-121 |
| 1738 | Formula (I-2) | Ar¹-156 | Ar¹-151 |
| 1739 | Formula (I-2) | Ar¹-156 | Ar¹-153 |
| 1740 | Formula (I-2) | Ar¹-156 | Ar¹-162 |
| 1741 | Formula (I-2) | Ar¹-157 | Ar¹-1 |
| 1742 | Formula (I-2) | Ar¹-157 | Ar¹-2 |
| 1743 | Formula (I-2) | Ar¹-157 | Ar¹-3 |
| 1744 | Formula (I-2) | Ar¹-157 | Ar¹-4 |
| 1745 | Formula (I-2) | Ar¹-157 | Ar¹-59 |
| 1746 | Formula (I-2) | Ar¹-157 | Ar¹-60 |
| 1747 | Formula (I-2) | Ar¹-157 | Ar¹-63 |
| 1748 | Formula (I-2) | Ar¹-157 | Ar¹-65 |
| 1749 | Formula (I-2) | Ar¹-157 | Ar¹-68 |
| 1750 | Formula (I-2) | Ar¹-157 | Ar¹-75 |
| 1751 | Formula (I-2) | Ar¹-157 | Ar¹-87 |
| 1752 | Formula (I-2) | Ar¹-157 | Ar¹-91 |
| 1753 | Formula (I-2) | Ar¹-157 | Ar¹-107 |
| 1754 | Formula (I-2) | Ar¹-157 | Ar¹-109 |
| 1755 | Formula (I-2) | Ar¹-157 | Ar¹-111 |
| 1756 | Formula (I-2) | Ar¹-157 | Ar¹-114 |
| 1757 | Formula (I-2) | Ar¹-157 | Ar¹-121 |
| 1758 | Formula (I-2) | Ar¹-157 | Ar¹-151 |
| 1759 | Formula (I-2) | Ar¹-157 | Ar¹-153 |
| 1760 | Formula (I-2) | Ar¹-157 | Ar¹-162 |
| 1761 | Formula (I-2) | Ar¹-158 | Ar¹-1 |
| 1762 | Formula (I-2) | Ar¹-158 | Ar¹-2 |
| 1763 | Formula (I-2) | Ar¹-158 | Ar¹-3 |
| 1764 | Formula (I-2) | Ar¹-158 | Ar¹-4 |
| 1765 | Formula (I-2) | Ar¹-158 | Ar¹-59 |
| 1766 | Formula (I-2) | Ar¹-158 | Ar¹-60 |
| 1767 | Formula (I-2) | Ar¹-158 | Ar¹-63 |
| 1768 | Formula (I-2) | Ar¹-158 | Ar¹-65 |
| 1769 | Formula (I-2) | Ar¹-158 | Ar¹-68 |
| 1770 | Formula (I-2) | Ar¹-158 | Ar¹-75 |
| 1771 | Formula (I-2) | Ar¹-158 | Ar¹-87 |
| 1772 | Formula (I-2) | Ar¹-158 | Ar¹-91 |
| 1773 | Formula (I-2) | Ar¹-158 | Ar¹-107 |
| 1774 | Formula (I-2) | Ar¹-158 | Ar¹-109 |
| 1775 | Formula (I-2) | Ar¹-158 | Ar¹-111 |
| 1776 | Formula (I-2) | Ar¹-158 | Ar¹-114 |
| 1777 | Formula (I-2) | Ar¹-158 | Ar¹-121 |
| 1778 | Formula (I-2) | Ar¹-158 | Ar¹-151 |
| 1779 | Formula (I-2) | Ar¹-158 | Ar¹-153 |
| 1780 | Formula (I-2) | Ar¹-158 | Ar¹-162 |
| 1781 | Formula (I-2) | Ar¹-160 | Ar¹-1 |
| 1782 | Formula (I-2) | Ar¹-160 | Ar¹-2 |
| 1783 | Formula (I-2) | Ar¹-160 | Ar¹-3 |
| 1784 | Formula (I-2) | Ar¹-160 | Ar¹-4 |
| 1785 | Formula (I-2) | Ar¹-160 | Ar¹-59 |
| 1786 | Formula (I-2) | Ar¹-160 | Ar¹-60 |
| 1787 | Formula (I-2) | Ar¹-160 | Ar¹-63 |
| 1788 | Formula (I-2) | Ar¹-160 | Ar¹-65 |
| 1789 | Formula (I-2) | Ar¹-160 | Ar¹-68 |
| 1790 | Formula (I-2) | Ar¹-160 | Ar¹-75 |
| 1791 | Formula (I-2) | Ar¹-160 | Ar¹-87 |
| 1792 | Formula (I-2) | Ar¹-160 | Ar¹-91 |
| 1793 | Formula (I-2) | Ar¹-160 | Ar¹-107 |
| 1794 | Formula (I-2) | Ar¹-160 | Ar¹-109 |
| 1795 | Formula (I-2) | Ar¹-160 | Ar¹-111 |
| 1796 | Formula (I-2) | Ar¹-160 | Ar¹-114 |
| 1797 | Formula (I-2) | Ar¹-160 | Ar¹-121 |
| 1798 | Formula (I-2) | Ar¹-160 | Ar¹-151 |
| 1799 | Formula (I-2) | Ar¹-160 | Ar¹-153 |
| 1800 | Formula (I-2) | Ar¹-160 | Ar¹-162 |
| 1801 | Formula (I-2) | Ar¹-162 | Ar¹-1 |
| 1802 | Formula (I-2) | Ar¹-162 | Ar¹-2 |
| 1803 | Formula (I-2) | Ar¹-162 | Ar¹-3 |
| 1804 | Formula (I-2) | Ar¹-162 | Ar¹-4 |
| 1805 | Formula (I-2) | Ar¹-162 | Ar¹-59 |
| 1806 | Formula (I-2) | Ar¹-162 | Ar¹-60 |
| 1807 | Formula (I-2) | Ar¹-162 | Ar¹-63 |
| 1808 | Formula (I-2) | Ar¹-162 | Ar¹-65 |
| 1809 | Formula (I-2) | Ar¹-162 | Ar¹-68 |
| 1810 | Formula (I-2) | Ar¹-162 | Ar¹-75 |
| 1811 | Formula (I-2) | Ar¹-162 | Ar¹-87 |
| 1812 | Formula (I-2) | Ar¹-162 | Ar¹-91 |
| 1813 | Formula (I-2) | Ar¹-162 | Ar¹-107 |
| 1814 | Formula (I-2) | Ar¹-162 | Ar¹-109 |
| 1815 | Formula (I-2) | Ar¹-162 | Ar¹-111 |
| 1816 | Formula (I-2) | Ar¹-162 | Ar¹-114 |
| 1817 | Formula (I-2) | Ar¹-162 | Ar¹-121 |
| 1818 | Formula (I-2) | Ar¹-162 | Ar¹-151 |
| 1819 | Formula (I-2) | Ar¹-162 | Ar¹-153 |
| 1820 | Formula (I-2) | Ar¹-162 | Ar¹-162 |
| 1821 | Formula (I-2) | Ar¹-163 | Ar¹-1 |

| No. | Base skeleton according to | One of the Ar¹ groups according to | Other Ar¹ groups according to |
|---|---|---|---|
| 1822 | Formula (I-2) | Ar¹-163 | Ar¹-2 |
| 1823 | Formula (I-2) | Ar¹-163 | Ar¹-3 |
| 1824 | Formula (I-2) | Ar¹-163 | Ar¹-4 |
| 1825 | Formula (I-2) | Ar¹-163 | Ar¹-59 |
| 1826 | Formula (I-2) | Ar¹-163 | Ar¹-60 |
| 1827 | Formula (I-2) | Ar¹-163 | Ar¹-63 |
| 1828 | Formula (I-2) | Ar¹-163 | Ar¹-65 |
| 1829 | Formula (I-2) | Ar¹-163 | Ar¹-68 |
| 1830 | Formula (I-2) | Ar¹-163 | Ar¹-75 |
| 1831 | Formula (I-2) | Ar¹-163 | Ar¹-87 |
| 1832 | Formula (I-2) | Ar¹-163 | Ar¹-91 |
| 1833 | Formula (I-2) | Ar¹-163 | Ar¹-107 |
| 1834 | Formula (I-2) | Ar¹-163 | Ar¹-109 |
| 1835 | Formula (I-2) | Ar¹-163 | Ar¹-111 |
| 1836 | Formula (I-2) | Ar¹-163 | Ar¹-114 |
| 1837 | Formula (I-2) | Ar¹-163 | Ar¹-121 |
| 1838 | Formula (I-2) | Ar¹-163 | Ar¹-151 |
| 1839 | Formula (I-2) | Ar¹-163 | Ar¹-153 |
| 1840 | Formula (I-2) | Ar¹-163 | Ar¹-162 |
| 1841 | Formula (I-2) | Ar¹-164 | Ar¹-1 |
| 1842 | Formula (I-2) | Ar¹-164 | Ar¹-2 |
| 1843 | Formula (I-2) | Ar¹-164 | Ar¹-3 |
| 1844 | Formula (I-2) | Ar¹-164 | Ar¹-4 |
| 1845 | Formula (I-2) | Ar¹-164 | Ar¹-59 |
| 1846 | Formula (I-2) | Ar¹-164 | Ar¹-60 |
| 1847 | Formula (I-2) | Ar¹-164 | Ar¹-63 |
| 1848 | Formula (I-2) | Ar¹-164 | Ar¹-65 |
| 1849 | Formula (I-2) | Ar¹-164 | Ar¹-68 |
| 1850 | Formula (I-2) | Ar¹-164 | Ar¹-75 |
| 1851 | Formula (I-2) | Ar¹-164 | Ar¹-87 |
| 1852 | Formula (I-2) | Ar¹-164 | Ar¹-91 |
| 1853 | Formula (I-2) | Ar¹-164 | Ar¹-107 |
| 1854 | Formula (I-2) | Ar¹-164 | Ar¹-109 |
| 1855 | Formula (I-2) | Ar¹-164 | Ar¹-111 |
| 1856 | Formula (I-2) | Ar¹-164 | Ar¹-114 |
| 1857 | Formula (I-2) | Ar¹-164 | Ar¹-121 |
| 1858 | Formula (I-2) | Ar¹-164 | Ar¹-151 |
| 1859 | Formula (I-2) | Ar¹-164 | Ar¹-153 |
| 1860 | Formula (I-2) | Ar¹-164 | Ar¹-162 |
| 1861 | Formula (I-2) | Ar¹-165 | Ar¹-1 |
| 1862 | Formula (I-2) | Ar¹-165 | Ar¹-2 |
| 1863 | Formula (I-2) | Ar¹-165 | Ar¹-3 |
| 1864 | Formula (I-2) | Ar¹-165 | Ar¹-4 |
| 1865 | Formula (I-2) | Ar¹-165 | Ar¹-59 |
| 1866 | Formula (I-2) | Ar¹-165 | Ar¹-60 |
| 1867 | Formula (I-2) | Ar¹-165 | Ar¹-63 |
| 1868 | Formula (I-2) | Ar¹-165 | Ar¹-65 |
| 1869 | Formula (I-2) | Ar¹-165 | Ar¹-68 |
| 1870 | Formula (I-2) | Ar¹-165 | Ar¹-75 |
| 1871 | Formula (I-2) | Ar¹-165 | Ar¹-87 |
| 1872 | Formula (I-2) | Ar¹-165 | Ar¹-91 |
| 1873 | Formula (I-2) | Ar¹-165 | Ar¹-107 |
| 1874 | Formula (I-2) | Ar¹-165 | Ar¹-109 |
| 1875 | Formula (I-2) | Ar¹-165 | Ar¹-111 |
| 1876 | Formula (I-2) | Ar¹-165 | Ar¹-114 |
| 1877 | Formula (I-2) | Ar¹-165 | Ar¹-121 |
| 1878 | Formula (I-2) | Ar¹-165 | Ar¹-151 |
| 1879 | Formula (I-2) | Ar¹-165 | Ar¹-153 |
| 1880 | Formula (I-2) | Ar¹-165 | Ar¹-162 |
| 1881 | Formula (I-2) | Ar¹-189 | Ar¹-1 |
| 1882 | Formula (I-2) | Ar¹-189 | Ar¹-2 |
| 1883 | Formula (I-2) | Ar¹-189 | Ar¹-3 |
| 1884 | Formula (I-2) | Ar¹-189 | Ar¹-4 |
| 1885 | Formula (I-2) | Ar¹-189 | Ar¹-59 |
| 1886 | Formula (I-2) | Ar¹-189 | Ar¹-60 |
| 1887 | Formula (I-2) | Ar¹-189 | Ar¹-63 |
| 1888 | Formula (I-2) | Ar¹-189 | Ar¹-65 |
| 1889 | Formula (I-2) | Ar¹-189 | Ar¹-68 |
| 1890 | Formula (I-2) | Ar¹-189 | Ar¹-75 |
| 1891 | Formula (I-2) | Ar¹-189 | Ar¹-87 |
| 1892 | Formula (I-2) | Ar¹-189 | Ar¹-91 |
| 1893 | Formula (I-2) | Ar¹-189 | Ar¹-107 |
| 1894 | Formula (I-2) | Ar¹-189 | Ar¹-109 |
| 1895 | Formula (I-2) | Ar¹-189 | Ar¹-111 |
| 1896 | Formula (I-2) | Ar¹-189 | Ar¹-114 |
| 1897 | Formula (I-2) | Ar¹-189 | Ar¹-121 |
| 1898 | Formula (I-2) | Ar¹-189 | Ar¹-151 |
| 1899 | Formula (I-2) | Ar¹-189 | Ar¹-153 |
| 1900 | Formula (I-2) | Ar¹-189 | Ar¹-162 |
| 1901 | Formula (I-2) | Ar¹-192 | Ar¹-1 |
| 1902 | Formula (I-2) | Ar¹-192 | Ar¹-2 |
| 1903 | Formula (I-2) | Ar¹-192 | Ar¹-3 |
| 1904 | Formula (I-2) | Ar¹-192 | Ar¹-4 |
| 1905 | Formula (I-2) | Ar¹-192 | Ar¹-59 |
| 1906 | Formula (I-2) | Ar¹-192 | Ar¹-60 |
| 1907 | Formula (I-2) | Ar¹-192 | Ar¹-63 |
| 1908 | Formula (I-2) | Ar¹-192 | Ar¹-65 |
| 1909 | Formula (I-2) | Ar¹-192 | Ar¹-68 |
| 1910 | Formula (I-2) | Ar¹-192 | Ar¹-75 |
| 1911 | Formula (I-2) | Ar¹-192 | Ar¹-87 |
| 1912 | Formula (I-2) | Ar¹-192 | Ar¹-91 |
| 1913 | Formula (I-2) | Ar¹-192 | Ar¹-107 |
| 1914 | Formula (I-2) | Ar¹-192 | Ar¹-109 |
| 1915 | Formula (I-2) | Ar¹-192 | Ar¹-111 |
| 1916 | Formula (I-2) | Ar¹-192 | Ar¹-114 |
| 1917 | Formula (I-2) | Ar¹-192 | Ar¹-121 |
| 1918 | Formula (I-2) | Ar¹-192 | Ar¹-151 |
| 1919 | Formula (I-2) | Ar¹-192 | Ar¹-153 |
| 1920 | Formula (I-2) | Ar¹-192 | Ar¹-162 |
| 1921 | Formula (I-2) | Ar¹-234 | Ar¹-1 |
| 1922 | Formula (I-2) | Ar¹-234 | Ar¹-2 |
| 1923 | Formula (I-2) | Ar¹-234 | Ar¹-3 |
| 1924 | Formula (I-2) | Ar¹-234 | Ar¹-4 |
| 1925 | Formula (I-2) | Ar¹-234 | Ar¹-59 |
| 1926 | Formula (I-2) | Ar¹-234 | Ar¹-60 |
| 1927 | Formula (I-2) | Ar¹-234 | Ar¹-63 |
| 1928 | Formula (I-2) | Ar¹-234 | Ar¹-65 |
| 1929 | Formula (I-2) | Ar¹-234 | Ar¹-68 |
| 1930 | Formula (I-2) | Ar¹-234 | Ar¹-75 |
| 1931 | Formula (I-2) | Ar¹-234 | Ar¹-87 |
| 1932 | Formula (I-2) | Ar¹-234 | Ar¹-91 |
| 1933 | Formula (I-2) | Ar¹-234 | Ar¹-107 |
| 1934 | Formula (I-2) | Ar¹-234 | Ar¹-109 |
| 1935 | Formula (I-2) | Ar¹-234 | Ar¹-111 |
| 1936 | Formula (I-2) | Ar¹-234 | Ar¹-114 |
| 1937 | Formula (I-2) | Ar¹-234 | Ar¹-121 |
| 1938 | Formula (I-2) | Ar¹-234 | Ar¹-151 |
| 1939 | Formula (I-2) | Ar¹-234 | Ar¹-153 |
| 1940 | Formula (I-2) | Ar¹-234 | Ar¹-162 |
| 1941 | Formula (I-2) | Ar¹-237 | Ar¹-1 |
| 1942 | Formula (I-2) | Ar¹-237 | Ar¹-2 |
| 1943 | Formula (I-2) | Ar¹-237 | Ar¹-3 |
| 1944 | Formula (I-2) | Ar¹-237 | Ar¹-4 |
| 1945 | Formula (I-2) | Ar¹-237 | Ar¹-59 |
| 1946 | Formula (I-2) | Ar¹-237 | Ar¹-60 |
| 1947 | Formula (I-2) | Ar¹-237 | Ar¹-63 |
| 1948 | Formula (I-2) | Ar¹-237 | Ar¹-65 |
| 1949 | Formula (I-2) | Ar¹-237 | Ar¹-68 |
| 1950 | Formula (I-2) | Ar¹-237 | Ar¹-75 |
| 1951 | Formula (I-2) | Ar¹-237 | Ar¹-87 |
| 1952 | Formula (I-2) | Ar¹-237 | Ar¹-91 |
| 1953 | Formula (I-2) | Ar¹-237 | Ar¹-107 |
| 1954 | Formula (I-2) | Ar¹-237 | Ar¹-109 |
| 1955 | Formula (I-2) | Ar¹-237 | Ar¹-111 |
| 1956 | Formula (I-2) | Ar¹-237 | Ar¹-114 |
| 1957 | Formula (I-2) | Ar¹-237 | Ar¹-121 |
| 1958 | Formula (I-2) | Ar¹-237 | Ar¹-151 |
| 1959 | Formula (I-2) | Ar¹-237 | Ar¹-153 |
| 1960 | Formula (I-2) | Ar¹-237 | Ar¹-162 |

Further preferred compounds correspond to the compounds 1 to 1960 shown above, with a formula (I-3) correspondingly in place of the formula (I-1) or (I-2), Further preferred compounds again correspond to the compounds 1 to 1960 shown above, with a formula (I-4) correspondingly in place of the formula (I-1) or (I-2).

Further examples of compounds of formula (I) are depicted below:

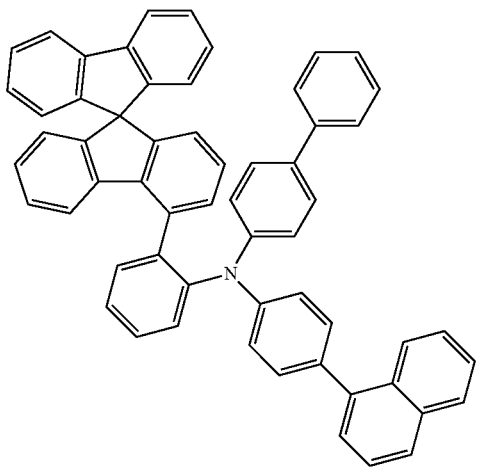
1
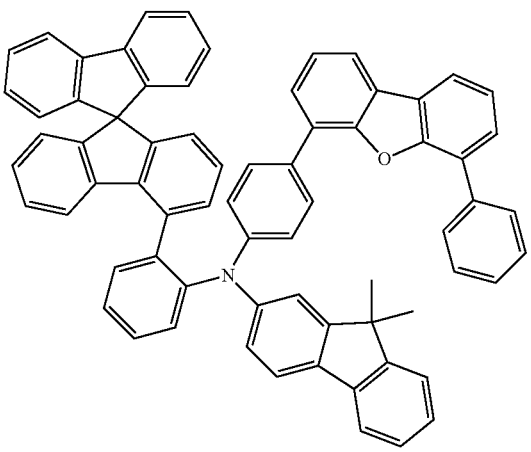
4
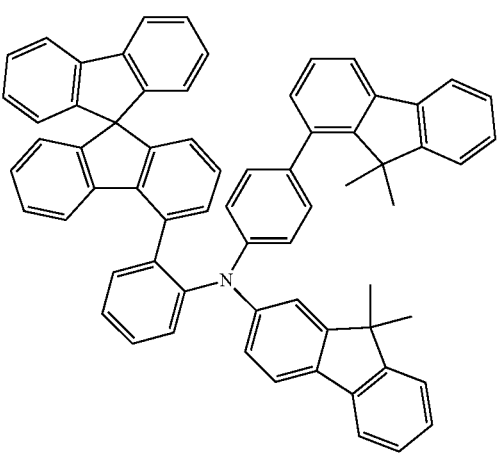
5
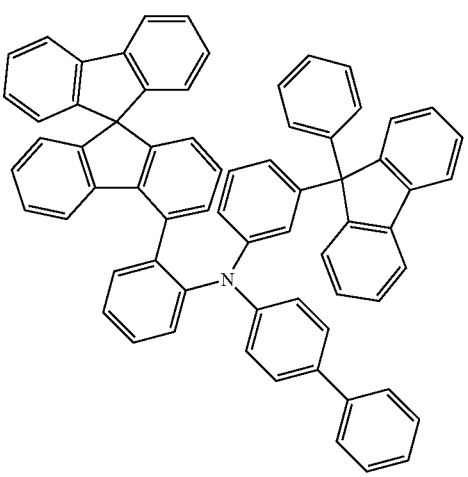
6

85
-continued
7
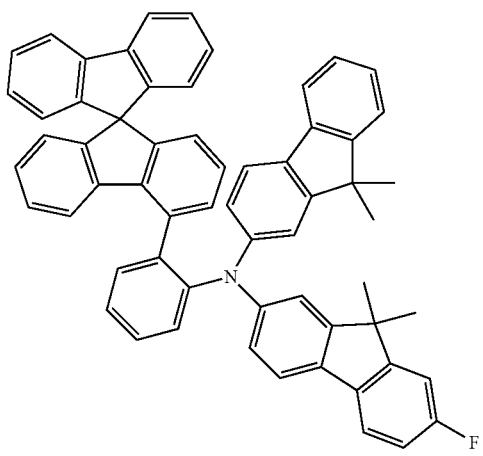
8
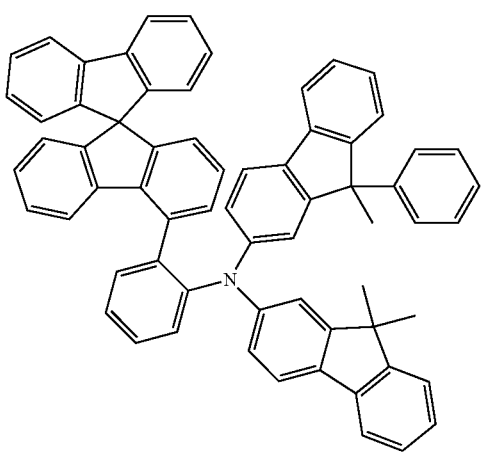
9
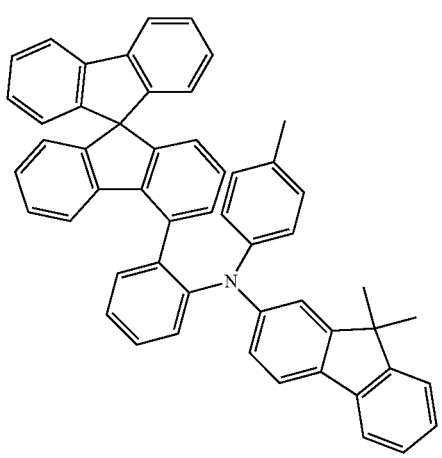
86
-continued
10
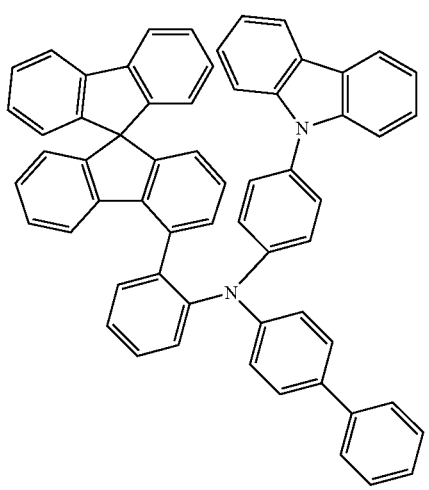
11
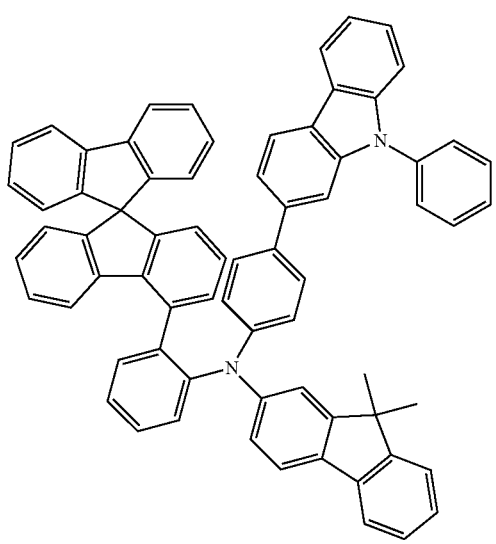
12
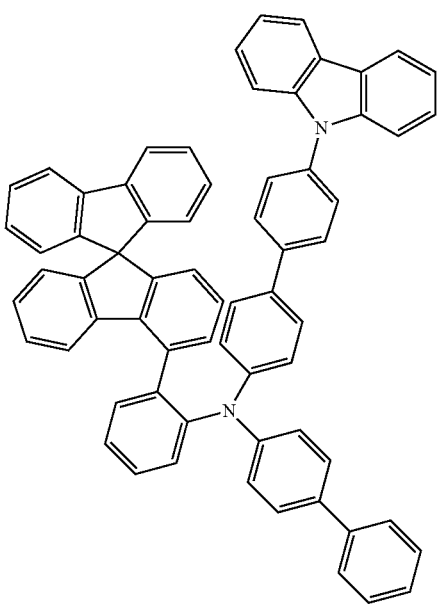

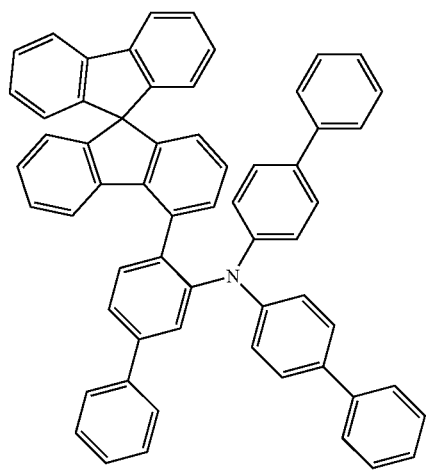
13
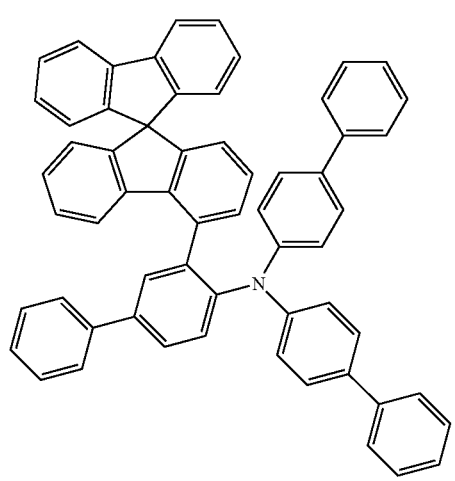
14
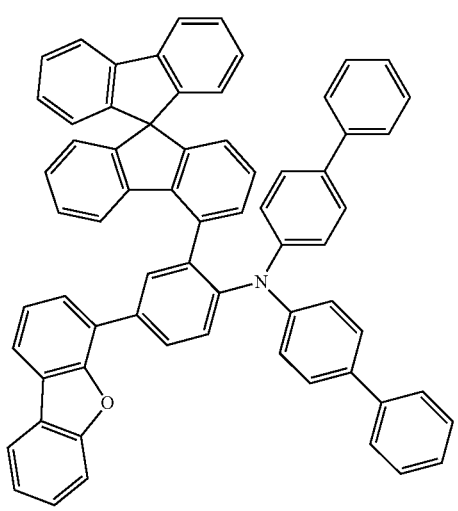
15
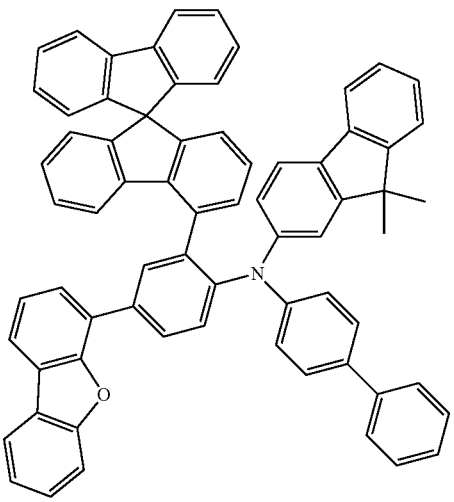
16
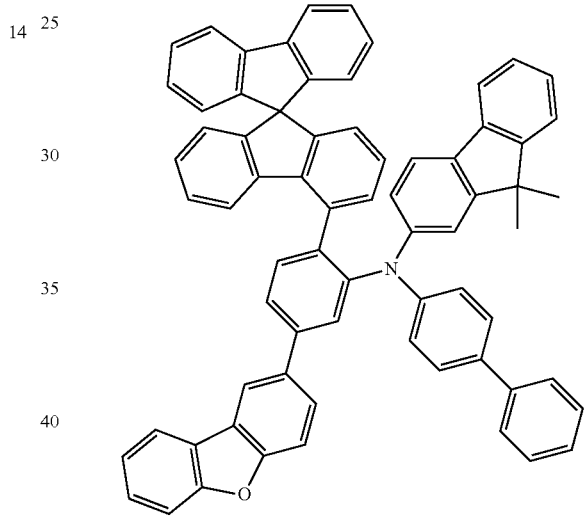
17
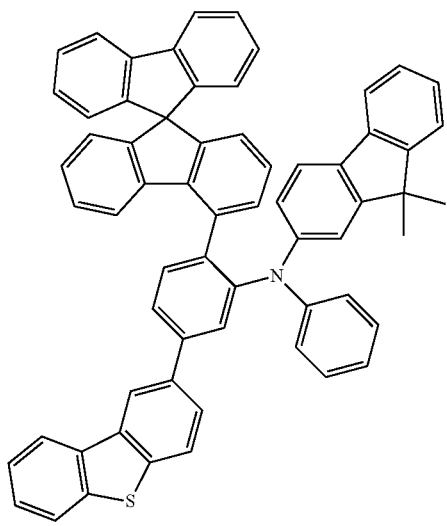
18

89
-continued
19
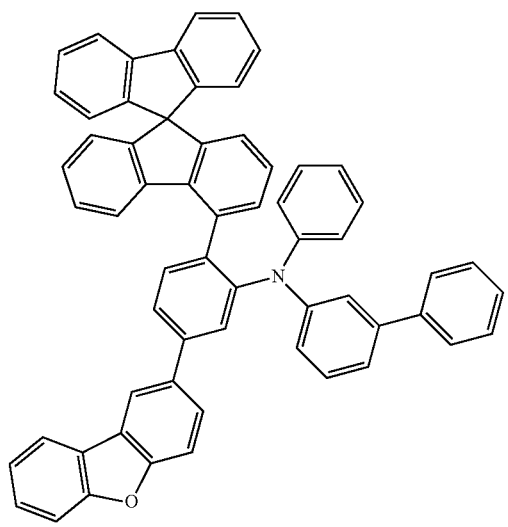
20
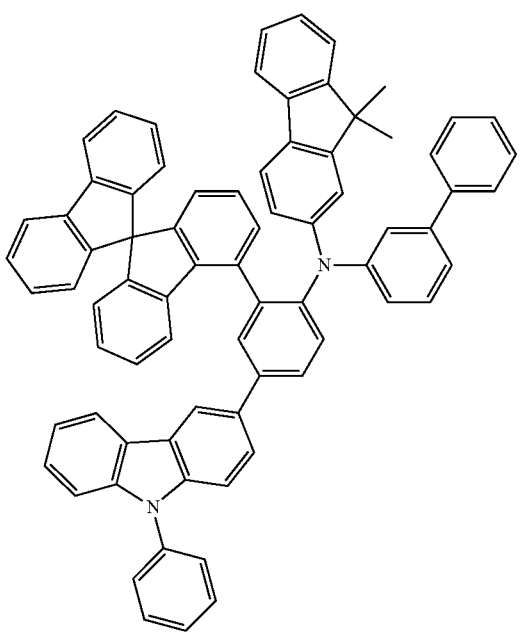
90
-continued
21
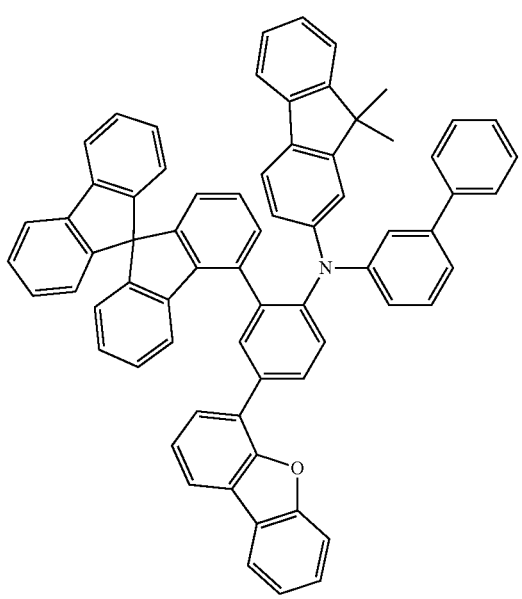
22
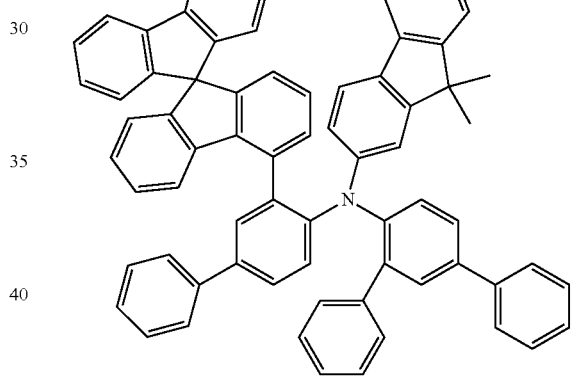
23
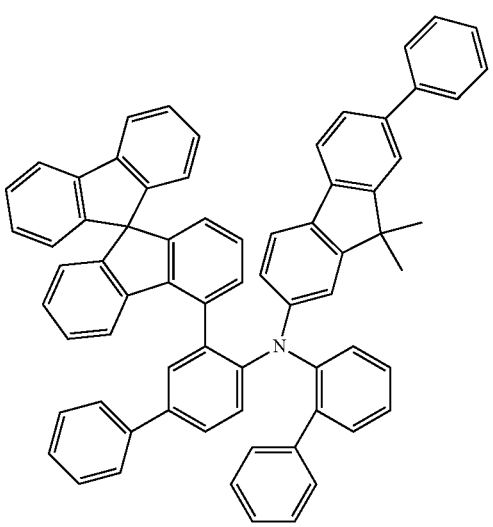

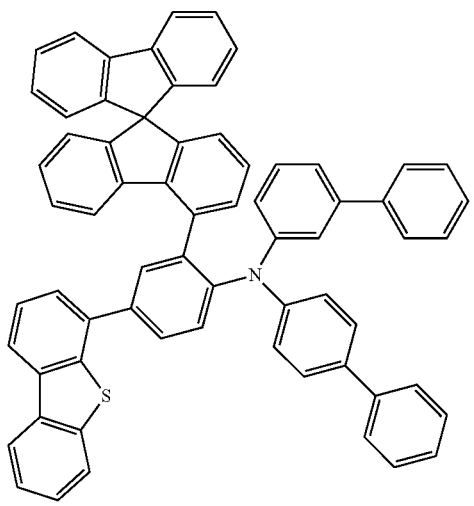
24
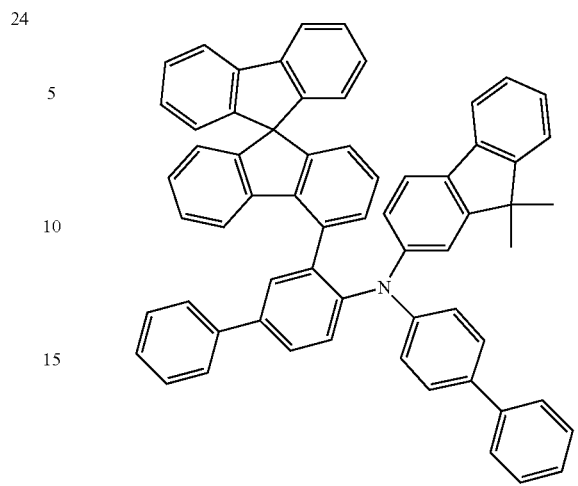
27
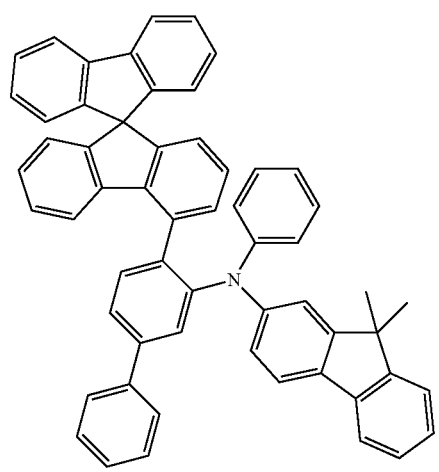
25
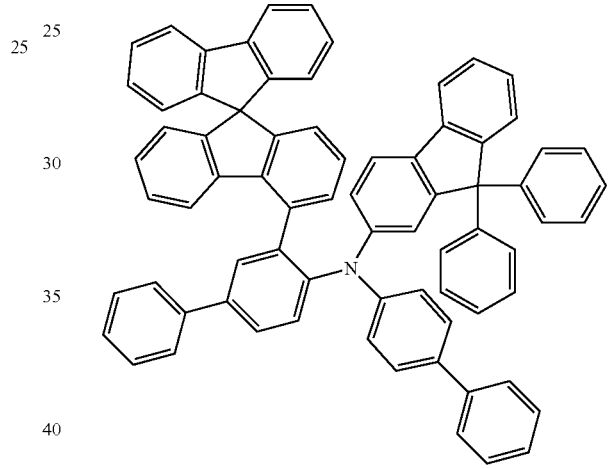
28
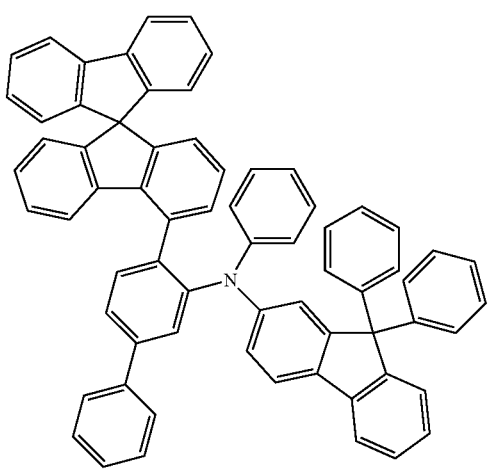
26
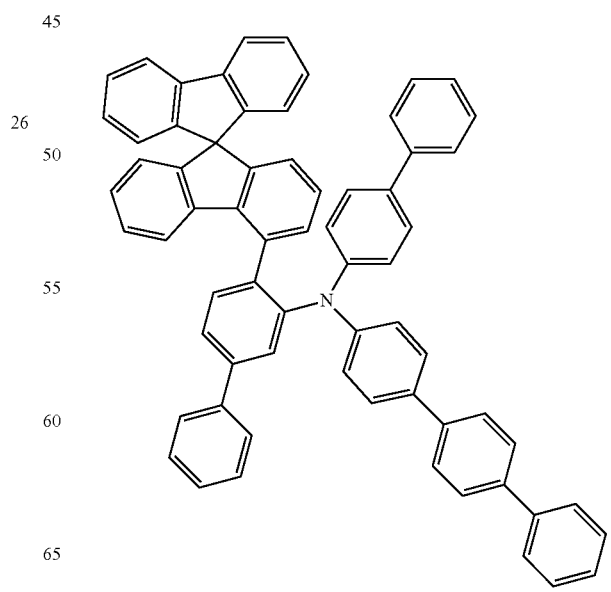
29

93
-continued
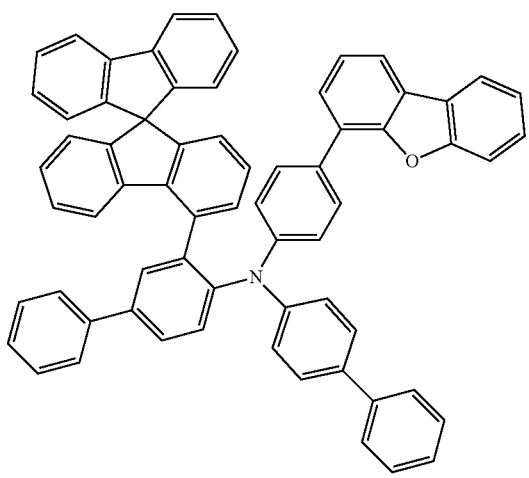
30
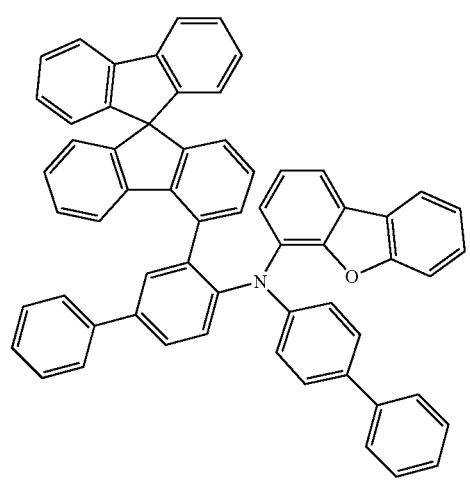
31
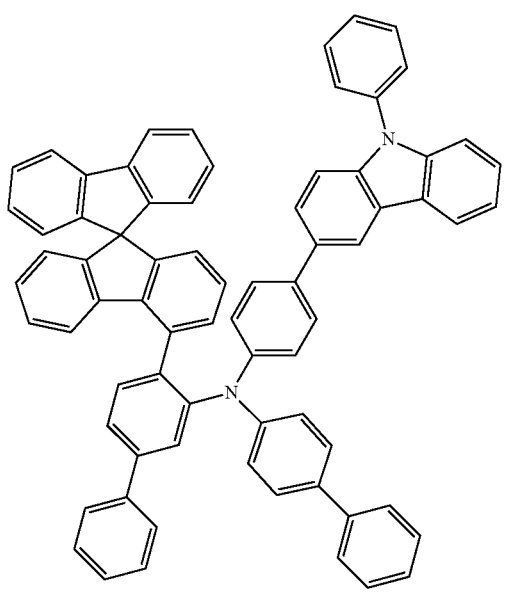
32
94
-continued
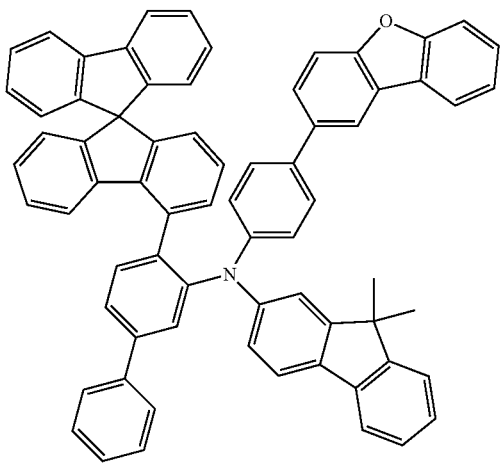
33
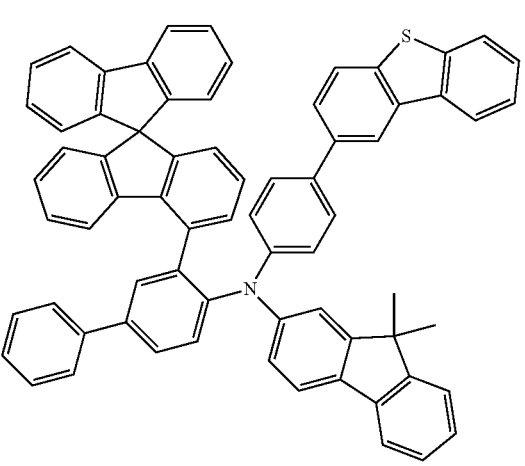
34
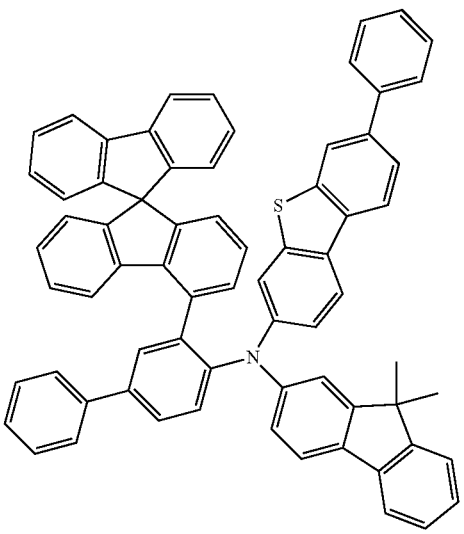
35

36
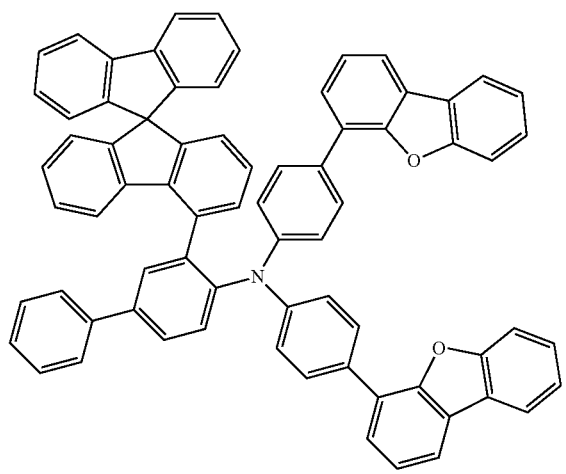
37
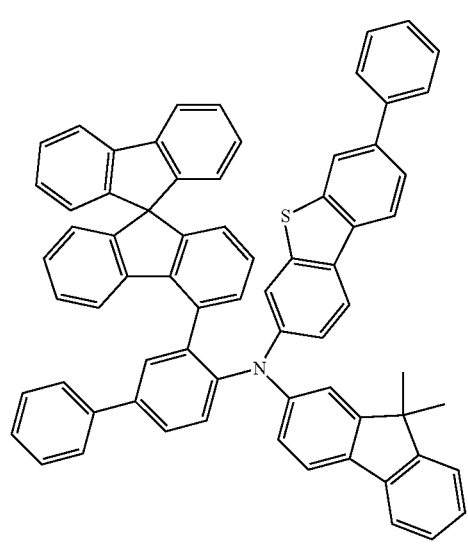
38
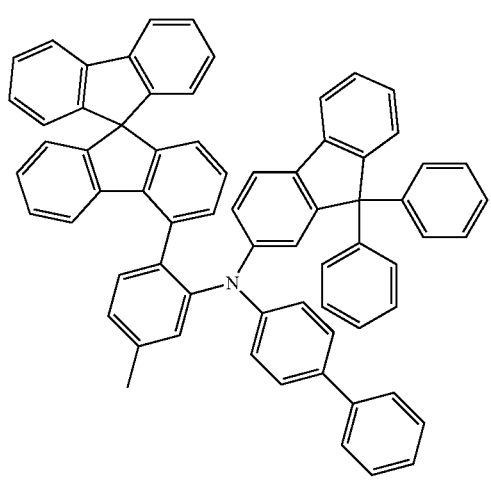
39
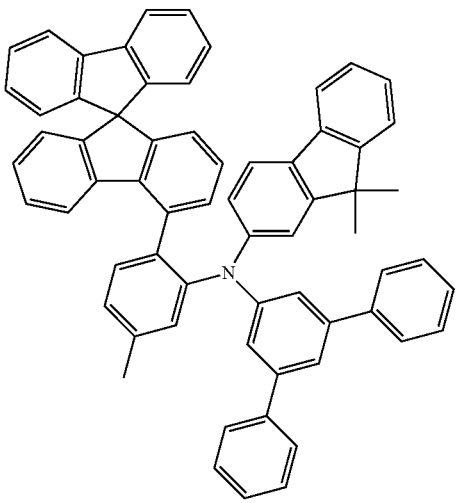
40
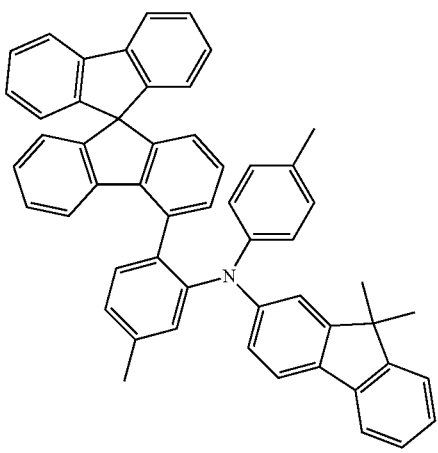
41
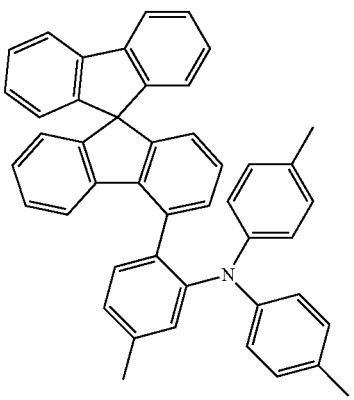

42
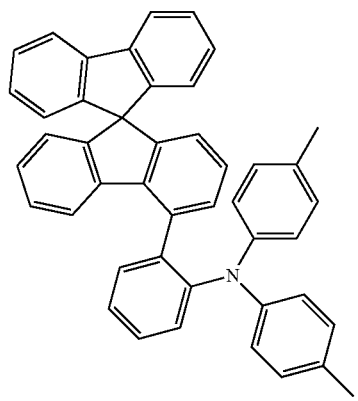
43
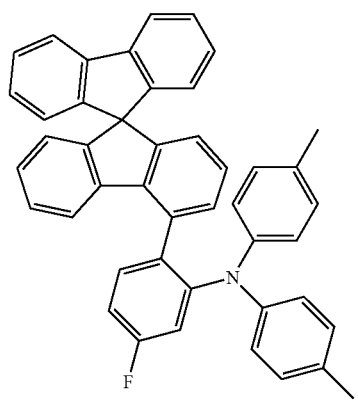
44
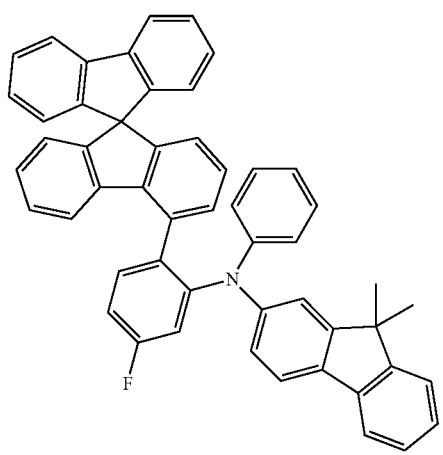
45
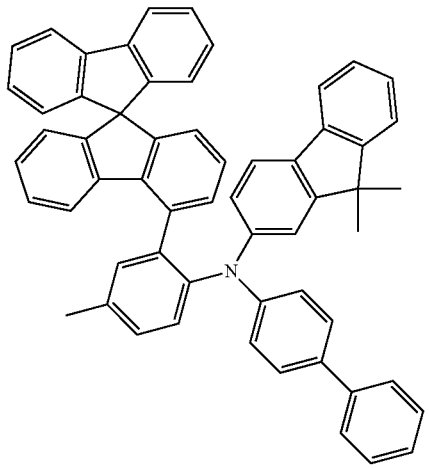
46
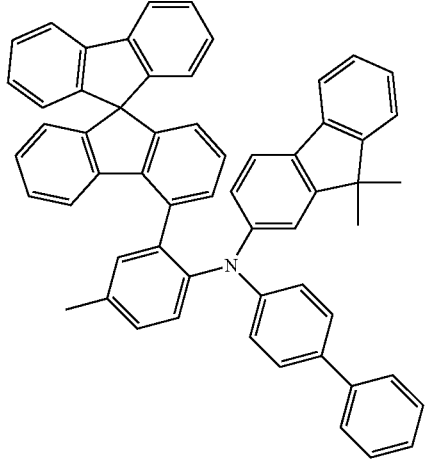
47
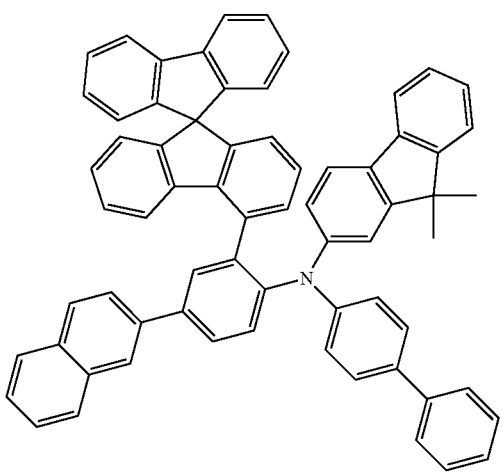

48
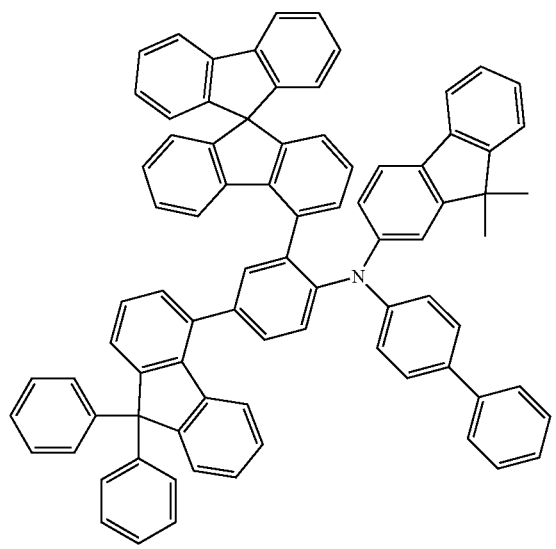
49
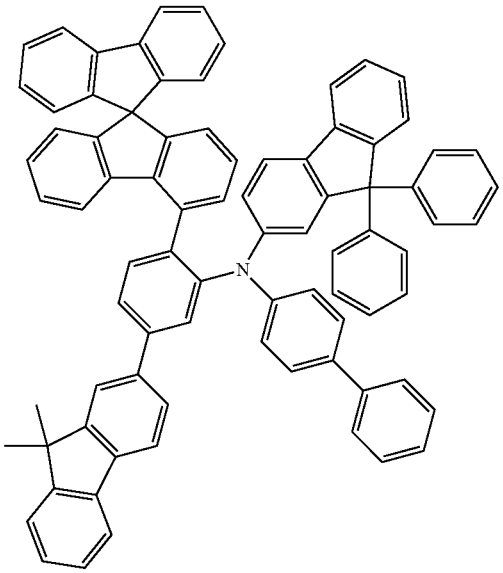
50
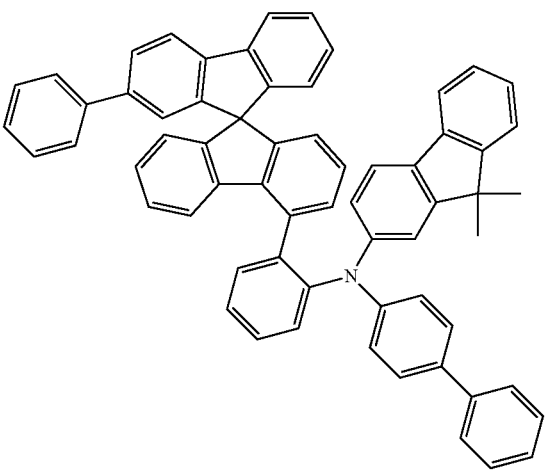
51
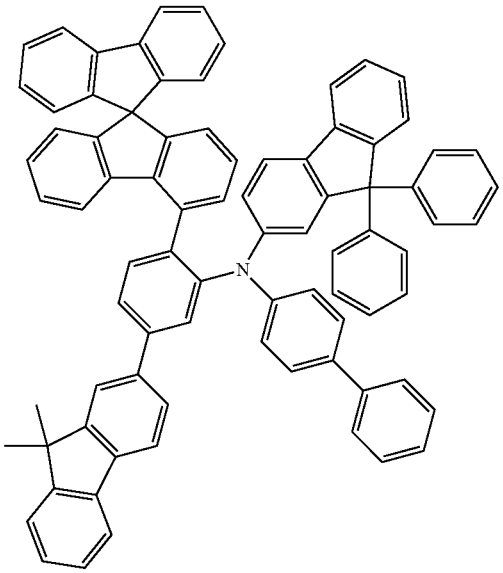
52
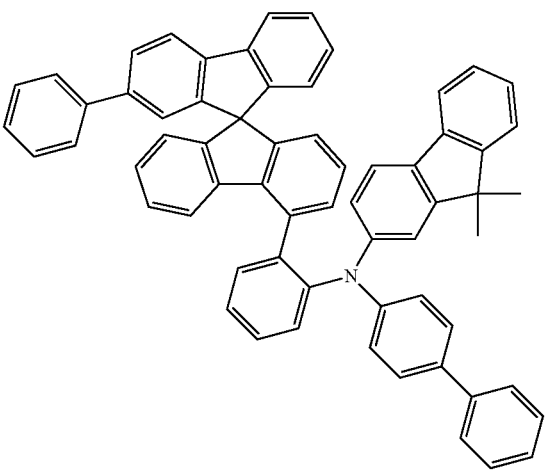
53
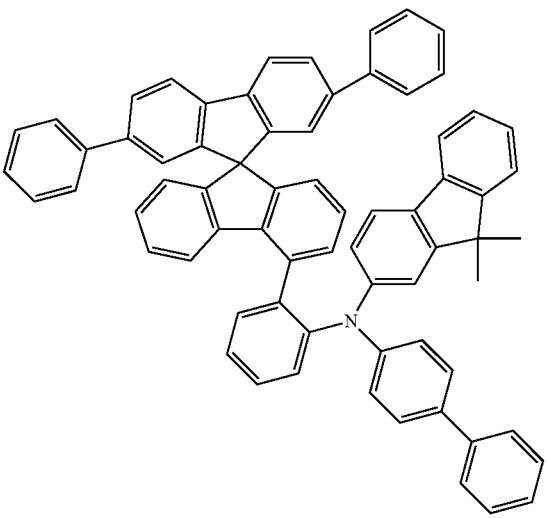

-continued
54
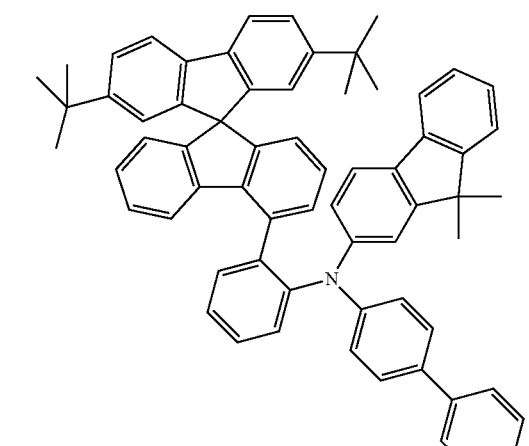
55
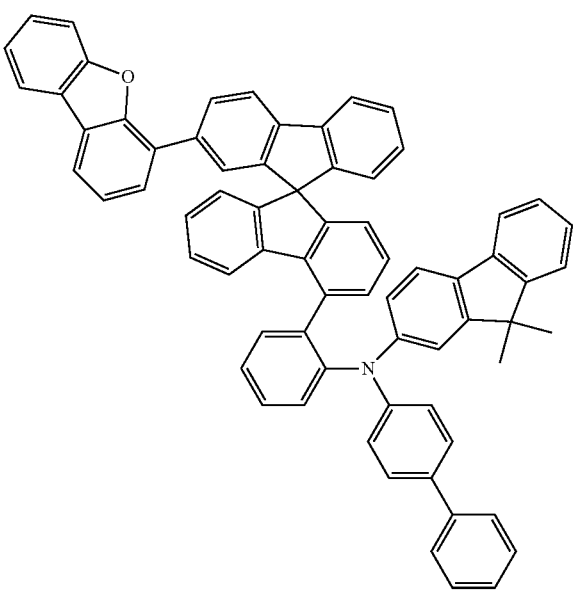
56
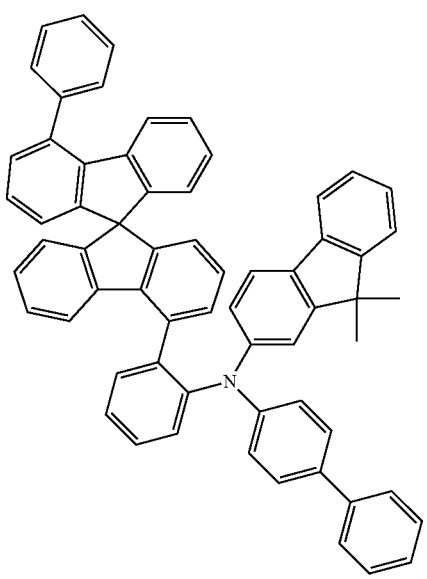
-continued
57
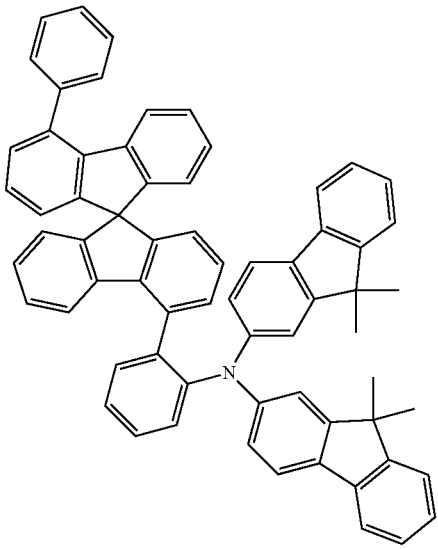
58
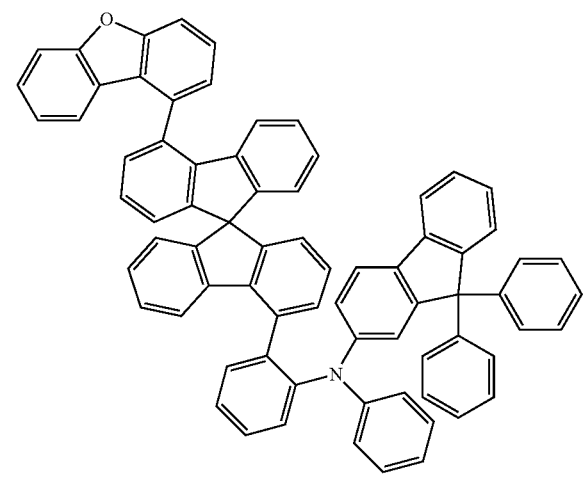

103
-continued
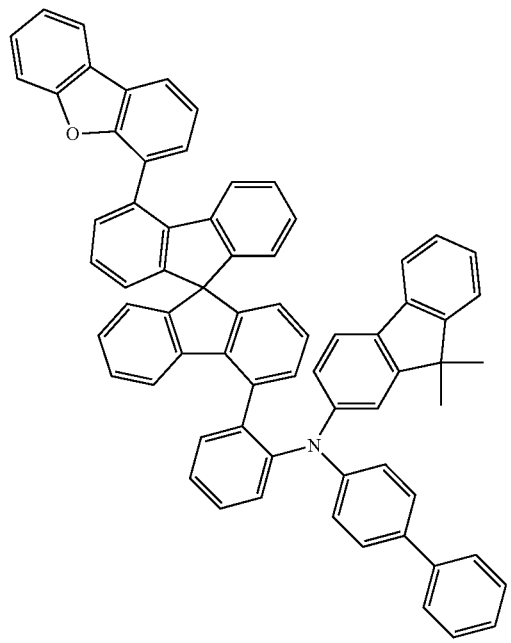
59
104
-continued
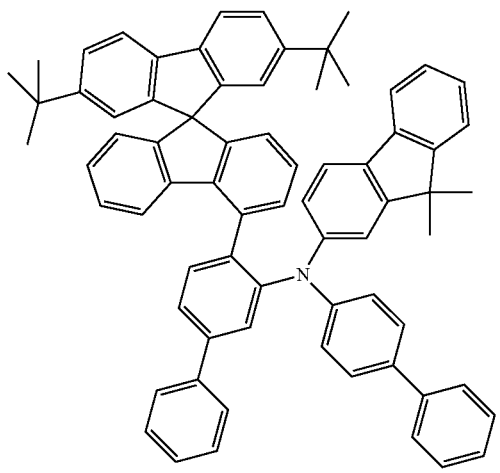
61
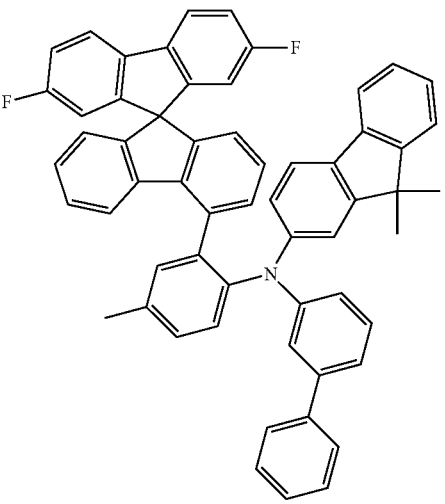
62
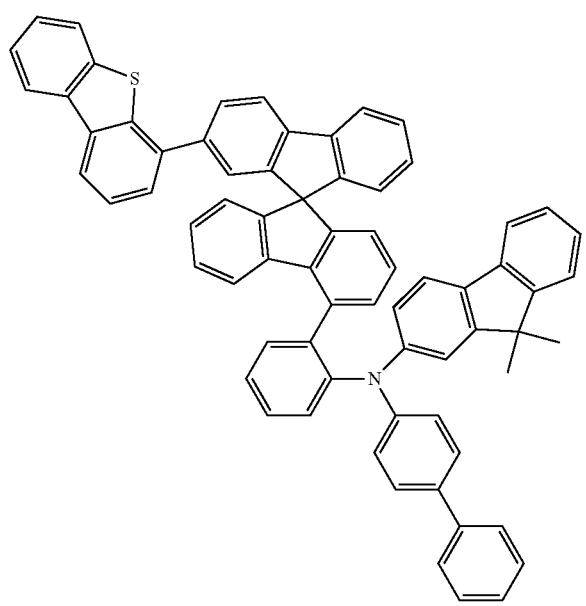
60
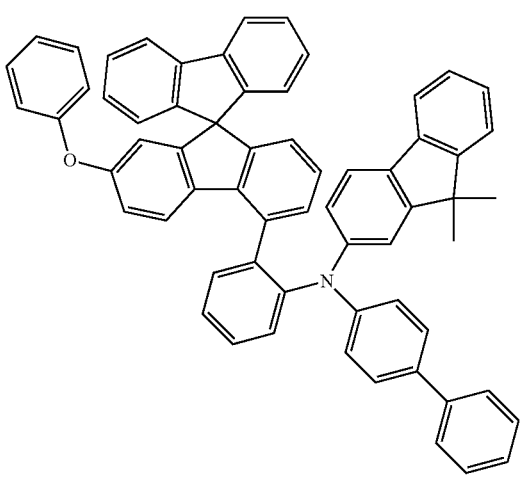
63

64
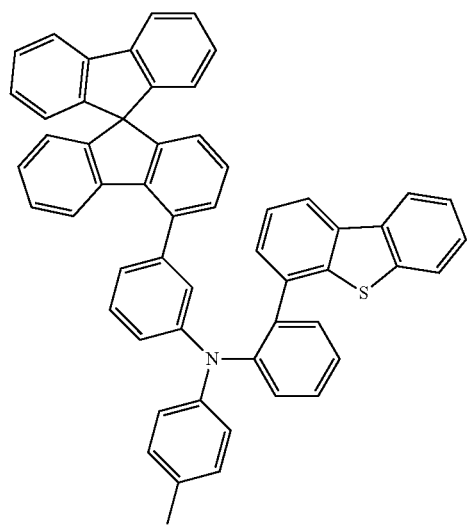
66
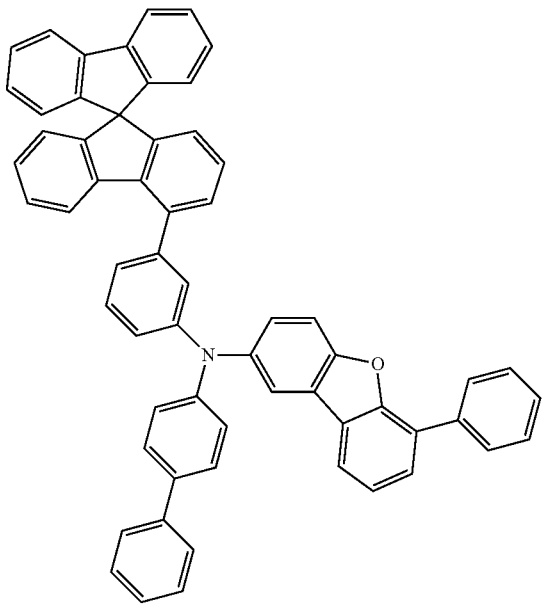
65
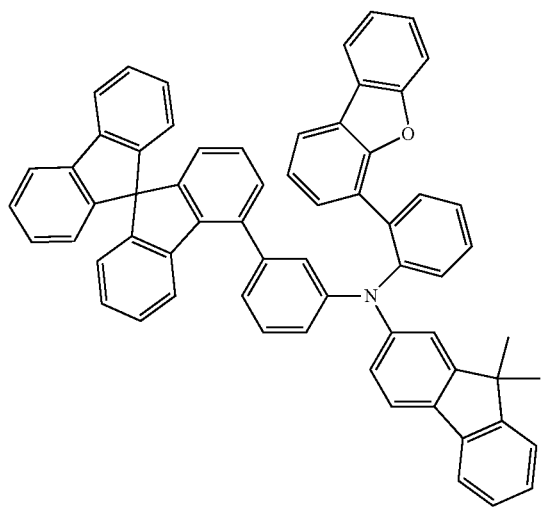
67
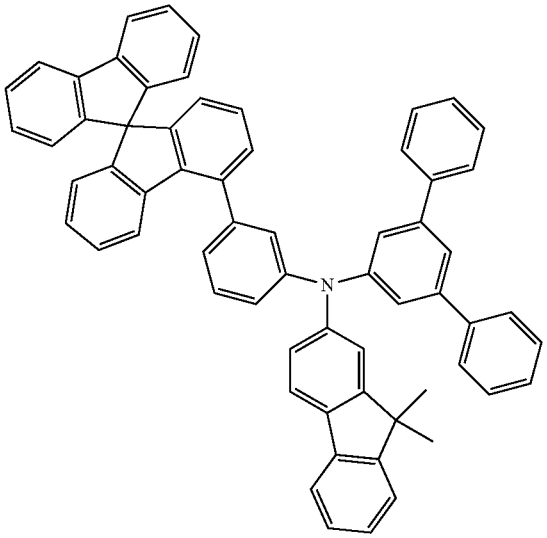

68
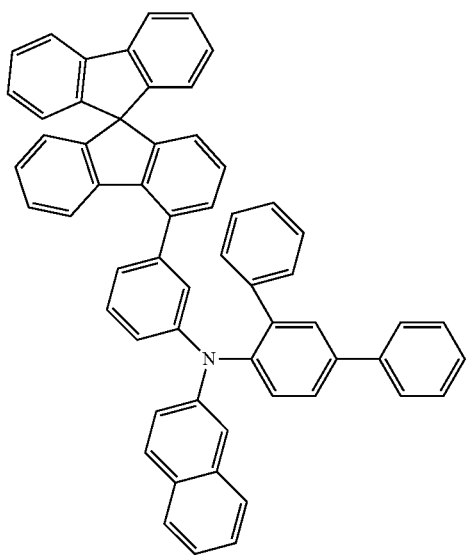
69
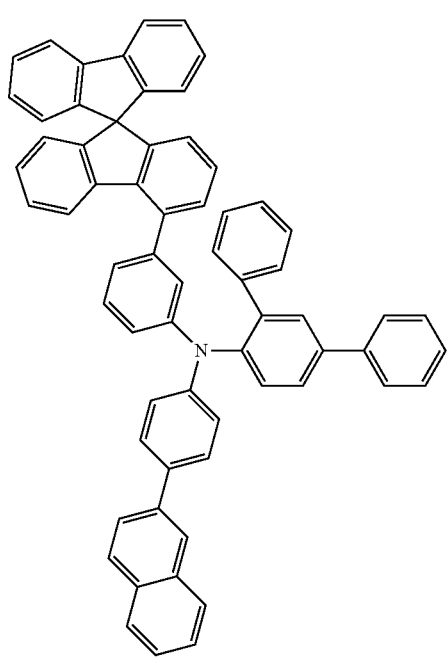
70
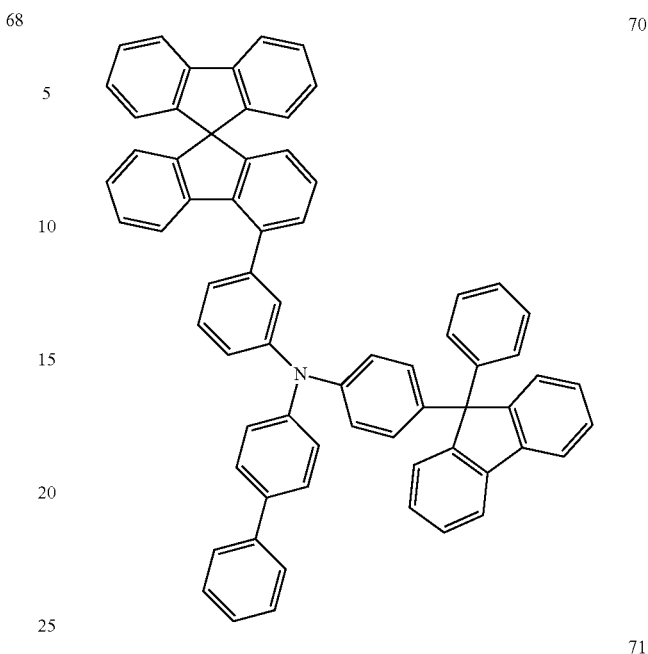
71
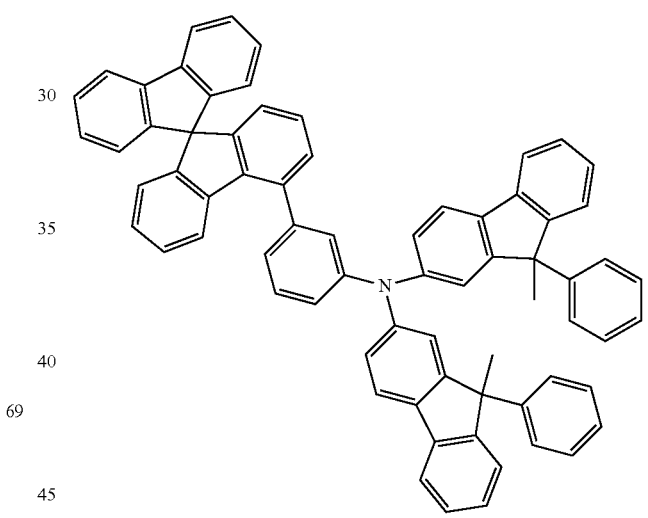
72
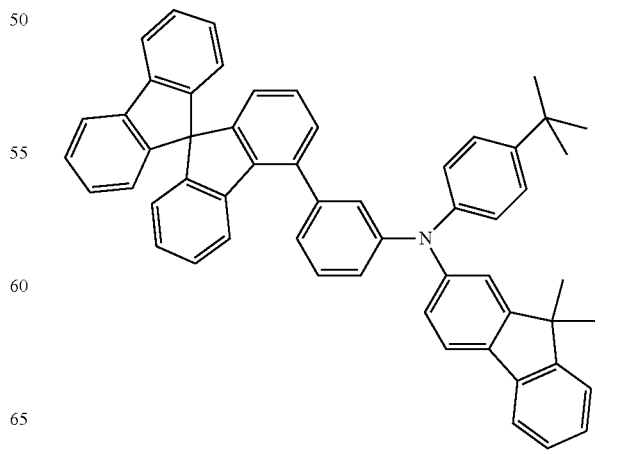

73
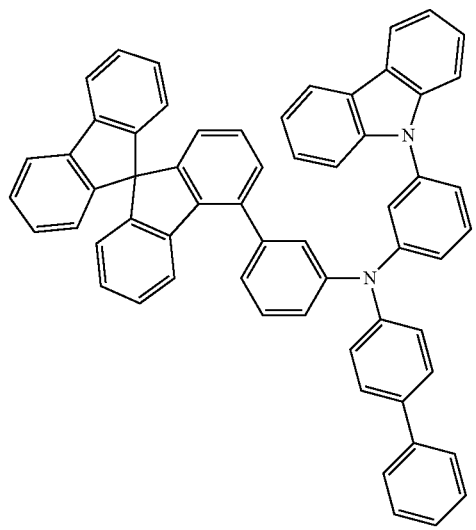
74
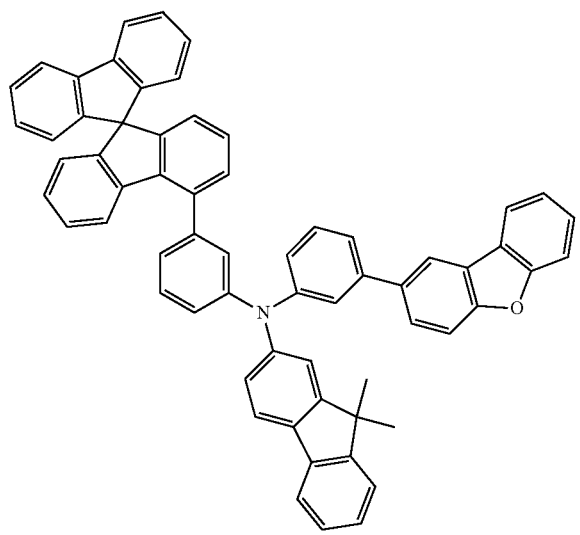
75
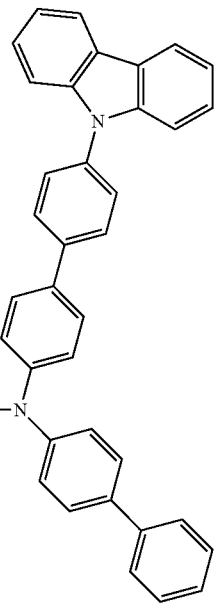
76
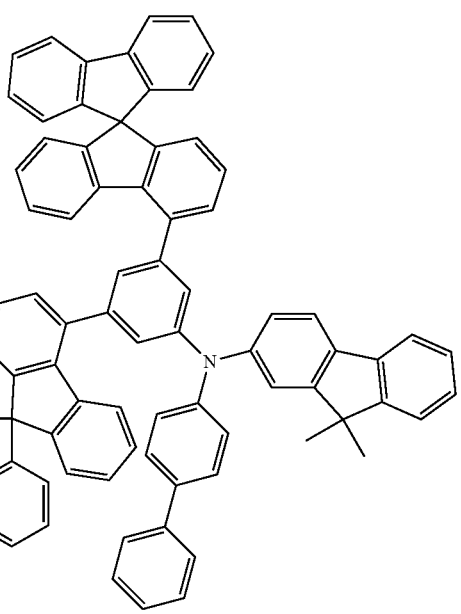

111
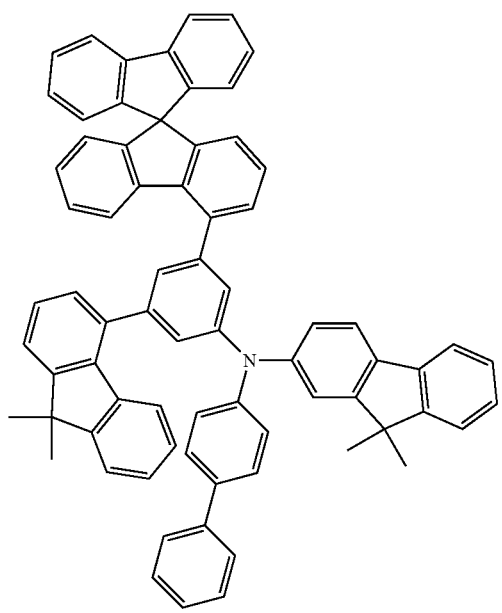
77
112
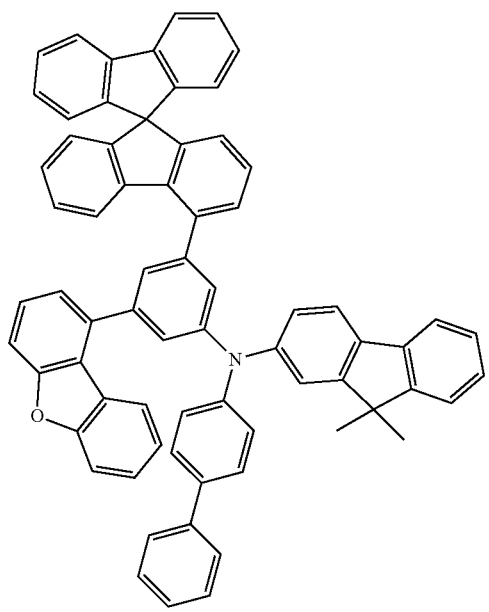
79
78
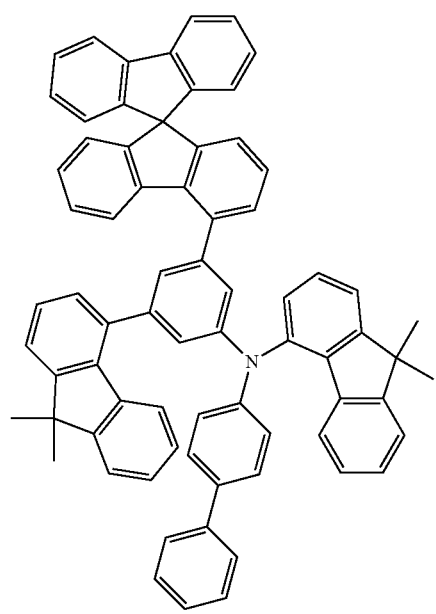
80
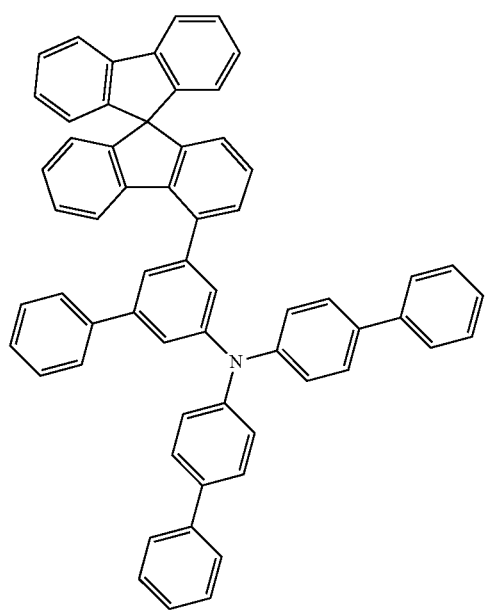

113
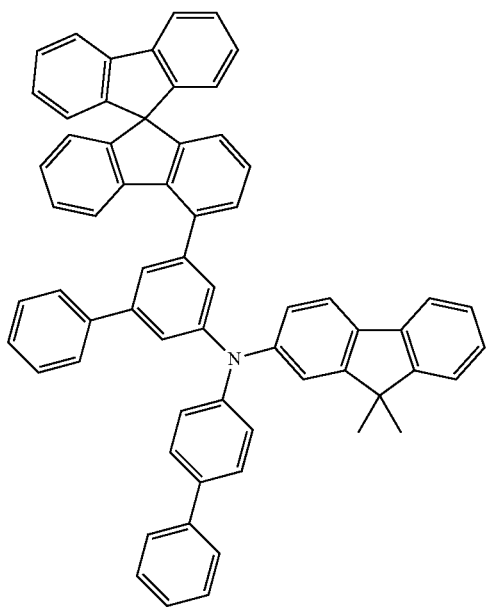
114
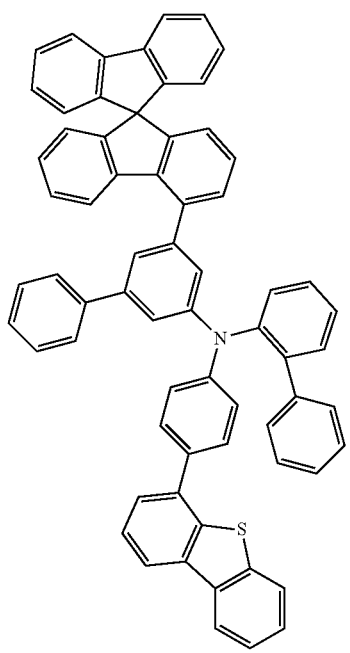
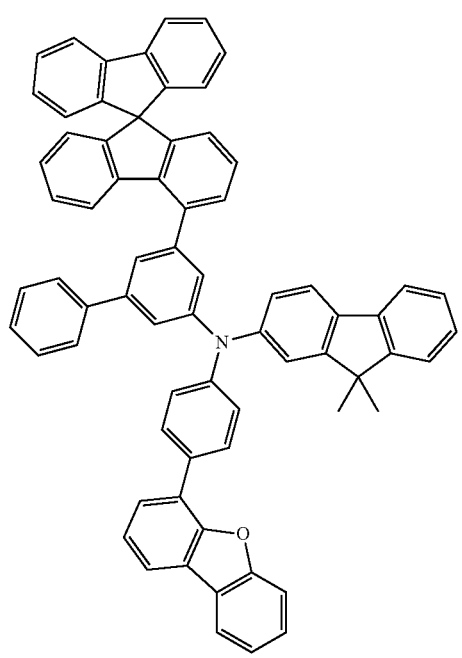
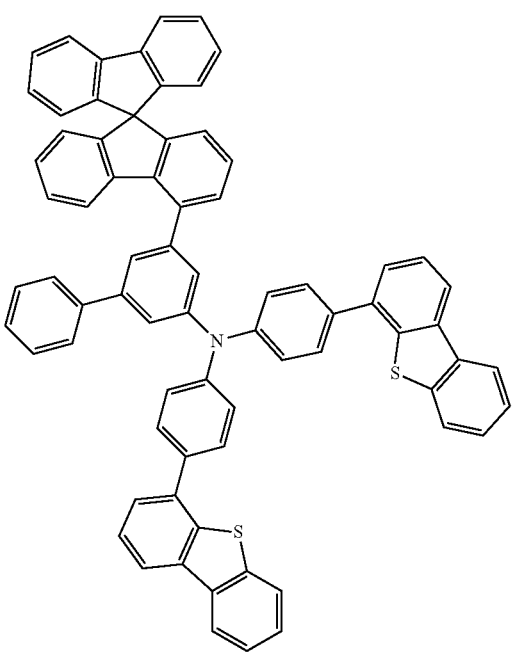

115
-continued
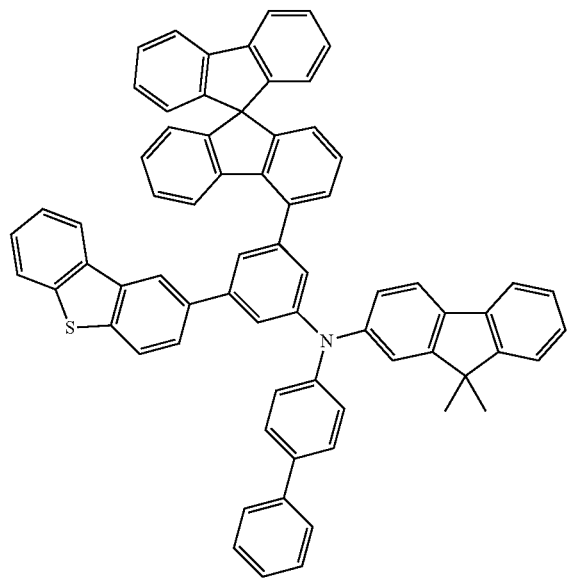
85
116
-continued
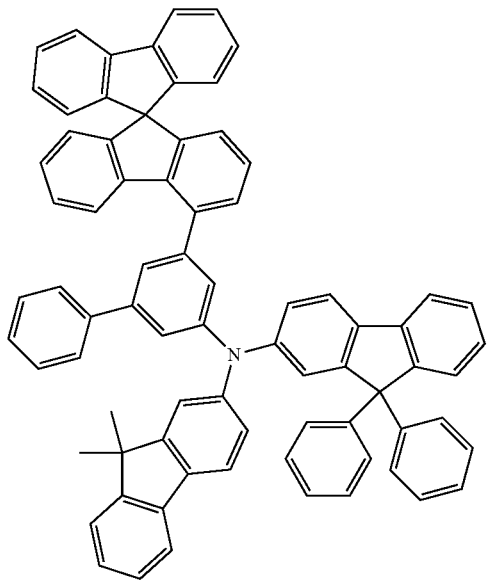
87
86
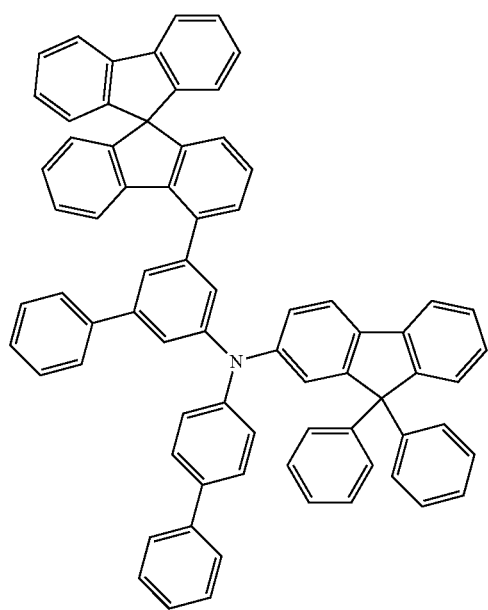
88
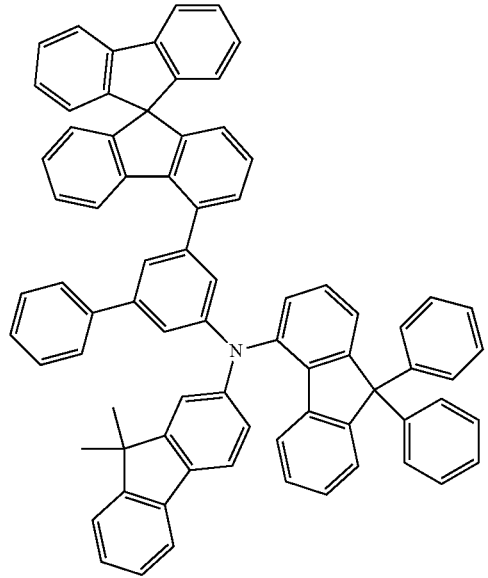

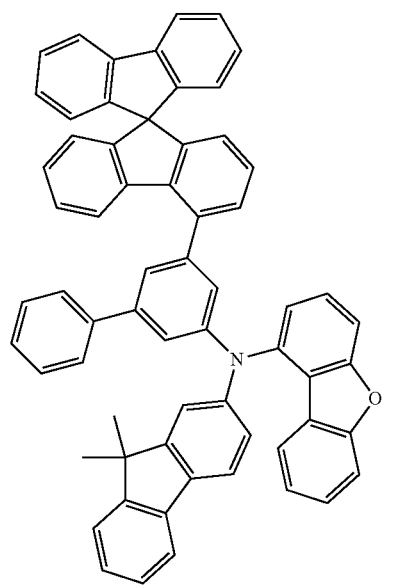
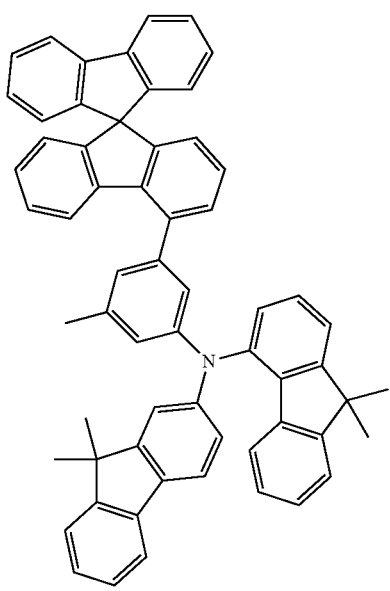

93
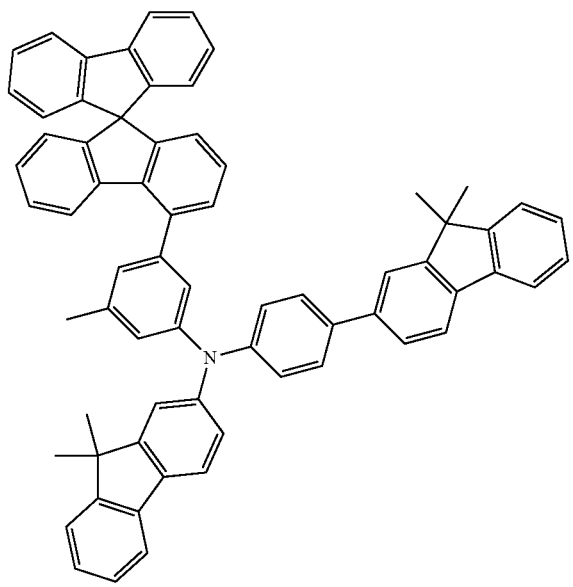
94
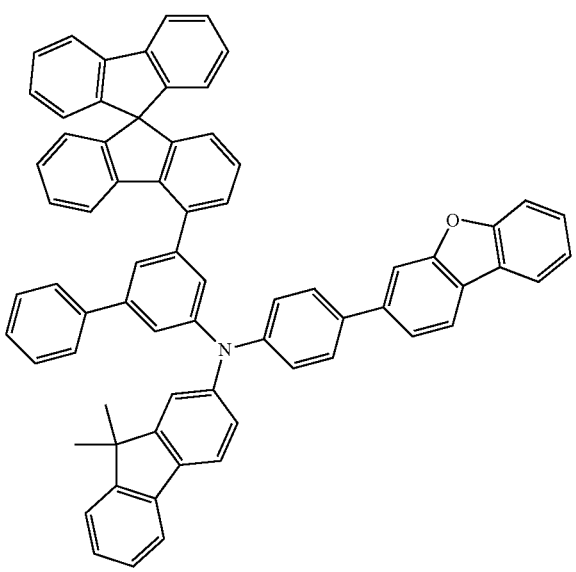
95
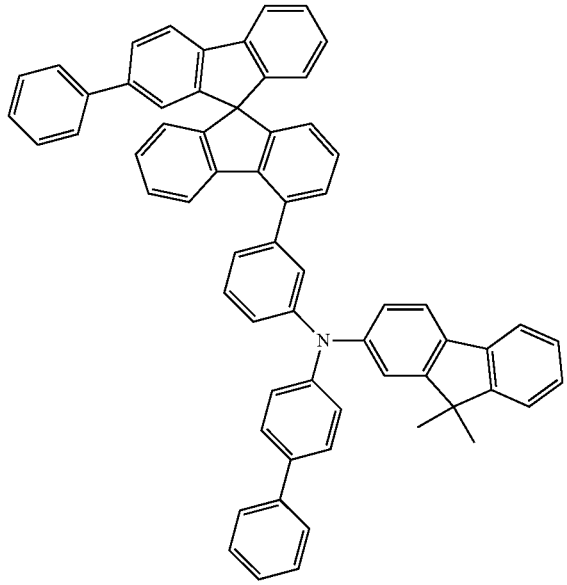
96
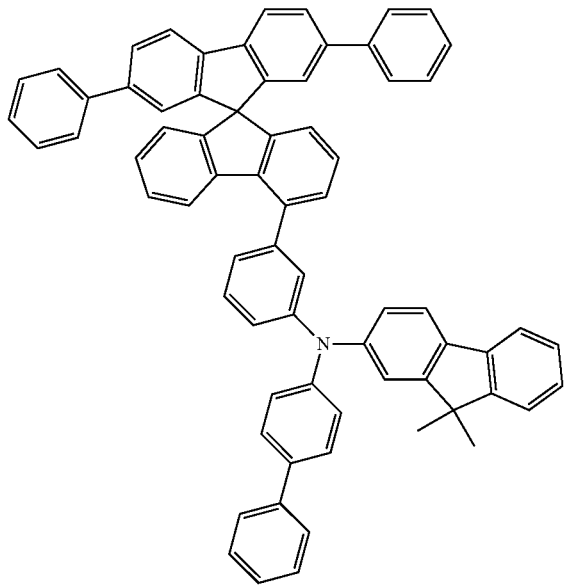

97
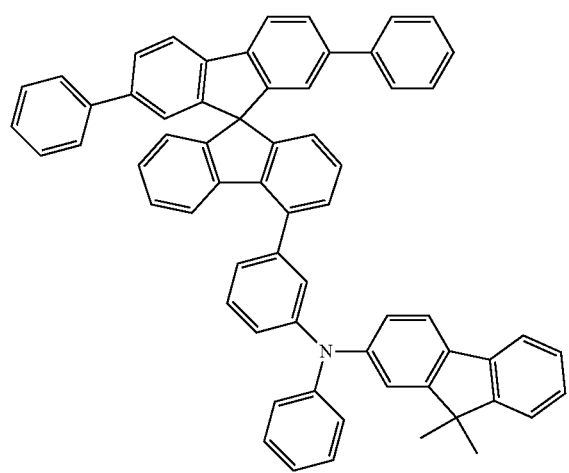
98
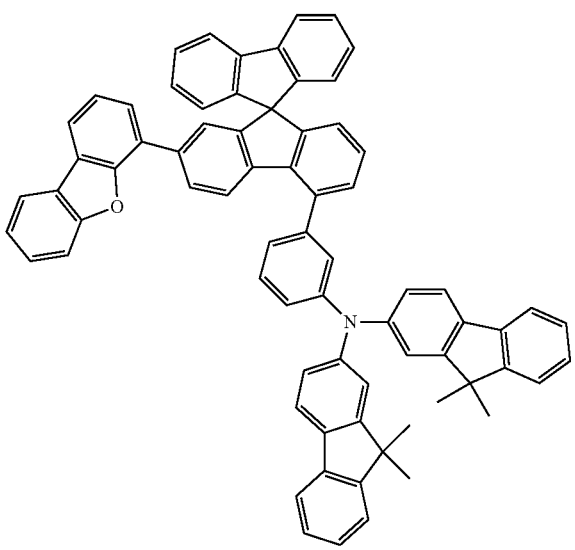
99
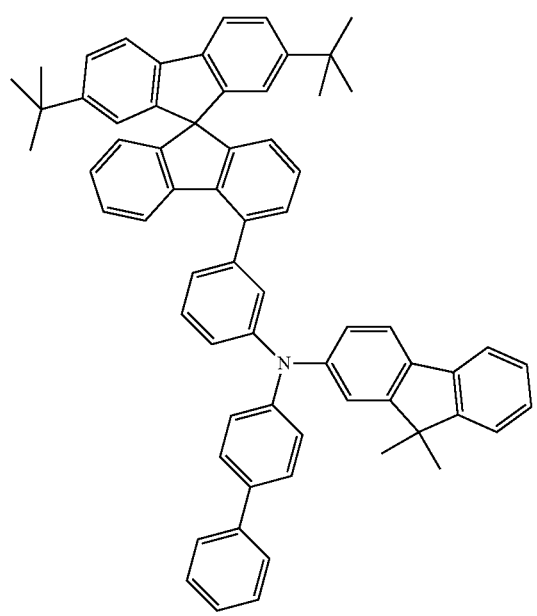
100
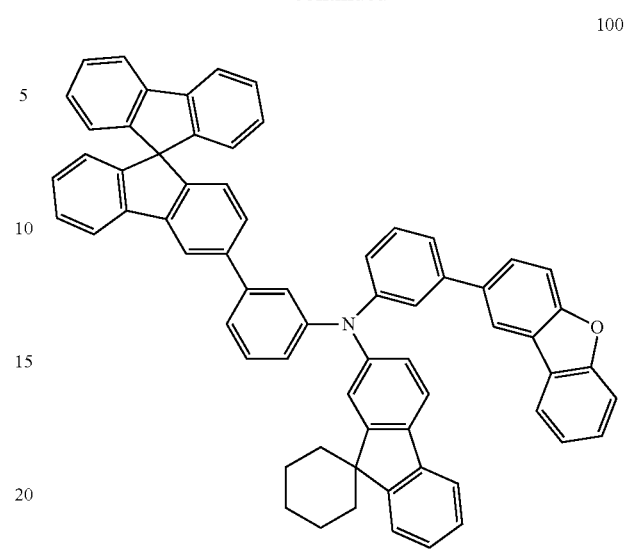
101
102

103
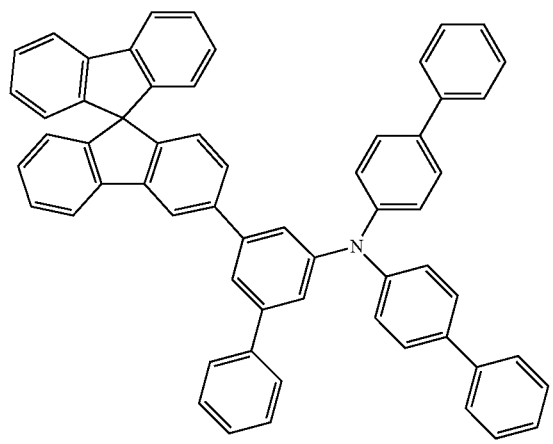
104
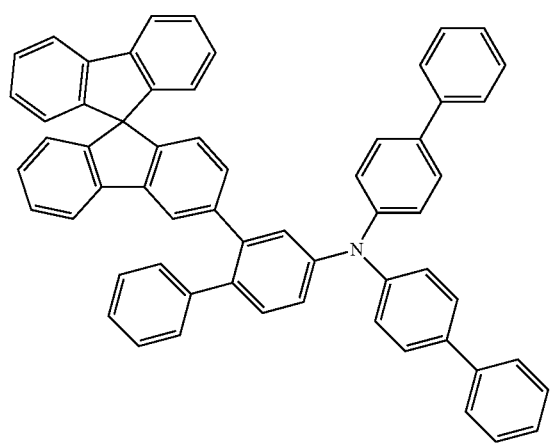
105
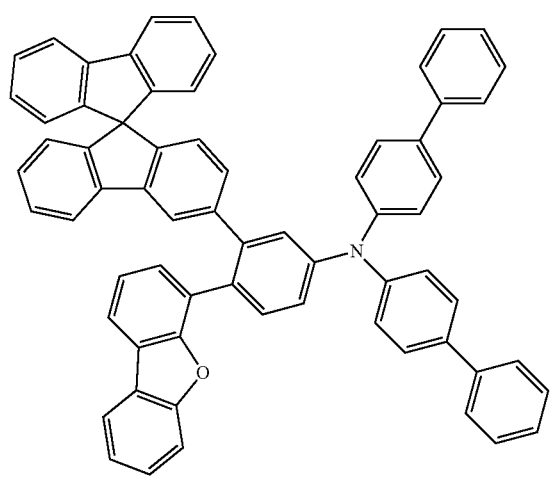
106
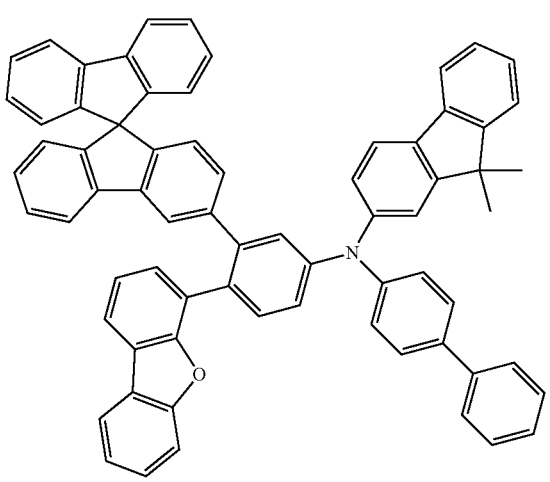
107
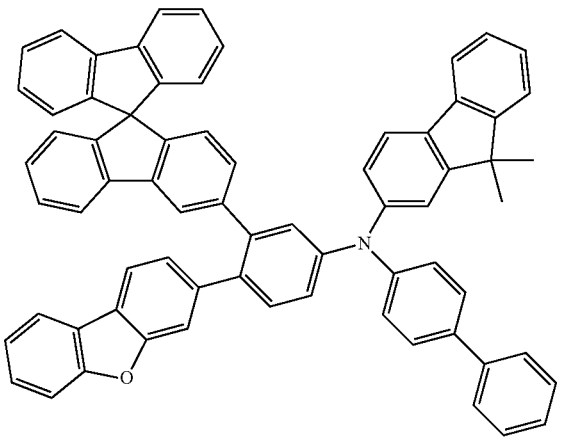
108
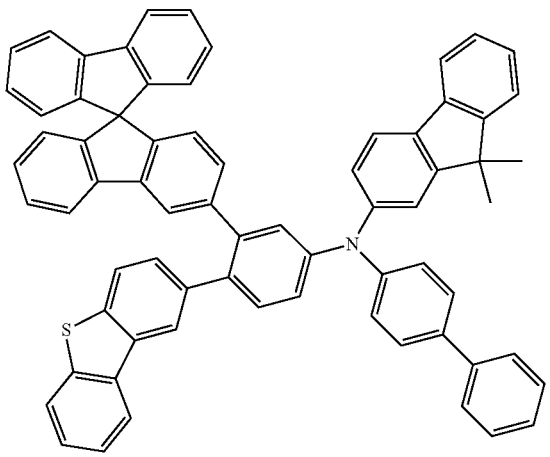

109
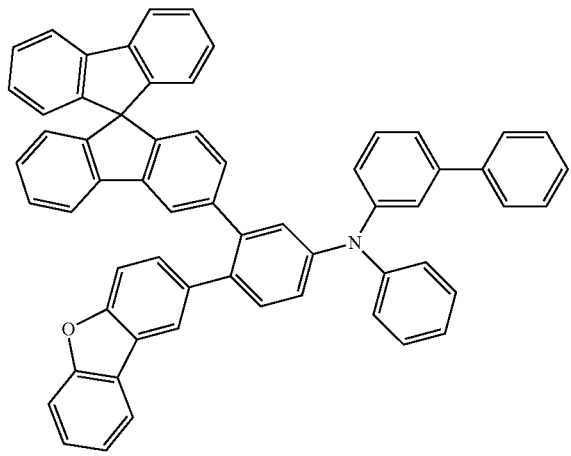
110
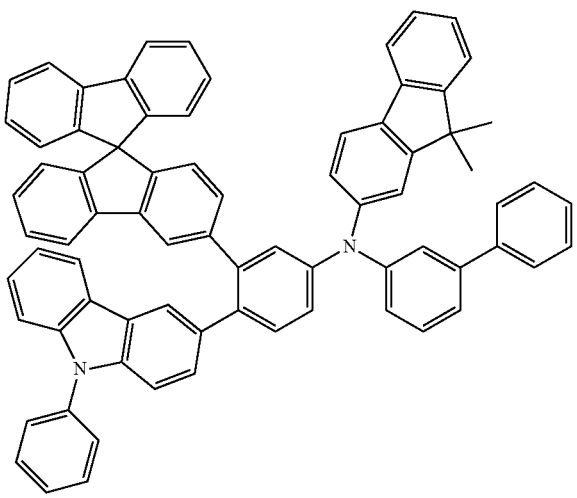
111
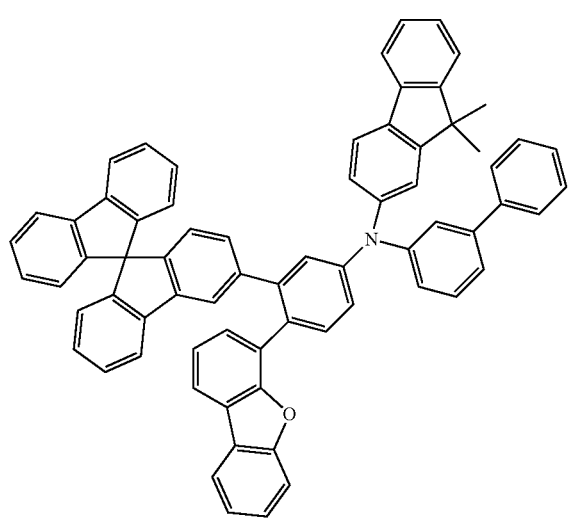
112
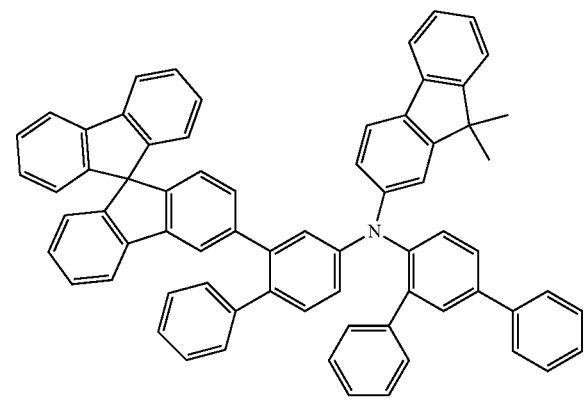
113
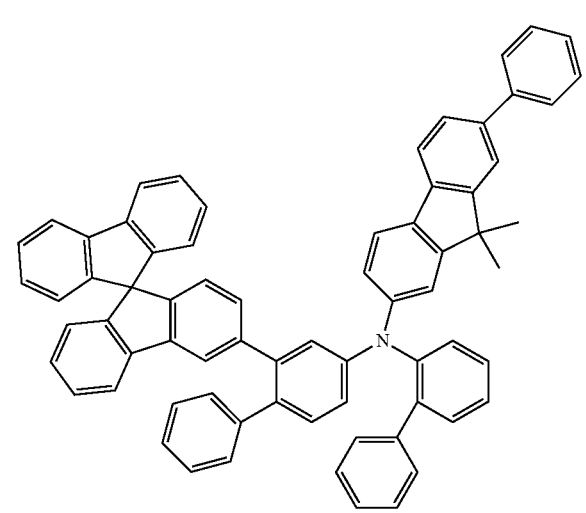
114
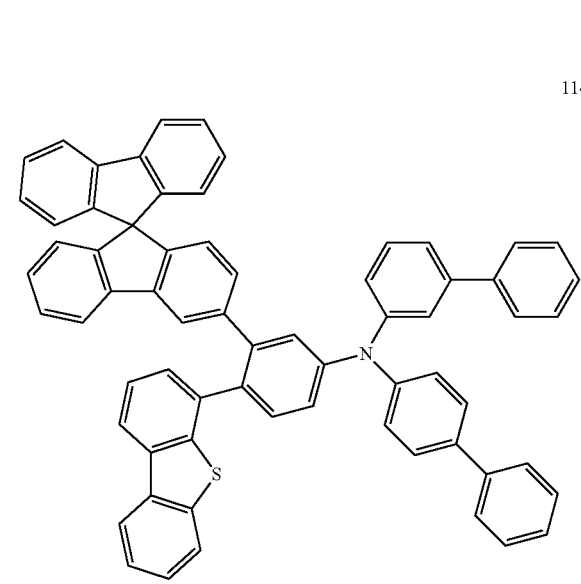

115
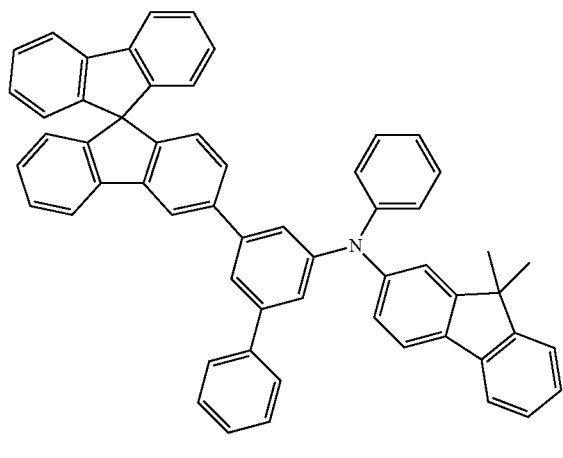
116
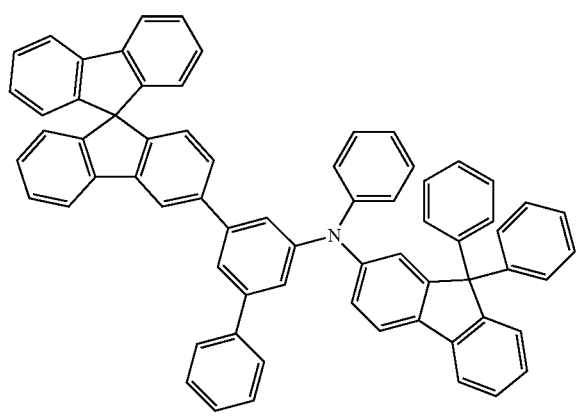
117
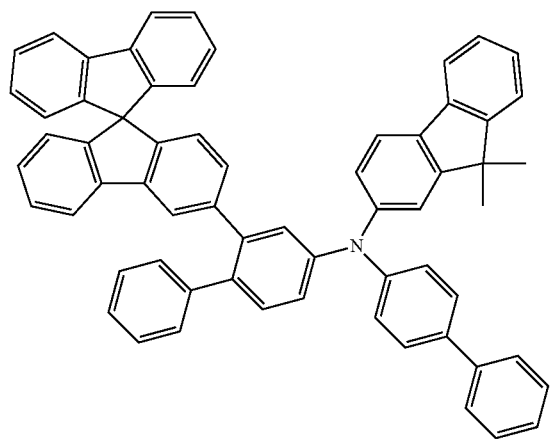
118
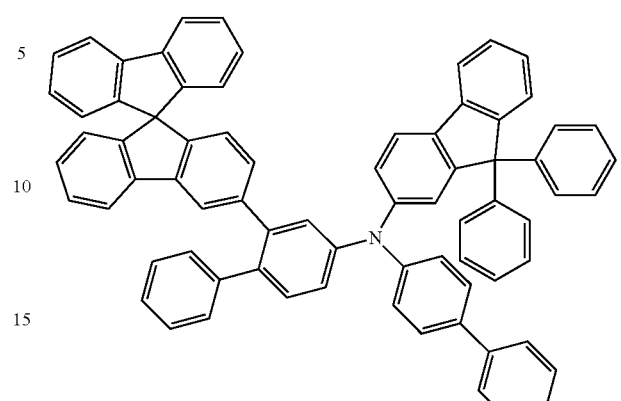
119
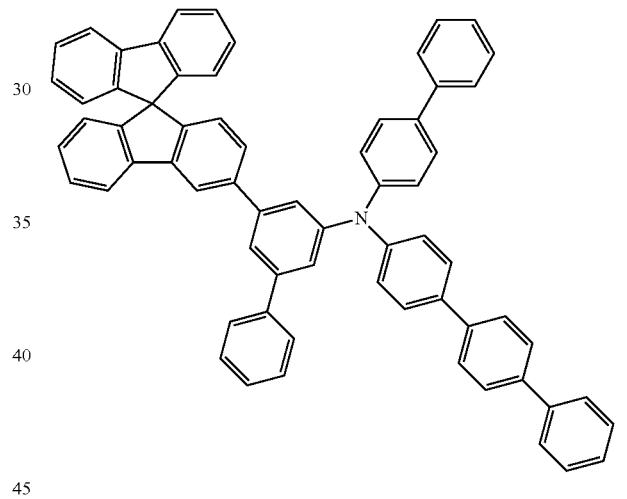
120
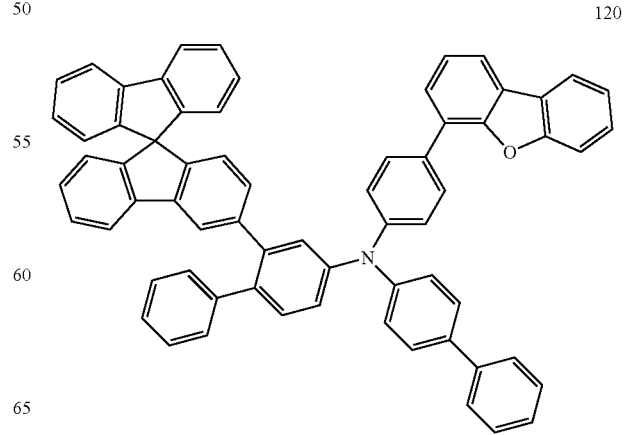

121
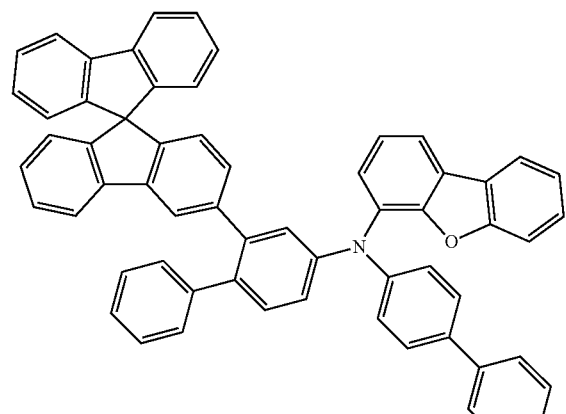
122
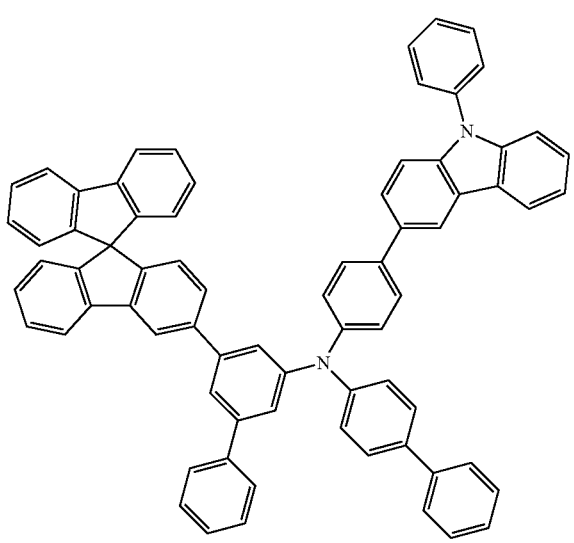
123
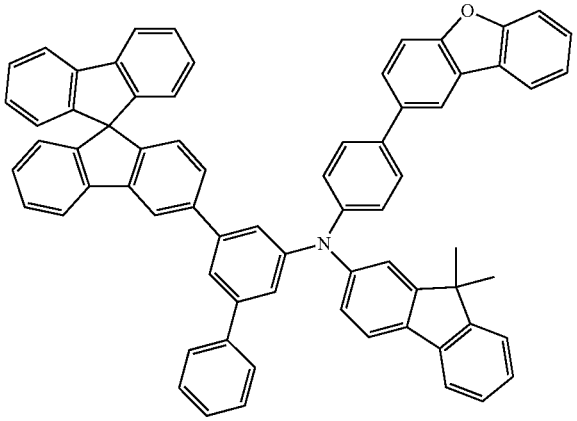
124
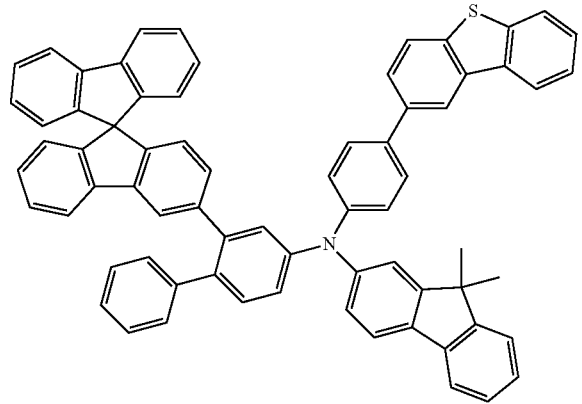
125
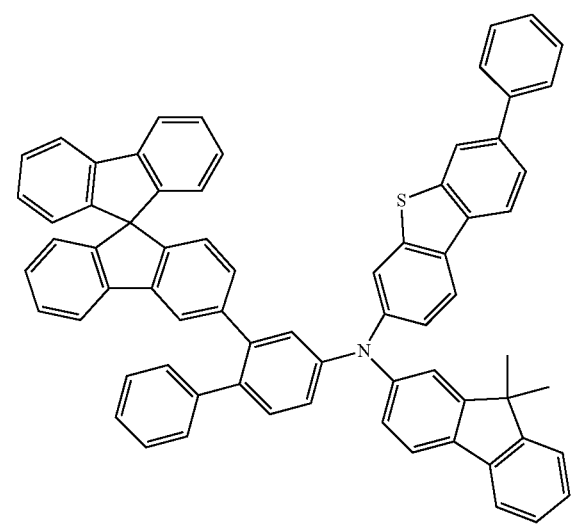
126
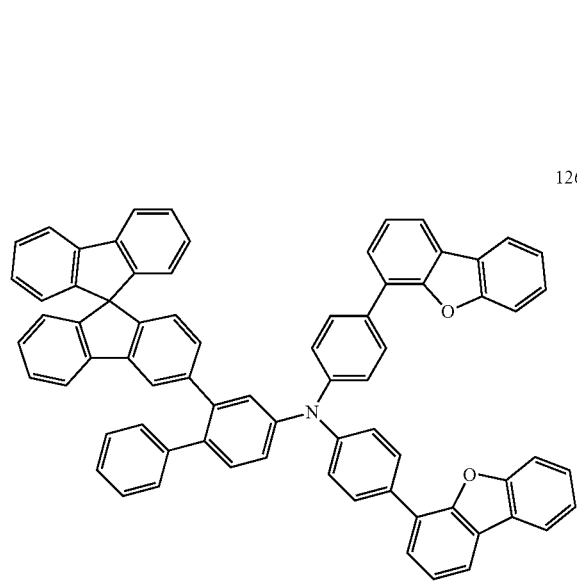

127
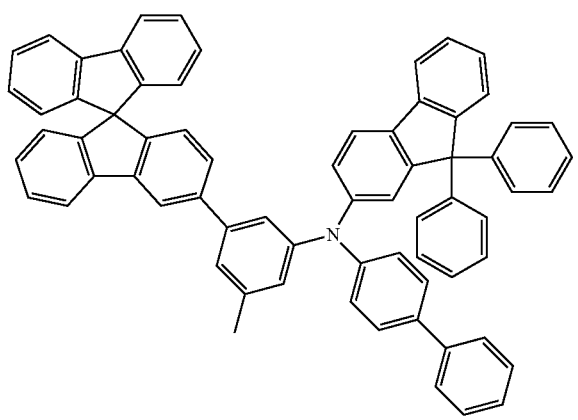
130
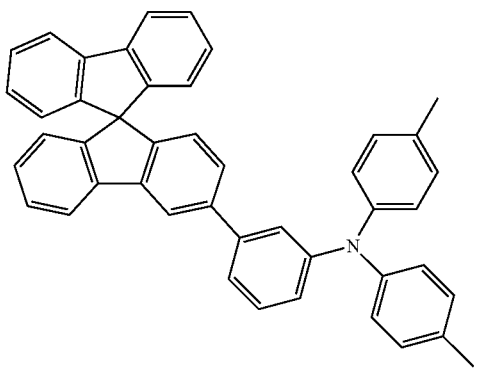
128
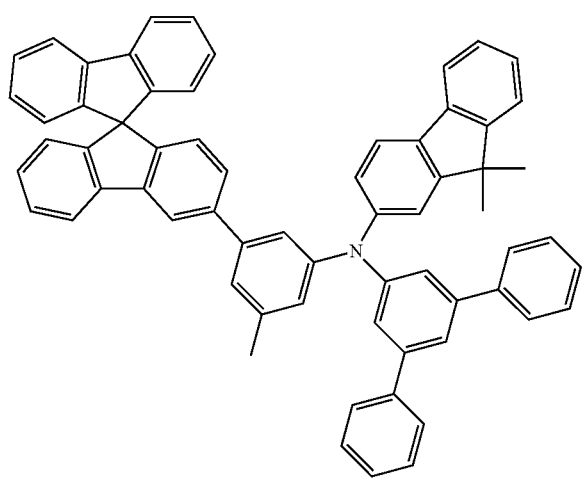
131
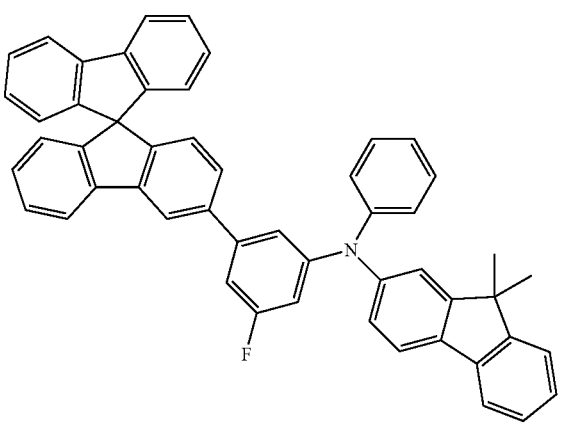
129
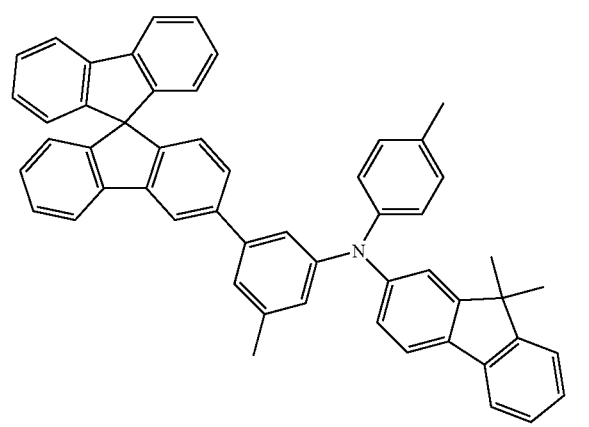
132
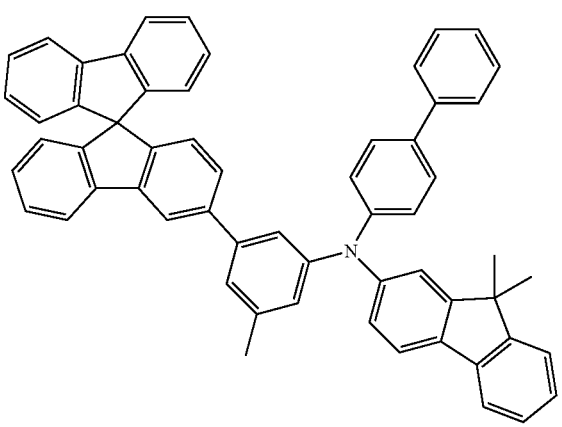

133
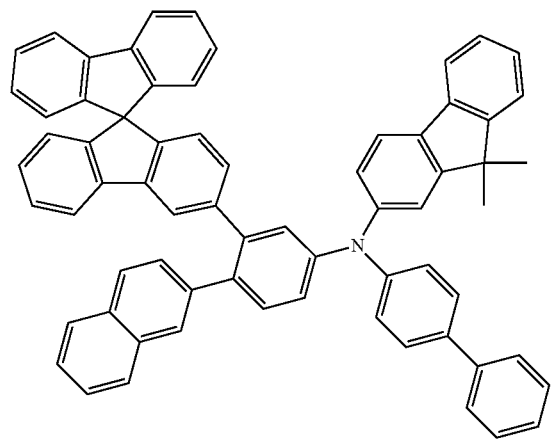
134
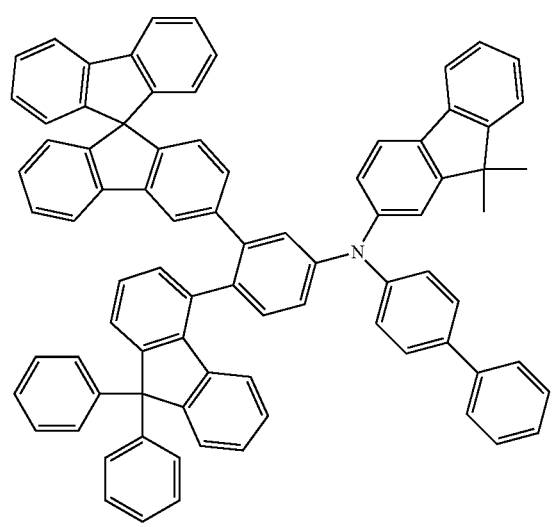
135
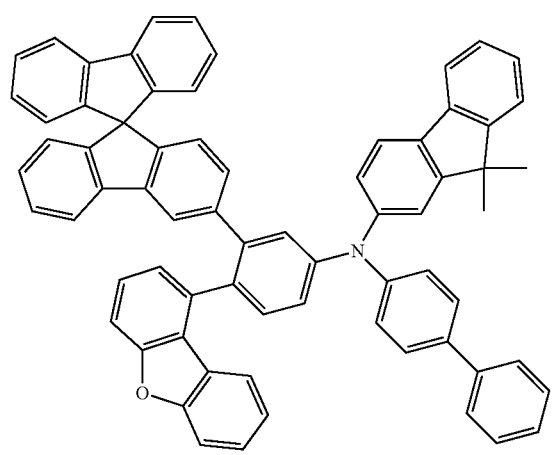
136
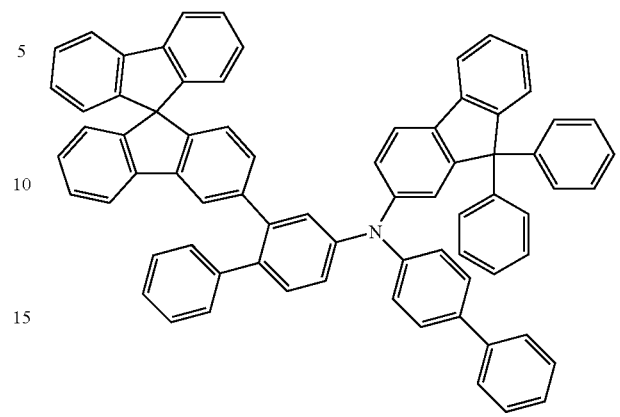
137
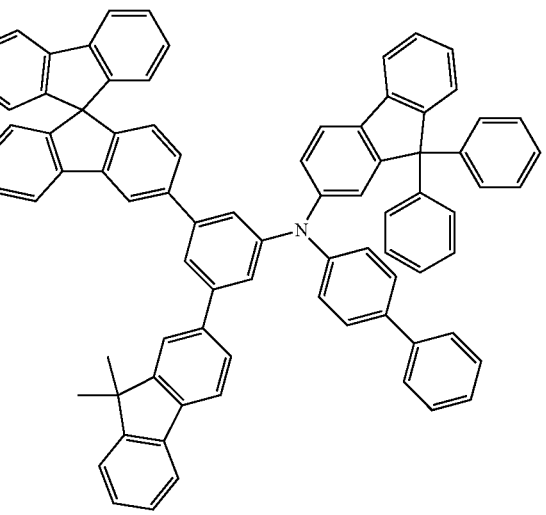
138
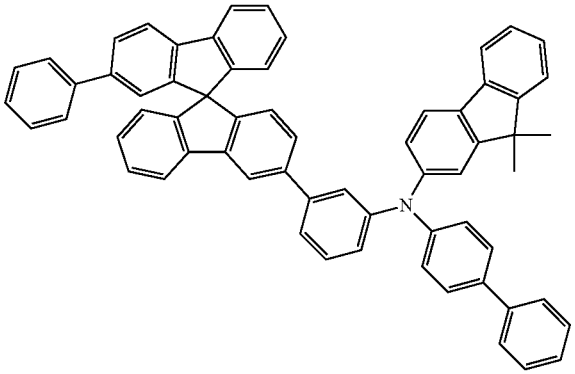

139
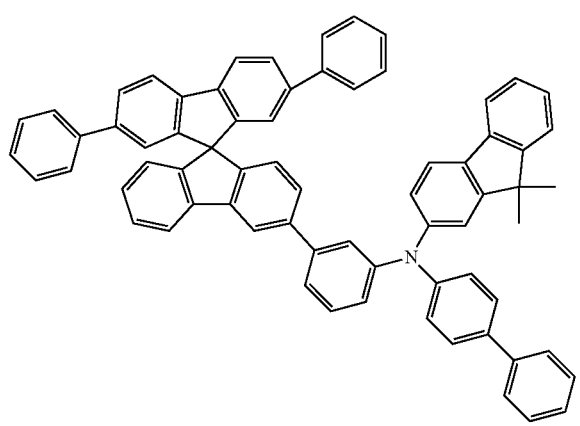
140
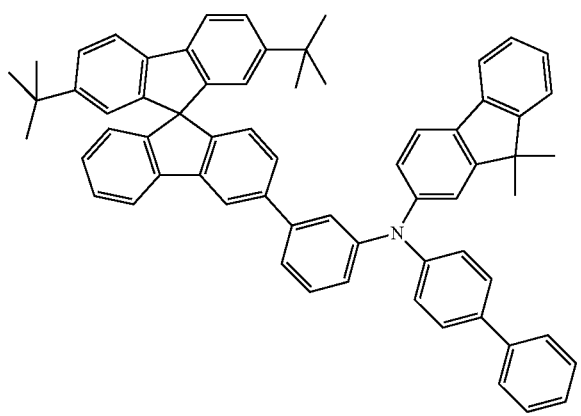
141
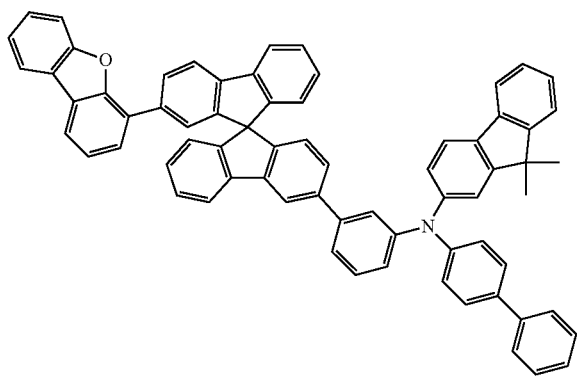
142
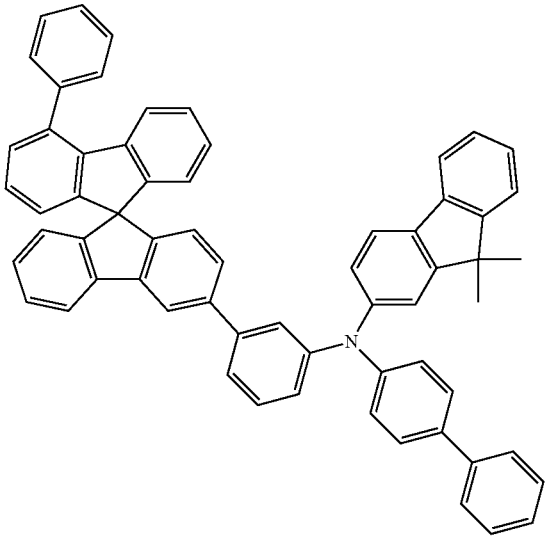
143
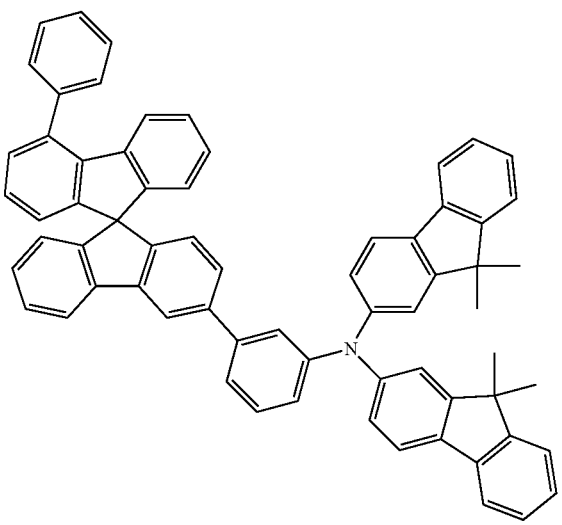
144
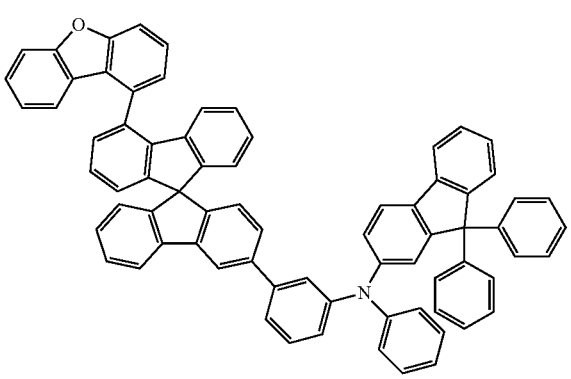

145
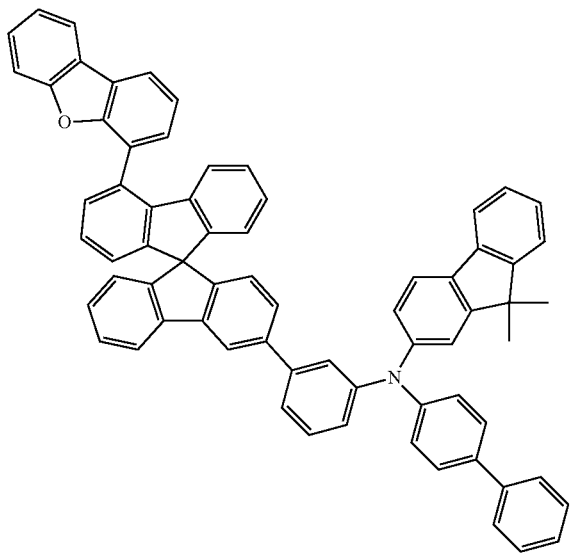
146
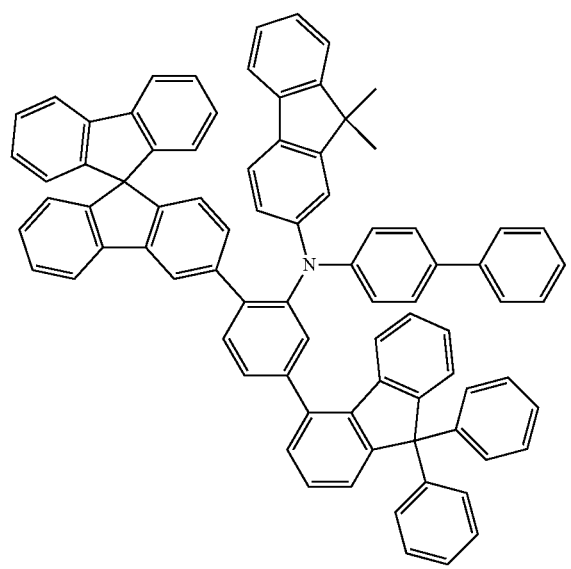
147
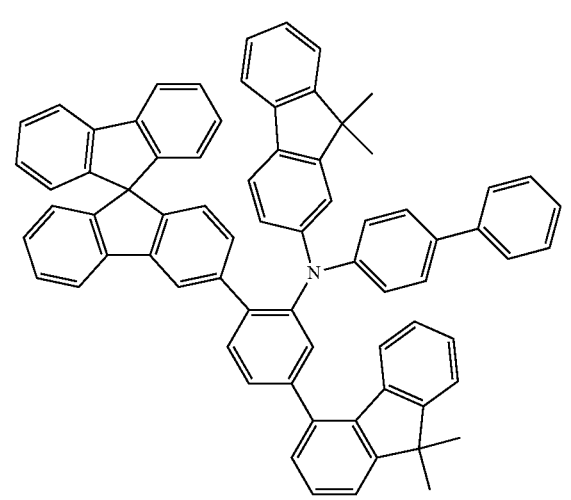
148
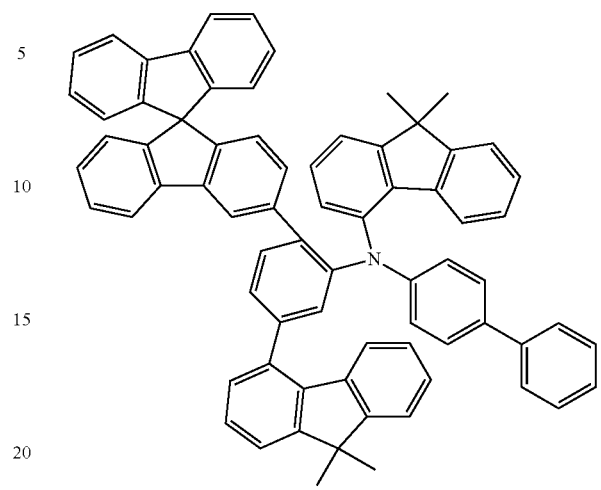
149
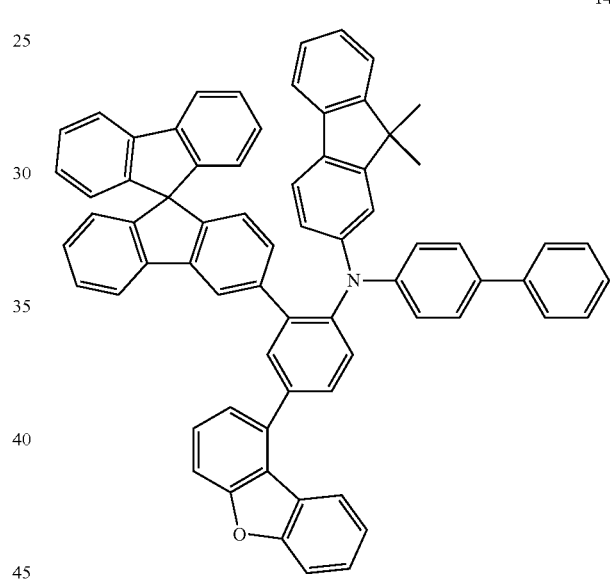
150
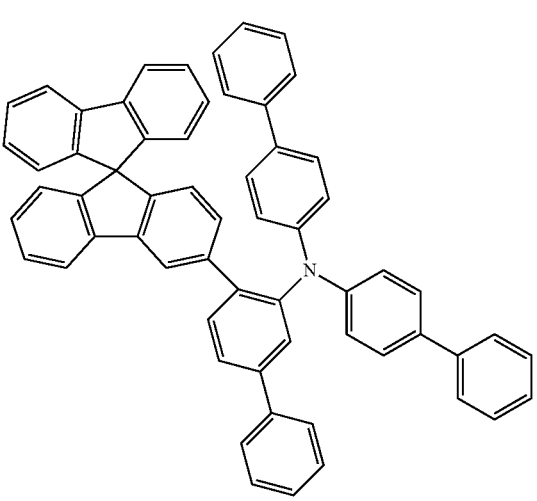

151
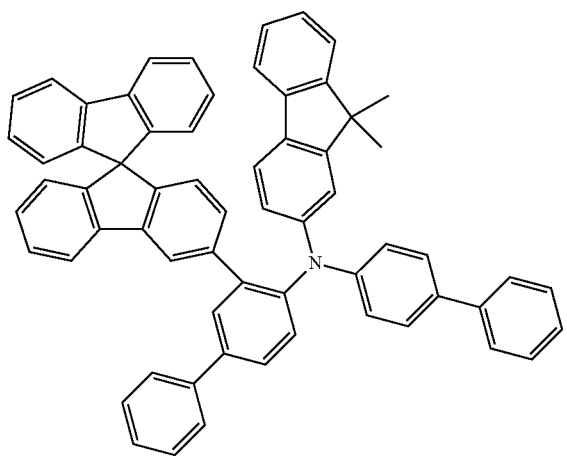
152
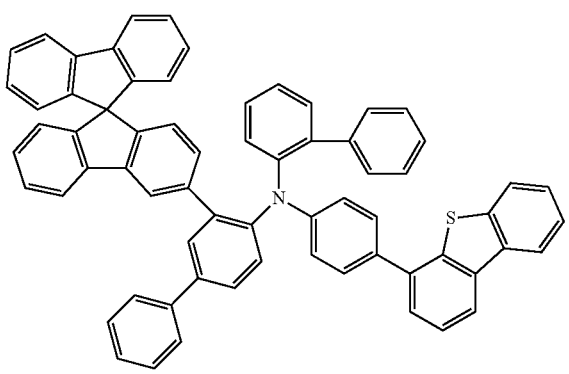
153
154
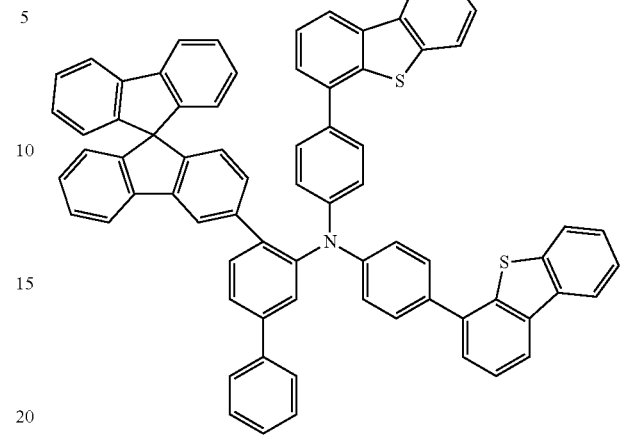
155
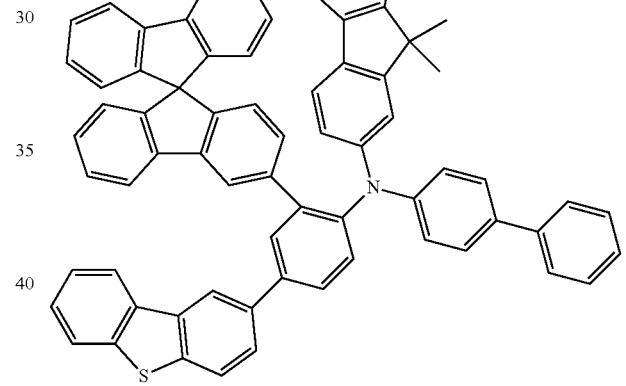
156
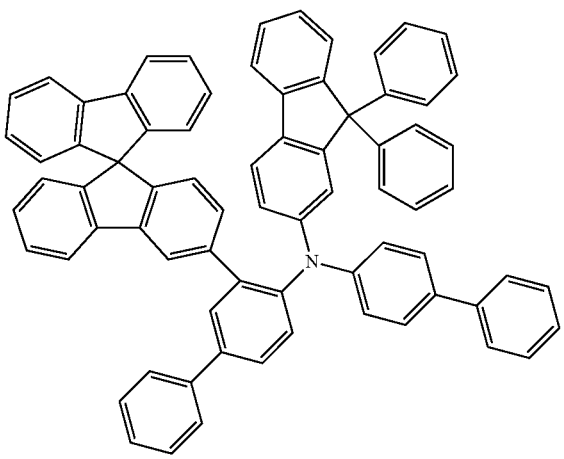

157
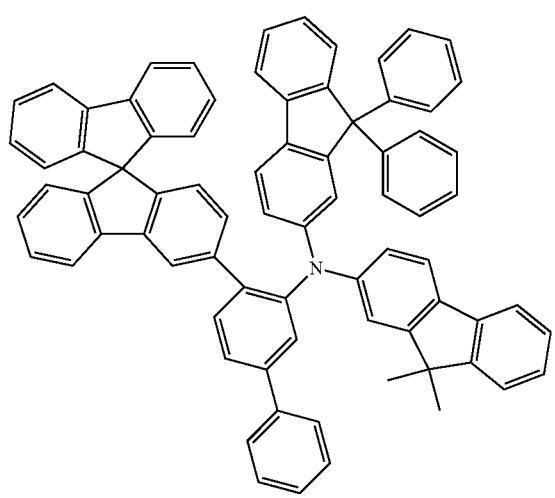
158
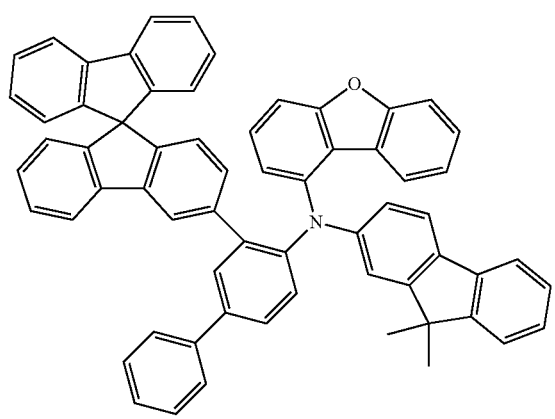
159
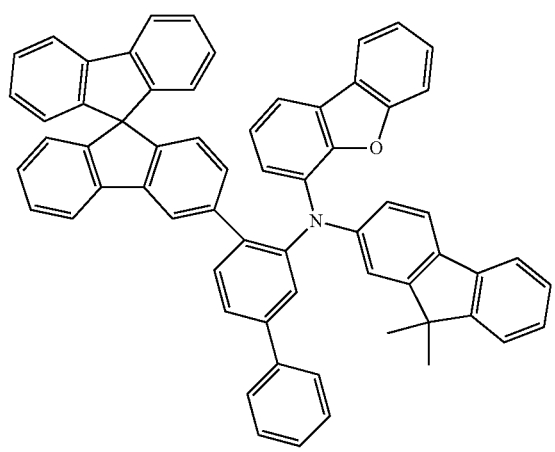
160
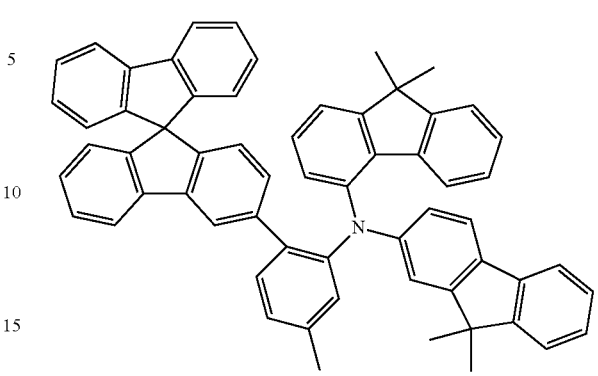
161
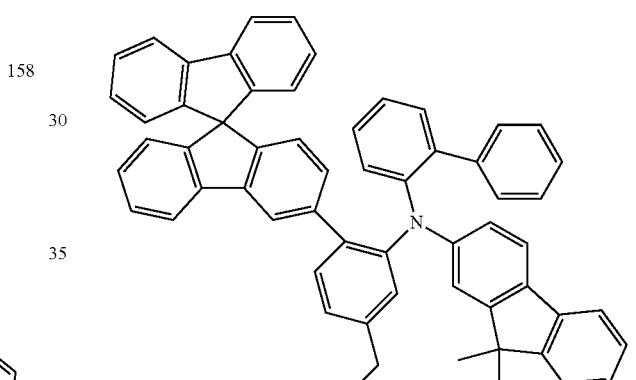
162
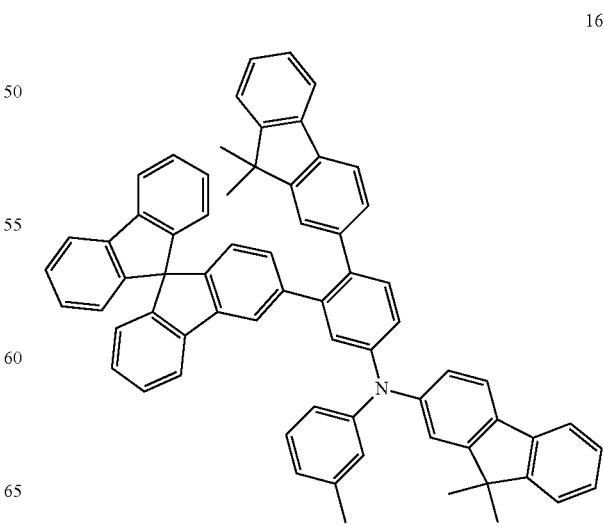

163
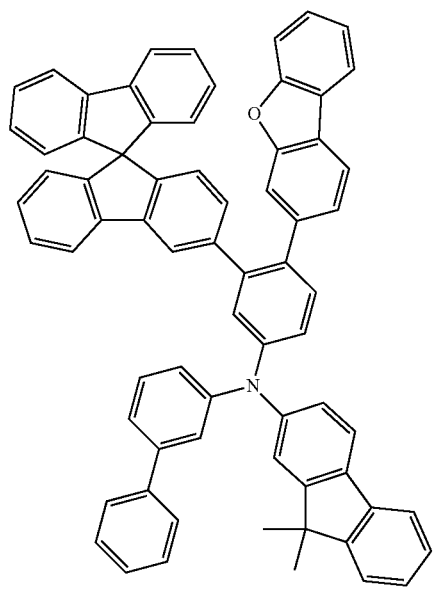
164
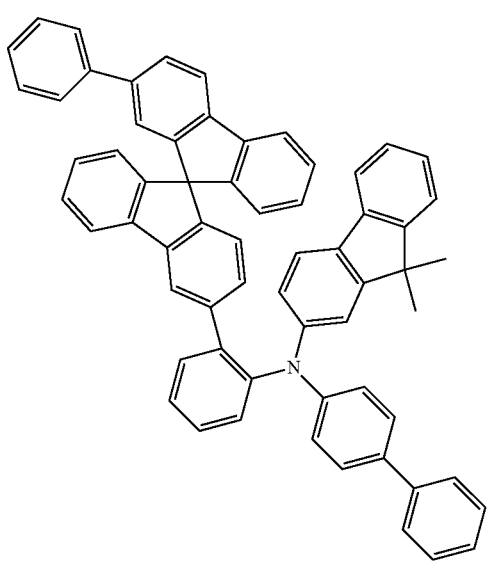
165
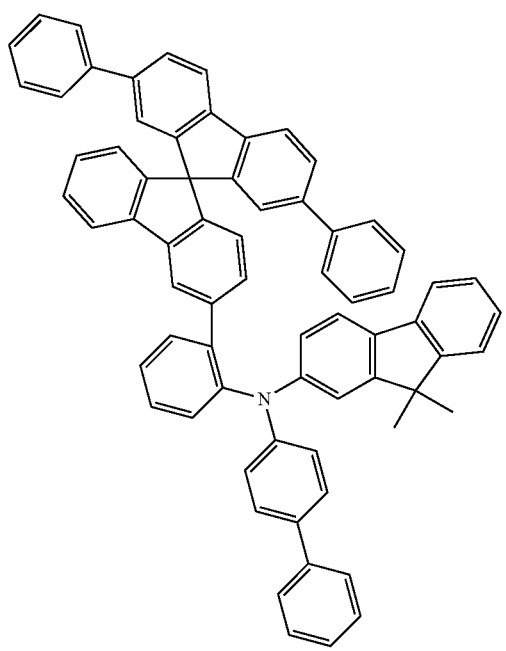
166
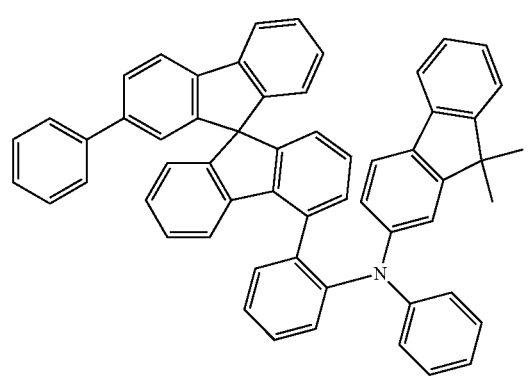
167

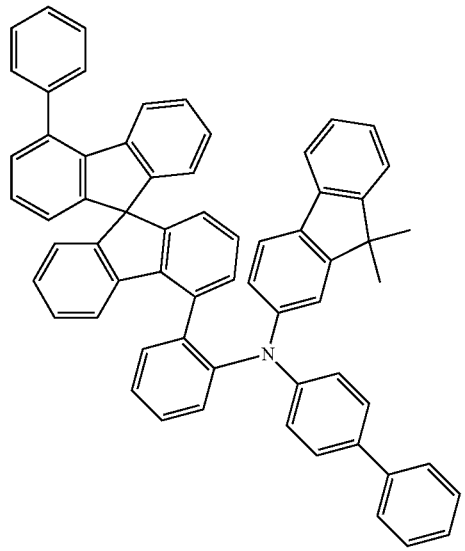
168
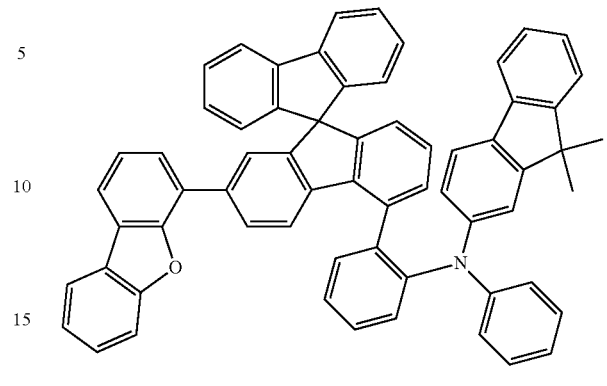
171
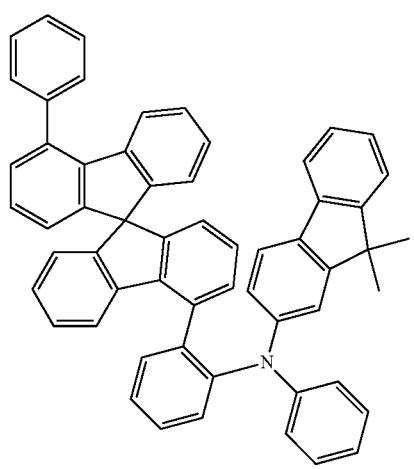
169
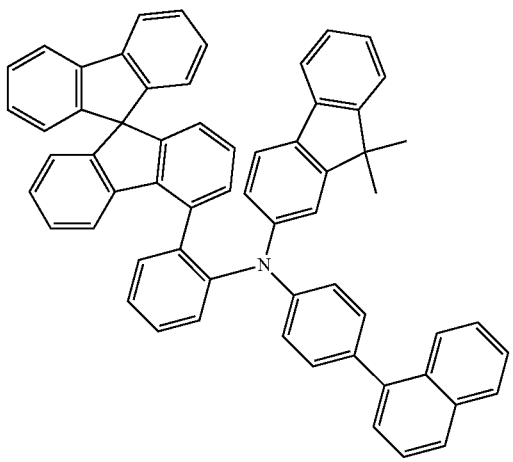
172
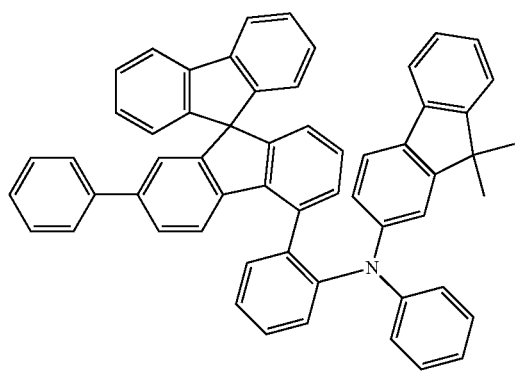
170
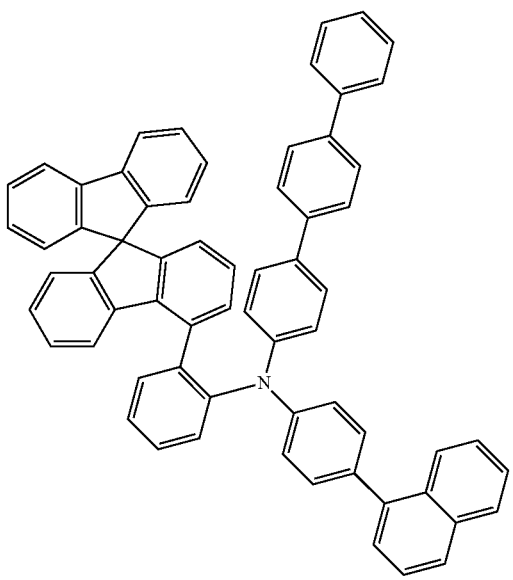
173

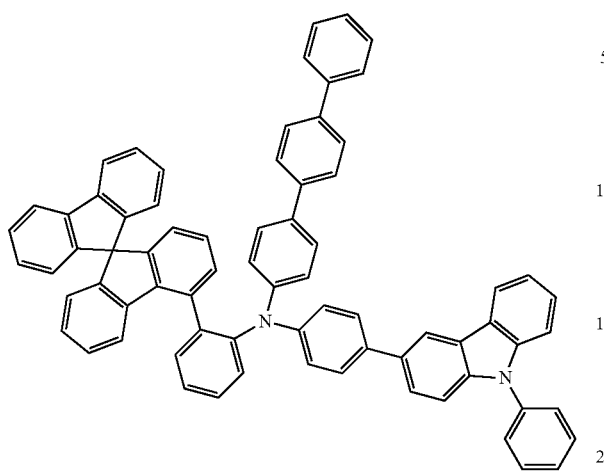
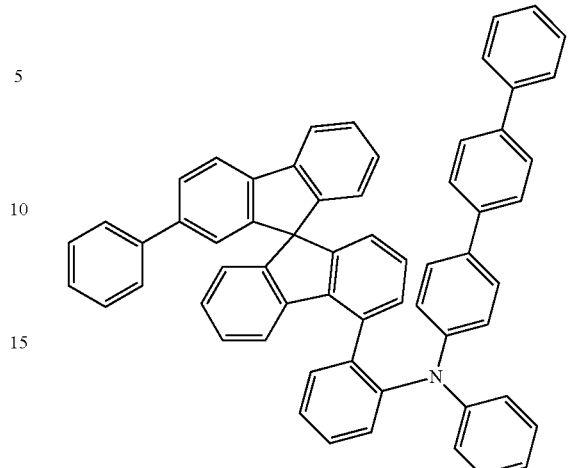

The compounds can be prepared by methods of organic synthesis known to the person skilled in the art. These especially include halogenation reactions and metal-catalysed coupling reactions, and among these especially Buchwald coupling reactions and Suzuki coupling reactions.

In a preferred process for preparing the compounds of the invention (see Scheme 1 below), a benzene ring is attached to a spirobifluorene unit substituted in the corresponding 3 or 4 position by a reactive group, preferably a bromine or iodine atom, via a Suzuki coupling. Preferably, said benzene ring is already substituted by a further reactive group. Alternatively, this further reactive group can be introduced in a functionalization reaction. Thereafter, a Buchwald coupling with an appropriate amine is conducted on this further reactive group. In this way, it is possible to obtain the compound of the invention. The coupling reaction may optionally be followed by further functionalization steps.

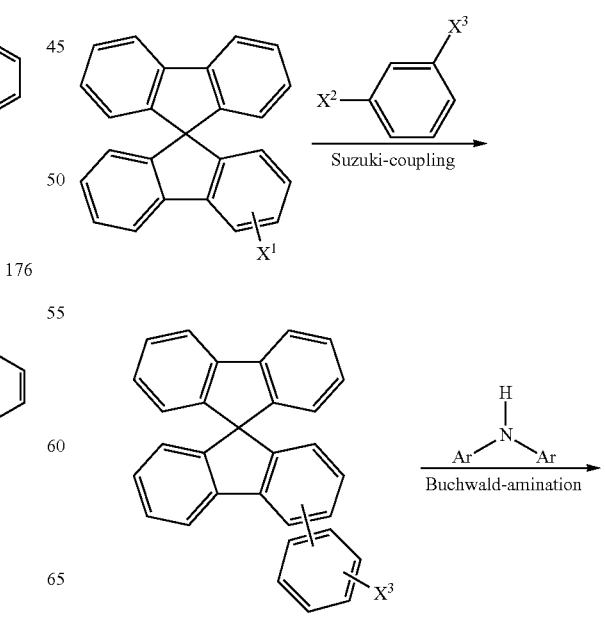

Scheme 1

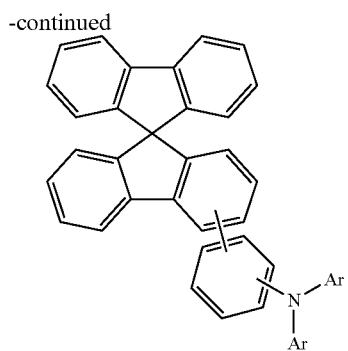

The positions shown unsubstituted in Scheme 1 may each be substituted by an organic radical. The variable groups in Scheme 1 are defined as follows:

$X^1$=reactive group, preferably Br or I
$X^2$=reactive group, preferably —B(OR)$_2$
$X^3$=reactive group, preferably Cl
Ar=aromatic or heteroaromatic ring system Alternatively, the compounds of the invention can be prepared by, in a first step, converting a benzene compound disubstituted by reactive groups firstly at bearing a reactive group and an amino group. In a second step, a spirobifluorene unit is then coupled to the remaining reactive group of the benzene compound in a Suzuki reaction (Scheme 2).

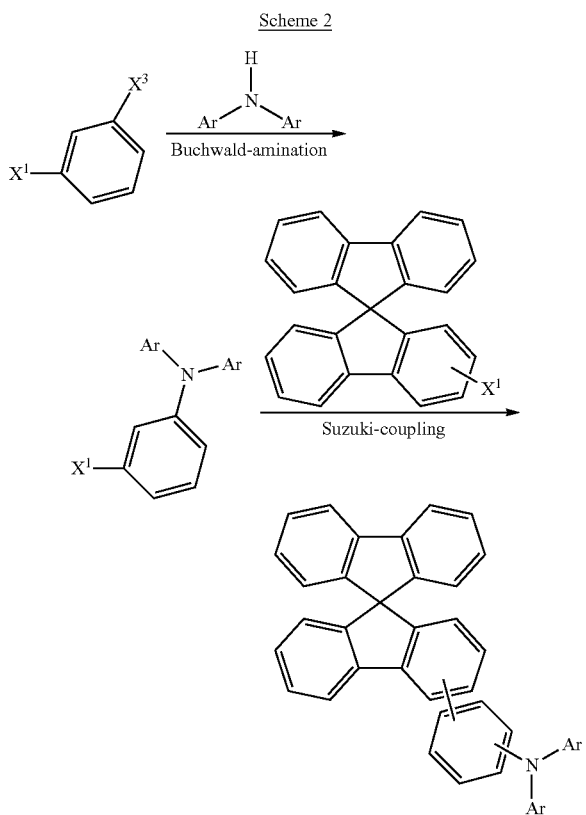

The positions shown unsubstituted in Scheme 2 may each be substituted by an organic radical. The variable groups in Scheme 2 are as defined for Scheme 1.

The present invention thus provides a process for preparing a compound of formula (I), characterized in that a spirobifluorene bearing one reactive group is first reacted in a first metal-catalysed coupling reaction with a benzene derivative containing two reactive groups, one of which is converted in this coupling reaction, and wherein an amino group is finally introduced into the compound via a second organometallic coupling reaction at the other of the two reactive groups.

The first metal-catalysed coupling reaction is preferably a Suzuki coupling reaction. The second metal-catalysed coupling reaction is preferably a Buchwald coupling reaction. In addition, the reactive group on the spirobifluorene is preferably a halogen atom, more preferably a bromine atom. Furthermore, the reactive groups on the benzene derivative are preferably selected from halogen atoms, more preferably chlorine, and from boronic acid derivatives.

The invention further provides an alternative process for preparing a compound of formula (I), characterized in that a benzene compound bearing two reactive groups is reacted in a first metal-catalysed coupling reaction with an amino compound on one of the two reactive groups and is reacted in a second metal-catalysed coupling reaction with a spirobifluorene derivative on the other of the two reactive groups.

The first metal-catalysed coupling reaction is preferably a Buchwald coupling reaction. The second metal-catalysed coupling reaction is preferably a Suzuki coupling reaction. In addition, the reactive group on the spirobifluorene is preferably a halogen atom, more preferably a bromine atom. Furthermore, the reactive groups on the benzene derivative are preferably selected from halogen atoms, more preferably chlorine, and from boronic acid derivatives.

The above-described compounds, especially compounds substituted by reactive leaving groups, such as bromine, iodine, chlorine, boronic acid or boronic ester, may find use as monomers for production of corresponding oligomers, dendrimers or polymers. Suitable reactive leaving groups are, for example, bromine, iodine, chlorine, boronic acids, boronic esters, amines, alkenyl or alkynyl groups having a terminal C—C double bond or C—C triple bond, oxiranes, oxetanes, groups which enter into a cycloaddition, for example a 1,3-dipolar cycloaddition, for example dienes or azides, carboxylic acid derivatives, alcohols and silanes.

The invention therefore further provides oligomers, polymers or dendrimers containing one or more compounds of formula (I), wherein the bond(s) to the polymer, oligomer or dendrimer may be localized at any desired positions substituted by $R^1$, $R^2$ or $R^3$ in formula (I). According to the linkage of the compound of formula (I), the compound is part of a side chain of the oligomer or polymer or part of the main chain. An oligomer in the context of this invention is understood to mean a compound formed from at least three monomer units. A polymer in the context of the invention is understood to mean a compound formed from at least ten monomer units. The polymers, oligomers or dendrimers of the invention may be conjugated, partly conjugated or nonconjugated. The oligomers or polymers of the invention may be linear, branched or dendritic. In the structures having linear linkage, the units of formula (I) may be joined directly to one another, or they may be joined to one another via a bivalent group, for example via a substituted or unsubstituted alkylene group, via a heteroatom or via a bivalent aromatic or heteroaromatic group. In branched and dendritic structures, it is possible, for example, for three or more units of formula (I) to be joined via a trivalent or higher-valency group, for example via a trivalent or higher-valency aromatic or heteroaromatic group, to give a branched or dendritic oligomer or polymer.

For the repeat units of formula (I) in oligomers, dendrimers and polymers, the same preferences apply as described above for compounds of formula (I).

For preparation of the oligomers or polymers, the monomers of the invention are homopolymerized or copolymerized with further monomers. Suitable and preferred comonomers are chosen from fluorenes (for example according to EP 842208 or WO 2000/22026), spirobifluorenes (for example according to EP 707020, EP 894107 or WO 2006/061181), paraphenylenes (for example according to WO 1992/18552), carbazoles (for example according to WO 2004/070772 or WO 2004/113468), thiophenes (for example according to EP 1028136), dihydrophenanthrenes (for example according to WO 2005/014689 or WO 2007/006383), cis- and trans-indenofluorenes (for example according to WO 2004/041901 or WO 2004/113412), ketones (for example according to WO 2005/040302), phenanthrenes (for example according to WO 2005/104264 or WO 2007/017066) or else a plurality of these units. The polymers, oligomers and dendrimers typically contain still further units, for example emitting (fluorescent or phosphorescent) units, for example vinyltriarylamines (for example according to WO 2007/068325) or phosphorescent metal complexes (for example according to WO 2006/003000), and/or charge transport units, especially those based on triarylamines.

The polymers and oligomers of the invention are generally prepared by polymerization of one or more monomer types, of which at least one monomer leads to repeat units of the formula (I) in the polymer. Suitable polymerization reactions are known to those skilled in the art and are described in the literature. Particularly suitable and preferred polymerization reactions which lead to formation of C—C or C—N bonds are the Suzuki polymerization, the Yamamoto polymerization, the Stille polymerization and the Hartwig-Buchwald polymerization.

For the processing of the compounds of the invention from a liquid phase, for example by spin-coating or by printing methods, formulations of the compounds of the invention are required. These formulations may, for example, be solutions, dispersions or emulsions. For this purpose, it may be preferable to use mixtures of two or more solvents. Suitable and preferred solvents are, for example, toluene, anisole, o-, m- or p-xylene, methyl benzoate, mesitylene, tetralin, veratrole, THF, methyl-THF, THP, chlorobenzene, dioxane, phenoxytoluene, especially 3-phenoxytoluene, (−)-fenchone, 1,2,3,5-tetramethylbenzene, 1,2,4,5-tetramethylbenzene, 1-methylnaphthalene, 2-methylbenzothiazole, 2-phenoxyethanol, 2-pyrrolidinone, 3-methylanisole, 4-methylanisole, 3,4-dimethylanisole, 3,5-dimethylanisole, acetophenone, α-terpineol, benzothiazole, butyl benzoate, cumene, cyclohexanol, cyclohexanone, cyclohexylbenzene, decalin, dodecylbenzene, ethyl benzoate, indane, methyl benzoate, NMP, ṗ-cymene, phenetole, 1,4-diisopropylbenzene, dibenzyl ether, diethylene glycol butyl methyl ether, triethylene glycol butyl methyl ether, diethylene glycol dibutyl ether, triethylene glycol dimethyl ether, diethylene glycol monobutyl ether, tripropylene glycol dimethyl ether, tetraethylene glycol dimethyl ether, 2-isopropylnaphthalene, pentylbenzene, hexylbenzene, heptylbenzene, octylbenzene, 1,1-bis(3,4-dimethylphenyl)ethane or mixtures of these solvents.

The invention therefore further provides a formulation, especially a solution, dispersion or emulsion, comprising at least one compound of formula (I) and at least one solvent, preferably an organic solvent. The way in which such solutions can be prepared is known to those skilled in the art and is described, for example, in WO 2002/072714, WO 2003/019694 and the literature cited therein.

The compounds of the invention are suitable for use in electronic devices, especially in organic electroluminescent devices (OLEDs). Depending on the substitution, the compounds are used in different functions and layers. The invention therefore further provides for the use of the compound of formula (I) in an electronic device. This electronic device is preferably selected from the group consisting of organic integrated circuits (OICs), organic field-effect transistors (OFETs), organic thin-film transistors (OTFTs), organic light-emitting transistors (OLETs), organic solar cells (OSCs), organic optical detectors, organic photoreceptors, organic field-quench devices (OFQDs), organic light-emitting electrochemical cells (OLECs), organic laser diodes (O-lasers) and more preferably organic electroluminescent devices (OLEDs).

The invention further provides, as already set out above, an electronic device comprising at least one compound of formula (I). This electronic device is preferably selected from the abovementioned devices.

It is more preferably an organic electroluminescent device (OLED) comprising anode, cathode and at least one emitting layer, characterized in that at least one organic layer, which may be an emitting layer, a hole transport layer or another layer, comprises at least one compound of formula (I).

Apart from the cathode, anode and emitting layer, the organic electroluminescent device may also comprise further layers. These are selected, for example, from in each case one or more hole injection layers, hole transport layers, hole blocker layers, electron transport layers, electron injection layers, electron blocker layers, exciton blocker layers, interlayers, charge generation layers (IDMC 2003, Taiwan; Session 21 OLED (5), T. Matsumoto, T. Nakada, J. Endo, K. Mori, N. Kawamura, A. Yokoi, J. Kido, *Multiphoton Organic EL Device Having Charge Generation Layer*) and/or organic or inorganic p/n junctions.

The sequence of the layers of the organic electroluminescent device comprising the compound of the formula (I) is preferably as follows: anode-hole injection layer-hole transport layer-optionally further hole transport layer(s)-optionally electron blocker layer-emitting layer-optionally hole blocker layer-electron transport layer-electron injection layer-cathode. It is additionally possible for further layers to be present in the OLED.

The organic electroluminescent device of the invention may contain two or more emitting layers. More preferably, these emission layers in this case have several emission maxima between 380 nm and 750 nm overall, such that the overall result is white emission; in other words, various emitting compounds which may fluoresce or phosphoresce and which emit blue, green, yellow, orange or red light are used in the emitting layers. Especially preferred are three-layer systems, i.e. systems having three emitting layers, where the three layers show blue, green and orange or red emission (for the basic construction see, for example, WO 2005/011013). The compounds of the invention are preferably present in the hole transport layer, hole injection layer or electron blocker layer.

It is preferable in accordance with the invention when the compound of formula (I) is used in an electronic device comprising one or more phosphorescent emitting compounds. In this case, the compound may be present in different layers, preferably in a hole transport layer, an electron blocker layer, a hole injection layer or in an emitting layer.

The term "phosphorescent emitting compounds" typically encompasses compounds where the emission of light is effected through a spin-forbidden transition, for example a transition from an excited triplet state or a state having a higher spin quantum number, for example a quintet state.

Suitable phosphorescent emitting compounds (=triplet emitters) are especially compounds which, when suitably excited, emit light, preferably in the visible region, and also contain at least one atom of atomic number greater than 20, preferably greater than 38, and less than 84, more preferably greater than 56 and less than 80. Preference is given to using, as phosphorescent emitting compounds, compounds containing copper, molybdenum, tungsten, rhenium, ruthenium, osmium, rhodium, iridium, palladium, platinum, silver, gold or europium, especially compounds containing iridium, platinum or copper. In the context of the present invention, all luminescent iridium, platinum or copper complexes are considered to be phosphorescent emitting compounds.

Examples of the above-described emitting compounds can be found in applications WO 00/70655, WO 01/41512, WO 02/02714, WO 02/15645, EP 1191613, EP 1191612, EP 1191614, WO 05/033244, WO 05/019373 and US 2005/0258742. In general, all phosphorescent complexes as used for phosphorescent OLEDs according to the prior art and as known to those skilled in the art in the field of organic electroluminescent devices are suitable. It is also possible for the person skilled in the art, without exercising inventive skill, to use further phosphorescent complexes in combination with the compounds of formula (I) in organic electroluminescent devices. Further examples are listed in a table which follows.

It is also possible in accordance with the invention to use the compound of formula (I) in an electronic device comprising one or more fluorescent emitting compounds.

In a preferred embodiment of the invention, the compounds of formula (I) are used as hole-transporting material. In that case, the compounds are preferably present in a hole transport layer, an electron blocker layer or a hole injection layer. Particular preference is given to use in an electron blocker layer.

A hole transport layer according to the present application is a layer having a hole-transporting function between the anode and emitting layer.

Hole injection layers and electron blocker layers are understood in the context of the present application to be specific embodiments of hole transport layers.

A hole injection layer, in the case of a plurality of hole transport layers between the anode and emitting layer, is a hole transport layer which directly adjoins the anode or is separated therefrom only by a single coating of the anode. An electron blocker layer, in the case of a plurality of hole transport layers between the anode and emitting layer, is that hole transport layer which directly adjoins the emitting layer on the anode side. Preferably, the OLED of the invention comprises two, three or four hole-transporting layers between the anode and emitting layer, at least one of which preferably contains a compound of formula (I), and more preferably exactly one or two contain a compound of formula (I).

If the compound of formula (I) is used as hole transport material in a hole transport layer, a hole injection layer or an electron blocker layer, the compound can be used as pure material, i.e. in a proportion of 100%, in the hole transport layer, or it can be used in combination with one or more further compounds. In a preferred embodiment, the organic layer comprising the compound of the formula (I) then additionally contains one or more p-dopants. p-Dopants used according to the present invention are preferably those organic electron acceptor compounds capable of oxidizing one or more of the other compounds in the mixture.

Particularly preferred embodiments of p-dopants are the compounds disclosed in WO 2011/073149, EP 1968131, EP 2276085, EP 2213662, EP 1722602, EP 2045848, DE 102007031220, U.S. Pat. Nos. 8,044,390, 8,057,712, WO 2009/003455, WO 2010/094378, WO 2011/120709, US 2010/0096600, WO 2012/095143 and DE 102012209523.

Particularly preferred p-dopants are quinodimethane compounds, azaindenofluorenediones, azaphenalenes, azatriphenylenes, 12, metal halides, preferably transition metal halides, metal oxides, preferably metal oxides containing at least one transition metal or a metal of main group 3, and transition metal complexes, preferably complexes of Cu, Co, Ni, Pd and Pt with ligands containing at least one oxygen atom as bonding site. Preference is further given to transition metal oxides as dopants, preferably oxides of rhenium, molybdenum and tungsten, more preferably $Re_2O_7$, $MaO_3$, $WO_3$ and $ReO_3$.

The p-dopants are preferably in substantially homogeneous distribution in the p-doped layers. This can be achieved, for example, by coevaporation of the p-dopant and the hole transport material matrix.

Preferred p-dopants are especially the following compounds:

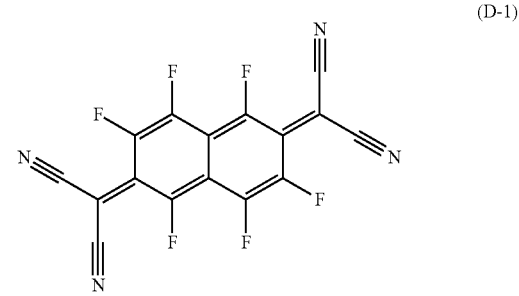

(D-1)

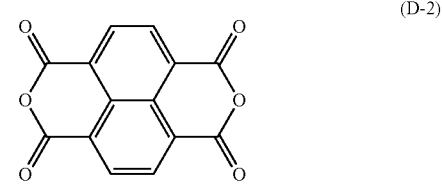

(D-2)

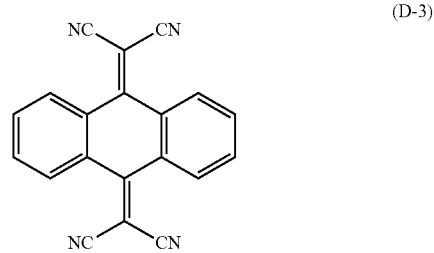

(D-3)

(D-4)
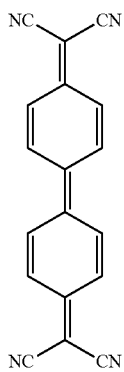

(D-5)
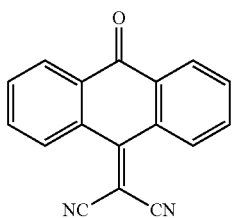

(D-6)
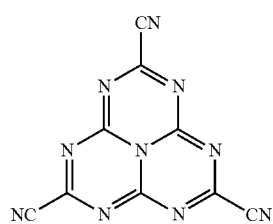

(D-7)
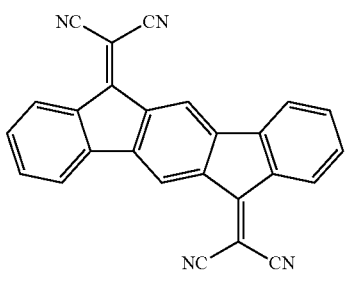

(D-8)
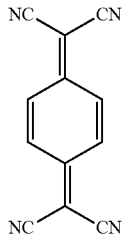

(D-9)
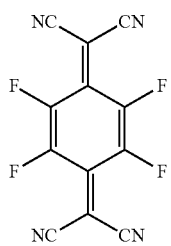

(D-10)
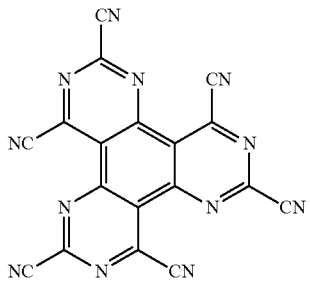

(D-11)
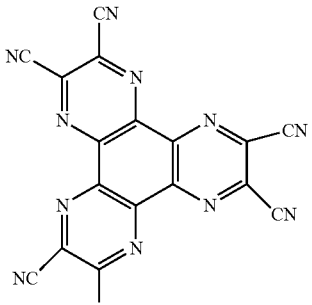

(D-12)
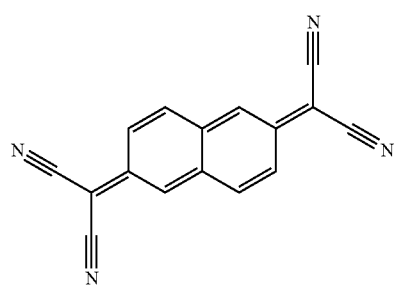

(D-13)

In a further preferred embodiment of the invention, the compound of formula (I) is used as hole transport material in combination with a hexaazatriphenylene derivative as described in US 2007/0092755. Particular preference is given here to using the hexaazatriphenylene derivative in a separate layer.

In a further embodiment of the present invention, the compound of the formula (I) is used in an emitting layer as matrix material in combination with one or more emitting compounds, preferably phosphorescent emitting compounds.

The proportion of the matrix material in the emitting layer in this case is between 50.0% and 99.9% by volume, preferably between 80.0% and 99.5% by volume, and more preferably between 92.0% and 99.5% by volume for fluorescent emitting layers and between 85.0% and 97.0% by volume for phosphorescent emitting layers.

Correspondingly, the proportion of the emitting compound is between 0.1% and 50.0% by volume, preferably between 0.5% and 20.0% by volume, and more preferably between 0.5% and 8.0% by volume for fluorescent emitting layers and between 3.0% and 15.0% by volume for phosphorescent emitting layers.

An emitting layer of an organic electroluminescent device may also comprise systems comprising a plurality of matrix materials (mixed matrix systems) and/or a plurality of emitting compounds. In this case too, the emitting compounds are generally those compounds having the smaller proportion in the system and the matrix materials are those compounds having the greater proportion in the system. In individual cases, however, the proportion of a single matrix material in the system may be less than the proportion of a single emitting compound.

It is preferable that the compounds of formula (I) are used as a component of mixed matrix systems. The mixed matrix systems preferably comprise two or three different matrix materials, more preferably two different matrix materials. Preferably, in this case, one of the two materials is a material having hole-transporting properties and the other material is a material having electron-transporting properties. The compound of the formula (I) is preferably the matrix material having hole-transporting properties. The desired electron-transporting and hole-transporting properties of the mixed matrix components may, however, also be combined mainly or entirely in a single mixed matrix component, in which case the further mixed matrix component(s) fulfill(s) other functions. The two different matrix materials may be present in a ratio of 1:50 to 1:1, preferably 1:20 to 1:1, more preferably 1:10 to 1:1 and most preferably 1:4 to 1:1. Preference is given to using mixed matrix systems in phosphorescent organic electroluminescent devices. One source of more detailed information about mixed matrix systems is the application WO 2010/108579.

The mixed matrix systems may comprise one or more emitting compounds, preferably one or more phosphorescent emitting compounds. In general, mixed matrix systems are preferably used in phosphorescent organic electroluminescent devices.

Particularly suitable matrix materials which can be used in combination with the compounds of the invention as matrix components of a mixed matrix system are selected from the preferred matrix materials specified below for phosphorescent emitting compounds or the preferred matrix materials for fluorescent emitting compounds, according to what type of emitting compound is used in the mixed matrix system.

Preferred phosphorescent emitting compounds for use in mixed matrix systems are the same as detailed further up as generally preferred phosphorescent emitter materials.

Preferred embodiments of the different functional materials in the electronic device are listed hereinafter.

Preferred phosphorescent emitting compounds are those mentioned above.

Preferred fluorescent emitting compounds are selected from the class of the arylamines. An arylamine or an aromatic amine in the context of this invention is understood to mean a compound containing three substituted or unsubstituted aromatic or heteroaromatic ring systems bonded directly to the nitrogen. Preferably, at least one of these aromatic or heteroaromatic ring systems is a fused ring system, more preferably having at least 14 aromatic ring atoms. Preferred examples of these are aromatic anthracenamines, aromatic anthracenediamines, aromatic pyrenamines, aromatic pyrenediamines, aromatic chrysenamines or aromatic chrysenediamines. An aromatic anthracenamine is understood to mean a compound in which a diarylamino group is bonded directly to an anthracene group, preferably in the 9 position. An aromatic anthracenediamine is understood to mean a compound in which two diarylamino groups are bonded directly to an anthracene group, preferably in the 9,10 positions. Aromatic pyrenamines, pyrenediamines, chrysenamines and chrysenediamines are defined analogously, where the diarylamino groups are bonded to the pyrene preferably in the 1 position or 1,6 positions. Further preferred emitting compounds are indenofluorenamines or -fluorenediamines, for example according to WO 2006/108497 or WO 2006/122630, benzoindenofluorenamines or -fluorenediamines, for example according to WO 2008/006449, and dibenzoindenofluoreneamines or -diamines, for example according to WO 2007/140847, and the indenofluorene derivatives having fused aryl groups disclosed in WO 2010/012328. Likewise preferred are the pyreneary-lamines disclosed in WO 2012/048780 and in WO 2013/185871. Likewise preferred are the benzoindenofluore-namines disclosed in WO 2014/037077, the benzofluorenamines disclosed in WO 2014/106522, the extended benzoindenofluorenes disclosed in WO 2014/1111269 and in the as yet unpublished application EP 15182993.4, the phenoxazines disclosed in the as yet unpublished applications EP 15181178.3 and EP 15181177.5, and the fluorene derivatives bonded to furan units or to thiophene units that are disclosed in the as yet unpublished application EP 15000876.1.

Useful matrix materials, preferably for fluorescent emitting compounds, include materials of various substance classes. Preferred matrix materials are selected from the classes of the oligoarylenes (e.g. 2,2',7,7'-tetraphenylspirobifluorene according to EP 676461 or dinaphthylanthracene), especially of the oligoarylenes containing fused aromatic groups, the oligoarylenevinylenes (e.g. DPVBi or spiro-DPVBi according to EP 676461), the polypodal metal complexes (for example according to WO 2004/081017), the hole-conducting compounds (for example according to WO 2004/058911), the electron-conducting compounds, especially ketones, phosphine oxides, sulphoxides, etc. (for example according to WO 2005/084081 and WO 2005/084082), the atropisomers (for example according to WO 2006/048268), the boronic acid derivatives (for example according to WO 2006/117052) or the benzanthracenes (for example according to WO 2008/145239). Particularly preferred matrix materials are selected from the classes of the oligoarylenes comprising naphthalene, anthracene, benzanthracene and/or pyrene or atropisomers of these compounds, the oligoarylenevinylenes, the ketones, the phosphine oxides and the sulphoxides. Very particularly preferred matrix materials are selected from the classes of the oligoarylenes comprising anthracene, benzanthracene, benzophenanthrene and/or pyrene or atropisomers of these compounds. An oligoarylene in the context of this invention shall be understood to mean a compound in which at least three aryl or arylene groups are bonded to one another. Preference is further given to the anthracene derivatives disclosed in WO 2006/097208, WO 2006/131192, WO 2007/065550, WO 2007/110129, WO 2007/065678, WO 2008/145239, WO 2009/100925, WO 2011/054442 and EP 1553154, the pyrene compounds disclosed in EP 1749809, EP 1905754 and US 2012/0187826, the benzanthracenylanthracene compounds disclosed in WO 2015/158409, the indenobenzofurans disclosed in the as yet unpublished application EP 15180777.3, and the phenanthrylanthracenes disclosed in the as yet unpublished application EP 15182962.9.

Preferred matrix materials for phosphorescent emitting compounds are, as well as the compounds of the formula (I), aromatic ketones, aromatic phosphine oxides or aromatic sulphoxides or sulphones, for example according to WO 2004/013080, WO 2004/093207, WO 2006/005627 or WO 2010/006680, triarylamines, carbazole derivatives, e.g. CBP (N,N-biscarbazolylbiphenyl) or the carbazole derivatives disclosed in WO 2005/039246, US 2005/0069729, JP 2004/288381, EP 1205527 or WO 2008/086851, indolocarbazole derivatives, for example according to WO 2007/063754 or WO 2008/056746, indenocarbazole derivatives, for example according to WO 2010/136109, WO 2011/000455 or WO 2013/041176, azacarbazole derivatives, for example according to EP 1617710, EP 1617711, EP 1731584, JP 2005/347160, bipolar matrix materials, for example according to WO 2007/137725, silanes, for example according to WO 2005/111172, azaboroles or boronic esters, for example according to WO 2006/117052, triazine derivatives, for example according to WO 2010/015306, WO 2007/063754 or WO 2008/056746, zinc complexes, for example according to EP 652273 or WO 20091/062578, diazasilole or tetraazasilole derivatives, for example according to WO 2010/054729, diazaphosphole derivatives, for example according to WO 2010/054730, bridged carbazole derivatives, for example according to US 2009/0136779, WO 2010/050778, WO 2011/042107, WO 2011/088877 or WO 2012/143080, triphenylene derivatives, for example according to WO 2012/048781, or lactams, for example according to WO 2011/116865 or WO 2011/137951.

Suitable charge transport materials as usable in the hole injection or hole transport layer or electron blocker layer or in the electron transport layer of the electronic device of the invention are, as well as the compounds of the formula (I), for example, the compounds disclosed in Y. Shirota et al., Chem. Rev. 2007, 107(4), 953-1010, or other materials as used in these layers according to the prior art.

Preferably, the inventive OLED comprises two or more different hole-transporting layers. The compound of the formula (I) may be used here in one or more of or in all the hole-transporting layers. In a preferred embodiment, the compound of the formula (I) is used in exactly one or exactly two hole-transporting layers, and other compounds, preferably aromatic amine compounds, are used in the further hole-transporting layers present. Further compounds which are used alongside the compounds of the formula (I), preferably in hole-transporting layers of the OLEDs of the invention, are especially indenofluorenamine derivatives (for example according to WO 06/122630 or WO 06/100896), the amine derivatives disclosed in EP 1661888, hexaazatriphenylene derivatives (for example according to WO 01/049806), amine derivatives with fused aromatics (for example according to U.S. Pat. No. 5,061,569), the amine derivatives disclosed in WO 95/09147, monobenzoindenofluorenamines (for example according to WO 08/006449), dibenzoindenofluorenamines (for example according to WO 07/140847), spirobifluorenamines (for example according to WO 2012/034627 or WO 2013/120577), fluorenamines (for example according to WO 2014/015937, WO 2014/015938, WO 2014/015935 and WO 2015/082056), spirodibenzopyranamines (for example according to WO 2013/083216), dihydroacridine derivatives (for example according to WO 2012/150001), spirodibenzofurans and spirodibenzothiophenes, for example according to WO 2015/022051 and the as yet unpublished applications PCT/EP2015/002475 and PCT/EP2016/000084, phenanthrenediarylamines, for example according to WO 2015/131976, spirotribenzotropolones, for example according to the as yet unpublished application PCT/EP2015/002225, spirobifluorenes with meta-phenyldiamine groups, for example according to the as yet unpublished application PCT/EP2015/002112, spirobisacridines, for example according to WO 2015/158411, xanthenediarylamines, for example according to WO 2014/072017, and 9,10-dihydroanthracene spiro compounds with diarylamino groups according to WO 2015/086108.

Very particular preference is given to the use of spirobifluorenes substituted by diarylamino groups in the 4 position as hole-transporting compounds, especially to the use of those compounds that are claimed and disclosed in WO 2013/120577, and to the use of spirobifluorenes substituted by diarylamino groups in the 2 position as hole-transporting compounds, especially to the use of those compounds that are claimed and disclosed in WO 2012/034627.

Materials used for the electron transport layer may be any materials as used according to the prior art as electron transport materials in the electron transport layer. Especially suitable are aluminum complexes, for example $Alq_3$, zirconium complexes, for example $Zrq_4$, lithium complexes, for example Liq, benzimidazole derivatives, triazine derivatives, pyrimidine derivatives, pyridine derivatives, pyrazine derivatives, quinoxaline derivatives, quinoline derivatives, oxadiazole derivatives, aromatic ketones, lactams, boranes, diazaphosphole derivatives and phosphine oxide derivatives. Further suitable materials are derivatives of the above-mentioned compounds as disclosed in JP 2000/053957, WO 2003/060956, WO 2004/028217, WO 2004/080975 and WO 2010/072300.

Preferred cathodes of the electronic device are metals having a low work function, metal alloys or multilayer structures composed of various metals, for example alkaline earth metals, alkali metals, main group metals or lanthanoids (e.g. Ca, Ba, Mg, Al, In, Mg, Yb, Sm, etc.). Additionally suitable are alloys composed of an alkali metal or alkaline earth metal and silver, for example an alloy composed of magnesium and silver. In the case of multilayer structures, in addition to the metals mentioned, it is also possible to use further metals having a relatively high work function, for example Ag or Al, in which case combinations of the metals such as Ca/Ag, Mg/Ag or Ba/Ag, for example, are generally used. It may also be preferable to introduce a thin interlayer of a material having a high dielectric constant between a metallic cathode and the organic semiconductor. Examples of useful materials for this purpose are alkali metal or alkaline earth metal fluorides, but also the corresponding oxides or carbonates (e.g. LiF, $Li_2O$, $BaF_2$, MgO, NaF, CsF, $Cs_2CO_3$, etc.). It is also possible to use lithium quinolinate (LiQ) for this purpose. The layer thickness of this layer is preferably between 0.5 and 5 nm.

Preferred anodes are materials having a high work function. Preferably, the anode has a work function of greater than 4.5 eV versus vacuum. Firstly, metals having a high redox potential are suitable for this purpose, for example Ag, Pt or Au. Secondly, metal/metal oxide electrodes (e.g. Al/Ni/$NiO_x$, Al/$PtO_x$) may also be preferred. For some applications, at least one of the electrodes has to be transparent or partly transparent in order to enable the irradiation of the organic material (organic solar cell) or the emission of light (OLED, O-laser). Preferred anode materials here are conductive mixed metal oxides. Particular preference is given to indium tin oxide (ITO) or indium zinc oxide (IZO). Preference is further given to conductive doped organic materials, especially conductive doped polymers. In addition, the anode may also consist of two or more layers, for example of an inner layer of ITO and an outer layer of a metal oxide, preferably tungsten oxide, molybdenum oxide or vanadium oxide.

The device is structured appropriately (according to the application), contact-connected and finally sealed, in order to rule out damaging effects by water and air.

In a preferred embodiment, the electronic device is characterized in that one or more layers are coated by a sublimation process. In this case, the materials are applied by vapour deposition in vacuum sublimation systems at an initial pressure of less than $10^{-5}$ mbar, preferably less than $10^{-6}$ mbar. In this case, however, it is also possible that the initial pressure is even lower, for example less than $10^{-7}$ mbar.

Preference is likewise given to an electronic device, characterized in that one or more layers are coated by the OVPD (organic vapour phase deposition) method or with the aid of a carrier gas sublimation. In this case, the materials are applied at a pressure between $10^{-5}$ mbar and 1 bar. A special case of this method is the OVJP (organic vapour jet printing) method, in which the materials are applied directly by a nozzle and thus structured (for example M. S. Arnold et al., Appl. Phys. Lett. 2008, 92, 053301).

Preference is additionally given to an electronic device, characterized in that one or more layers are produced from solution, for example by spin-coating, or by any printing method, for example screen printing, flexographic printing, nozzle printing or offset printing, but more preferably LITI (light-induced thermal imaging, thermal transfer printing) or inkjet printing. For this purpose, soluble compounds of formula (I) are needed. High solubility can be achieved by suitable substitution of the compounds.

It is further preferable that an electronic device of the invention is produced by applying one or more layers from solution and one or more layers by a sublimation method.

According to the invention, the electronic devices comprising one or more compounds of formula (I) can be used in displays, as light sources in lighting applications and as light sources in medical and/or cosmetic applications (e.g. light therapy).

EXAMPLES

A) Synthesis Examples

A1) Example 1

Synthesis of the compound bis(biphenyl-3-yl)[4-(9,9-spirobifluoren-4-yl)phenyl]amine (1-1) and of compounds (1-2) to (1-17)

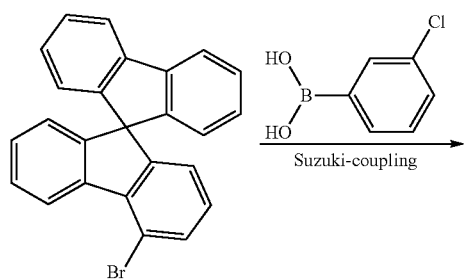

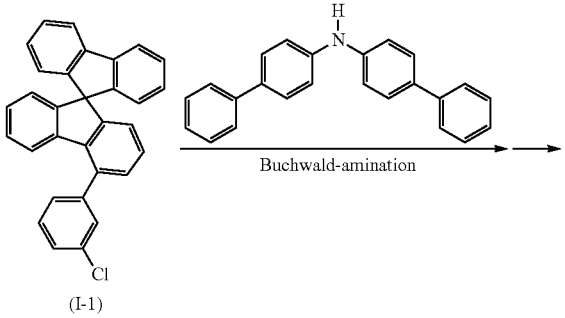

(I-1)

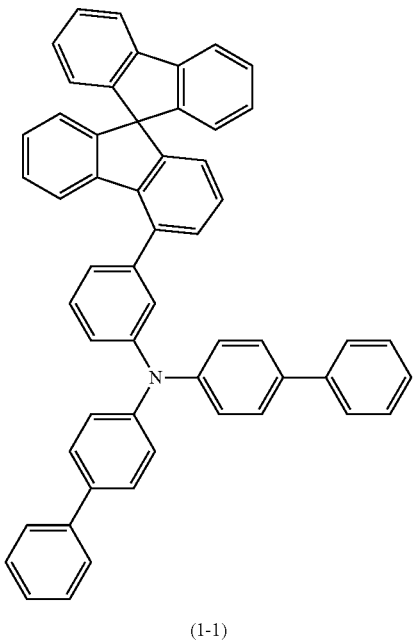

(1-1)

Synthesis of intermediate I-1:

4-(3-Chlorophenyl)-9,9-spirobifluorene 21.7 g (139 mmol) of 4-chlorobenzeneboronic acid, 50 g (126 mmol) of 4-bromo-9,9-spirobifluorene and 208 ml of an aqueous 2 M $K_2CO_3$ solution (416 mmol) are suspended in 300 ml of tetrahydrofuran. To this suspension are added 1.45 g (1.26 mmol) of tetrakis(triphenyl)phosphine-palladium(0). The reaction mixture is heated under reflux for 16 h. After cooling, the organic phase is removed, filtered through silica gel, washed three times with 300 ml of water and then concentrated to dryness. After the crude product has been filtered through silica gel with heptane/ethyl acetate (20:1), 48 g (89%) of 4-(3-chlorophenyl)-9,9-spirobifluorene are obtained.

The following compounds are prepared in an analogous manner:

| | Reactant 1 | Reactant 2 | Product | Yield |
|---|---|---|---|---|
| I-1 | | (63503-60-6) | | 89% |
| I-2 | | (63503-60-6) | | 88% |
| I-3 | | (3900-89-8) | | 85% |
| I-4 | | (3900-89-8) | | 89% |

-continued

| | Reactant 1 | Reactant 2 | Product | Yield |
|---|---|---|---|---|
| I-5 | [structure: 4-bromo-9,9'-spirobifluorene] | [structure: (3-chloro-5-phenyl)phenylboronic acid] (1186403-21-3) | [structure: spirobifluorene-biphenyl-Cl product] | 89% |
| I-6 | [structure: 3-bromo-9,9'-spirobifluorene] | [structure: (3-chloro-5-methyl)phenylboronic acid] (913836-14-3) | [structure: spirobifluorene-(chloromethylphenyl) product] | 83% |
| I-7 | [structure: 4-bromo-9,9'-spirobifluorene] | [structure: (2-chloro-5-methyl)phenylboronic acid] (193353-35-4) | [structure: spirobifluorene-(chloromethylphenyl) product] | 83% |

Bis(biphenyl-3-yl)[4-(9,9-spirobifluoren-4 yl)phenyl]amine (1-1)

15.1 g of bis(biphenyl-4-yl)amine (46.8 mmol) and 20 g of 4-(3-chlorophenyl)-9,9-spirobifluorene (46.8 mmol) are dissolved in 300 ml of toluene. The solution is degassed and saturated with $N_2$. Thereafter, 2.34 ml (2.34 mmol) of a 1 M tri-tert-butylphosphine solution and 0.26 g (1.17 mmol) of palladium(II) acetate are added thereto. Subsequently, 11.2 g of sodium tert-butoxide (117 mmol) are added. The reaction mixture is heated to boiling under a protective atmosphere for 4 h. The mixture is subsequently partitioned between toluene and water, and the organic phase is washed three times with water, dried over $Na_2SO_4$ and concentrated by rotary evaporation. After the crude product has been filtered through silica gel with toluene, the remaining residue is recrystallized from heptane/toluene and finally sublimed under high vacuum. The purity is 99.9%. The yield is 23 g (71% of theory). The following compounds are prepared in an analogous manner:

| | Reactant 1 | Reactant 2 | Product | Yield |
|---|---|---|---|---|
| 1-1 | 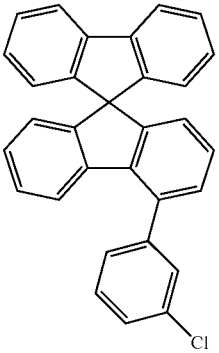 [SMILES: Clc1cccc(-c2cccc3c2-c2ccccc2C32c3ccccc3-c3ccccc32)c1] | 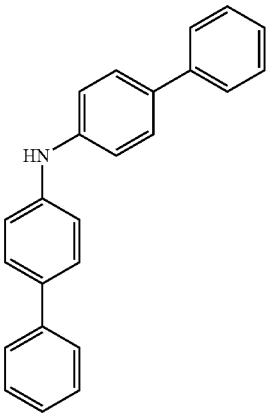 [SMILES: c1ccc(-c2ccc(Nc3ccc(-c4ccccc4)cc3)cc2)cc1] | 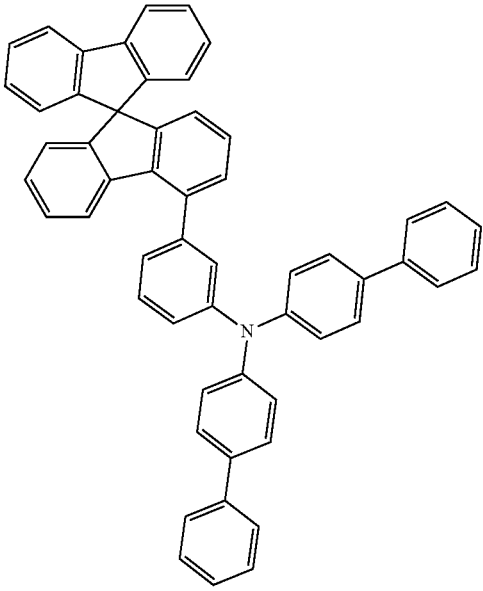 [SMILES: c1ccc(-c2ccc(N(c3ccc(-c4ccccc4)cc3)c3cccc(-c4cccc5c4-c4ccccc4C54c5ccccc5-c5ccccc54)c3)cc2)cc1] | 71% |
| 1-2 | 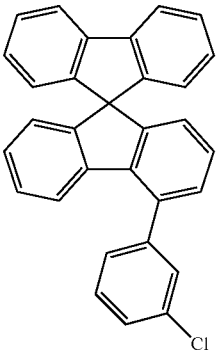 [SMILES: Clc1cccc(-c2cccc3c2-c2ccccc2C32c3ccccc3-c3ccccc32)c1] | 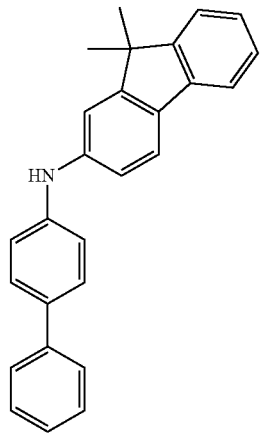 [SMILES: CC1(C)c2ccccc2-c2ccc(Nc3ccc(-c4ccccc4)cc3)cc21] | 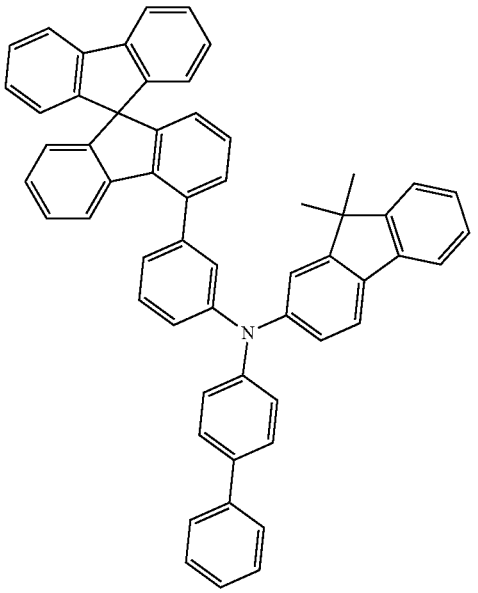 [SMILES: CC1(C)c2ccccc2-c2ccc(N(c3ccc(-c4ccccc4)cc3)c3cccc(-c4cccc5c4-c4ccccc4C54c5ccccc5-c5ccccc54)c3)cc21] | 68% |

| Reactant 1 | Reactant 2 | Product | Yield |
|---|---|---|---|
| 1-3 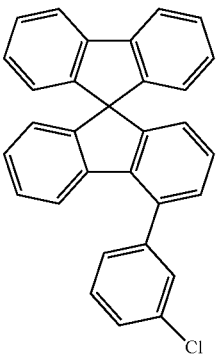 [SMILES: Clc1cccc(-c2cccc3c2-c2ccccc2C32c3ccccc3-c3ccccc32)c1] | 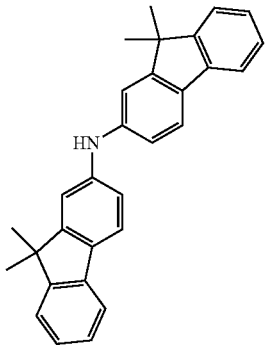 [SMILES: CC1(C)c2ccccc2-c2ccc(Nc3ccc4c(c3)C(C)(C)c3ccccc3-4)cc21] | 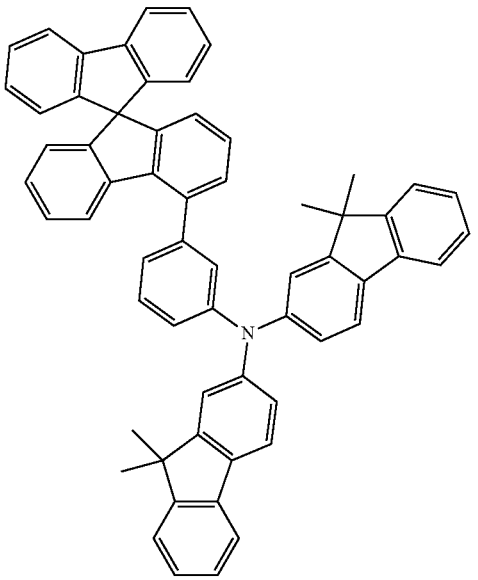 [SMILES: CC1(C)c2ccccc2-c2ccc(N(c3cccc(-c4cccc5c4-c4ccccc4C54c5ccccc5-c5ccccc54)c3)c3ccc4c(c3)C(C)(C)c3ccccc3-4)cc21] | 80% |
| 1-4 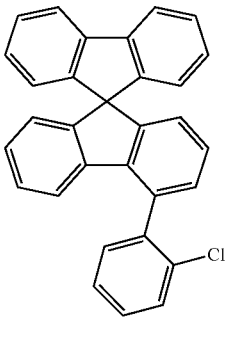 [SMILES: Clc1ccccc1-c1cccc2c1-c1ccccc1C21c2ccccc2-c2ccccc21] | 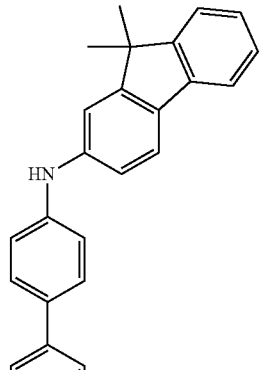 | 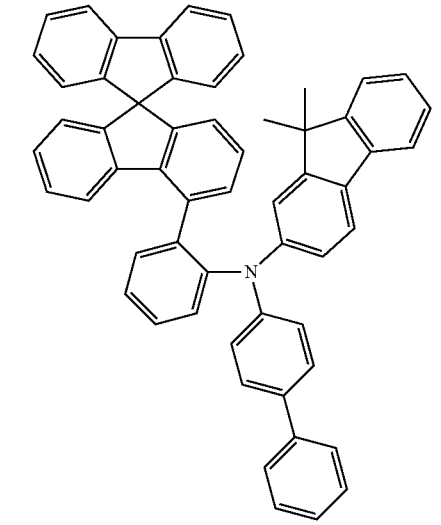 [SMILES: CC1(C)c2ccccc2-c2ccc(N(c3ccc(-c4ccccc4)cc3)c3ccccc3-c3cccc4c3-c3ccccc3C43c4ccccc4-c4ccccc43)cc21] | 70% |

-continued

| | Reactant 1 | Reactant 2 | Product | Yield |
|---|---|---|---|---|
| 1-5 | | | | 75% |
| 1-6 | | | | 70% |
| 1-8 | | | | 70% |

-continued
| | Reactant 1 | Reactant 2 | Product | Yield |
|---|---|---|---|---|
| 1-9 | 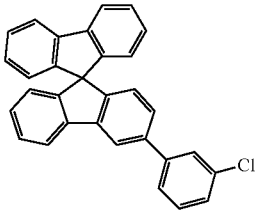 [SMILES: Clc1cccc(-c2ccc3c(c2)-c2ccccc2C32c3ccccc3-c3ccccc32)c1] | 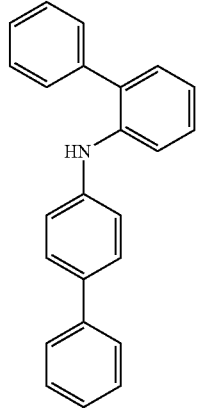 [SMILES: c1ccc(-c2ccc(Nc3ccccc3-c3ccccc3)cc2)cc1] | 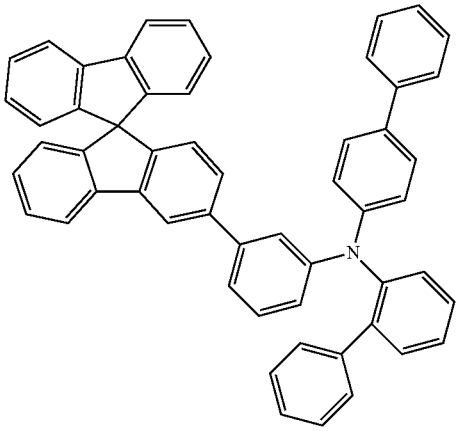 [SMILES: c1ccc(-c2ccc(N(c3cccc(-c4ccc5c(c4)-c4ccccc4C54c5ccccc5-c5ccccc54)c3)c3ccccc3-c3ccccc3)cc2)cc1] | 73% |
| 1-10 | 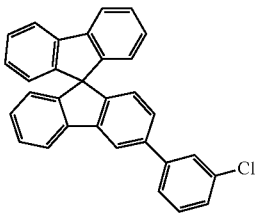 [SMILES: Clc1cccc(-c2ccc3c(c2)-c2ccccc2C32c3ccccc3-c3ccccc32)c1] | 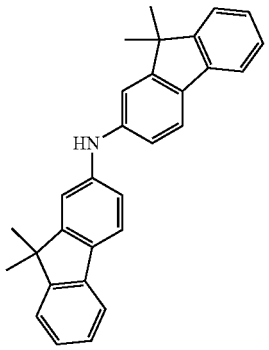 [SMILES: CC1(C)c2ccccc2-c2ccc(Nc3ccc4c(c3)C(C)(C)c3ccccc3-4)cc21] | 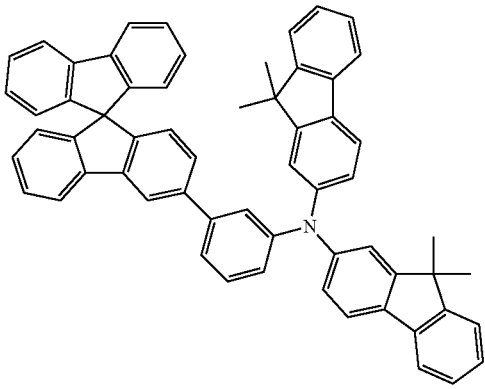 [SMILES: CC1(C)c2ccccc2-c2ccc(N(c3cccc(-c4ccc5c(c4)-c4ccccc4C54c5ccccc5-c5ccccc54)c3)c3ccc4c(c3)C(C)(C)c3ccccc3-4)cc21] | 73% |
| 1-11 | 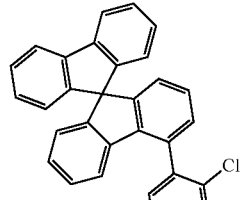 | 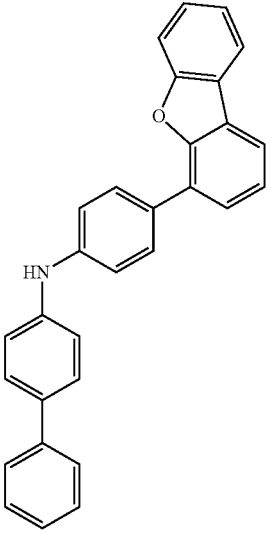 [SMILES: c1ccc(-c2ccc(Nc3ccc(-c4cccc5c4oc4ccccc45)cc3)cc2)cc1] | 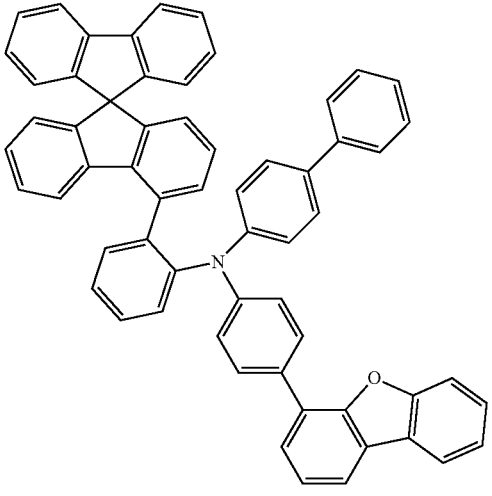 [SMILES: c1ccc(-c2ccc(N(c3ccc(-c4cccc5c4oc4ccccc45)cc3)c3ccccc3-c3cccc4c3-c3ccccc3C43c4ccccc4-c4ccccc43)cc2)cc1] | 65% |

-continued
| Reactant 1 | Reactant 2 | Product | Yield |
|---|---|---|---|
| 1-12 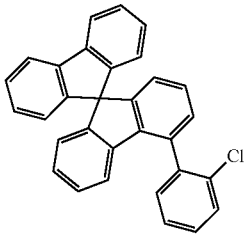 [SMILES: Clc1ccccc1-c1cccc2c1-c1ccccc1C21c2ccccc2-c2ccccc21] | 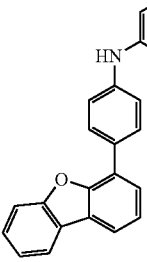 | 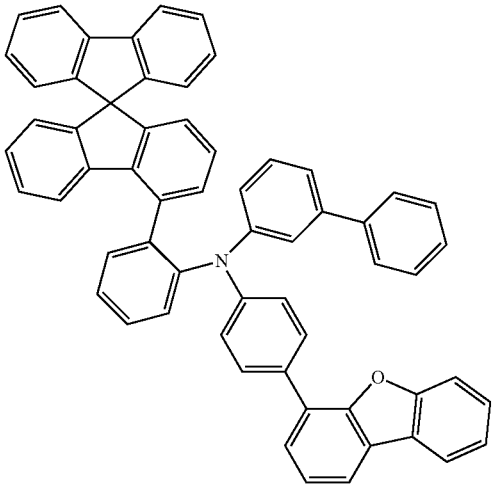 [SMILES: c1ccc(-c2cccc(N(c3ccc(-c4cccc5c4oc4ccccc45)cc3)c3ccccc3-c3cccc4c3-c3ccccc3C43c4ccccc4-c4ccccc43)c2)cc1] | 71% |
| 1-13 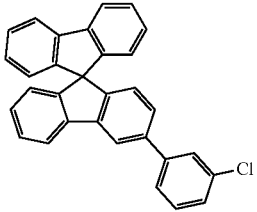 [SMILES: Clc1cccc(-c2ccc3c(c2)-c2ccccc2C32c3ccccc3-c3ccccc32)c1] | 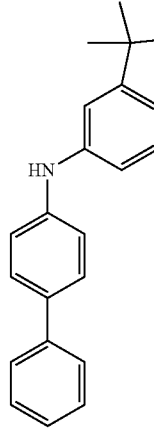 | 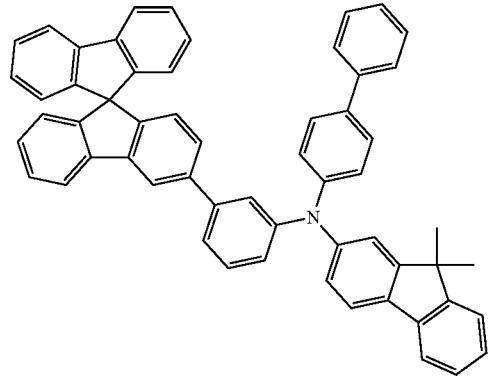 [SMILES: CC1(C)c2ccccc2-c2ccc(N(c3ccc(-c4ccccc4)cc3)c3cccc(-c4ccc5c(c4)-c4ccccc4C54c5ccccc5-c5ccccc54)c3)cc21] | 68% |
| 1-14 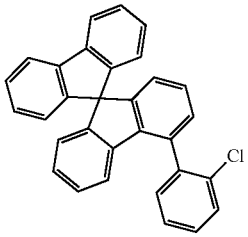 [SMILES: Clc1ccccc1-c1cccc2c1-c1ccccc1C21c2ccccc2-c2ccccc21] | 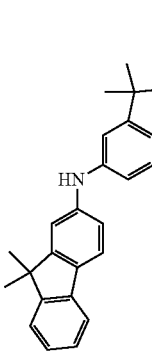 | 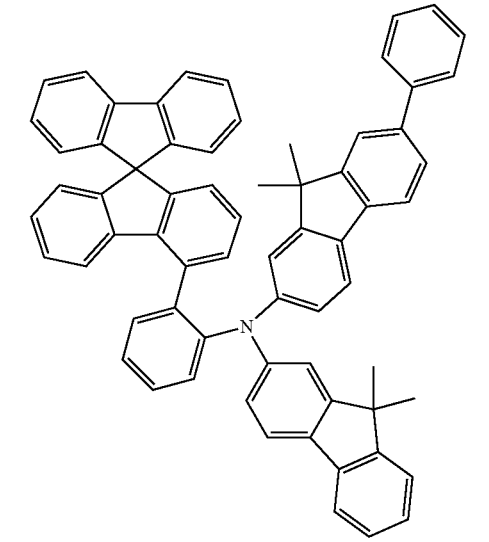 [SMILES: CC1(C)c2ccccc2-c2ccc(N(c3ccc4c(c3)C(C)(C)c3cc(-c5ccccc5)ccc3-4)c3ccccc3-c3cccc4c3-c3ccccc3C43c4ccccc4-c4ccccc43)cc21] | 63% |

| | Reactant 1 | Reactant 2 | Product | Yield |
|---|---|---|---|---|
| 1-15 | 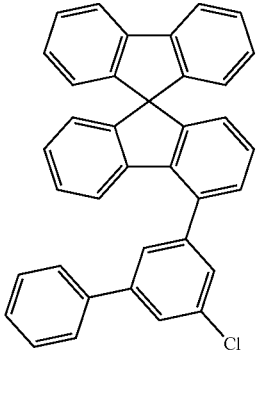 [SMILES: Clc1cc(-c2ccccc2)cc(-c2cccc3c2-c2ccccc2C32c3ccccc3-c3ccccc32)c1] | 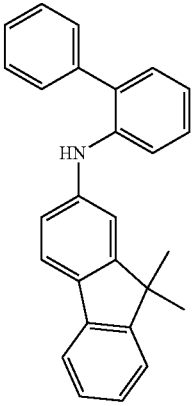 [SMILES: CC1(C)c2ccccc2-c2ccc(Nc3ccccc3-c3ccccc3)cc21] | 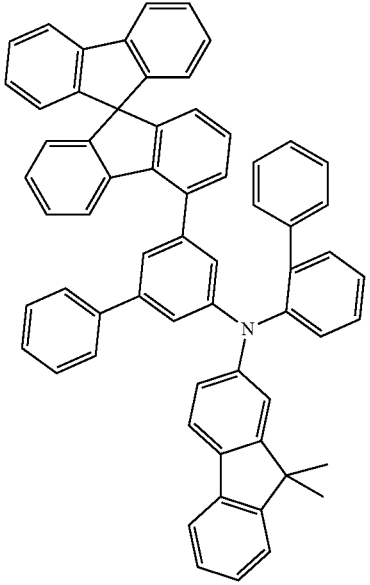 [SMILES: CC1(C)c2ccccc2-c2ccc(N(c3cc(-c4ccccc4)cc(-c4cccc5c4-c4ccccc4C54c5ccccc5-c5ccccc54)c3)c3ccccc3-c3ccccc3)cc21] | 58% |
| 1-16 | 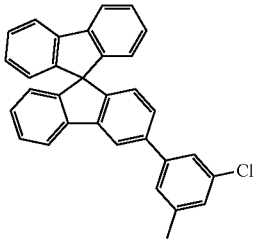 [SMILES: Cc1cc(Cl)cc(-c2ccc3c(c2)-c2ccccc2C32c3ccccc3-c3ccccc32)c1] | 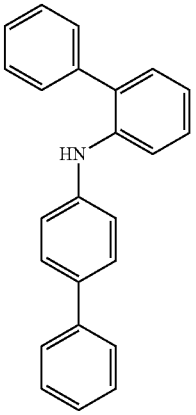 [SMILES: c1ccc(-c2ccc(Nc3ccccc3-c3ccccc3)cc2)cc1] | 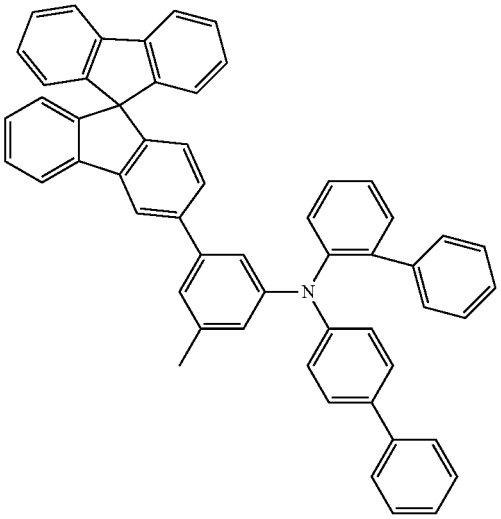 [SMILES: Cc1cc(-c2ccc3c(c2)-c2ccccc2C32c3ccccc3-c3ccccc32)cc(N(c2ccc(-c3ccccc3)cc2)c2ccccc2-c2ccccc2)c1] | 50% |
| 1-17 | 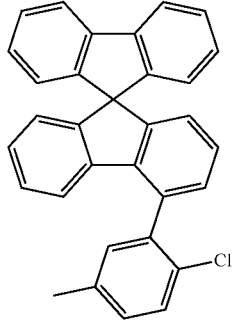 [SMILES: Cc1ccc(Cl)c(-c2cccc3c2-c2ccccc2C32c3ccccc3-c3ccccc32)c1] | 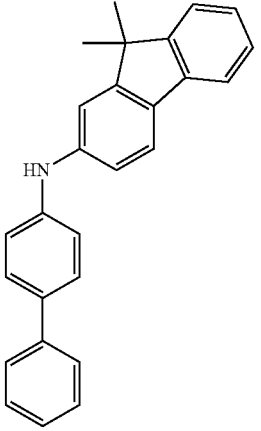 [SMILES: CC1(C)c2ccccc2-c2ccc(Nc3ccc(-c4ccccc4)cc3)cc21] | 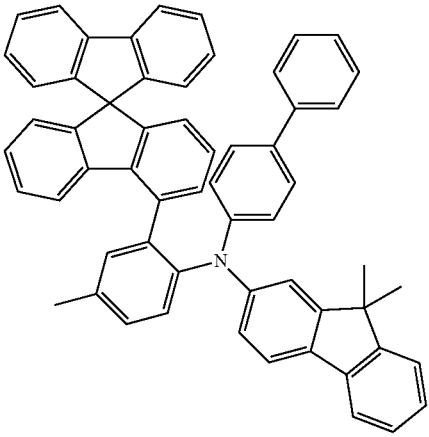 [SMILES: Cc1ccc(N(c2ccc(-c3ccccc3)cc2)c2ccc3c(c2)C(C)(C)c2ccccc2-3)c(-c2cccc3c2-c2ccccc2C32c3ccccc3-c3ccccc32)c1] | 50% |

-continued

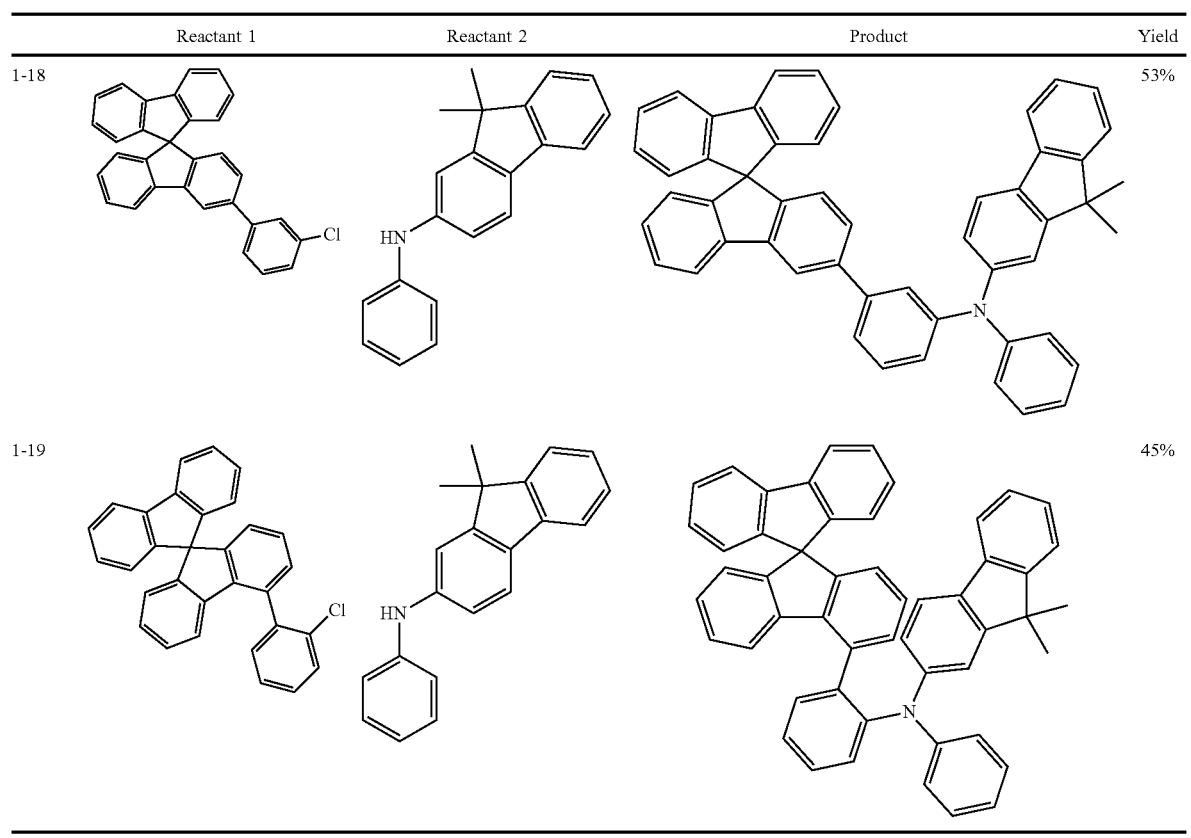

B) Device Examples

OLEDs of the invention and OLEDs according to the prior art are produced by a general method according to WO 04/058911, which is adapted to the circumstances described here (e.g. materials, layer thicknesses).

In the inventive examples which follow, the data of various OLEDs are presented (see Tables 1 to 4). The substrates used are glass plates coated with structured ITO (indium tin oxide) of thickness 50 nm. The OLEDs have the following general layer structure: substrate/hole injection layer (HIL)/hole transport layer (HTL)/optional second hole transport layer (HTL2)/electron blocker layer (EBL)/emission layer (EML)/electron transport layer (ETL)/electron injection layer (EIL) and finally a cathode. The cathode is formed by an aluminium layer of thickness 100 nm. The exact structure of the OLEDs is shown in Table 1. The materials required for production of the OLEDs are shown in Table 3.

All materials are applied by thermal vapour deposition in a vacuum chamber. In this case, the emission layer always consists of at least one matrix material (host material) and an emitting dopant (emitter) which is added to the matrix material(s) in a particular proportion by volume by co-evaporation. Details given in such a form as H1:SEB(5%) mean here that the material H1 is present in the layer in a proportion by volume of 95% and SEB in a proportion by volume of 5%. In an analogous manner, other layers may also consist of a mixture of two or more materials. Details of this are given in Tables 1 and 4.

The OLEDs are characterized in a standard manner. For this purpose, the external quantum efficiency (EQE, measured in percent) is determined as a function of luminance, calculated from current-voltage-luminance characteristics (IUL characteristics) assuming Lambertian radiation characteristics, and the lifetime. The parameter EQE @ 10 mA/cm$^2$ refers to the external quantum efficiency at a current density of 10 mA/cm$^2$. LD80 @60 mA/cm$^2$ is the lifetime until the OLED has dropped from its starting brightness of 5000 cd/m$^2$ to 80% of its starting brightness, i.e. 4000 cd/m$^2$, without any acceleration factor. The values obtained for the OLEDs of the invention and the comparative OLEDs are summarized in Tables 2a and 2b.

TABLE 1

| | | | | | | | |
|---|---|---|---|---|---|---|---|
| | | Structure of the OLEDs | | | | | |
| Ex. | HIL Thickness/nm | HTL Thickness/ nm | HTL2 Thickness/ nm | EBL Thickness/ nm | EML Thickness/nm | ETL Thickness/nm | EIL Thickness/ nm |
| C1 | HIM: F4TCNQ (5%) 20 nm | HIM 180 nm | — | HTMC1 10 nm | H1:SEB (5%) 20 nm | ETM:LiQ (50%) 30 nm | LiQ 1 nm |

TABLE 1-continued

Structure of the OLEDs

| Ex. | HIL Thickness/nm | HTL Thickness/nm | HTL2 Thickness/nm | EBL Thickness/nm | EML Thickness/nm | ETL Thickness/nm | EIL Thickness/nm |
|---|---|---|---|---|---|---|---|
| C2 | HIM:F4TCNQ (5%) 20 nm | HIM 180 nm | — | HTMC2 10 nm | H1:SEB (5%) 20 nm | ETM:LiQ (50%) 30 nm | LiQ 1 nm |
| I1 | HIM:F4TCNQ (5%) 20 nm | HIM 180 nm | — | HTM1 10 nm | H1:SEB (5%) 20 nm | ETM:LiQ (50%) 30 nm | LiQ 1 nm |
| I3 | HIM:F4TCNQ (5%) 20 nm | HIM 180 nm | — | HTM2 10 nm | H1:SEB (5%) 20 nm | ETM:LiQ (50%) 30 nm | LiQ 1 nm |
| I8 | HIM:F4TCNQ (5%) 20 nm | HIM 180 nm | — | HTM6 10 nm | H1:SEB (5%) 20 nm | ETM:LiQ (50%) 30 nm | LiQ 1 nm |
| I10 | HIM:F4TCNQ (5%) 20 nm | HIM 180 nm | — | HTM7 10 nm | H1:SEB (5%) 20 nm | ETM:LiQ (50%) 30 nm | LiQ 1 nm |
| C3 | HTMC3:F4TCNQ (5%) 20 nm | HTMC3 180 nm | — | EBM 10 nm | H1:SEB (5%) 20 nm | ETM:LiQ (50%) 30 nm | LiQ 1 nm |
| I2 | HTM3:F4TCNQ (5%) 20 nm | HTM3 180 nm | — | EBM 10 nm | H1:SEB (5%) 20 nm | ETM:LiQ (50%) 30 nm | LiQ 1 nm |
| I4 | HTM2:F4TCNQ (5%) 20 nm | HTM2 180 nm | — | EBM 10 nm | H1:SEB (5%) 20 nm | ETM:LiQ (50%) 30 nm | LiQ 1 nm |
| I9 | HTM6:F4TCNQ (5%) 20 nm | HTM6 180 nm | — | EBM 10 nm | H1:SEB (5%) 20 nm | ETM:LiQ (50%) 30 nm | LiQ 1 nm |
| C4 | HIM:F4TCNQ (5%) 20 nm | HIM 210 nm | HTMC1:F4TCNQ (5%) 20 nm | HTMC1 20 nm | TMM:TEG(10%) 30 nm | ETM:LiQ (50%) 40 nm | LiQ 1 nm |
| C5 | HIM:F4TCNQ (5%) 20 nm | HIM 210 nm | HTMC2:F4TCNQ (5%) 20 nm | HTMC2 20 nm | TMM:TEG(10%) 30 nm | ETM:LiQ (50%) 40 nm | LiQ 1 nm |
| I7 | HIM:F4TCNQ (5%) 20 nm | HIM 210 nm | HTM2:F4TCNQ (5%) 20 nm | HTM2 20 nm | TMM:TEG(10%) 30 nm | ETM:LiQ (50%) 40 nm | LiQ 1 nm |

TABLE 2a

Data obtained for the OLEDs with singlet blue EML

| | U [V] | EQE @ 10 mA/cm$^2$ [%] |
|---|---|---|
| C1 | 3.8 | 8.0 |
| C2 | 4.1 | 8.0 |
| I1 | 3.8 | 8.7 |
| I3 | 4.0 | 8.6 |
| I8 | 3.6 | 8.1 |
| I10 | 3.8 | 8.6 |
| C3 | 7.9 | 5.5 |
| I2 | 3.9 | 8.9 |
| I4 | 4.0 | 8.1 |
| I9 | 3.8 | 8.7 |

TABLE 2b

Data obtained for the OLEDs with triplet green EML

| | U [V] | LD80 @ 60 mA/cm$^2$ |
|---|---|---|
| C4 | 4.1 | 130 |
| C5 | 3.9 | 70 |
| I7 | 4.1 | 165 |

TABLE 3

Structures of the compounds used

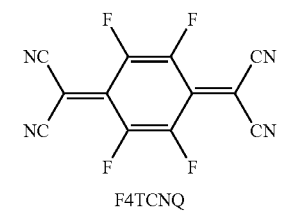 [SMILES: N#CC(C#N)=c1c(F)c(F)c(=C(C#N)C#N)c(F)c1F]

F4TCNQ

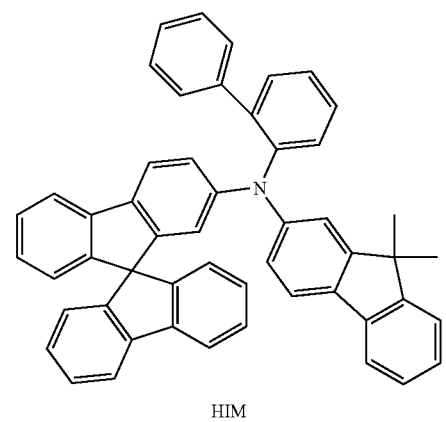 [SMILES: CC1(C)c2ccccc2-c2ccc(N(c3ccc4c(c3)C3(c5ccccc5-c5ccccc53)c3ccccc3-4)c3ccccc3-c3ccccc3)cc21]

HIM

TABLE 3-continued
Structures of the compounds used
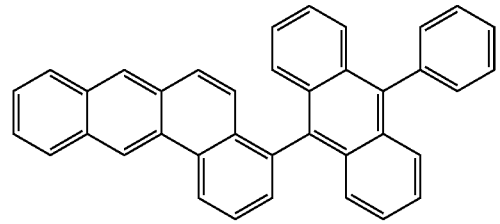
H1
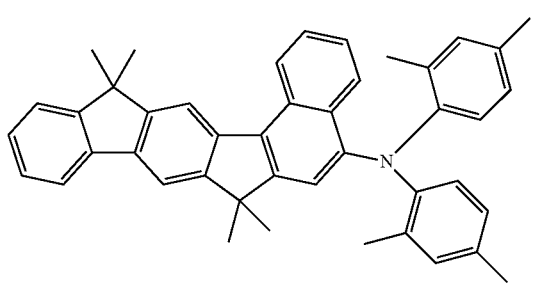
SEB
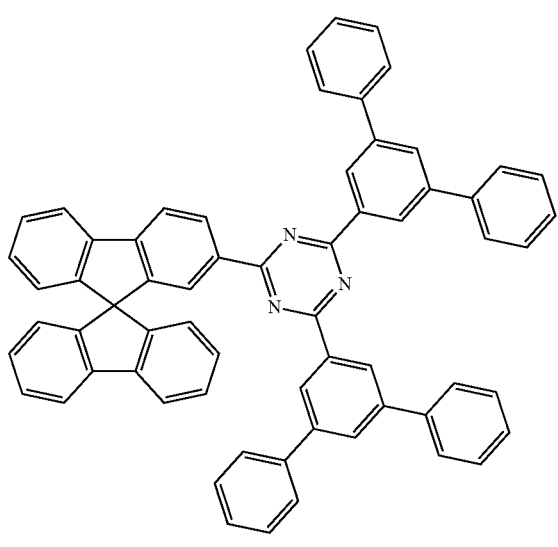
ETM
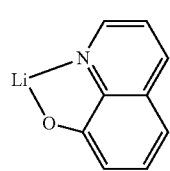
LiQ
TABLE 3-continued
Structures of the compounds used
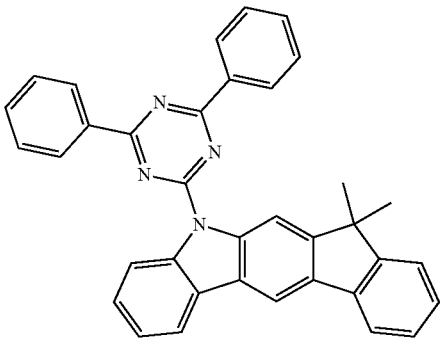
TMM
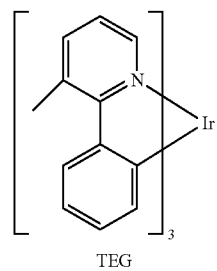
TEG
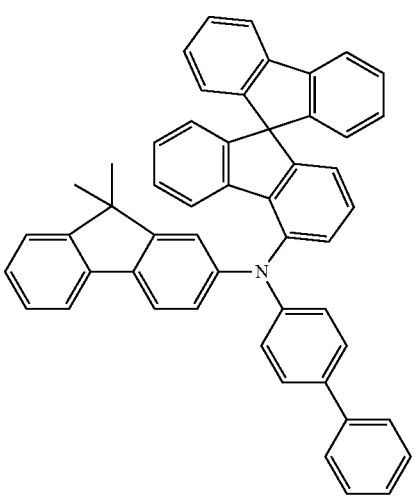
EBM TABLE 3-continued
Structures of the compounds used
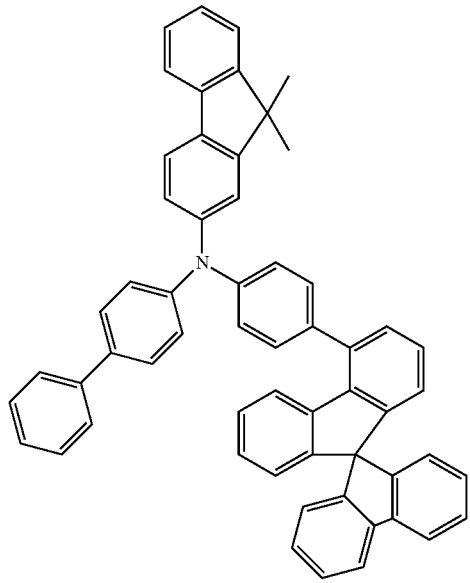
HTMC1
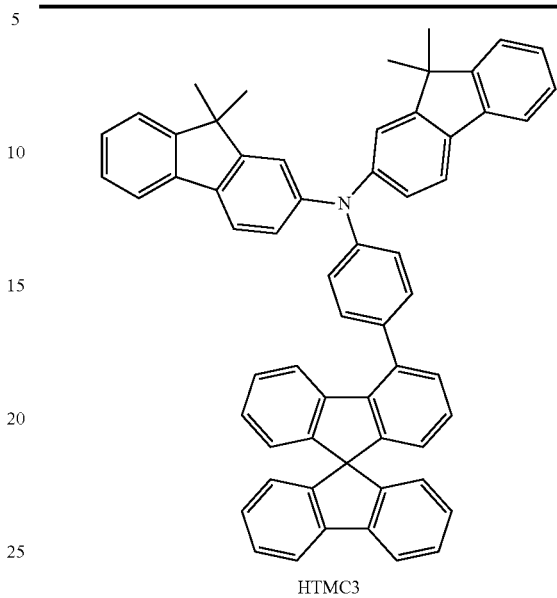
HTMC3
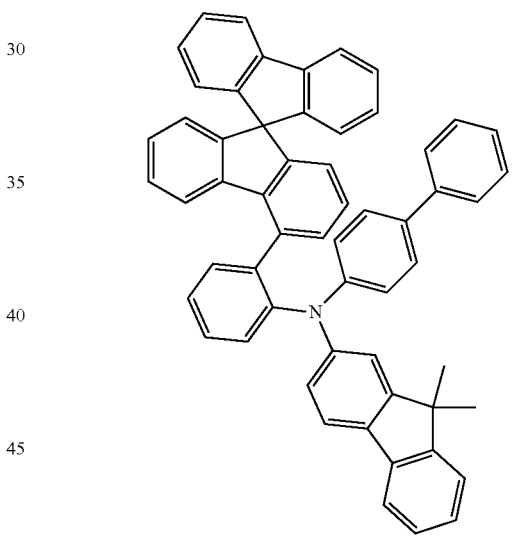
HTM1
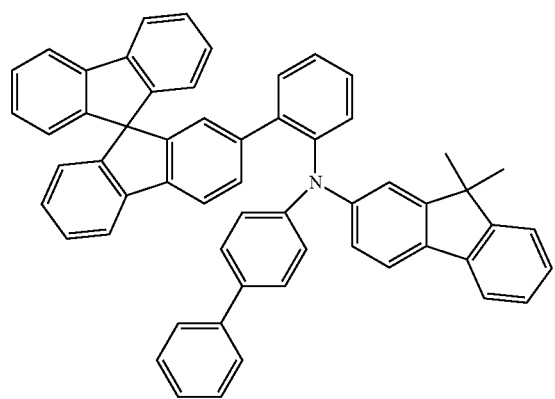
HTMC2
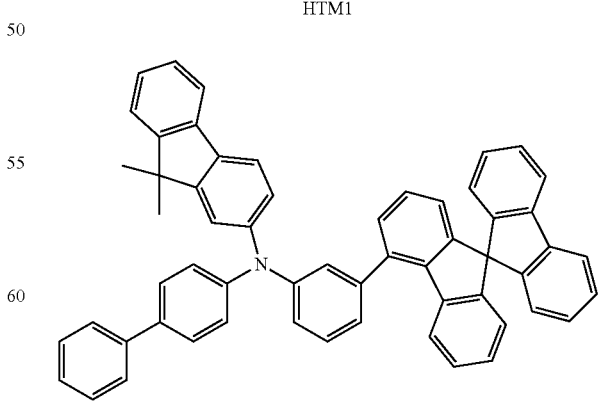
HTM2

TABLE 3-continued

Structures of the compounds used

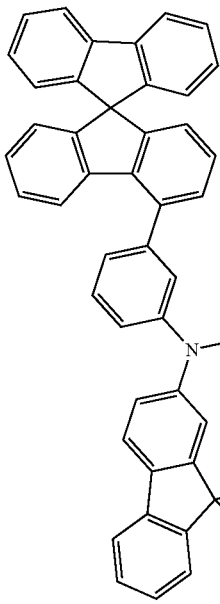

HTM3

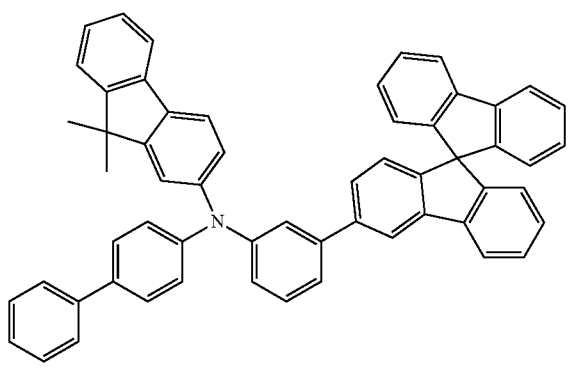

HTM4

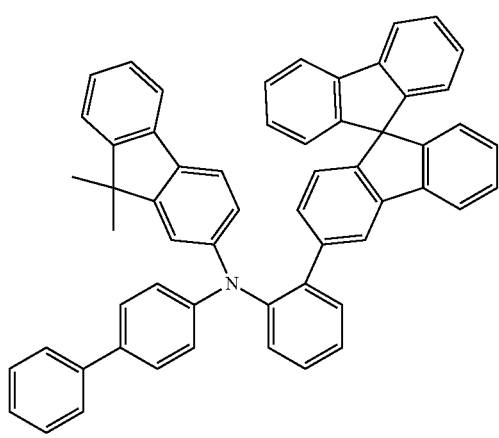

HTM5

TABLE 3-continued

Structures of the compounds used

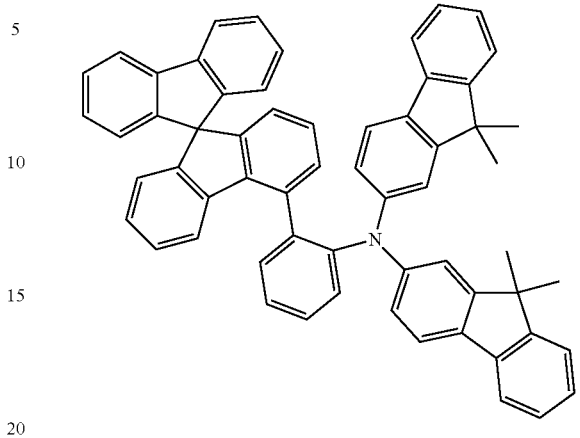

HTM6

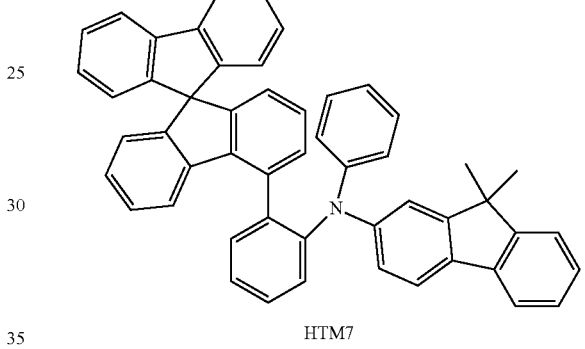

HTM7

All the OLEDs tested that contain compounds of the invention exhibit very good values for the measured parameters of lifetime and efficiency, both for singlet blue devices (I1 to I4 and I8 to I10) and for triplet green devices (I7). The compounds of the invention are each used in hole injection layers and/or hole transport layers and/or electron blocker layers in the devices produced.

From the results obtained, the following comparisons should be emphasized:

A comparison of the devices C1, I1 and I3 that are otherwise of identical structure shows that devices comprising the inventive compounds HTM1 (I1) and HTM2 (I3) show much better values for efficiency than the comparative device comprising the comparative compound HTMC1 (C1). This shows the improvement which is achieved by the introduction of an ortho- or meta-phenylene group compared to a para-phenylene group.

A comparison of the devices C2 and I1 that are otherwise of identical structure shows that a device comprising the inventive compound HTM1 (11) shows much better values for efficiency than the comparative device comprising the comparative compound HTMC2 (C2). This shows the improvement which is achieved by 4-substituted spiro compounds compared to 2-substituted spiro compounds.

A comparison of the devices C3 and I2 and I9 that are otherwise of identical structure shows that a device comprising the inventive compound HTM3 (I2) and a device comprising the inventive compound HTM6 (I9) show much better values for efficiency than the comparative device comprising the comparative compound HTMC3 (C3). This again shows, for two other examples, the improvement which is achieved by the introduction of a meta-phenylene group compared to a para-phenylene group.

A further comparison between the two inventive OLEDs I2 comprising HTM3 and I4 comprising HTM2 that are otherwise of identical structure shows the surprising distinct improvement in efficiency which is obtained through the use of two fluorenyl groups rather than one fluorenyl group and one biphenyl group on the amine.

A comparison of the devices C4 and I7 that are otherwise of identical structure shows that a device comprising the inventive compound HTM2 (I7) shows much better values for lifetime than the comparative device comprising the comparative compound HTMC1 (C4). This again shows, for another example, the improvement which is achieved by the introduction of a meta-phenylene group compared to a para-phenylene group.

In addition, the following two device constructions are created:

TABLE 4

Structure of the OLEDs

| Ex. | HIL Thickness/nm | HTL Thickness/nm | HIL2 Thickness/nm | EBL Thickness/nm | EML Thickness/nm | ETL Thickness/nm | EIL Thickness/nm |
|---|---|---|---|---|---|---|---|
| I5 | HIM: F4TCNQ (5%) 20 nm | HIM 180 nm | — | HTM4 10 nm | H1:SEB (5%) 20 nm | ETM:LiQ (50%) 30 nm | LiQ 1 nm |
| I6 | HIM: F4TCNQ (5%) 20 nm | HIM 180 nm | — | HTM5 10 nm | H1:SEB (5%) 20 nm | ETM:LiQ (50%) 30 nm | LiQ 1 nm |

In these two examples, the materials HTM4 and HTM5 are used, which are 3-substituted spirobifluorenes according to the present invention. With these two materials too, good results are achieved in OLEDs.

The invention claimed is:

1. Compound of formula (I-1)

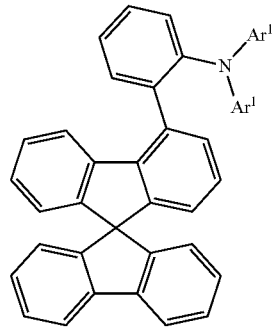

Formula (I-1)

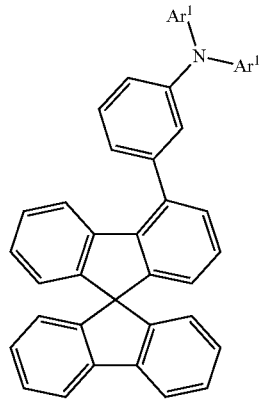

Formula (I-2)

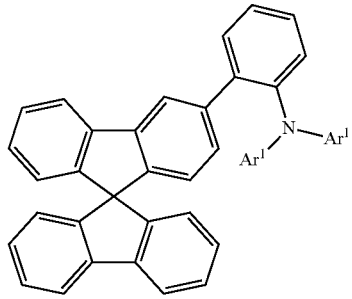

Formula (I-3)

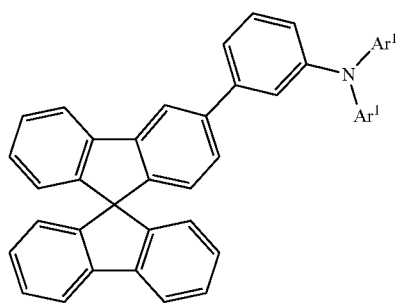

Formula (I-4)

where the compound is optionally substituted by an $R^1$ radical at each of the free positions on the spirobifluorene unit, and is optionally substituted by an $R^2$ radical at each of the free positions on the phenylene unit, and where the variables that occur are:
R¹ is the same or different at each instance and is selected from the group consisting of H and D;
R² is the same or different at each instance and is selected from the group consisting of H and D;
Ar¹ conform to one of the following definitions a) and b):
a) one of the two Ar¹ is selected from biphenyl and phenyl, and the other of the two Ar¹ is fluorenyl, which is substituted by two R³ radicals in the bridgehead position; b) both of the two Ar¹ are fluorenyl, which is substituted by two R³ radicals in the bridgehead position;
R³ is the same or different at each instance and is selected from the group consisting of H, D, and straight-chain alkyl groups having 1 to 6 carbon atoms.

2. The compound according to claim 1, wherein no R¹ radical is bonded, exactly one R¹ radical other than His bonded, or exactly two R¹ radicals other than H are bonded to the spirobifluorene base skeleton.

3. The compound according to claim 1, wherein no R² radical or exactly one R² radical other than H is bonded to the phenylene group in formula (I-1).

4. The compound according to claim 1, wherein R³ is H.

5. A process for preparing the compound according to claim 1, comprising reacting a spirobifluorene bearing one reactive group in a first metal-catalysed coupling reaction with a benzene derivative containing two reactive groups, one of which is converted in this coupling reaction, and where an amino group is finally introduced into the compound at the other of the two reactive groups via a second organometallic coupling reaction; or comprising reacting a benzene compound bearing two reactive groups in a first metal-catalysed coupling reaction with an amino compound at one of the two reactive groups, and is reacted in a second metal-catalysed coupling reaction with a spirobifluorene derivative at the other of the two reactive groups.

6. A formulation comprising at least one compound according to claim 1, and at least one solvent.

7. An electronic device comprising at least one compound according to claim 1.

8. The electronic device according to claim 7, wherein the device is an organic electroluminescent device comprising anode, cathode and at least one emitting layer, where it is at least one organic layer of the device, which may be an emitting layer or a hole-transporting layer, especially a hole transport layer, a hole injection layer or an electron-blocking layer, that contains the at least one compound.

9. The electronic device according to claim 7, wherein the device is an organic electroluminescent device comprising anode, cathode, at least one emitting layer, and exactly two, three or four hole-transporting layers between the anode and emitting layer, where it is at least one of the hole-transporting layers that contains the at least one compound.

10. The electronic device according to claim 7, wherein the device is an organic electroluminescent device comprising anode, cathode, at least one emitting layer and at least one hole-transporting layer that contains the at least one compound and at least one further compound selected from p-dopants.

11. The compound according to claim 1, wherein R¹ is H.

12. The compound according to claim 1, characterized in that R¹ is H; and R² is H; and
Ar¹ is the same or different on each occurrence and is selected from phenyl, biphenyl, and 9,9'-dimethylfluorenyl.

13. The compound according to claim 1, characterized in that R¹ is, identically or differently, selected from H and D; and R² is, identically or differently, selected from H and D; and Ar¹ is selected, identically or differently, from biphenyl and fluorenyl, where fluorenyl is substituted with radicals R³ in the bridgehead position.

14. The compound according to claim 1, characterized in that R¹ is, identically or differently, selected from H and D; and R² is, identically or differently, selected from H and D; and Ar¹ is selected, identically or differently, from biphenyl, and 9,9'-dimethylfluorenyl.

15. The compound according to claim 1, characterized in that R¹ is, identically or differently, selected from H and D; and R² is, identically or differently, selected from H and D; and one of the two Ar¹ is biphenyl, and the other of the two Ar¹ is 9,9'-dimethylfluorenyl.

16. The compound according to claim 1, characterized in that it has one of the following structures:

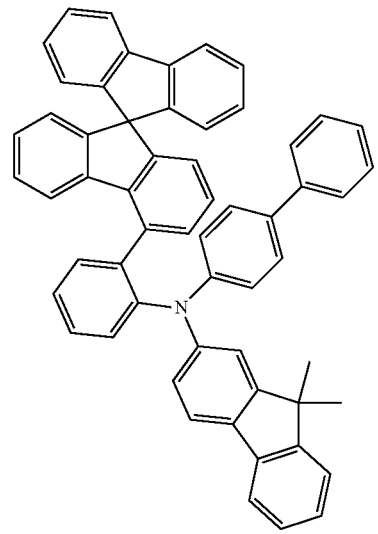

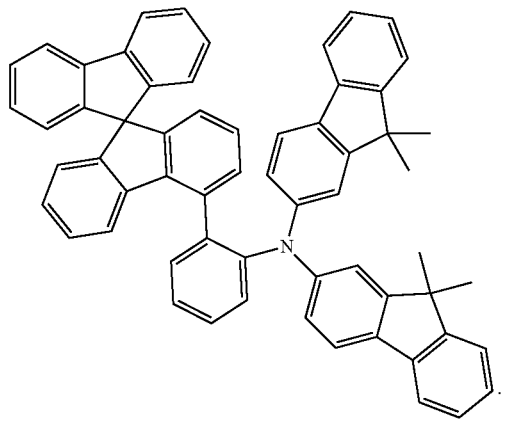

17. Compound of formula (I-2)

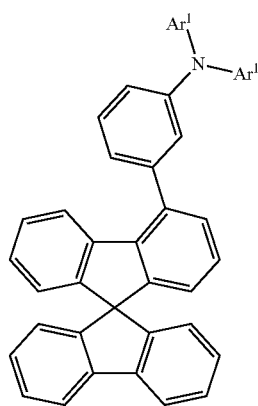

formula (I-2)

where the compound is optionally substituted by an R¹ radical at each of the free positions on the spirobifluorene unit, and is optionally substituted by an R² radical at each of the free positions on the phenylene unit, and where the variables that occur are:
R¹ is the same or different at each instance and is selected from the group consisting of H, and D;
R² is the same or different at each instance and is selected from the group consisting of H, and D;
Ar¹ conform to one of the following definitions a) and b):
a) one of the two Ar¹ is selected from biphenyl and phenyl, and the other of the two Ar¹ is fluorenyl, which is substituted by two R³ radicals in the bridgehead position; b) both of the two Ar¹ are fluorenyl, which is substituted by two R³ radicals in the bridgehead position;
R is the same or different at each instance and is selected from the group consisting of H, D, and straight-chain alkyl groups having 1 to 6 carbon atoms.

18. The compound according to claim 17, wherein no R¹ radical is bonded, exactly one R¹ radical other than His bonded, or exactly two R¹ radicals other than H are bonded to the spirobifluorene base skeleton.

19. The compound according to claim 17, wherein no R² radical or exactly one R² radical other than H is bonded to the phenylene group in formula (I-2).

20. The compound according to claim 17, wherein R³ is H.

21. A process for preparing the compound according to claim 17, comprising reacting a spirobifluorene bearing one reactive group in a first metal-catalysed coupling reaction with a benzene derivative containing two reactive groups, one of which is converted in this coupling reaction, and where an amino group is finally introduced into the compound at the other of the two reactive groups via a second organometallic coupling reaction; or comprising reacting a benzene compound bearing two reactive groups in a first metal-catalysed coupling reaction with an amino compound at one of the two reactive groups, and is reacted in a second metal-catalysed coupling reaction with a spirobifluorene derivative at the other of the two reactive groups.

22. A formulation comprising at least one compound according to claim 17, and at least one solvent.

23. An electronic device comprising at least one compound according to claim 17.

24. The electronic device according to claim 23, wherein the device is an organic electroluminescent device comprising anode, cathode and at least one emitting layer, where it is at least one organic layer of the device, which may be an emitting layer or a hole-transporting layer, especially a hole transport layer, a hole injection layer or an electron-blocking layer, that contains the at least one compound.

25. The electronic device according to claim 23, wherein the device is an organic electroluminescent device comprising anode, cathode, at least one emitting layer, and exactly two, three or four hole-transporting layers between the anode and emitting layer, where it is at least one of the hole-transporting layers that contains the at least one compound.

26. The electronic device according to claim 23, wherein the device is an organic electroluminescent device comprising anode, cathode, at least one emitting layer and at least one hole-transporting layer that contains the at least one compound and at least one further compound selected from p-dopants.

27. The compound according to claim 17, wherein R¹ is H.

28. The compound according to claim 17, characterized in that
R¹ is H; and R² is H; and
Ar¹ is the same or different on each occurrence and is selected from biphenyl, and 9,9'-dimethylfluorenyl.

29. The compound according to claim 17, characterized in that R¹ is, identically or differently, selected from H and D; and R² is, identically or differently, selected from H and D; and Ar¹ is selected, identically or differently, from biphenyl and fluorenyl where fluorenyl is substituted with radicals R³ in the bridgehead position.

30. The compound according to claim 17, characterized in that R¹ is, identically or differently, selected from H and D; and R² is, identically or differently, selected from H and D; and Ar¹ is selected, identically or differently, from biphenyl, and 9,9'-dimethylfluorenyl.

31. The compound according to claim 17, characterized in that R¹ is, identically or differently, selected from H and D; and R² is, identically or differently, selected from H and D; and one of the two Ar¹ is biphenyl, and the other of the two Ar¹ is 9,9'-dimethylfluorenyl.

32. The compound according to claim 17, characterized in that it has one of the following structures:

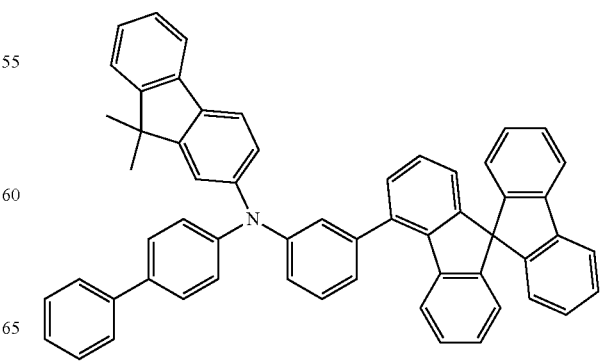

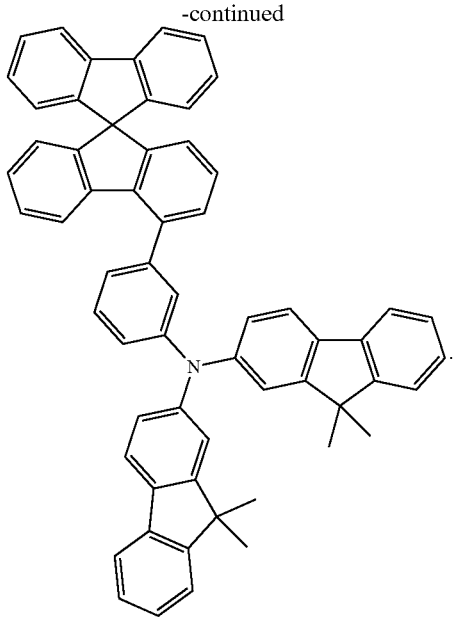

33. The compound according to claim 1, wherein one of the following two definitions applies: a) one of the two Ar$^1$ is selected from biphenyl and phenyl, and the other of the two Ar$^1$ is fluorenyl, which is substituted by two methyl radicals in the bridgehead position; b) both of the two Ar$^1$ are fluorenyl, which is substituted by two methyl radicals in the bridgehead position.

34. The compound according to claim 17, wherein one of the following two definitions applies: a) one of the two Ar$^1$ is selected from biphenyl and phenyl, and the other of the two Ar$^1$ is fluorenyl, which is substituted by two methyl radicals in the bridgehead position; b) both of the two Ar$^1$ are fluorenyl, which is substituted by two methyl radicals in the bridgehead position.

* * * * *